US010907955B2

(12) United States Patent
Armstrong et al.

(10) Patent No.: US 10,907,955 B2
(45) Date of Patent: Feb. 2, 2021

(54) THREE-DIMENSIONAL IMAGER

(71) Applicant: FARO Technologies, Inc., Lake Mary, FL (US)

(72) Inventors: Matthew Armstrong, Glenmoore, PA (US); Christopher S. Garcia, Malvern, PA (US); Theodore J. Hordeski, Jr., Dresher, PA (US); Michael Veksland, Mount Laurel, NJ (US); Yevgeniy Vinshtok, Downingtown, PA (US)

(73) Assignee: FARO TECHNOLOGIES, INC., Lake Mary, FL (US)

( * ) Notice: Subject to any disclaimer, the term of this patent is extended or adjusted under 35 U.S.C. 154(b) by 0 days.

(21) Appl. No.: 16/518,135

(22) Filed: Jul. 22, 2019

(65) Prior Publication Data

US 2019/0346257 A1 Nov. 14, 2019

Related U.S. Application Data

(63) Continuation of application No. 15/457,045, filed on Mar. 13, 2017, now Pat. No. 10,444,006, which is a
(Continued)

(51) Int. Cl.
  G01B 11/14 (2006.01)
  G01B 11/25 (2006.01)
  (Continued)

(52) U.S. Cl.
  CPC ............ *G01B 11/14* (2013.01); *G01B 11/245* (2013.01); *G01B 11/25* (2013.01); *G01B 21/042* (2013.01);
  (Continued)

(58) Field of Classification Search
  CPC ................................ G01B 11/25; G01B 11/14
  See application file for complete search history.

(56) References Cited

U.S. PATENT DOCUMENTS

| 5,670,787 A | 9/1997 | Pryor et al. |
| 5,734,172 A | 3/1998 | Pryor et al. |

(Continued)

FOREIGN PATENT DOCUMENTS

| DE | 10017463 A1 | 10/2001 |
| DE | 102009032771 A1 | 1/2011 |

(Continued)

OTHER PUBLICATIONS

International Search Report and Written Opinion for International Application No. PCT/US2016/046482 dated Feb. 8, 2017; 18 pgs.
(Continued)

*Primary Examiner* — Rowina J Cattungal
(74) *Attorney, Agent, or Firm* — Cantor Colburn LLP

(57) ABSTRACT

A three-dimensional (3D) measuring system and a method of determining a distance is provided. A three-dimensional (3D) measuring system includes a master part having a first base part and a first part-under-test including a second base. A photogrammetry camera images the master part to generate two-dimensional (2D) images. A first 3D imager determines 3D coordinates in a first imager frame of reference. A second 3D imager determines 3D coordinates in a second imager frame of reference. The system determines in a system frame of reference a first pose of the first imager and a second pose of the second imager. The system is further configured to determine 3D coordinates of the first part-under-test in the system frame of reference.

17 Claims, 78 Drawing Sheets

Related U.S. Application Data continuation-in-part of application No. 15/233,415, filed on Aug. 10, 2016, now Pat. No. 10,455,216.

(60) Provisional application No. 62/309,024, filed on Mar. 16, 2016, provisional application No. 62/276,325, filed on Jan. 8, 2016, provisional application No. 62/276,329, filed on Jan. 8, 2016, provisional application No. 62/276,319, filed on Jan. 8, 2016, provisional application No. 62/272,451, filed on Dec. 29, 2015, provisional application No. 62/272,461, filed on Dec. 29, 2015, provisional application No. 62/272,469, filed on Dec. 29, 2015, provisional application No. 62/272,442, filed on Dec. 29, 2015, provisional application No. 62/207,047, filed on Aug. 19, 2015.

(51) Int. Cl.

| | | |
|---|---|---|
| *G06T 7/60* | (2017.01) | |
| *G01B 11/245* | (2006.01) | |
| *G01C 11/00* | (2006.01) | |
| *G01S 17/48* | (2006.01) | |
| *G01B 21/04* | (2006.01) | |
| *G01C 3/10* | (2006.01) | |
| *H04N 13/254* | (2018.01) | |
| *G01C 3/08* | (2006.01) | |
| *H05K 7/20* | (2006.01) | |
| *H04N 13/00* | (2018.01) | |
| *H04N 13/246* | (2018.01) | |

(52) U.S. Cl.
CPC ............... *G01C 3/08* (2013.01); *G01C 3/10* (2013.01); *G01C 11/00* (2013.01); *G01S 17/48* (2013.01); *G06T 7/60* (2013.01); *H04N 13/254* (2018.05); *G06T 2207/30204* (2013.01); *G06T 2207/30244* (2013.01); *H04N 13/246* (2018.05); *H04N 2013/0081* (2013.01); *H05K 7/20136* (2013.01)

(56) References Cited

U.S. PATENT DOCUMENTS

| | | | | |
|---|---|---|---|---|
| 5,805,289 | A * | 9/1998 | Corby, Jr. | G01B 5/14 345/419 |
| 5,880,459 | A | 3/1999 | Pryor et al. | |
| 5,940,302 | A | 8/1999 | Pryor | |
| 6,138,055 | A | 10/2000 | Pryor | |
| 6,211,506 | B1 | 4/2001 | Pryor et al. | |
| 6,466,305 | B1 | 10/2002 | McBain | |
| 6,617,601 | B1 | 9/2003 | Wiklund | |
| 6,618,155 | B2 | 9/2003 | Metcalfe et al. | |
| 6,825,936 | B2 | 11/2004 | Metcalfe et al. | |
| 7,525,114 | B2 | 4/2009 | Metcalfe et al. | |
| 9,880,075 | B2 * | 1/2018 | Finch | B60C 11/246 |
| 2002/0023478 | A1 | 2/2002 | Pryor | |
| 2002/0136444 | A1 * | 9/2002 | Brown | G01C 11/06 382/154 |
| 2003/0025788 | A1 * | 2/2003 | Beardsley | H04N 5/2224 348/43 |
| 2003/0112448 | A1 * | 6/2003 | Maidhof | G01B 11/002 356/603 |
| 2008/0118143 | A1 | 5/2008 | Gordon et al. | |
| 2008/0201101 | A1 | 8/2008 | Herbert et al. | |
| 2009/0323121 | A1 * | 12/2009 | Valkenburg | G01C 15/002 358/1.18 |
| 2010/0017178 | A1 | 1/2010 | Tsuk et al. | |
| 2010/0134598 | A1 * | 6/2010 | St-Pierre | G01B 11/2513 348/47 |
| 2011/0007326 | A1 * | 1/2011 | Daxauer | G01B 11/002 356/620 |
| 2011/0173827 | A1 | 7/2011 | Bailey et al. | |
| 2011/0298916 | A1 | 12/2011 | Arden | |
| 2012/0062706 | A1 | 3/2012 | Keshavmurthy | |
| 2012/0120413 | A1 | 5/2012 | Bellis et al. | |
| 2012/0176478 | A1 | 7/2012 | Wang et al. | |
| 2013/0050410 | A1 * | 2/2013 | Steinbichler | G01B 21/042 348/42 |
| 2013/0125408 | A1 | 5/2013 | Atwell et al. | |
| 2013/0293684 | A1 | 11/2013 | Becker | |
| 2013/0307931 | A1 | 11/2013 | Bronstein | |
| 2014/0028805 | A1 | 1/2014 | Tohme | |
| 2014/0152769 | A1 | 6/2014 | Atwell et al. | |
| 2014/0192187 | A1 | 7/2014 | Atwell et al. | |
| 2014/0204204 | A1 | 7/2014 | Sumiyoshi et al. | |
| 2014/0292723 | A1 | 10/2014 | Suzuki | |
| 2015/0097968 | A1 | 4/2015 | Bergman et al. | |
| 2015/0160005 | A1 | 6/2015 | Iwai | |
| 2015/0178412 | A1 * | 6/2015 | Grau | G01B 5/004 703/1 |
| 2015/0195487 | A1 | 7/2015 | Liu et al. | |
| 2016/0069670 | A1 | 3/2016 | Ruhland et al. | |
| 2016/0134860 | A1 * | 5/2016 | Jovanovic | G01B 21/042 348/50 |
| 2016/0171712 | A1 | 6/2016 | Arden | |
| 2016/0202071 | A1 | 7/2016 | Sham et al. | |
| 2017/0054965 | A1 | 2/2017 | Raab et al. | |

FOREIGN PATENT DOCUMENTS

| | | | |
|---|---|---|---|
| DE | 102009055626 A1 | 5/2011 | |
| DE | 102013011848 A1 | 1/2015 | |
| EP | 2489977 A2 * | 8/2012 | ............ G01B 11/25 |
| EP | 2837907 A1 | 2/2015 | |

OTHER PUBLICATIONS

Macknojia, Rizwan et al., "Calibration of a Network of Kinect Sensors for Robotic Inspection over a Large Workspace" Robot Vision (WORV), 2013 IEEE Workshop on, Jan. 15, 2013, pp. 184-190, XP032415741.

Reich, C., "Photogrammetric Matching of Point Clouds for 3D-Measurement of Complex Objects" Optomechaatronic Micro/Nano Devices and Components III (Oct. 8-10, 2007) Lausanne, Switzerland, vol. 3520, Nov. 1, 1998 pp. 100-110, XP000901843.

Extended European Search Report for Application No. 19200452. 1-1010; dated Jan. 31, 2020; 8 pages.

* cited by examiner

SECTION A-A

SECTION B-B

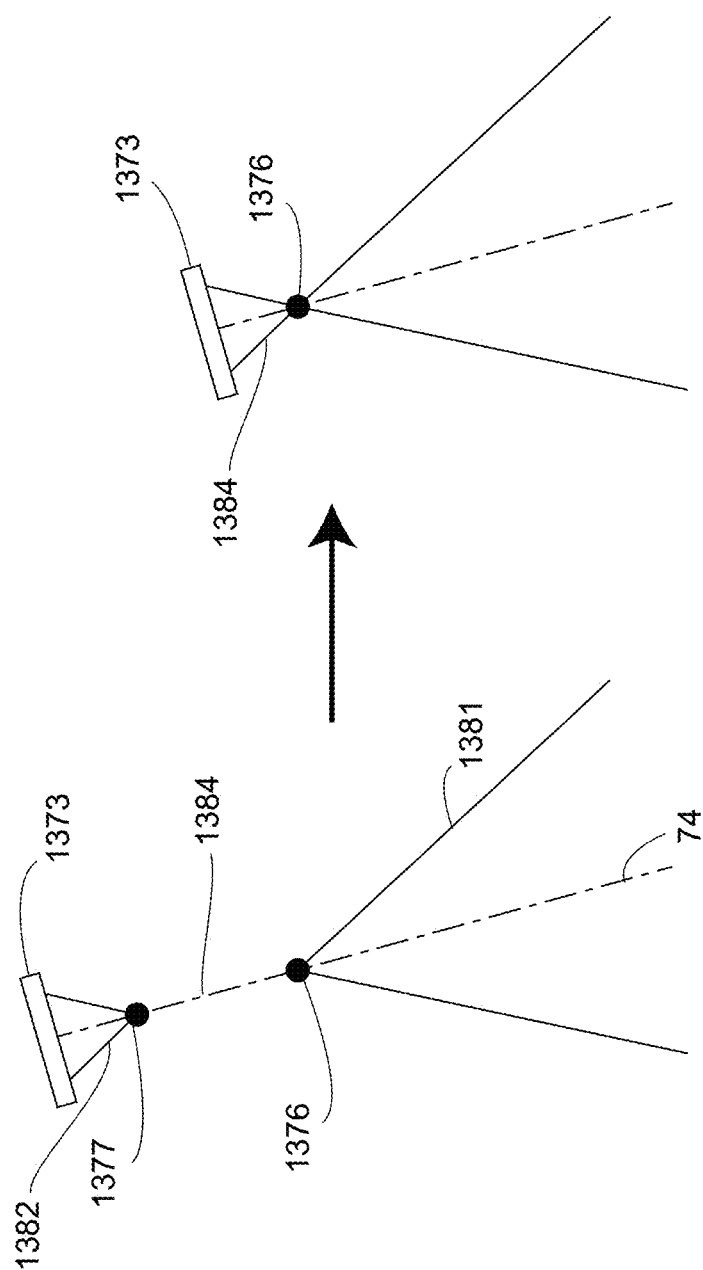

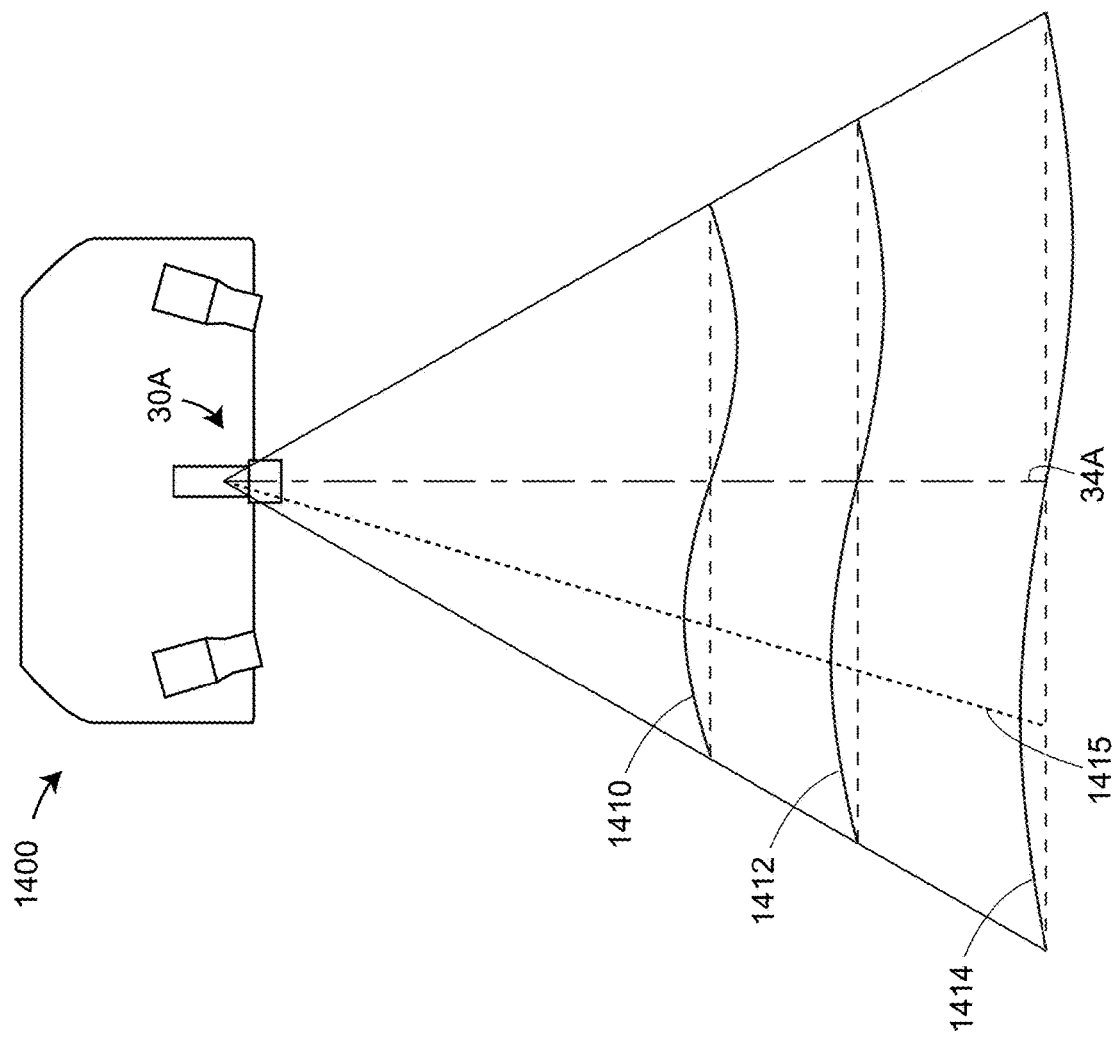

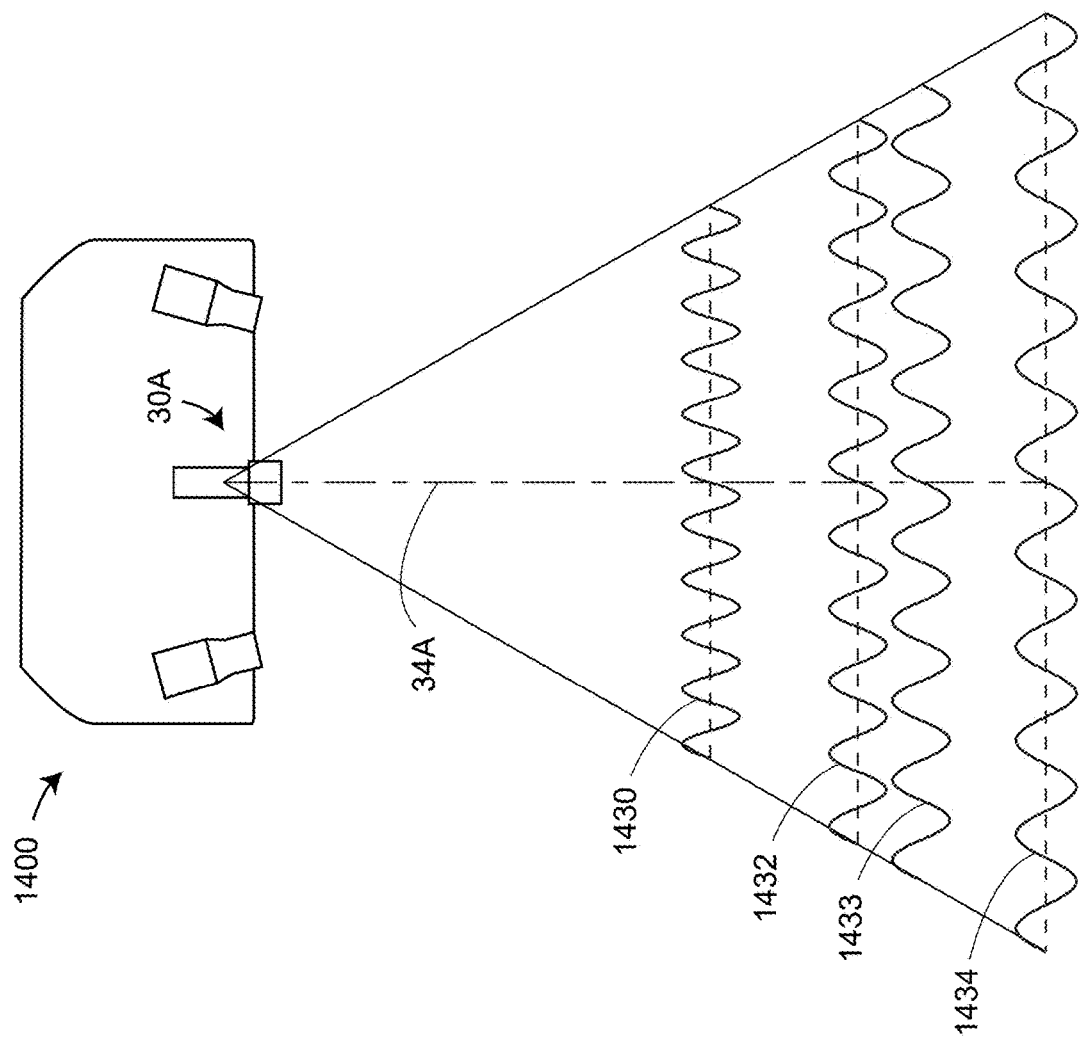

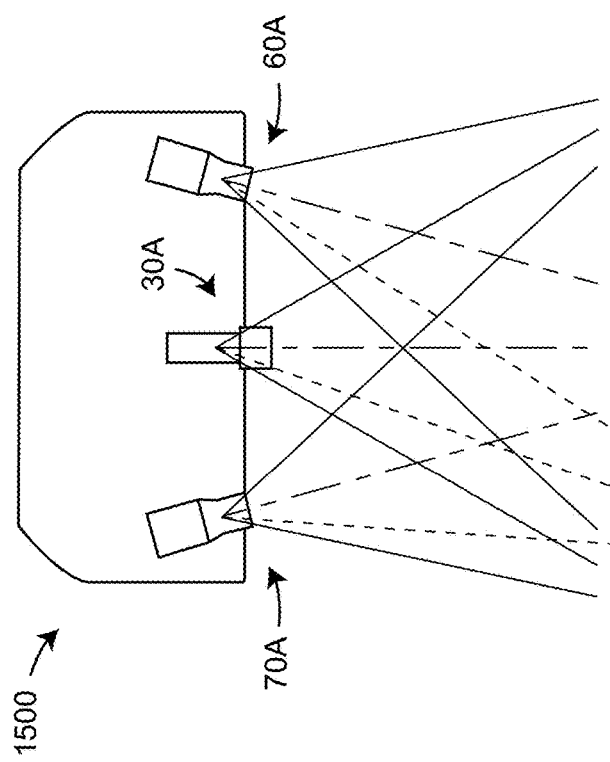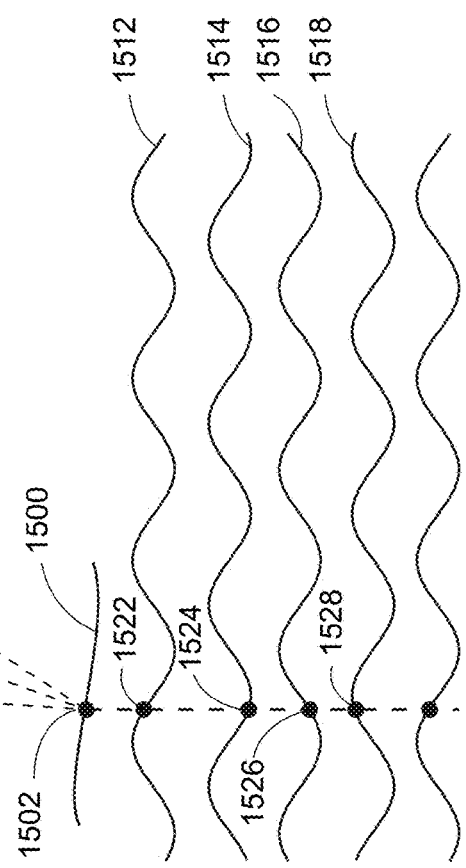
FIG. 15

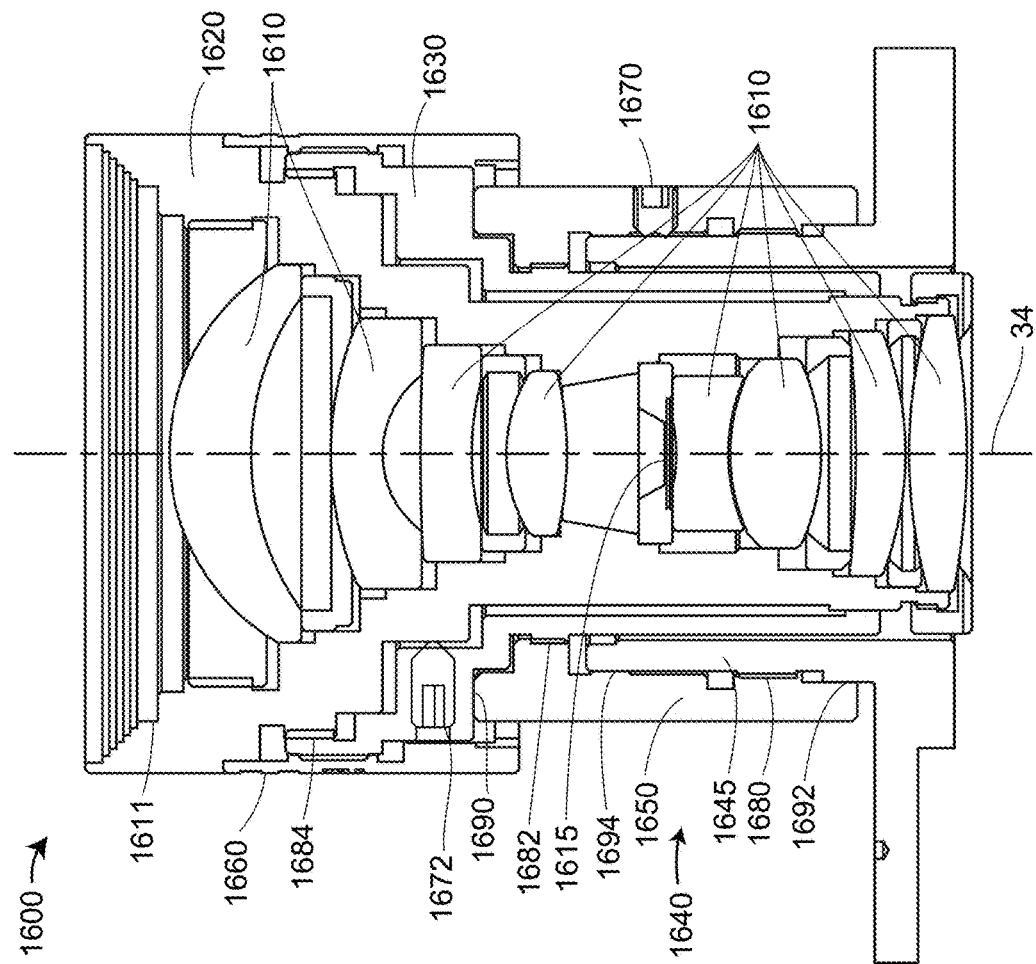

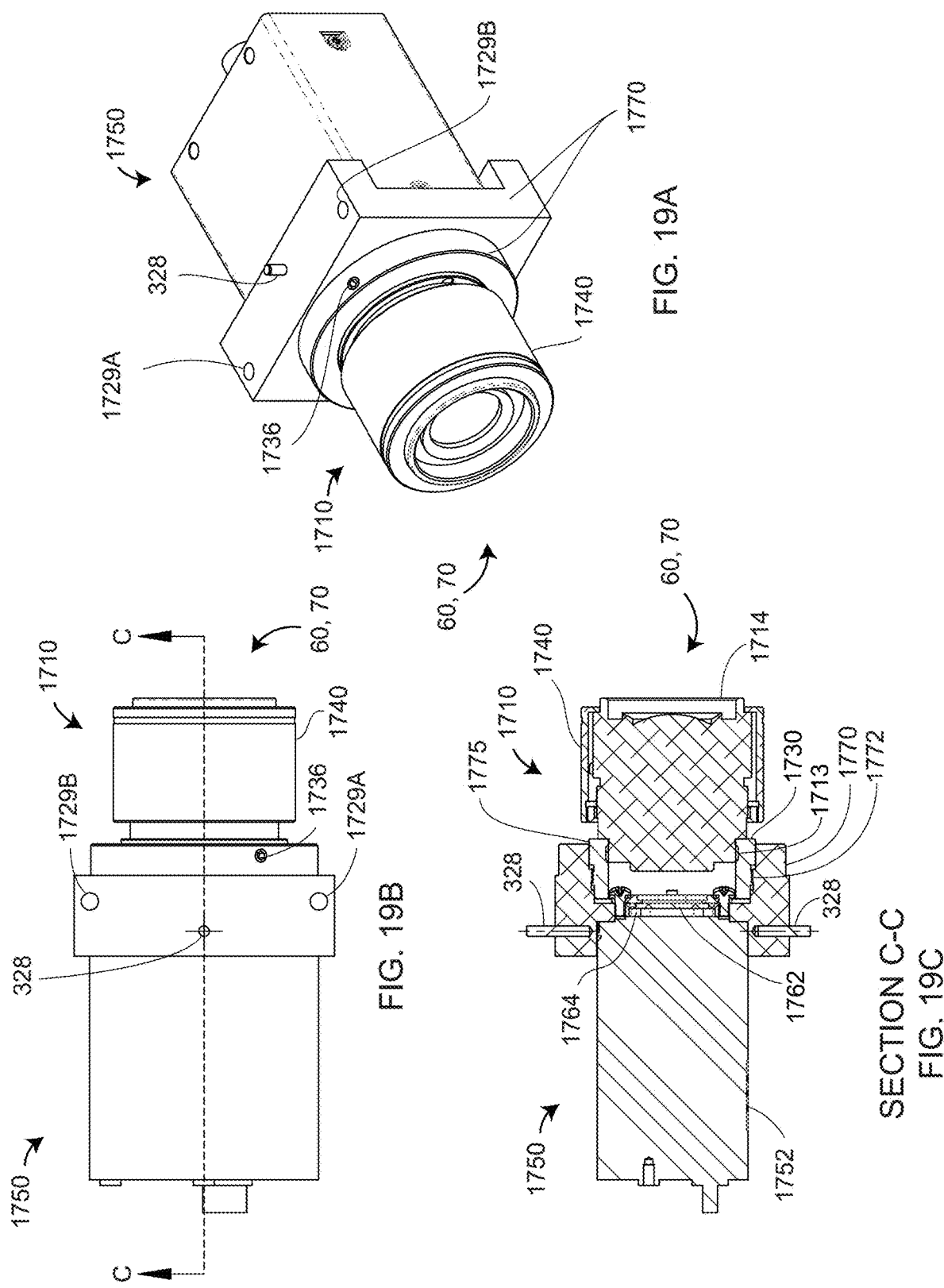

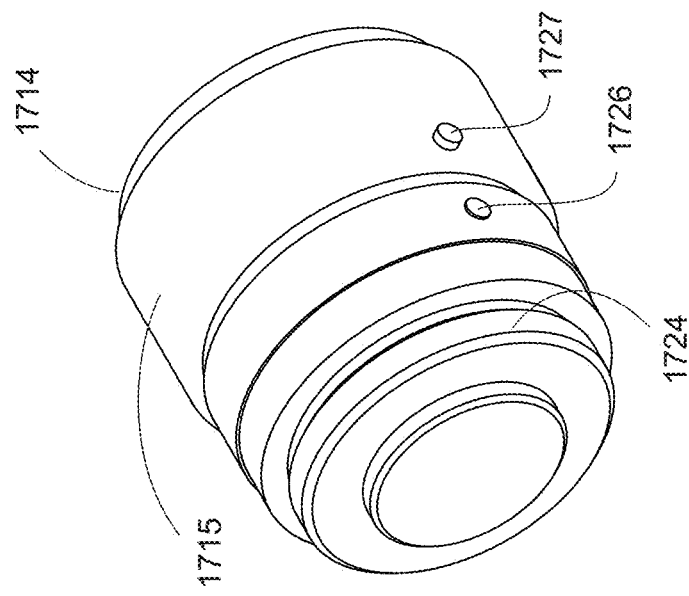
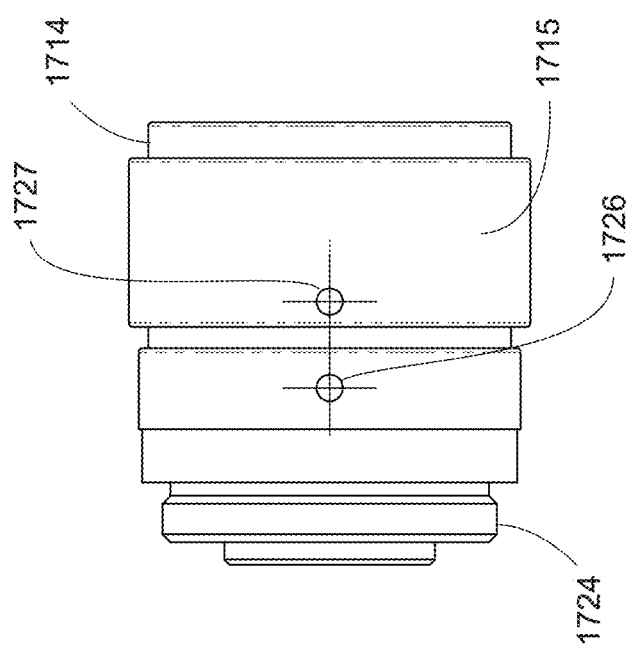

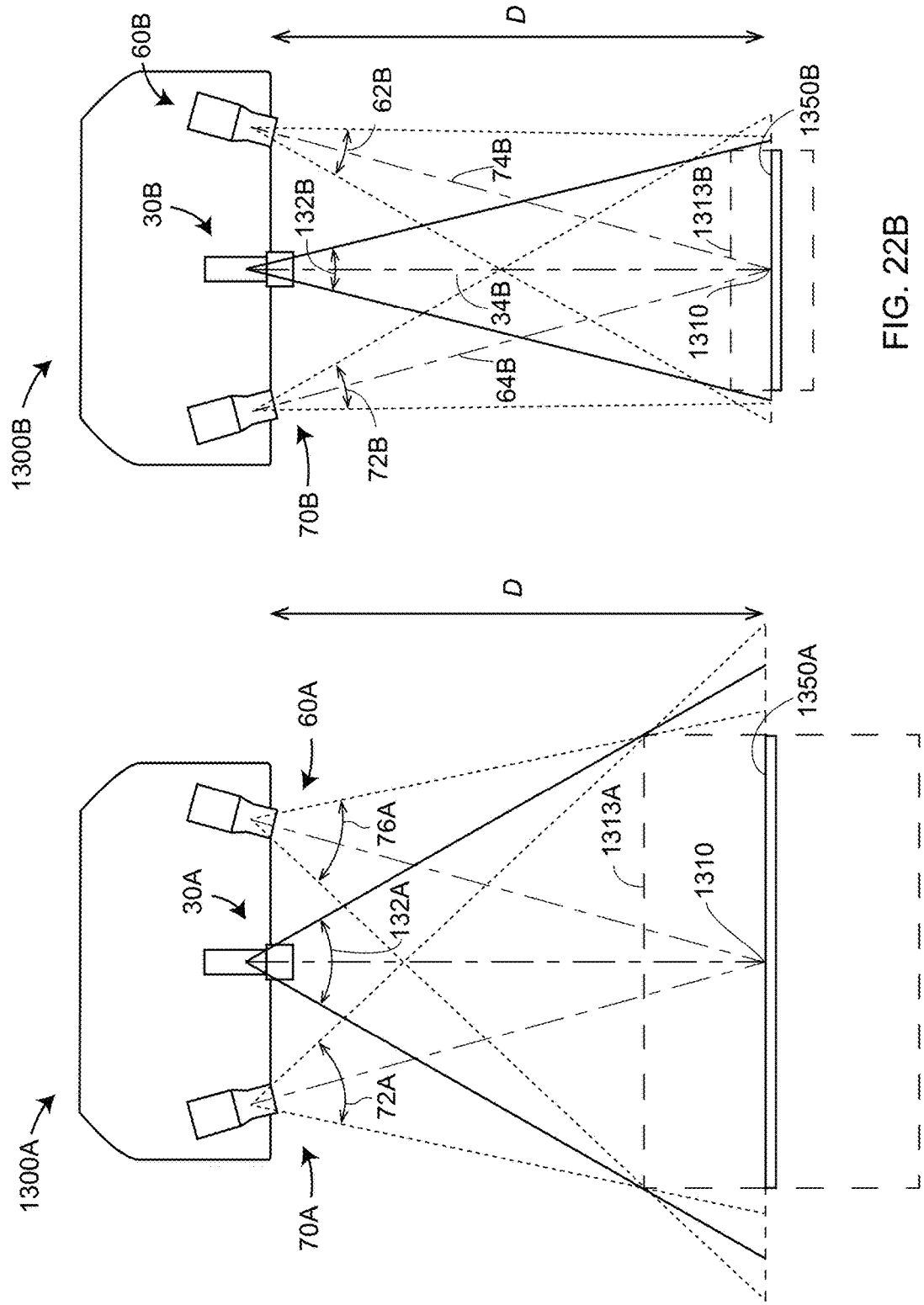

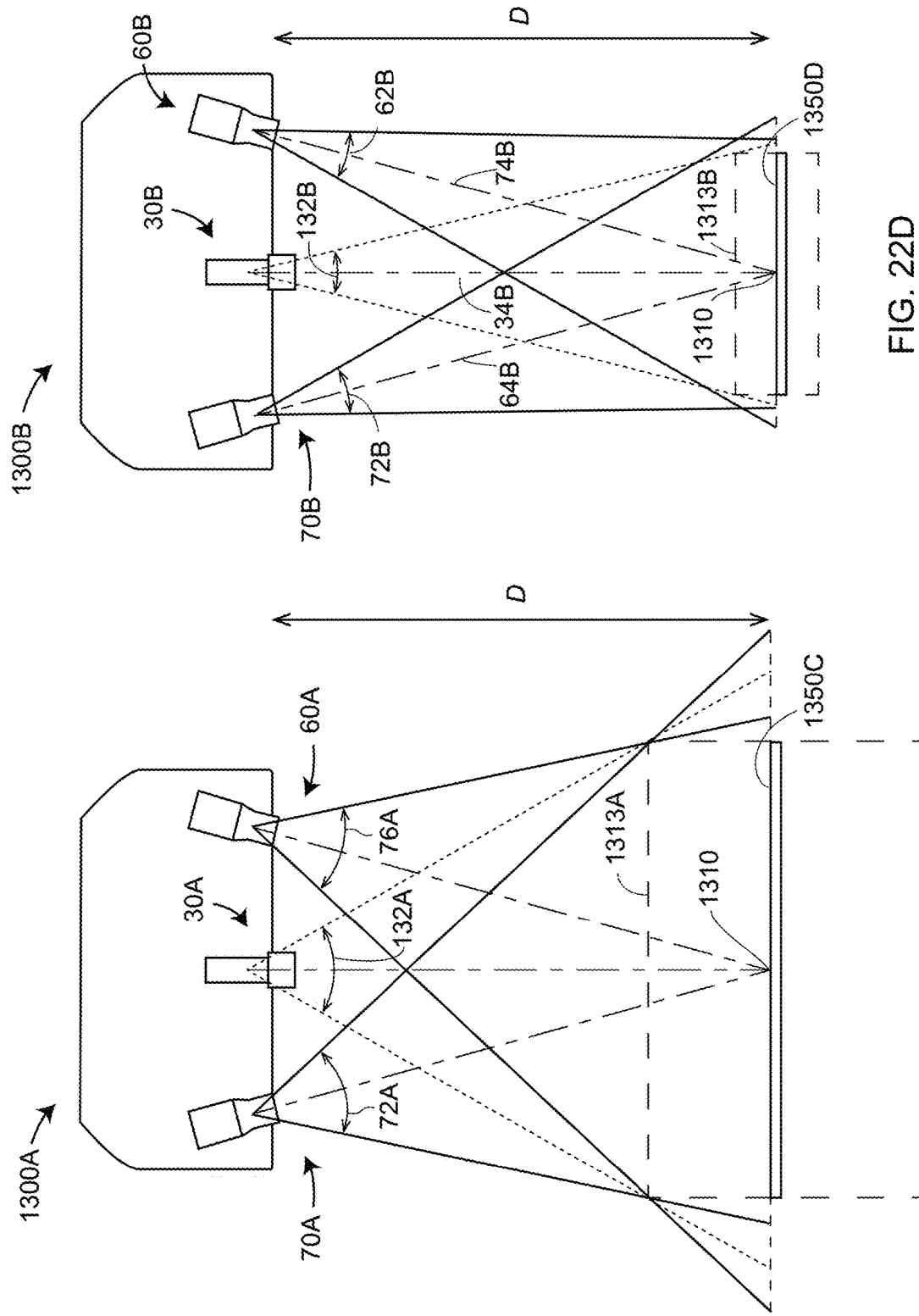

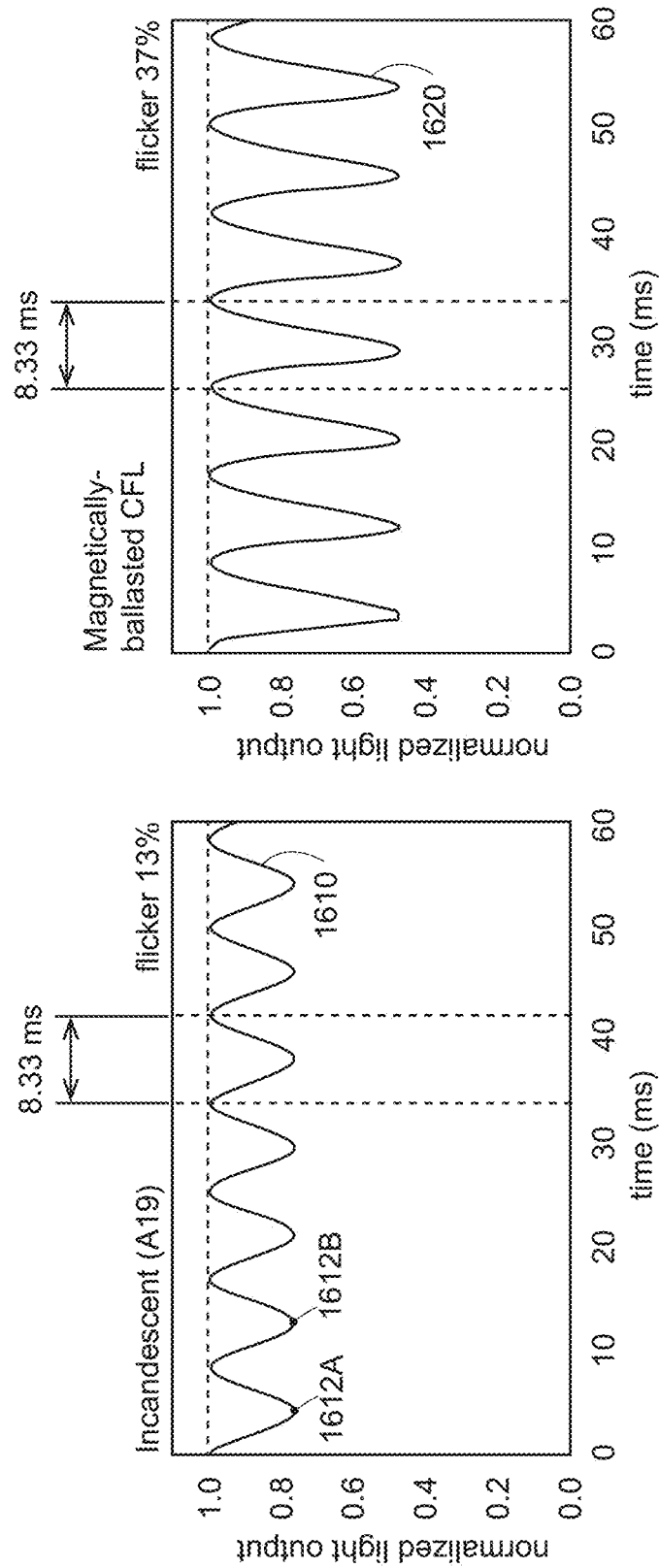

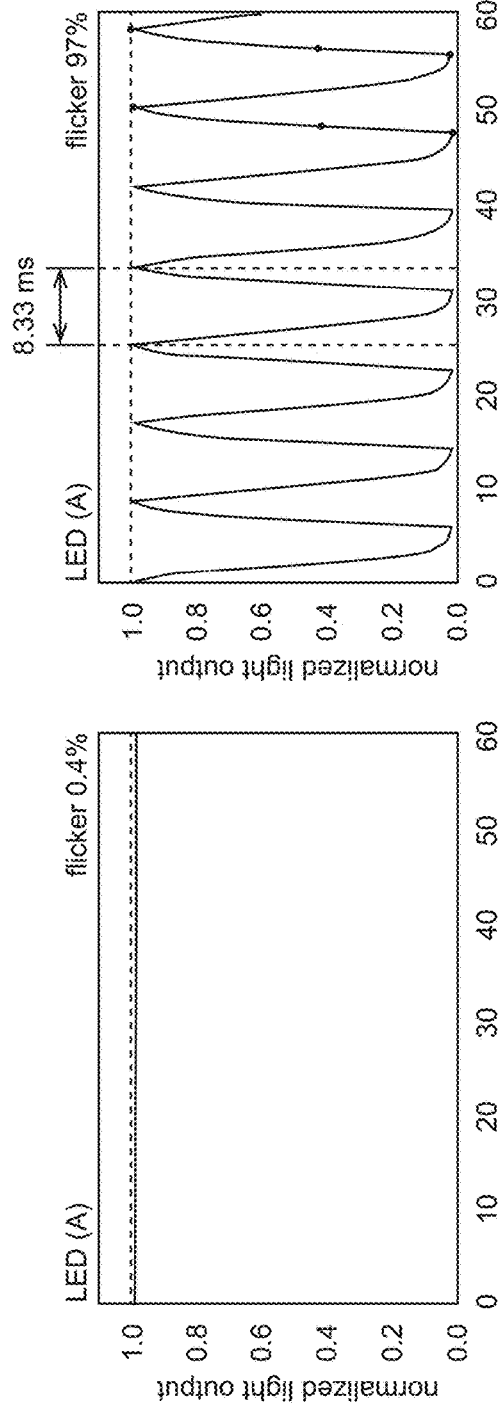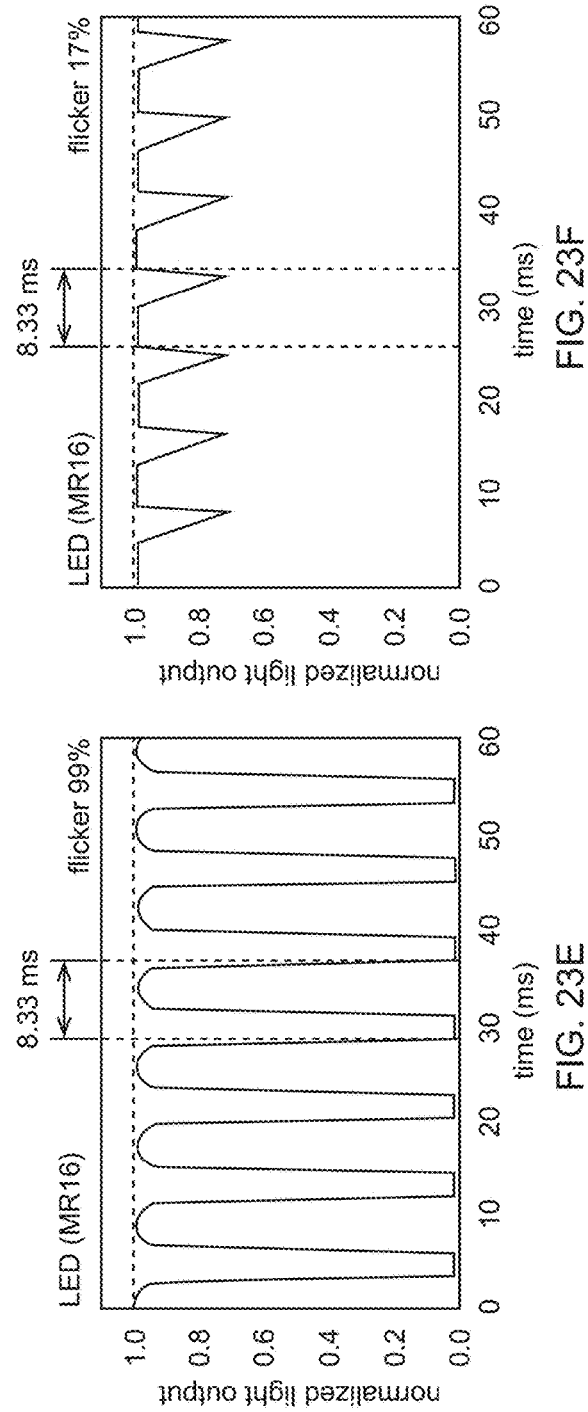

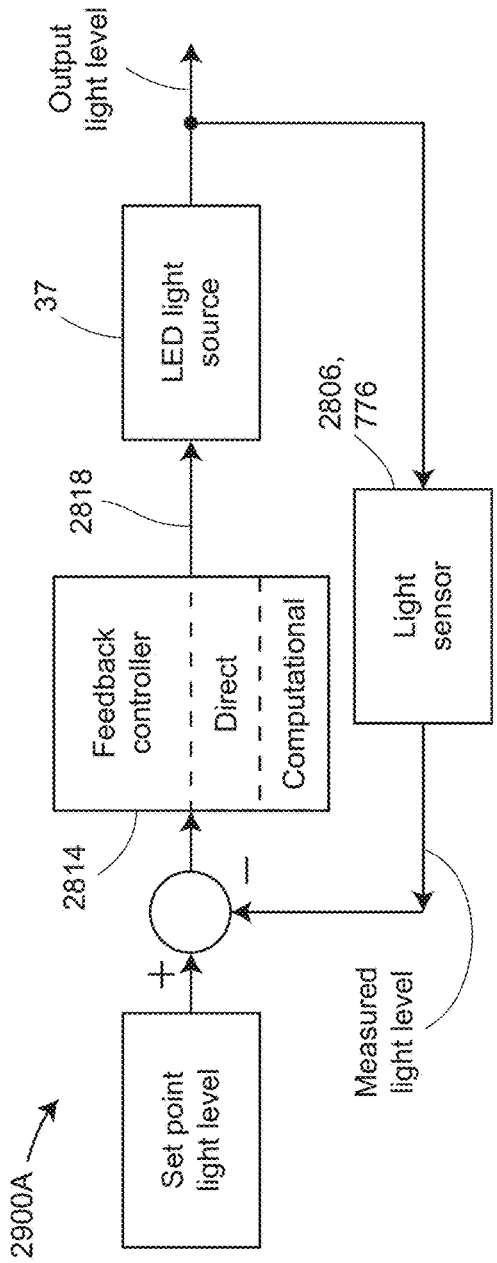
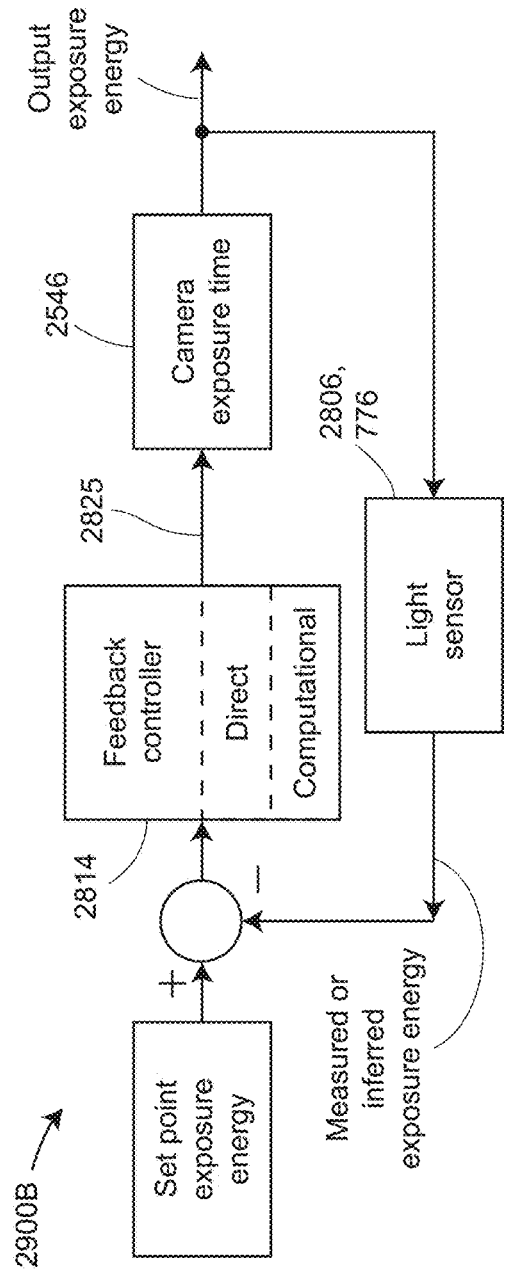

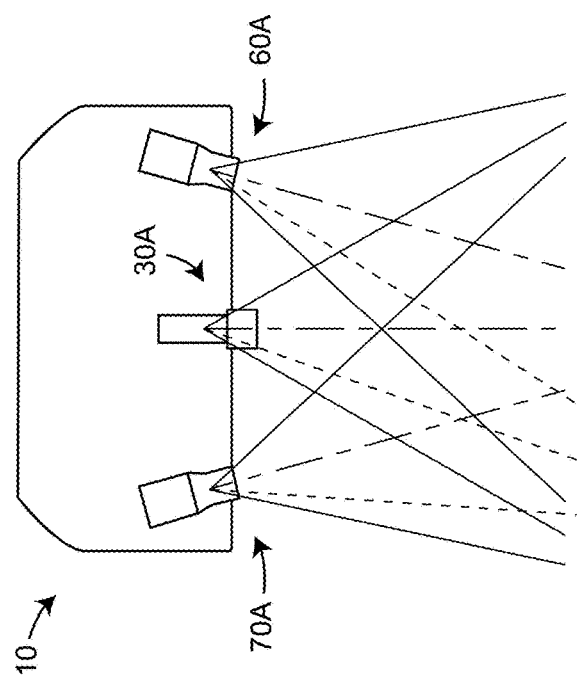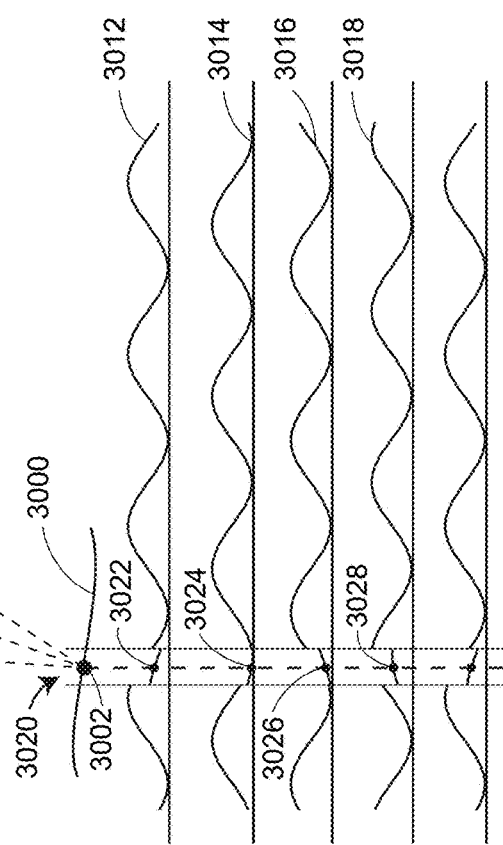
FIG. 30A

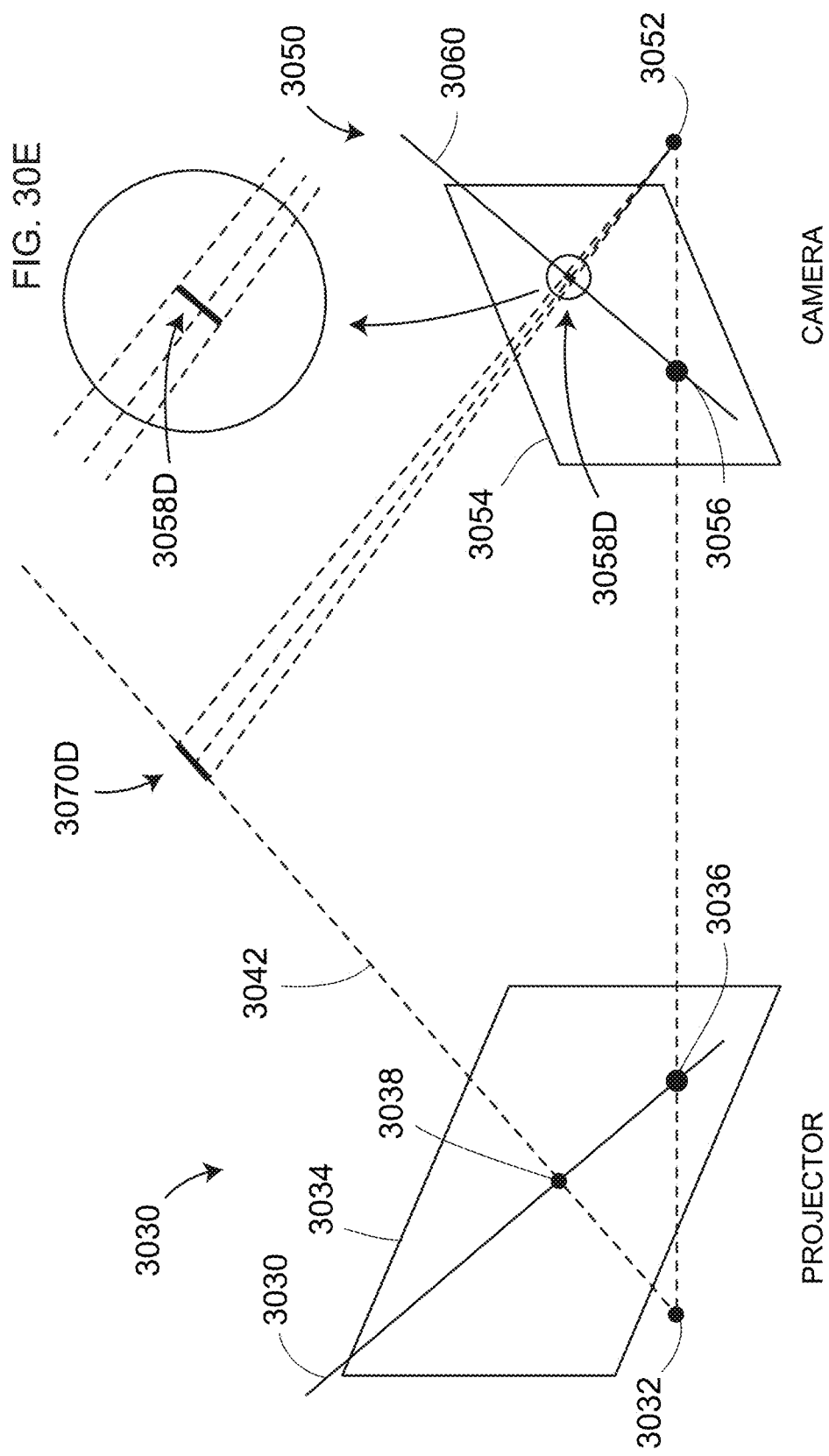

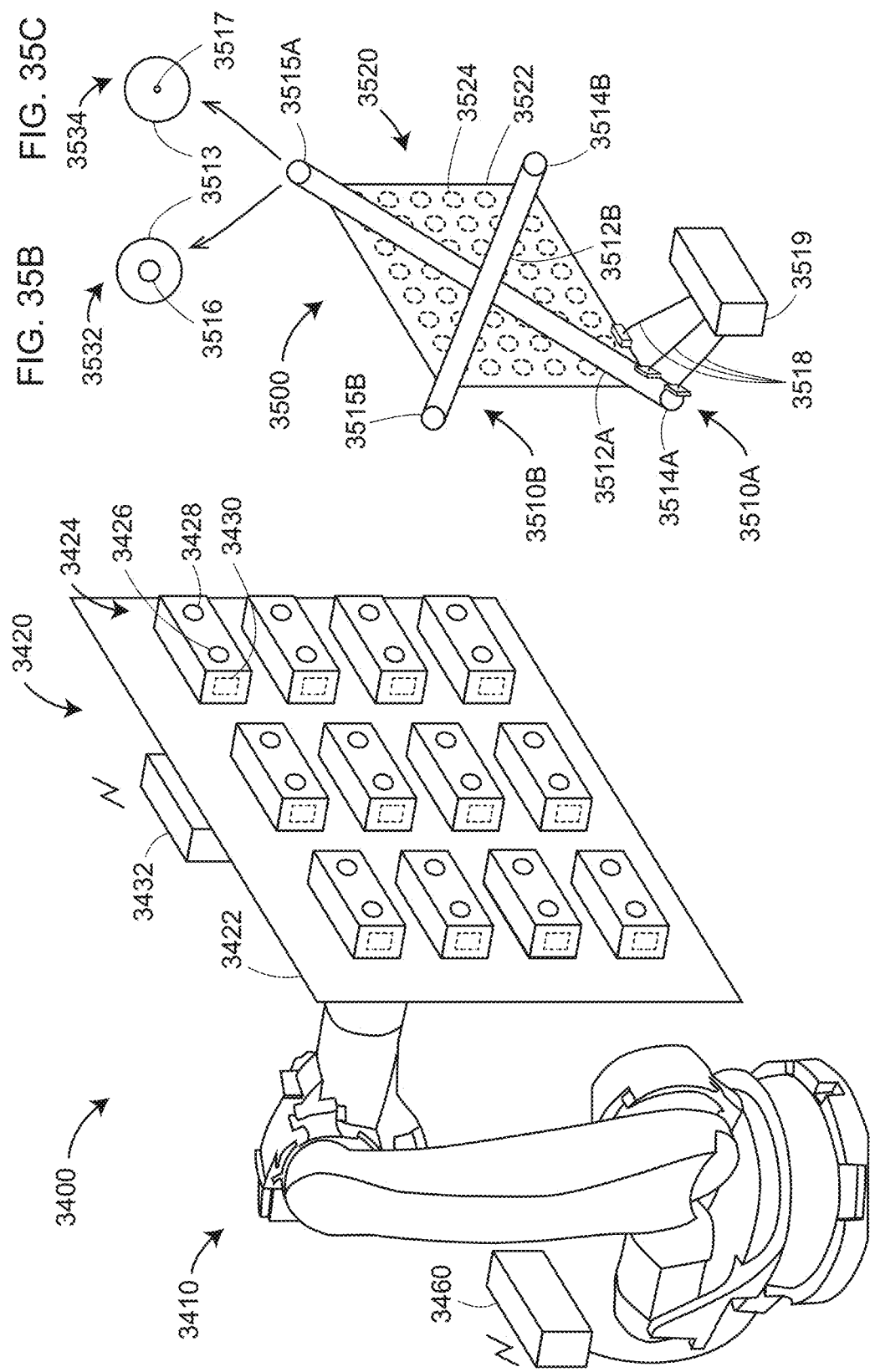

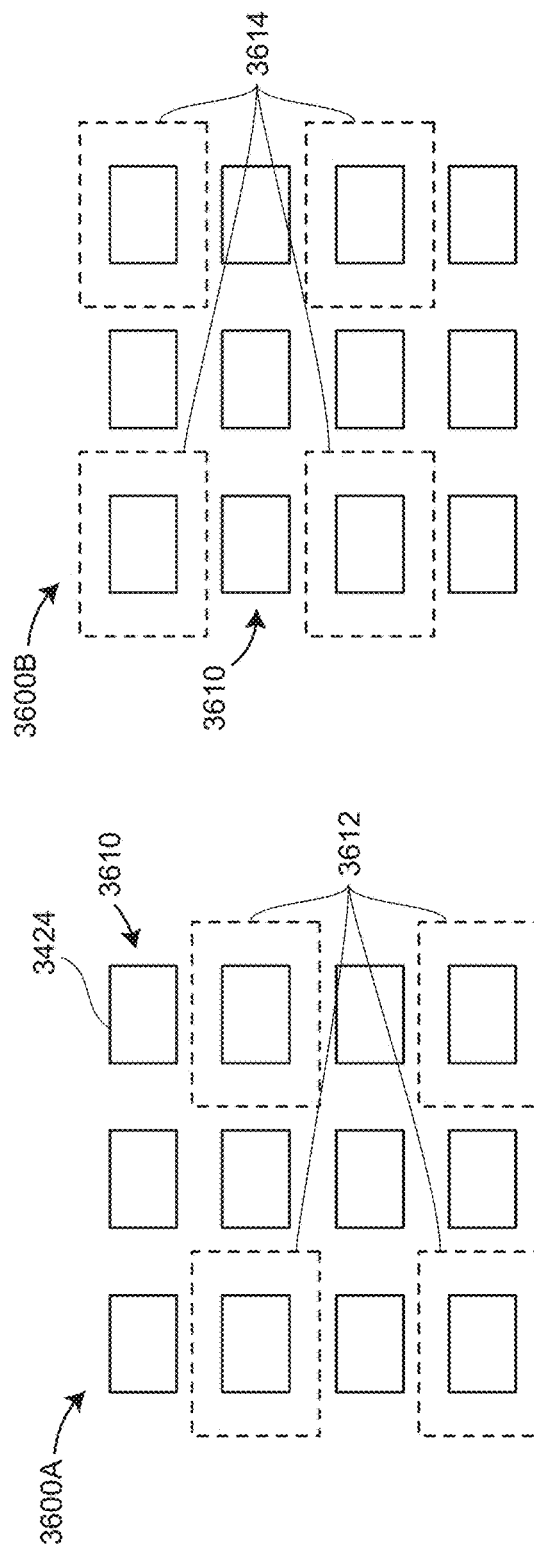
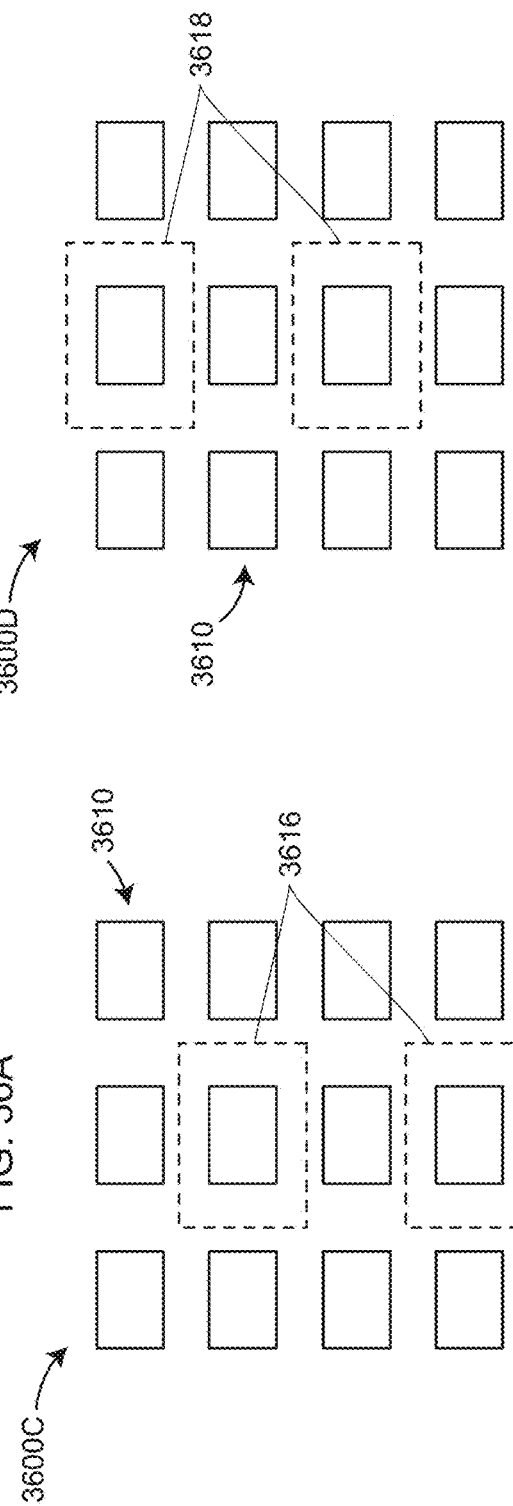
FIG. 36A
FIG. 36B
FIG. 36C
FIG. 36D

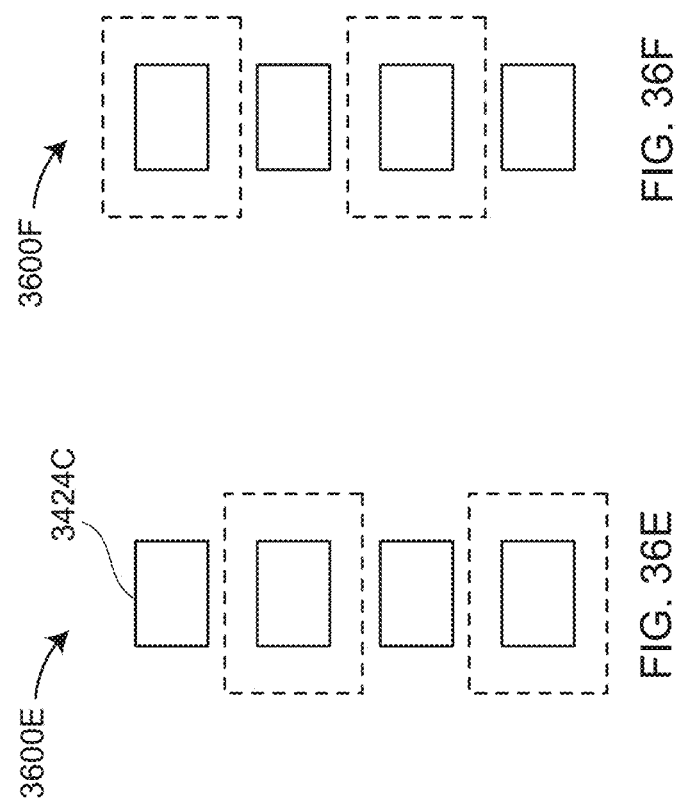

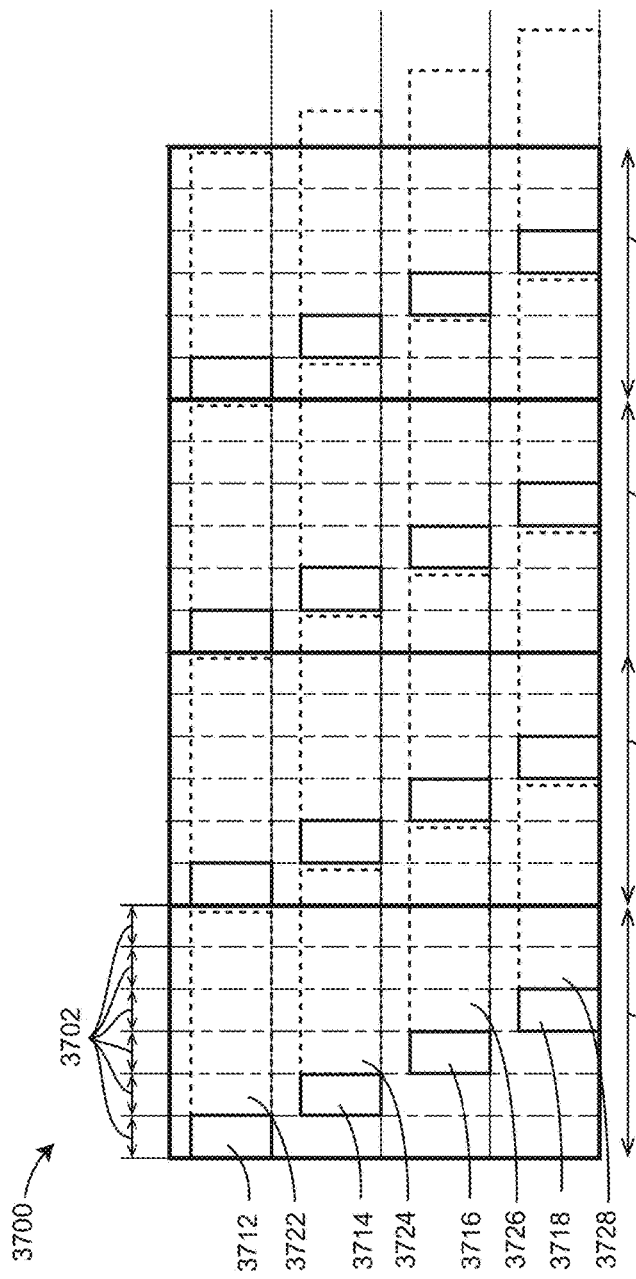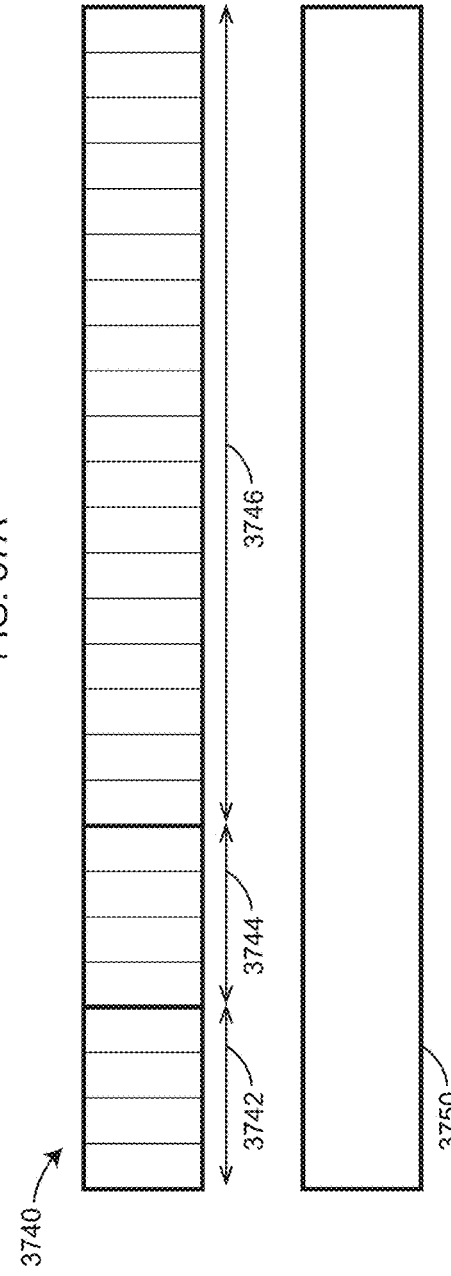
FIG. 37A
FIG. 37B

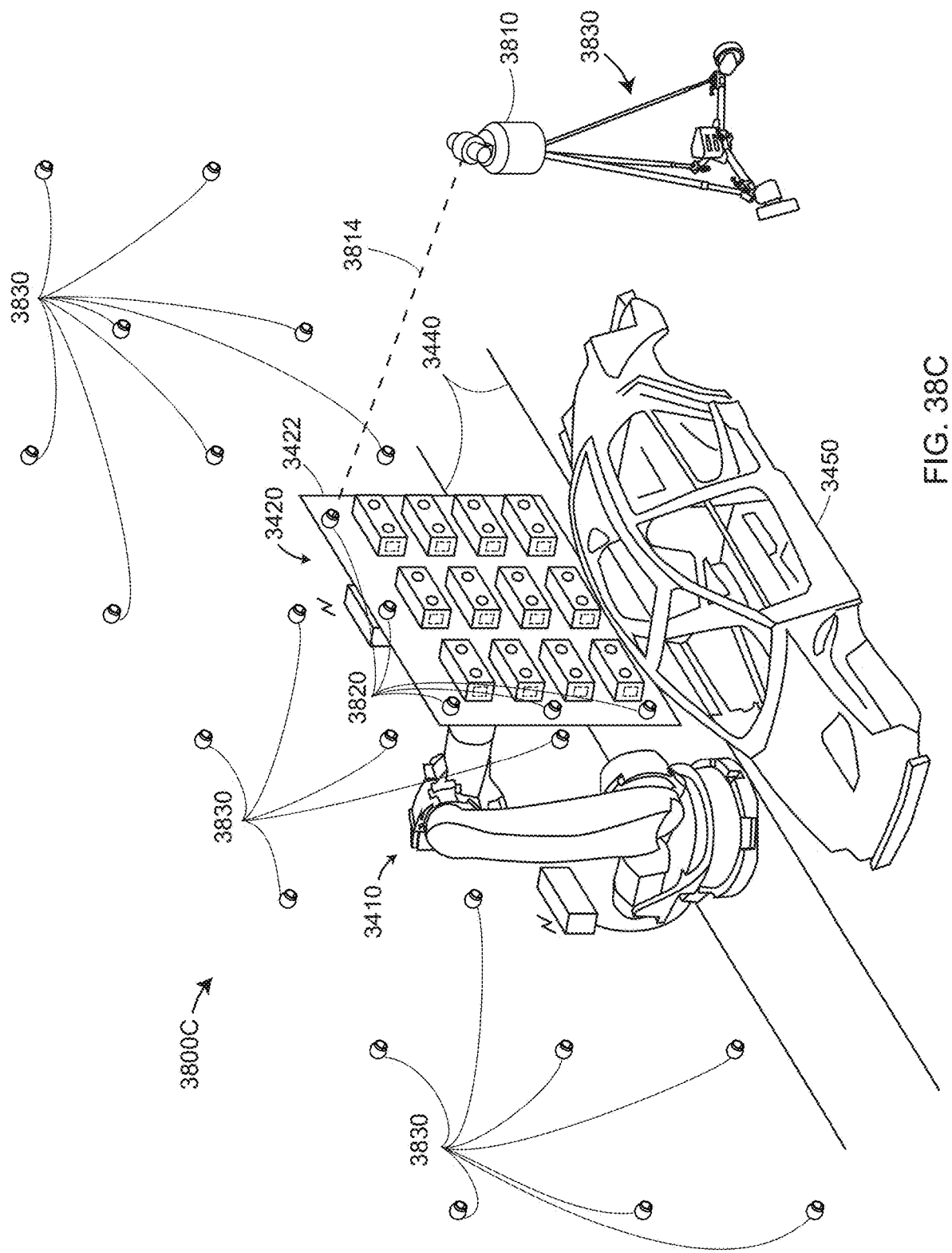

Calibrate Imager Array

Import configuration

Options
- First row: 1
- Units: mm
- Coordinate Format: Cartes

Separators
- Column: ;
- Decimal: .

Feature name

Position
[-110.245mm;-29.772mm;-489.374mm]
[86.338mm;11.171mm;-489.210mm]
[-206.214mm;-25.148mm;-491.177mm]
[20.469mm;-5.563mm;-488.780mm]
[213.185mm;-5.-46mm;-486.802mm]
[158.828mm;-29.650mm;-685.604mm]

Feature name

<< Previous    Next >>    Cancel    Help

FIG. 45

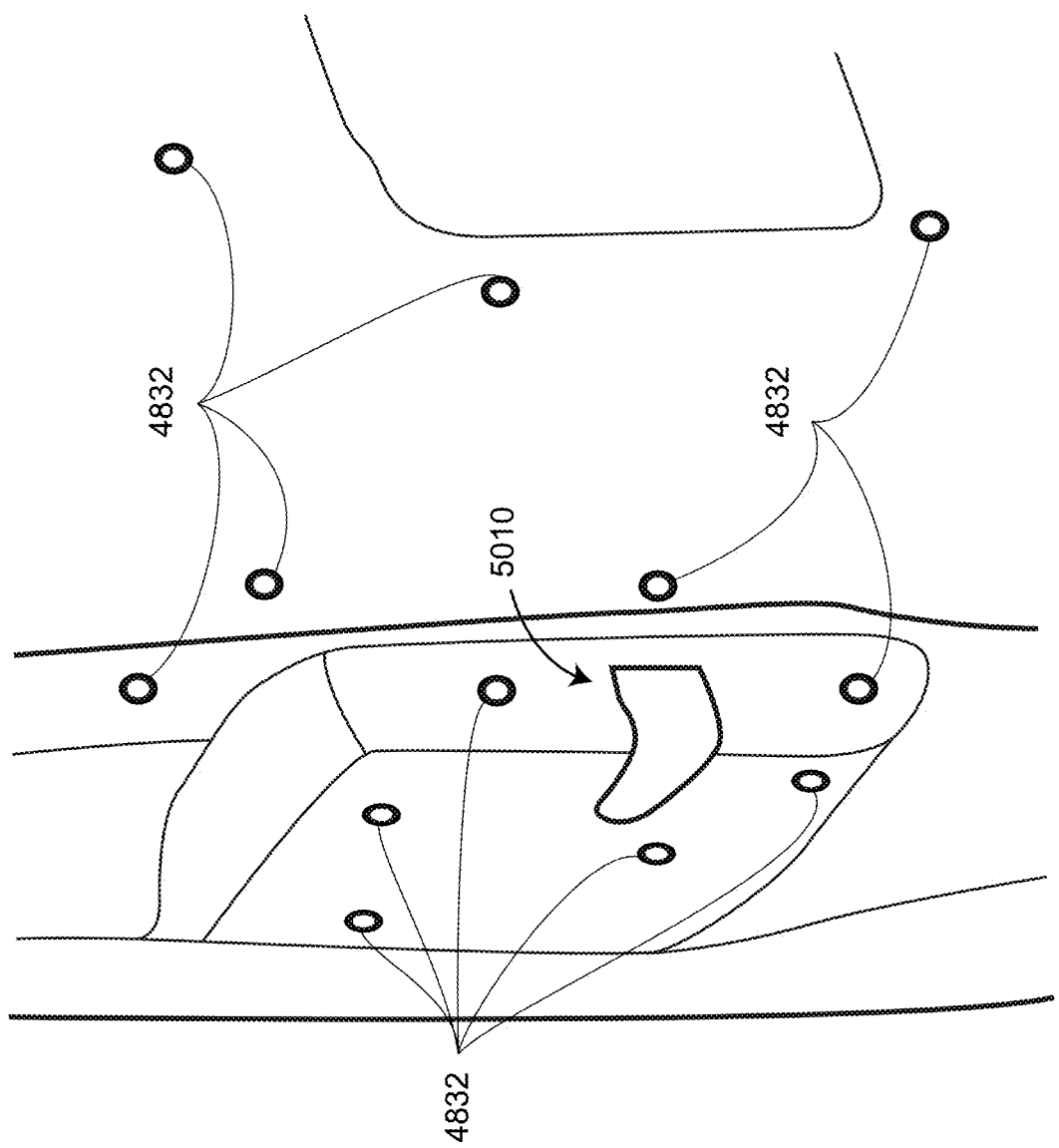

THREE-DIMENSIONAL IMAGER

CROSS REFERENCE TO RELATED APPLICATIONS

The present application is a Continuation application of U.S. application Ser. No. 15/457,045 filed on Mar. 13, 2017, which is a Continuation-In-Part application of U.S. Nonprovisional application Ser. No. 15/233,415 filed on Aug. 10, 2016. Application Ser. No. 15/233,415 is a nonprovisional application of U.S. Provisional Application Ser. No. 62/207,047 filed Aug. 19, 2015, a Nonprovisional application of U.S. Provisional Application Ser. No. 62/272,442 filed Dec. 29, 2015, a Nonprovisional application of U.S. Provisional Application Ser. No. 62/272,451 filed on Dec. 29, 2015, a Nonprovisional application of U.S. Provisional Application Ser. No. 62/272,461 filed Dec. 29, 2015, a Nonprovisional application of U.S. Provisional Application Ser. No. 62/272,469 filed on Dec. 29, 2015, a Nonprovisional application of U.S. Provisional Application Ser. No. 62/276,319 filed on Jan. 8, 2016, a Nonprovisional application of U.S. Provisional Application Ser. No. 62/276,325 filed on Jan. 8, 2016, a Nonprovisional application of U.S. Provisional Application Ser. No. 62/276,329 filed on Jan. 8, 2016, and a Nonprovisional application of U.S. Provisional Application Ser. No. 62/309,024 filed Mar. 16, 2016. The contents of all of which are incorporated herein by reference in their entirety.

FIELD OF THE INVENTION

The subject matter disclosed herein relates in general to a triangulation-type, three-dimensional (3D) imager device, also known as a triangulation scanner.

BACKGROUND OF THE INVENTION

A 3D imager uses a triangulation method to measure the 3D coordinates of points on an object. The 3D imager usually includes a projector that projects onto a surface of the object either a pattern of light in a line or a pattern of light covering an area. A camera is coupled to the projector in a fixed relationship, for example, by attaching a camera and the projector to a common frame. The light emitted from the projector is reflected off of the object surface and detected by the camera. Since the camera and projector are arranged in a fixed relationship, the distance to the object may be determined using trigonometric principles. Compared to coordinate measurement devices that use tactile probes, triangulation systems provide advantages in quickly acquiring coordinate data over a large area. As used herein, the resulting collection of 3D coordinate values or data points of the object being measured by the triangulation system is referred to as point cloud data or simply a point cloud.

There are a number of areas in which existing triangulation scanners may be improved, including improved thermal stability and cooling, improved geometries for detecting problems or automatically correcting scanner compensation parameters, improved rejection of background lighting, reduced effect of cooling fan vibration, optimized illumination projection levels, improved ways to measure relatively large objects with relatively high accuracy and high resolution in a relatively short time, improved methods of registering an array of 3D imagers, and a structure configured to simplify proper alignment of 3D imagers to a part-under-test.

Accordingly, while existing triangulation-based 3D imager devices that use photogrammetry methods are suitable for their intended purpose, the need for improvement remains.

BRIEF DESCRIPTION OF THE INVENTION

According to an embodiment of the present invention, a three-dimensional (3D) measuring system is provided. The system comprising: a master part including a first base part selected from a plurality of base parts, there being at least three fiducial markers affixed to the first base part; a first part-under-test including a second base part selected from the plurality of base parts; a photogrammetry camera configured to image the master part, including the at least three fiducial markers, from a plurality of photogrammetry camera positions to obtain a corresponding plurality of photogrammetry two-dimensional (2D) images; a first 3D imager having a first projector and a first camera, the first 3D imager configured to determine 3D coordinates in a first imager frame of reference; a second 3D imager having a second projector and a second camera, the second 3D imager configured to determine 3D coordinates in a second imager frame of reference, wherein the system is configured to determine in a system frame of reference a first pose of the first 3D imager and a second pose of the second 3D imager based at least in part on the plurality of photogrammetry 2D images, determined 3D coordinates of at least three fiducial markers from among the at least three fiducial markers in the first imager frame of reference, and determined 3D coordinates of at least three fiducial markers from among the at least three fiducial markers in the second imager frame of reference, and wherein the system is further configured to determine 3D coordinates of the first part-under-test in the system frame of reference based at least in part on the determined first pose, the determined second pose, determined 3D coordinates of the first part-under-test by the first 3D imager in the first imager frame of reference, and determined 3D coordinates of the first part-under-test by the second 3D imager in the second imager frame of reference.

According to an embodiment of the present invention, a method is provided. The method comprising: providing a master part, a first part-under-test, a photogrammetry camera, a first three-dimensional (3D) imager, and a second 3D imager, the master part including a first base part selected from a plurality of base parts, there being at least three fiducial markers affixed to the first base part, the first part-under-test including a second base part selected from the plurality of base parts, the first 3D imager having a first projector, a first camera, and a first frame of reference, the second 3D imager having a second projector, a second camera, and a second frame of reference; imaging the master part, including the at least three fiducial markers, with the photogrammetry camera from a plurality of photogrammetry camera positions to obtain a corresponding plurality of photogrammetry two-dimensional (2D) images; determining with the first 3D imager 3D coordinates of the at least three fiducial markers in the first frame of reference; determining with the second 3D imager 3D coordinates of the at least three fiducial markers in the second frame of reference; determining in a system frame of reference a first pose of the first 3D imager and a second pose of the second 3D imager based at least in part on the plurality of photogrammetry 2D images, the determined 3D coordinates of at least three fiducial markers from among the at least three fiducial markers in the first frame of reference, and the determined 3D coordinates of at least three fiducial markers from among the at least three fiducial markers in the second frame of reference; determining with the first 3D imager first 3D coordinates of the first part-under-test in the first frame of reference; determining with the second 3D imager second 3D coordinates of the first part-under-test in the second frame of reference; determining 3D coordinates of the first part-under-test in the system frame of reference based at least in part on the determined first pose, the determined second pose, the determined first 3D coordinates of the first part-under-test in the first imager frame of reference, and the determined second 3D coordinates of the first part-under-test in the second frame of reference; and storing the 3D coordinates of the first part-under-test in the system frame of reference.

According to an embodiment of the present invention, a three-dimensional (3D) measuring system is provided. The system comprising: a master part including a first base part, there being at least three fiducial markers affixed to the first base part; a first part-under-test including a second base part; a photogrammetry camera configured to image the master part, including the at least three fiducial markers, and to obtain a plurality of photogrammetry 2D images; a first 3D imager having a first projector and a first camera, the first 3D imager configured to determine 3D coordinates in a first imager frame of reference; a second 3D imager having a second projector and a second camera, the second 3D imager configured to determine 3D coordinates in a second imager frame of reference; and one or more processors responsive to executable computer instructions, to perform a method comprising: determine first 3D coordinates of at least three fiducial markers from among the at least three fiducial markers in the first imager frame of reference; determine second 3D coordinates of at least three fiducial markers from among the at least three fiducial markers in the second imager frame of reference; determine in a system frame of reference a first pose of the first 3D imager and a second pose of the second 3D imager based at least in part on the plurality of photogrammetry 2D images, the first 3D coordinates and the second 3D coordinates; determine in a system frame of reference a first pose of the first 3D imager and a second pose of the second 3D imager based at least in part on the plurality of photogrammetry 2D images, the first 3D coordinates, and the second; determine a third 3D coordinates of the first part-under-test by the first 3D imager in the first imager frame of reference; determine a fourth 3D coordinates of the first part-under-test by the second 3D imager in the second imager frame of reference; and determine a third 3D coordinates of the first part-under-test in the system frame of reference based at least in part on the determined first pose, the determined second pose, the third 3D coordinates and the fourth 3D coordinates.

These and other advantages and features will become more apparent from the following description taken in conjunction with the drawings.

BRIEF DESCRIPTION OF THE DRAWINGS

The subject matter, which is regarded as the invention, is particularly pointed out and distinctly claimed in the claims at the conclusion of the specification. The foregoing and other features and advantages of the invention are apparent from the following detailed description taken in conjunction with the accompanying drawings in which:

FIGS. 13D and 13E are schematic representations of ray models used for the camera and projector lenses;

FIG. 14A illustrates projection of a coarse sine-wave pattern according to an embodiment;

FIG. 14C illustrates projection of a finer sine-wave pattern according to an embodiment;

FIG. 15 illustrates how phase is determined from a set of shifted sine waves according to an embodiment;

FIG. 18 is a cross-sectional view of a projector lens assembly according to an embodiment;

FIGS. 19A, 19B, and 19C are a perspective view, a top view, and a cross-sectional view of a camera assembly, respectively, according to an embodiment;

FIGS. 20A and 20B are top and perspective views of a first camera lens assembly according to an embodiment;

FIGS. 22A and 22B show an arrangement for obtaining consistent projector lens assemblies by using a golden projector lens assembly according to an embodiment;

FIGS. 22C and 22D show an arrangement for obtaining consistent camera lens assemblies by using a golden camera lens assembly according to an embodiment;

FIGS. 23A and 23B show normalized light output of exemplary incandescent and compact fluorescent lights, respectively;

FIGS. 23C, 23D, 23E, and 23F show normalized light outputs of four exemplary types of light-emitting diode (LED) sources;

FIGS. 29A and 29B show two control systems according to an embodiment;

FIGS. 30A, 30B, 30C, and 30D illustrate a method of optimizing output power of projected light on a pixel-by-pixel basis according to an embodiment;

FIG. 35 is a perspective view of calibration/compensation of a 3D imager by measurement of a reference artifact according to an embodiment;

FIGS. 36A-36D illustrate a sequence of projections of light patterns by four sets of projectors so as to provide overlap of projected light according to an embodiment;

FIGS. 36E-36F illustrate a two-step sequence of patterned light projections for a one-dimensional array of 3D imagers according to an embodiment;

FIG. 37A and FIG. 37B illustrate timing of pattern projector/exposure and data processing according to an embodiment;

FIGS. 38A-C illustrate a 3D measuring device being used to register 3D coordinates obtained from a bank of 3D imagers that are moved by a mover according to an embodiment;

FIGS. 44-46 show UI display screens that enable a user to select fiducial targets, display 3D coordinates of the fiducial targets, and show results of an optimization calculation according to an embodiment;

FIG. 50 is a perspective view of a left edge of the master part showing a door latch assembly and a collection of fiducial targets according to an embodiment;

The detailed description explains embodiments of the invention, together with advantages and features, by way of example with reference to the drawings.

DETAILED DESCRIPTION OF THE INVENTION

Embodiments of the present invention provide advantages in improving thermal stability and cooling and in enabling measurement of large objects with relatively high accuracy and high resolution at relatively high speeds.

Figure 1:
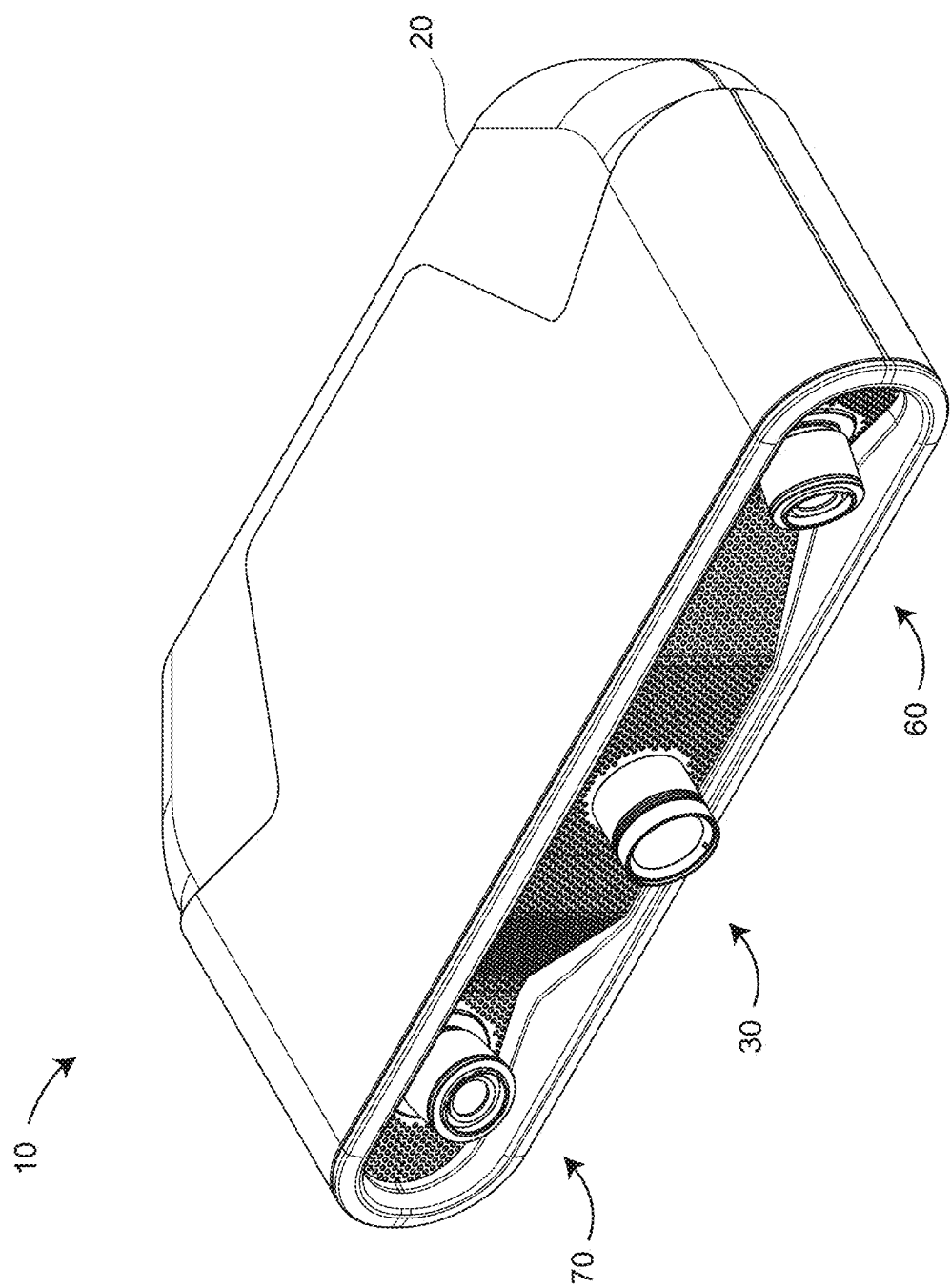
FIG. 1 is a perspective view of a 3D imager according to an embodiment.

FIG. 1 is a perspective view of a 3D imager 10 according to an embodiment. It includes a frame 20, a projector 30, a first camera assembly 60, and a second camera assembly 70.

Figure 2:
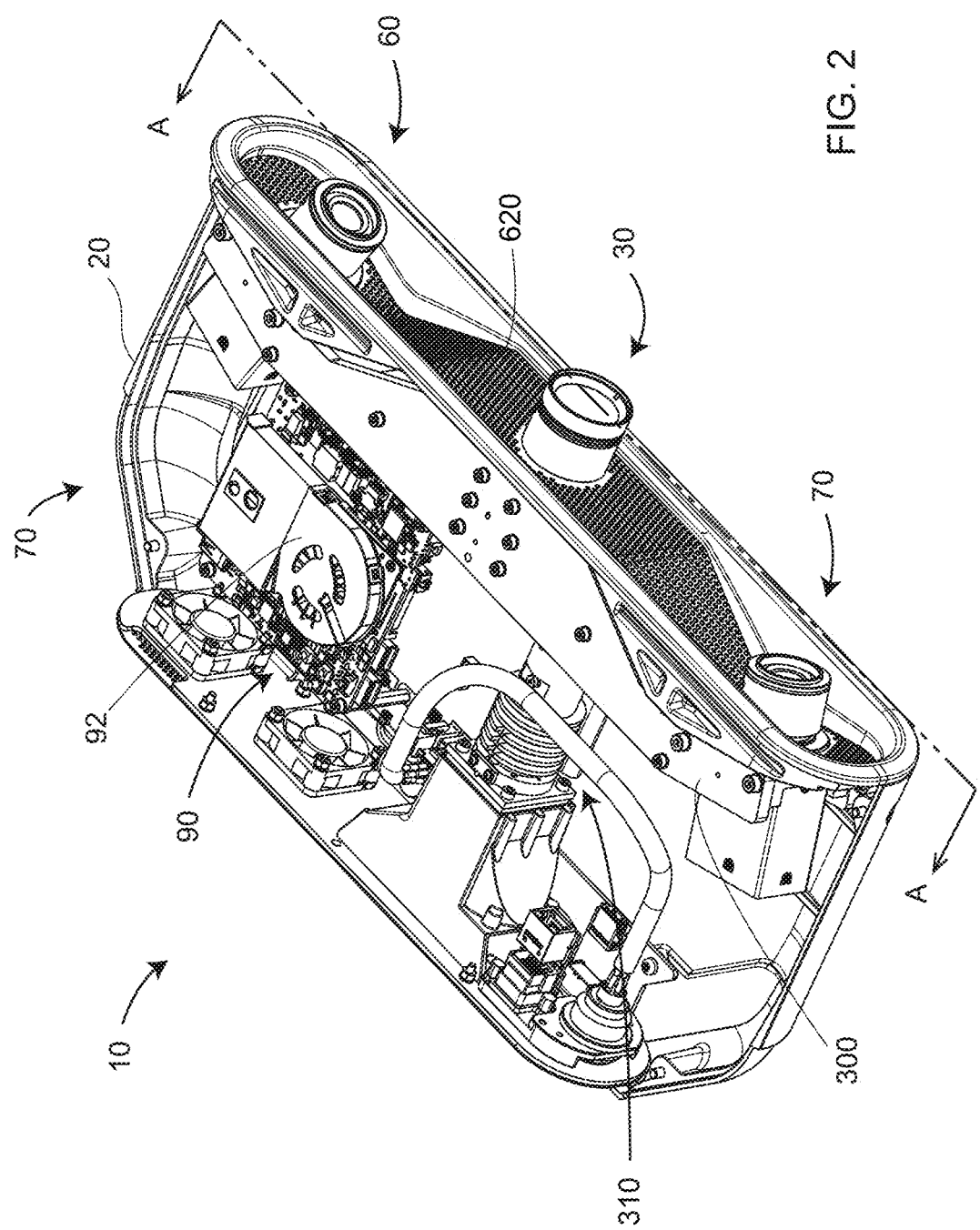
FIG. 2 is a perspective view of internal elements of a 3D imager having its cover removed according to an embodiment.
Figure 3:
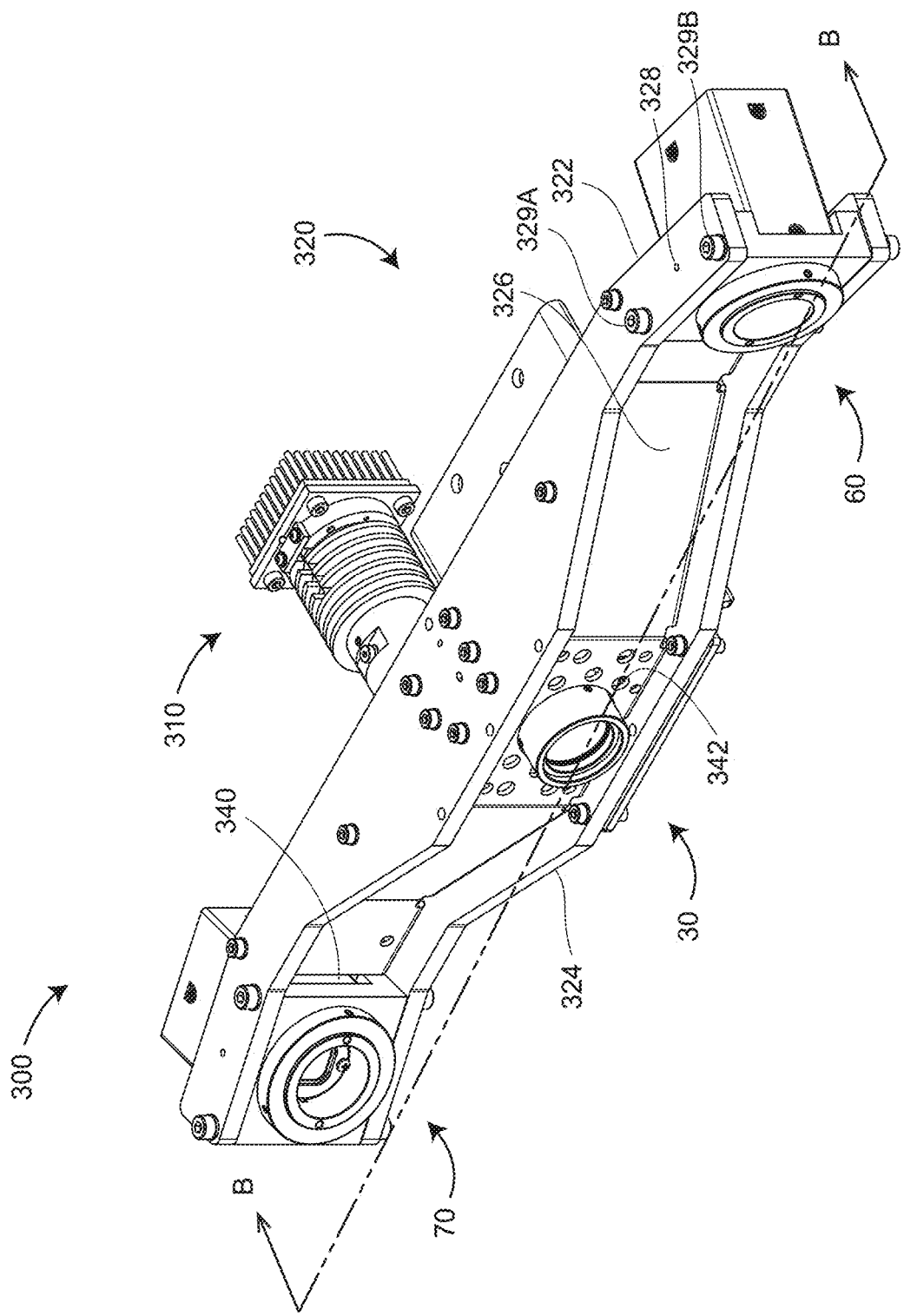
FIG. 3 is a perspective view of a projector-camera assembly of a 3D imager according to an embodiment.

FIG. 2 and FIG. 3 show perspective views of internal elements 70 of the 3D imager 10. Internal elements are enclosed in a lower frame element 20. FIG. 3 shows elements of a projector-camera assembly 300 that includes projector-source assembly 310, projector 30, first camera-lens assembly 60, second camera-lens assembly 70, and support assembly 320. The support assembly 320 includes top structural support 322, bottom structural support 324, and web support 326. In addition, each camera includes mounting pins 328 and screws 329A, 329B.

Figure 4:
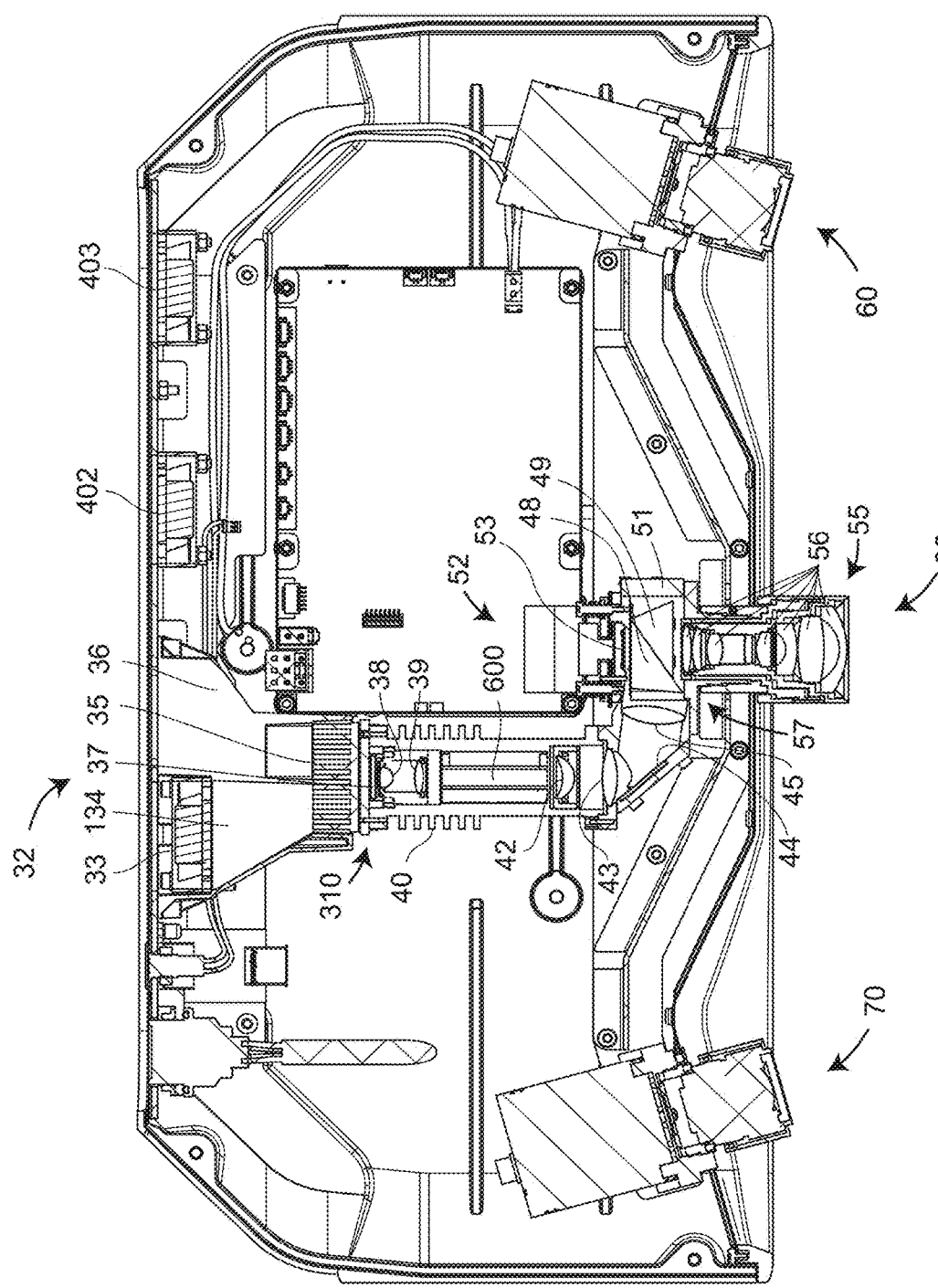
FIG. 4 is a top view of internal elements of a 3D imager having its cover removed according to an embodiment.

FIG. 4 is a top cross-sectional view of the 3D imager from FIG. 2. The projector lens assembly 30 includes a projector lens 55 and a projector lens mount 57. Projector lens 55 includes projector lens elements 56.

Figure 5A:
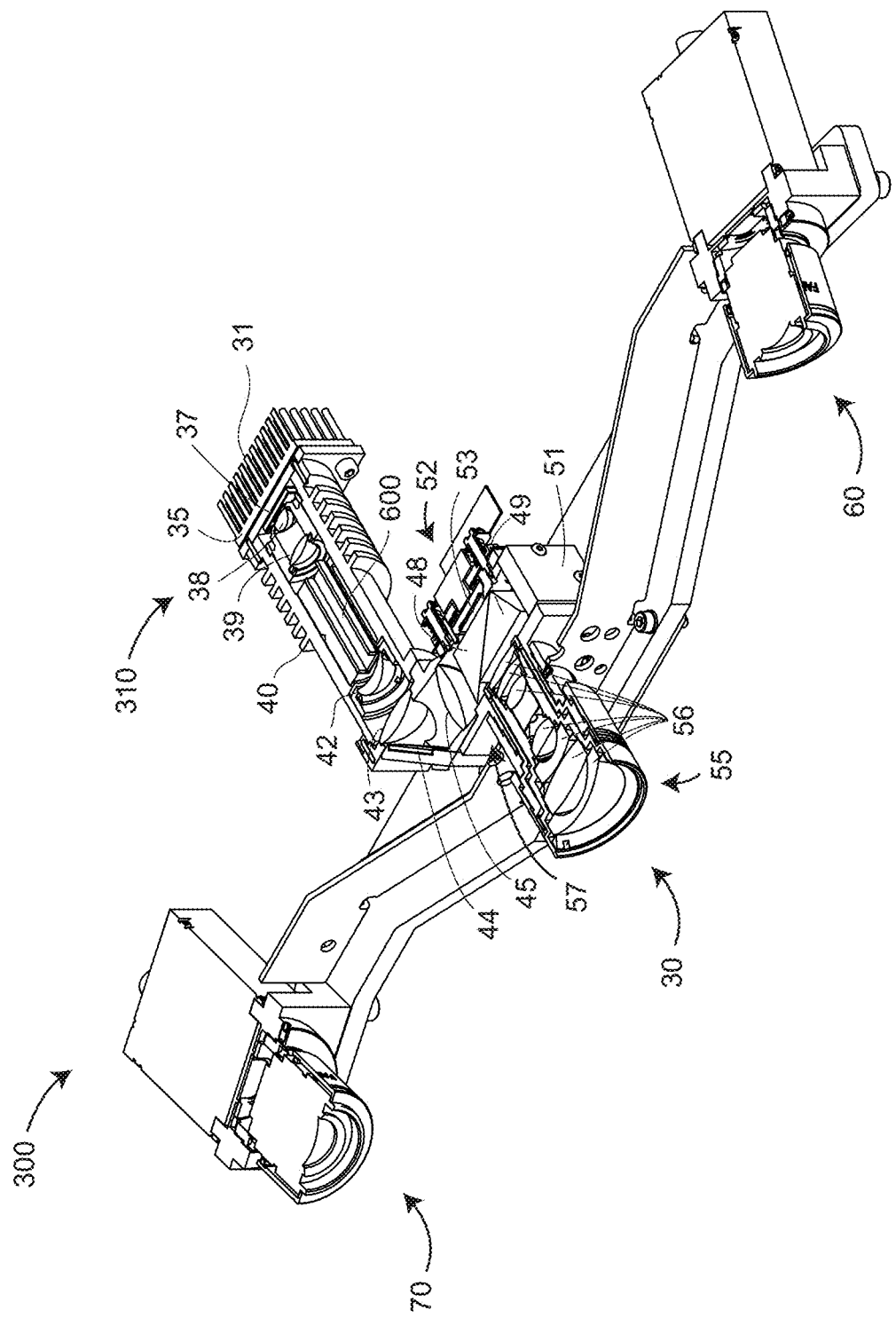
FIG. 5A is a cross sectional view of the projector-camera assembly according to an embodiment.
Figure 5B:
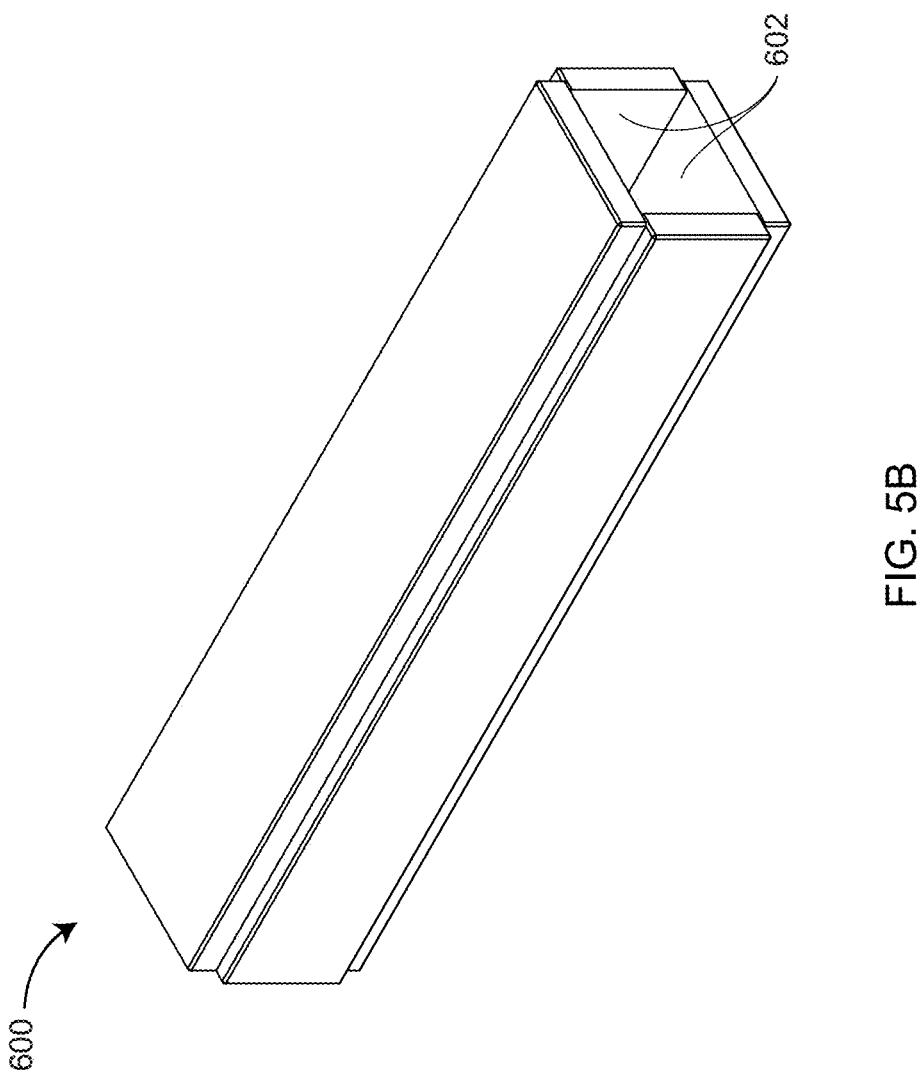
FIG. 5B is a perspective view of a light pipe according to an embodiment.

FIG. 5A, which is a cross-sectional view from FIG. 3, shows additional details of projector-source assembly 310 and pattern-projection assembly 52. In an embodiment, the projector-source assembly 310 includes light source 37, condensing lens elements 38, 39, light pipe 600, lenses 42, 43, 44, and mirror 44. In an embodiment, the light source 37 is an LED. The condensing lenses 38, 39 funnel light into the light pipe 600, which is shown in more detail in FIG. 5B. The light type reflects rays of light off reflective surfaces 602 in the light pipe 600. The purpose of the light pipe is to improve the homogeneity of the light from the condenser lenses 38, 39. Light passes through lenses 42 and 43 before reflecting off mirror 44 and passing through lens 45 into the pattern-projection assembly 52.

The pattern-projection assembly 52 includes a first prism 48, a second prism 49, and a digital micromirror device (DMD) 53. Together, the first prism 48 and second prism 49 comprise a total-internal-reflection (TIR) beam combiner. Light from lens 45 strikes an air interface between the first prism 48 and second prism 49. Because of the index of refraction of the glass in the first prism 48 and the angle of the first air interface relative to the light arriving from the lens 45, the light totally reflects toward the DMD 53. In the reverse direction, light reflected off the DMD 53 does not experience TIR and passes either out of the projector lens assembly 30 or onto a beam block 51. In an embodiment, the DMD 53 includes a large number of small micromechanical mirrors that rotate by a small angle of 10 to 12 degrees in either of two directions. In one direction, the light passes out of the projector 30. In the other direction, the light passes onto the beam block 51. Each mirror is toggled very quickly in such a way as to enable reflection of many shades of gray, from white to black. In an embodiment, the DMD chip produces 1024 shades of gray.

Figure 6B:
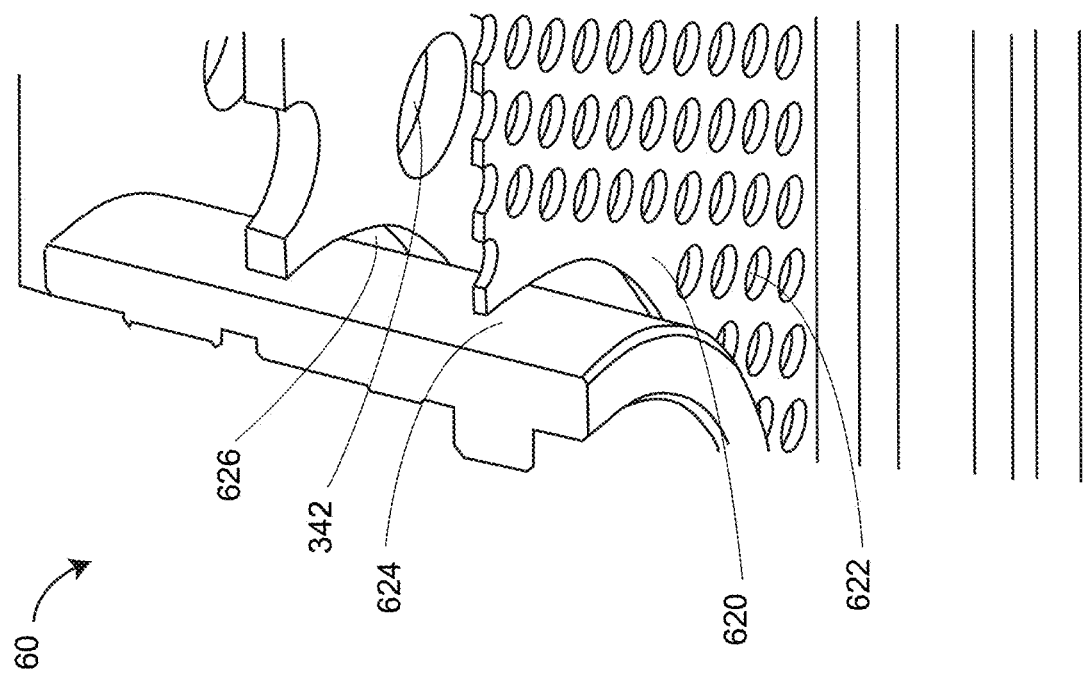
FIG. 6B is a partial perspective view of cooling vents surrounding a camera lens assembly according to an embodiment.
Figure 6A:
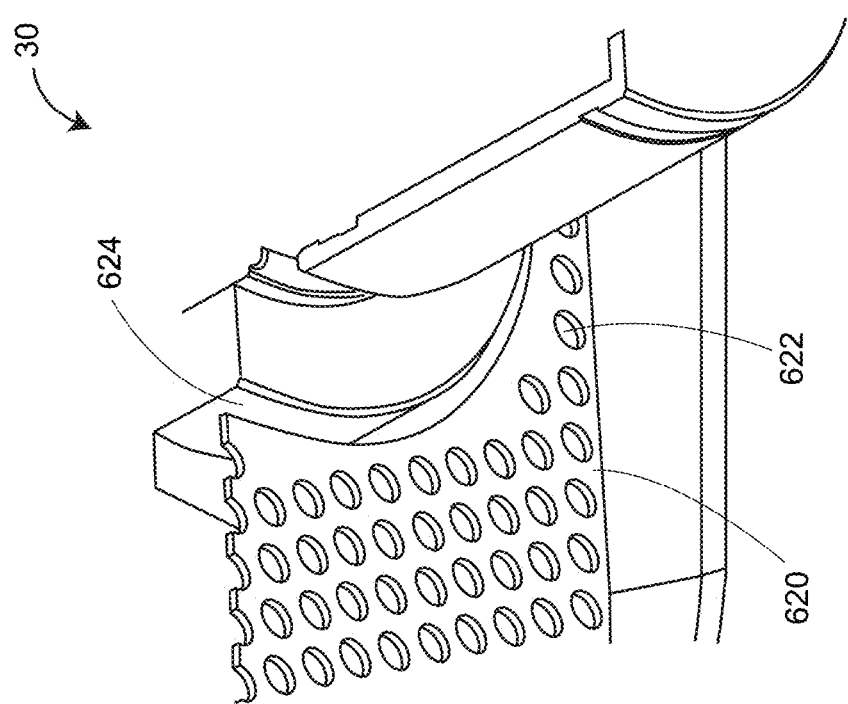
FIG. 6A is a partial perspective view of cooling vents surrounding a projector lens assembly according to an embodiment.
Figure 6C:
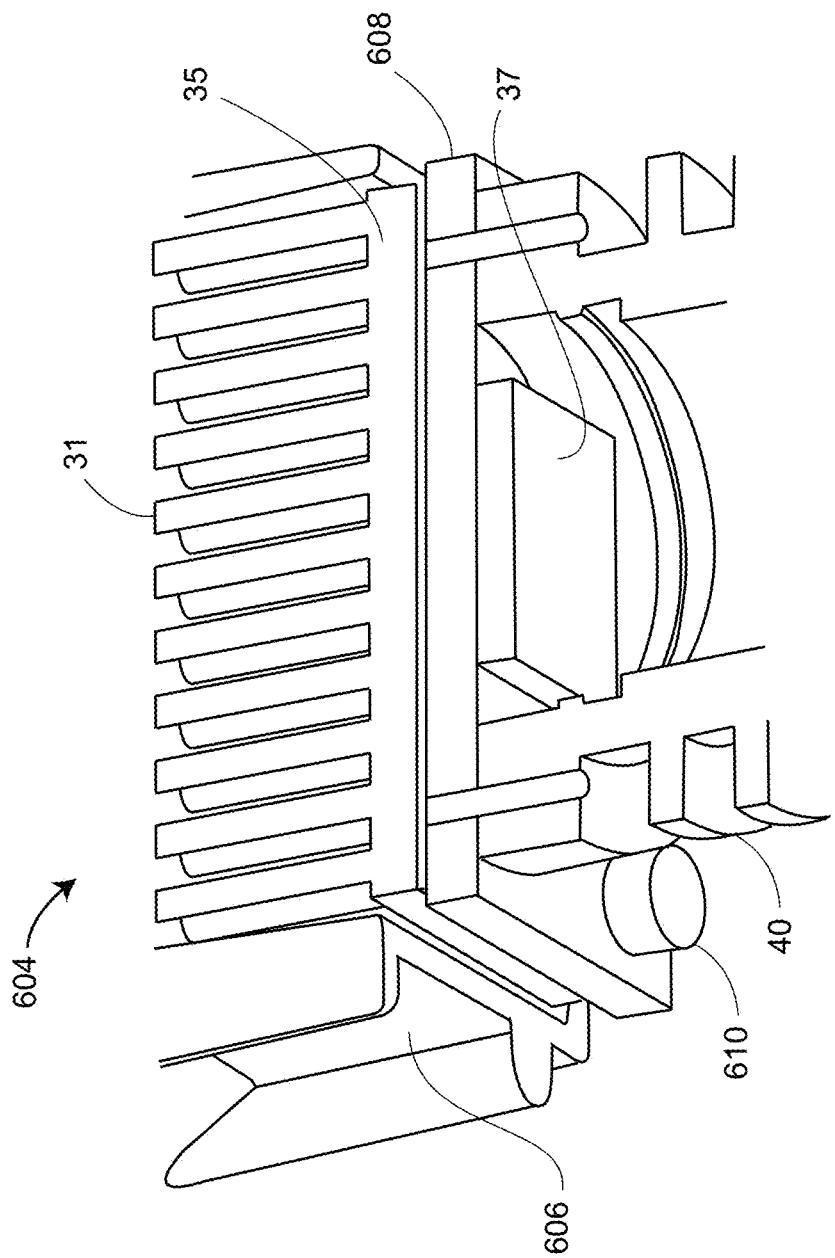
FIG. 6C is a partial perspective view of projector source cooling elements according to an embodiment.

The light source assembly 37 is cooled by projector cooling system 32 shown in FIG. 4. The projector cooling system 32 includes fan 33, chambers 134, 36, and heat sinks 35, 40. In an embodiment, the heat sink 35 includes projections 31 having intervening air spaces, as shown in FIGS. 5A and 6C. In an embodiment, the fan 33 pushes air through chamber 134, through the air spaces separating the projections 31, into the chamber 36, and out the 3D imager 10 through a filtered exit in the frame 20. In this way, relatively cool outside air is forced past the heat sink projections 31, thereby removing heat generated by the light source 37 and stabilizing the temperature of the light source 37. In an embodiment illustrated in partial perspective view 604 in FIG. 6C, the light source 37 is an LED chip mounted to a heat sink element 608 that is in contact with the heat sink 31 and heat sink 40. The heat sink 31 may be in contact with a surrounding heat sink 606. In an embodiment, a temperature sensor 610 is attached to the heat sink 608 to enable monitoring of the LED temperature.

Elements within the frame 20 are cooled by fans 402 and 403 shown in FIG. 4. The fans 402 and 403 pull air out of the cavity, first through holes 622 and openings 624 in a grill vent 620 surrounding the projector 30, the first camera assembly 60, and the second camera assembly 70. The air is pulled through additional openings and holes in the projector-camera assembly 300 such as the opening 340 and the web holes 342 shown in FIG. 3 and the opening 626 shown in FIG. 6B. The air drawn out of the frame 20 by the fans 402 and 403 provides cooling for the projector 30 and the camera assemblies 60, 70, as well as the heat sink 40 and other elements internal to the frame 20. As shown in FIG. 2, in an embodiment further cooling is provided for a circuit board 90 by a fan 92 that pumps heat from the circuit board out of the frame 20 through a dedicated duct.

Figure 7:
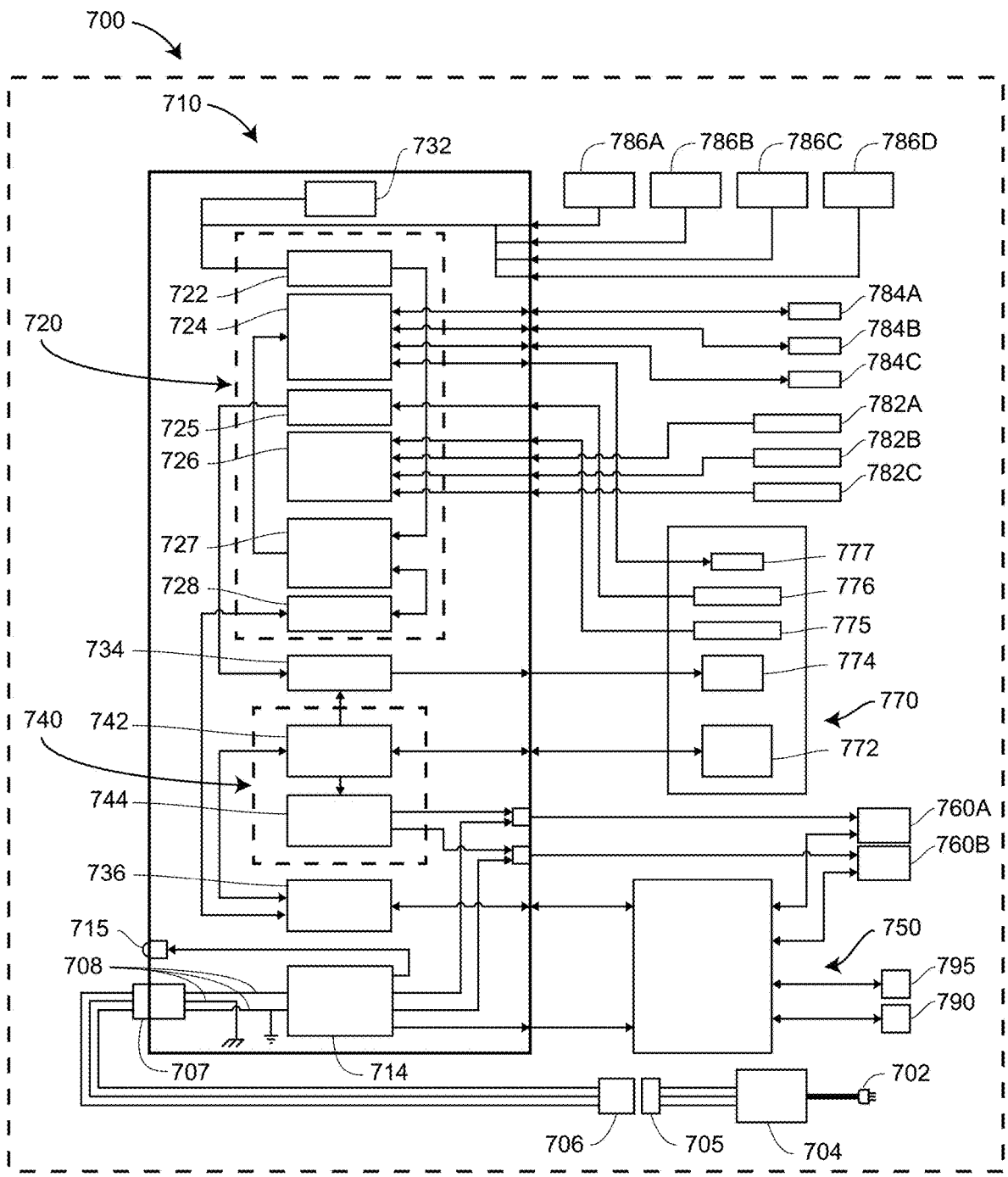
FIG. 7 is a block diagram of electrical components of a 3D imager according to an embodiment.

In an embodiment, the 3D imager includes internal electrical system 700 shown in FIG. 7. Internal electrical system 700 includes a Peripheral Component Interface (PCI) board 710, projector electronics 770, a processor board 750, and a collection of additional components discussed herein below. In an embodiment, the PCI board 710 includes a microcontroller integrated circuit 720, DMD controller chip 740, LED driver chip 734, an inertial measurement unit (IMU) chip 732, a Universal Serial Bus (USB) hub 736, and a power conversion component 714.

In an embodiment, the microcontroller integrated circuit 720 is a Programmable System-on-Chip (PSoC) by Cypress Semiconductor. The PSoC includes a central processing unit (CPU) core and mixed-signal arrays of configurable integrated analog and digital peripheral functions. In an embodiment, the microcontroller integrated circuit 720 is configured to serve as (1) a controller 724 for the fans 784A, 784B, and 784C, corresponding to fans 33, 402, and 403 in FIG. 4; (2) a controller for the LED driver chip 736; (3) an interface 726 for thermistor temperature sensors 782A, 782B, and 782C; (4) an inter-integrated circuit ($I^2C$) interface 722; (5) an ARM microcontroller 727; and (6) a USB interface 728. The $I^2C$ interface 722 receives signals from the IMU chip 732 and $I^2C$ temperature sensors 786A, 786B, 786C, and 786D. It sends signals to an ARM microcontroller 727, which in turn sends signals to the fan controller 724. The DMD controller chip 740 sends high speed electrical pattern sequences to a DMD chip 772. It also sends output trigger signals to electronics 760A and 760B of the first camera assembly 60 and the second camera assembly 70, respectively. In an embodiment, the IMU includes a three-axis accelerometer and a three-axis gyroscope. In other embodiments, the IMU further includes an attitude sensor such as a magnetometer and an altitude sensor such as a barometer.

The projector electronics 770 includes fan electronics 777, projector photodiode 776, projector thermistor electronics 775, light source electronics 774, and DMD chip 772. In an embodiment, fan electronics 777 provides an electrical signal to influence the speed of the projector fan 33. The projector photodiode 776 measures an amount of optical power received by the DMD chip 772. The projector thermistor electronics 775 receives a signal from a thermistor temperature sensor such as the sensor 610 in FIG. 6C. The sensor 610 may provide a control signal in response. The light source electronics 774 may drive an LED chip 37. In an embodiment, the DMD is a DLP4500 device from Texas Instruments. This device includes 912×1140 micromirrors.

In an embodiment, the processor board 750 is a Next Unit of Computing (NUC) small form factor PC by Intel. In an embodiment, the processor board 750 is on the circuit board 90, which includes an integrated fan header 92, as shown in FIG. 1. In an embodiment, the processor board 750 communicates with camera assemblies 60 and 70 over electronics 760A, 760B via USB 3.0. The processor board 750 performs phase and triangulation calculations as discussed herein below and sends the results over USB 3.0 to the USB 2.0 hub 736, which shares signals with the DMD controller chip 740 and the USB interface 728. The processor board 750 may perform additional functions such as filtering of data or it may send partly processed data to additional computing elements, as explained herein below with reference to FIG. 8. In an embodiment, the processor board 750 further includes a USB 3.0 jack and an RJ45 jack.

In an embodiment, a DC adapter 704 attached to an AC mains plug 702 provides DC power through a connector pair 705, 706 and a socket 707 to the 3D imager 10. Power enters the frame 20 over the wires 708 and arrives at the power conversion component 714, which down-converts the DC voltages to desired levels and distributes the electrical power to components in the internal electrical system 700. One or more LEDs 715 may be provided to indicate status of the 3D imager 10.

Figure 8:
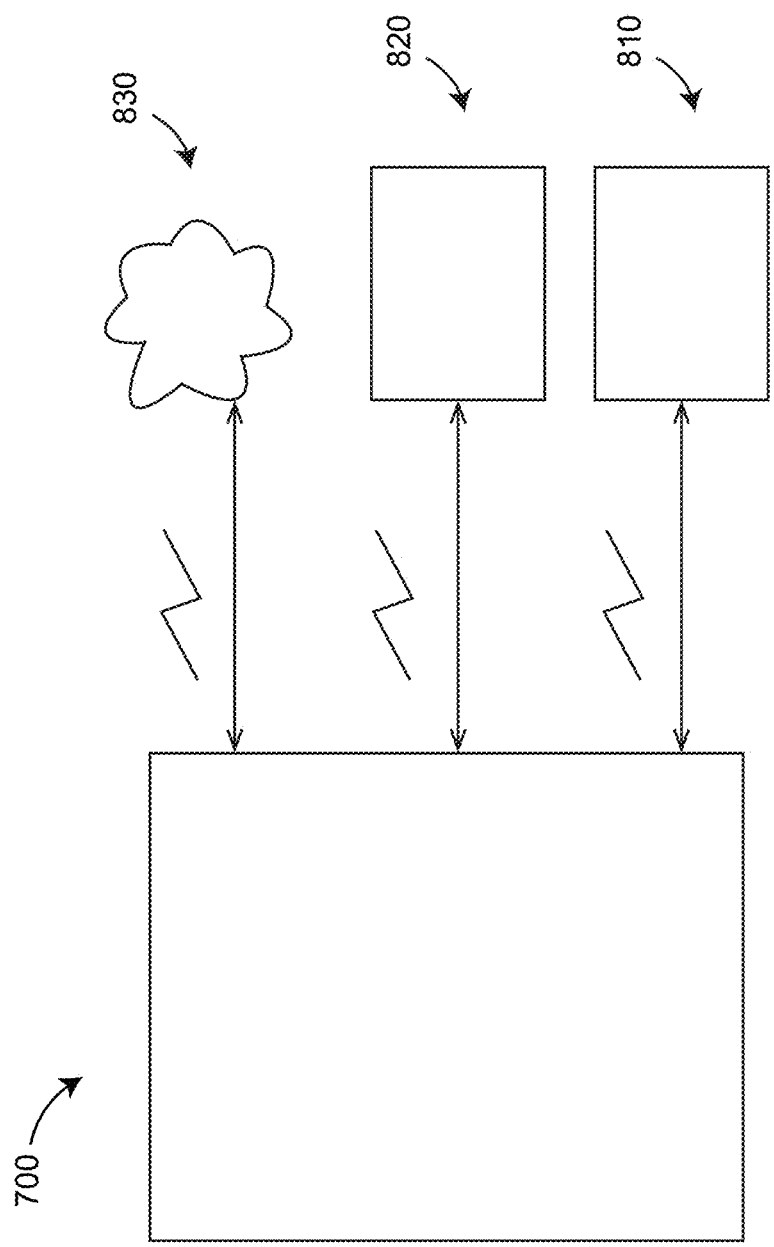
FIG. 8 is a block diagram of a processor system according to an embodiment.

FIG. 8 is a block diagram of a computing system that includes the internal electrical system 700, one or more computing elements 810, 820, and a network of computing elements 830, commonly referred to as the cloud. The cloud may represent any sort of network connection (e.g., the worldwide web or internet). Communication among the computing (processing and memory) components may be wired or wireless. Examples of wireless communication methods include IEEE 802.11 (Wi-Fi), IEEE 802.15.1 (Bluetooth), and cellular communication (e.g., 3G and 4G). Many other types of wireless communication are possible. A popular type of wired communication is IEEE 802.3 (Ethernet). In some cases, multiple external processors, especially processors on the cloud, may be used to process scanned data in parallel, thereby providing faster results, especially where relatively time-consuming registration and filtering may be required.

Figure 9:
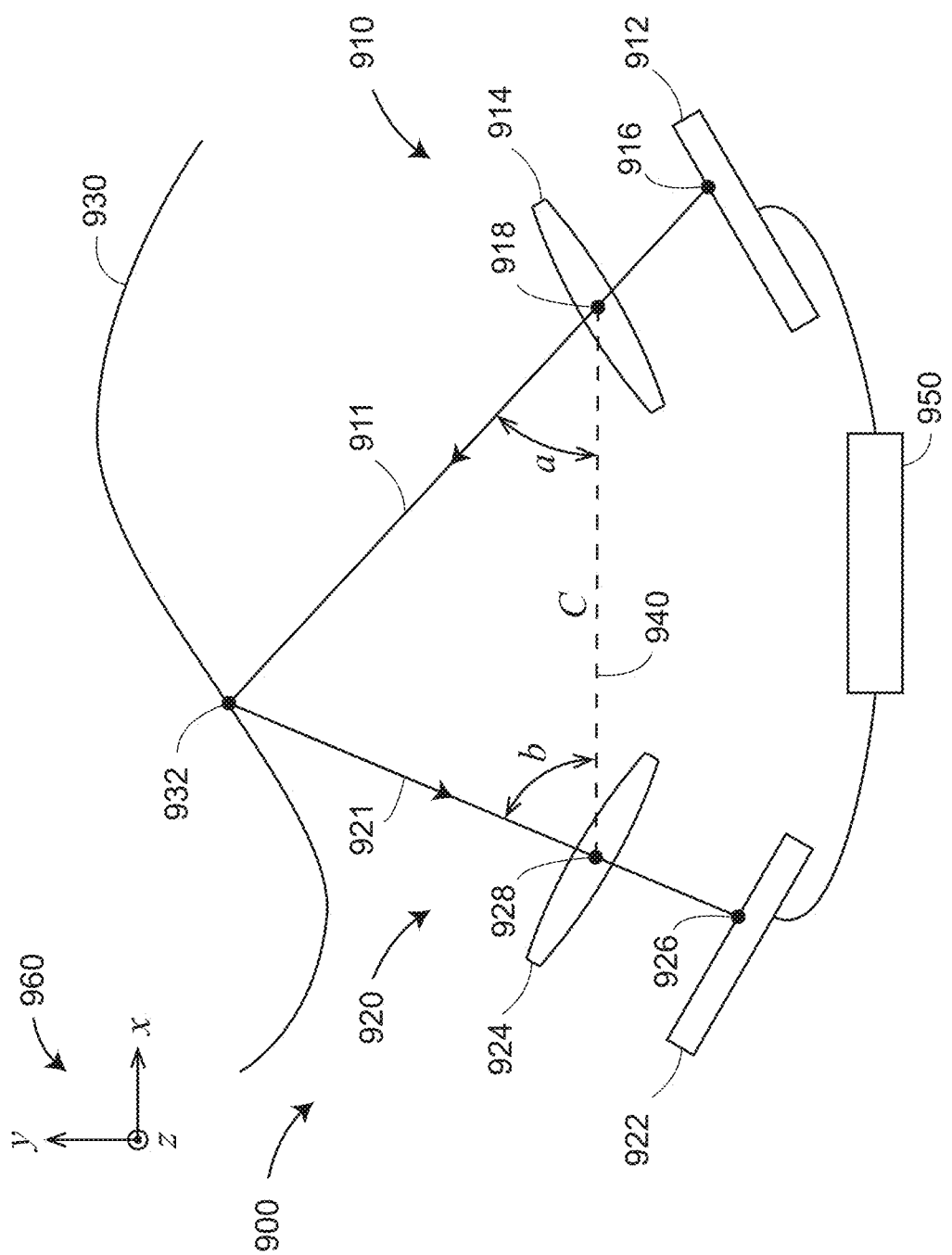
FIG. 9 is a schematic illustration of the principle of operation of a triangulation scanner having a camera and a projector according to an embodiment.

FIG. 9 shows a structured light triangulation scanner 900 that projects a pattern of light over an area on a surface 930. The scanner, which has a frame of reference 960, includes a projector 910 and a camera 920. The projector 910 includes an illuminated projector pattern generator 912, a projector lens 914, and a perspective center 918 through which a ray of light 911 emerges. The ray of light 911 emerges from a corrected point 916 having a corrected position on the pattern generator 912. In an embodiment, the point 916 has been corrected to account for aberrations of the projector, including aberrations of the lens 914, in order to cause the ray to pass through the perspective center, thereby simplifying triangulation calculations.

The ray of light 911 intersects the surface 930 in a point 932, which is reflected (scattered) off the surface and sent through the camera lens 924 to create a clear image of the pattern on the surface 930 on the surface of a photosensitive array 922. The light from the point 932 passes in a ray 921 through the camera perspective center 928 to form an image spot at the corrected point 926. The image spot is corrected in position to correct for aberrations in the camera lens. A correspondence is obtained between the point 926 on the photosensitive array 922 and the point 916 on the illuminated projector pattern generator 912. As explained herein below, the correspondence may be obtained by using a coded or an uncoded (sequentially projected) pattern. Once the correspondence is known, the angles a and b in FIG. 9 may be determined. The baseline 940, which is a line segment drawn between the perspective centers 918 and 928, has a length C. Knowing the angles a, b and the length C, all the angles and side lengths of the triangle 928-932-918 may be determined. Digital image information is transmitted to a processor 950, which determines 3D coordinates of the surface 930. The processor 950 may also instruct the illuminated pattern generator 912 to generate an appropriate pattern. The processor 950 may be located within the scanner assembly, or it may be an external computer, or a remote server.

As used herein, the term "pose" refers to a combination of a position and an orientation. In embodiment, the position and the orientation are desired for the camera and the projector in a frame of reference of the 3D imager 900. Since a position is characterized by three translational degrees of freedom (such as x, y, z) and an orientation is composed of three orientational degrees of freedom (such as roll, pitch, and yaw angles), the term pose defines a total of six degrees of freedom. In a triangulation calculation, a relative pose of the camera and the projector are desired within the frame of reference of the 3D imager. As used herein, the term "relative pose" is used because the perspective center of the camera or the projector can be located on an (arbitrary) origin of the 3D imager system; one direction (say the x axis) can be selected along the baseline; and one direction can be selected perpendicular to the baseline and perpendicular to an optical axis. In most cases, a relative pose described by six degrees of freedom is sufficient to perform the triangulation calculation. For example, the origin of a 3D imager can be placed at the perspective center of the camera. The baseline (between the camera perspective center and the projector perspective center) may be selected to coincide with the x axis of the 3D imager. The y axis may be selected perpendicular to the baseline and the optical axis of the camera. Two additional angles of rotation are used to fully define the orientation of the camera system. Three additional angles or rotation are used to fully define the orientation of the projector. In this embodiment, six degrees-of-freedom define the state of the 3D imager: one baseline, two camera angles, and three projector angles. In other embodiment, other coordinate representations are possible.

Figure 10:
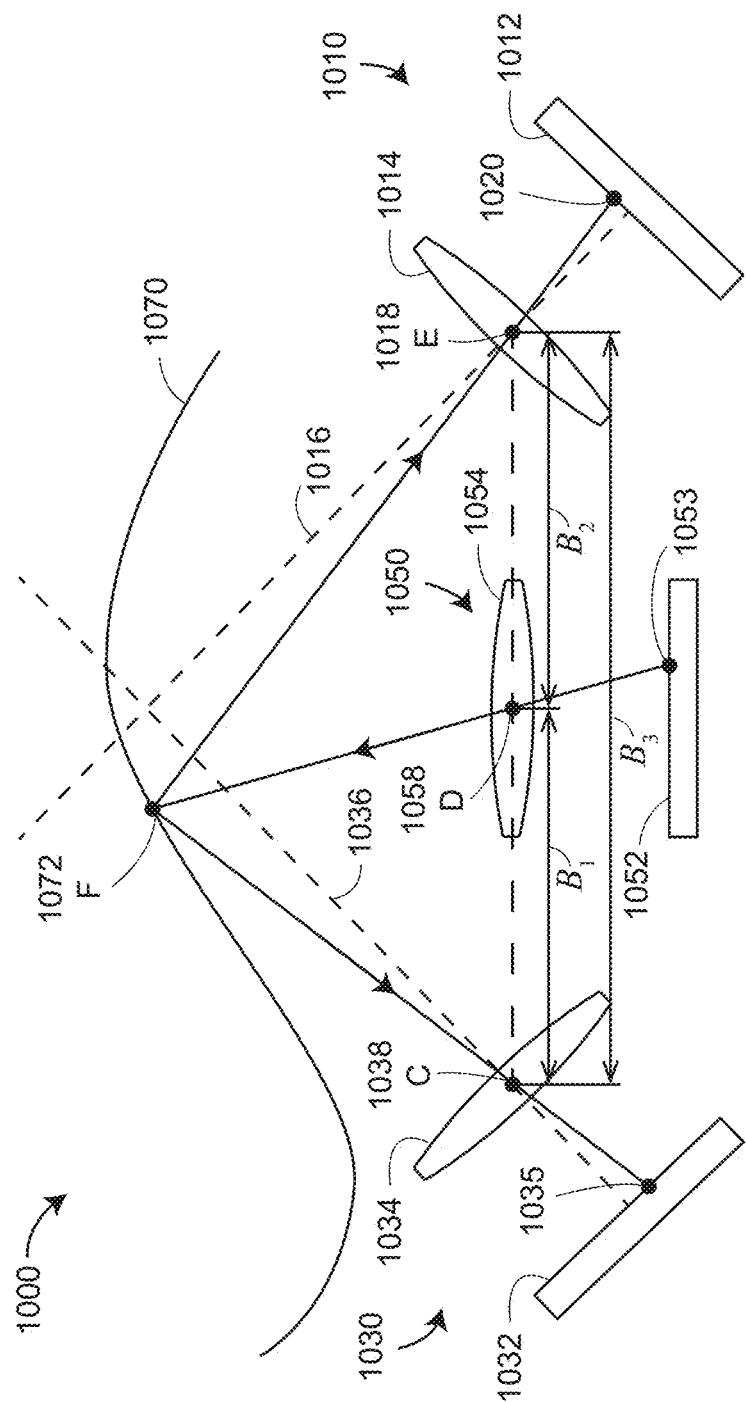
FIG. 10 is a schematic illustration of the principle of operation of a triangulation scanner having two cameras and one projector according to an embodiment.

FIG. 10 shows a structured light triangulation scanner 1000 having a projector 1050, a first camera 1010, and a second camera 1030. The projector creates a pattern of light on a pattern generator plane 1052, which it projects from a corrected point 1053 on the pattern through a perspective center 1058 (point D) of the lens 1054 onto an object surface 1070 at a point 1072 (point F). The point 1072 is imaged by the first camera 1010 by receiving a ray of light from the point 1072 through a perspective center 1018 (point E) of a lens 1014 onto the surface of a photosensitive array 1012 of the camera as a corrected point 1020. The point 1020 is corrected in the read-out data by applying a correction factor to remove the effects of lens aberrations. The point 1072 is likewise imaged by the second camera 1030 by receiving a ray of light from the point 1072 through a perspective center 1038 (point C) of the lens 1034 onto the surface of a photosensitive array 1032 of the second camera as a corrected point 1035.

The inclusion of two cameras 1010 and 1030 in the system 1000 provides advantages over the device of FIG. 9 that includes a single camera. One advantage is that each of the two cameras has a different view of the point 1072 (point F). Because of this difference in viewpoints, it is possible in some cases to see features that would otherwise be obscured—for example, seeing into a hole or behind a blockage. In addition, it is possible in the system 1000 of FIG. 10 to perform three triangulation calculations rather than a single triangulation calculation, thereby improving measurement accuracy. A first triangulation calculation can be made between corresponding points in the two cameras using the triangle CEF with the baseline $B_3$. A second triangulation calculation can be made based on corresponding points of the first camera and the projector using the triangle DEF with the baseline $B_2$. A third triangulation calculation can be made based on corresponding points of the second camera and the projector using the triangle CDF with the baseline $B_1$. The optical axis of the first camera 1020 is 1016, and the optical axis of the second camera 1030 is 1036.

Figure 11:
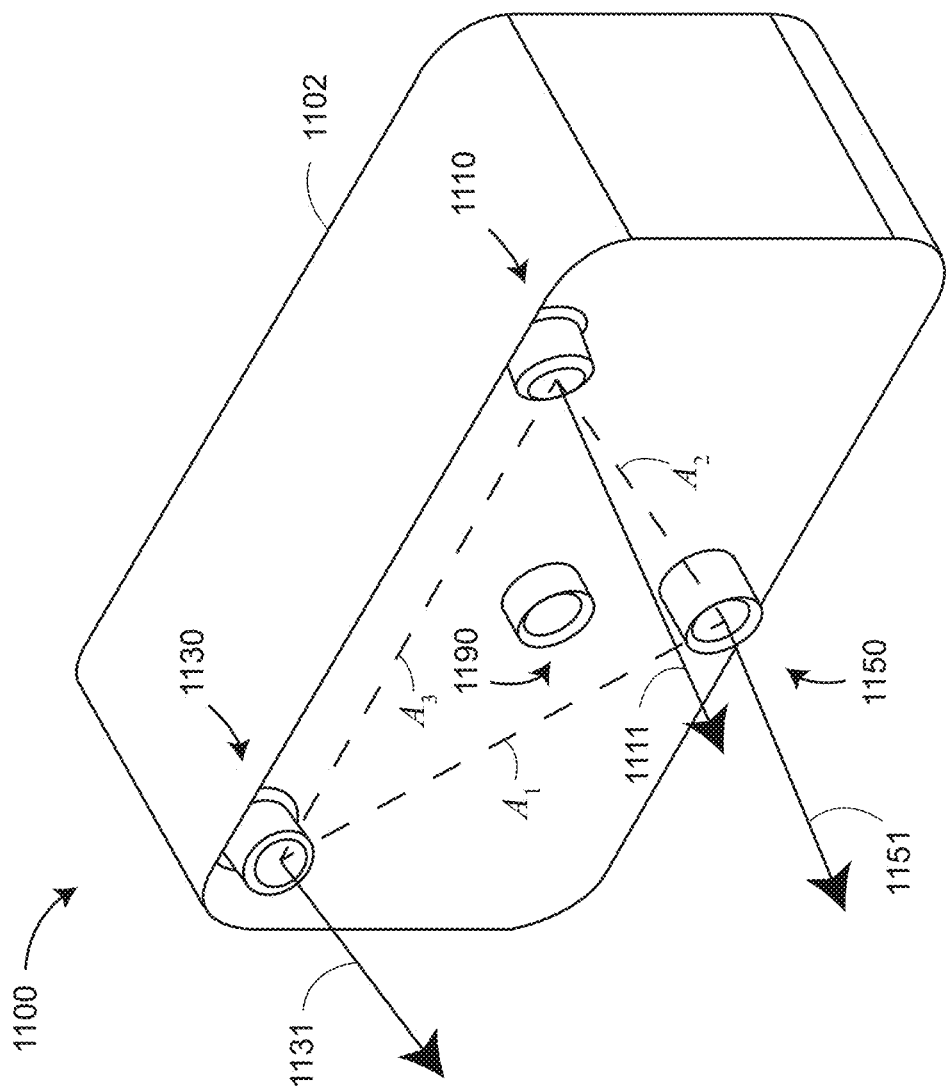
FIG. 11 is a perspective view of a scanner having two cameras and one projector arranged in a triangle for 3D measurement according to an embodiment.

FIG. 11 shows 3D imager 1100 having two cameras 1110, 1130 and a projector 1150 arranged in a triangle $A_1$-$A_2$-$A_3$. In an embodiment, the 3D imager 1100 of FIG. 11 further includes a camera 1190 that may be used to provide color (texture) information for incorporation into the 3D image. In addition, the camera 1190 may be used to register multiple 3D images through the use of videogrammetry.

Figure 12A:
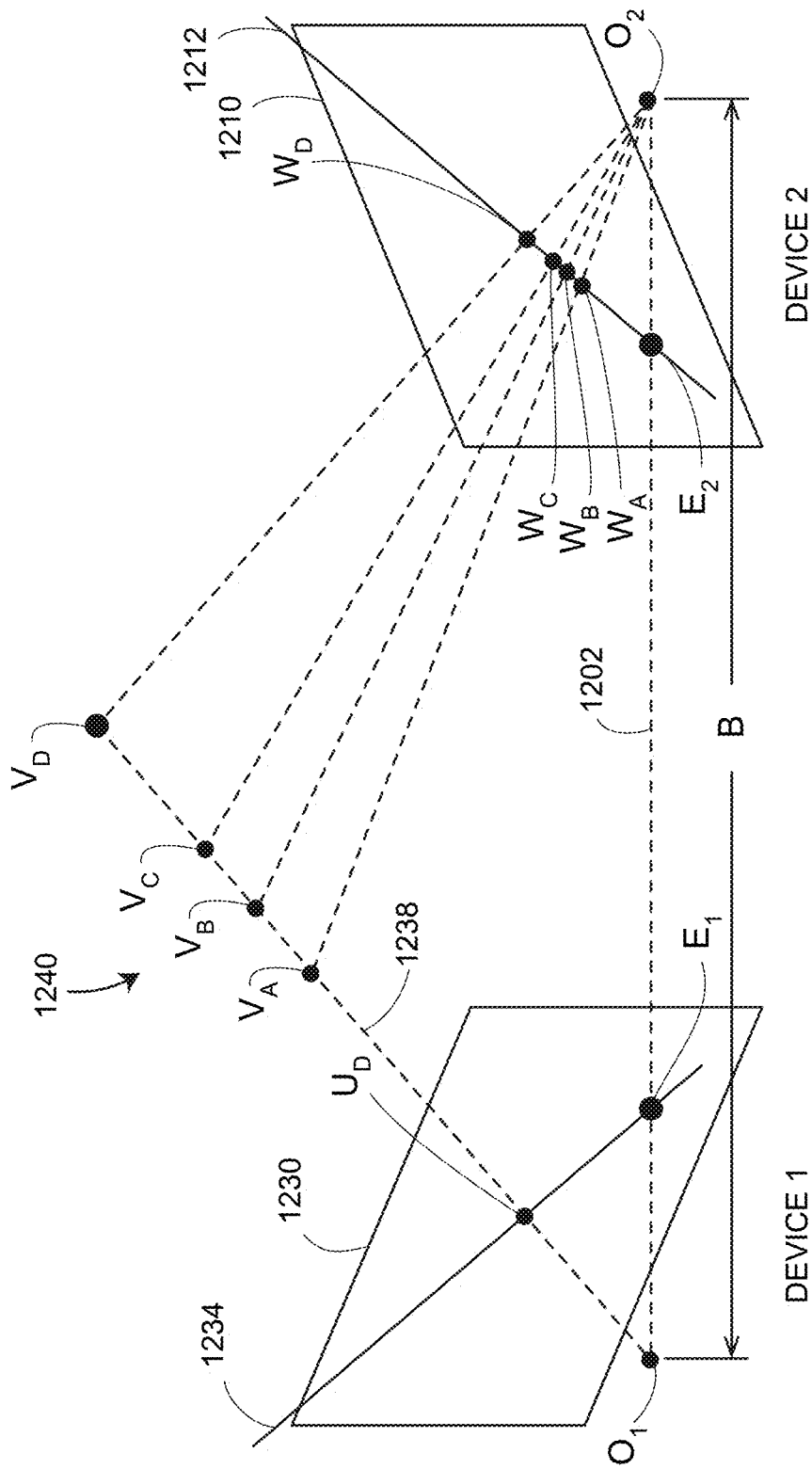
FIGS. 12A and 12B are schematic illustrations of the principle of operation of the scanner of FIG. 11.

This triangular arrangement provides additional information beyond that available for two cameras and a projector arranged in a straight line as illustrated in FIGS. 1 and 10. The additional information may be understood in reference to FIG. 12A, which explain the concept of epipolar constraints, and FIG. 12B that explains how epipolar constraints are advantageously applied to the triangular arrangement of the 3D imager 1100. In FIG. 12A, a 3D triangulation instrument 1240 includes a device 1 and a device 2 on the left and right sides of FIG. 12A, respectively. Device 1 and device 2 may be two cameras or device 1 and device 2 may be one camera and one projector. Each of the two devices, whether a camera or a projector, has a perspective center, $O_1$ and $O_2$, and a representative plane, 1230 or 1210. The perspective centers are separated by a baseline distance B, which is the length of the line 1202. The concept of perspective center is discussed in more detail in reference to FIGS. 13C, 13D, and 13E. Basically, the perspective centers $O_1$, $O_2$ are points through which rays of light may be considered to travel, either to or from a point on an object. These rays of light either emerge from an illuminated projector pattern, such as the pattern on illuminated projector pattern generator 912 of FIG. 9, or impinge on a photosensitive array, such as the photosensitive array 922 of FIG. 9. As can be seen in FIG. 9, the lens 914 lies between the illuminated object point 932 and plane of the illuminated object projector pattern generator 912. Likewise, the lens 924 lies between the illuminated object point 932 and the plane of the photosensitive array 922, respectively. However, the pattern of the front surface planes of devices 912 and 922 would be the same if they were moved to appropriate positions opposite the lenses 914 and 924, respectively. This placement of the reference planes 1230, 1210 is applied in FIG. 12A, which shows the reference planes 1230, 1210 between the object point and the perspective centers $O_1$, $O_2$.

In FIG. 12A, for the reference plane 1230 angled toward the perspective center $O_2$ and the reference plane 1210 angled toward the perspective center $O_1$, a line 1202 drawn between the perspective centers $O_1$ and $O_2$ crosses the planes 1230 and 1210 at the epipole points $E_1$, $E_2$, respectively. Consider a point $U_D$ on the plane 1230. If device 1 is a camera, it is known that an object point that produces the point $U_D$ on the image lies on the line 1238. The object point might be, for example, one of the points $V_A$, $V_B$, $V_C$, or $V_D$. These four object points correspond to the points $W_A$, $W_B$, $W_C$, $W_D$, respectively, on the reference plane 1210 of device 2. This is true whether device 2 is a camera or a projector. It is also true that the four points lie on a straight line 1212 in the plane 1210. This line, which is the line of intersection of the reference plane 1210 with the plane of $O_1$-$O_2$-$U_D$, is referred to as the epipolar line 1212. It follows that any epipolar line on the reference plane 1210 passes through the epipole $E_2$. Just as there is an epipolar line on the reference plane of device 2 for any point on the reference plane of device 1, there is also an epipolar line 1234 on the reference plane of device 1 for any point on the reference plane of device 2.

Figure 12B:
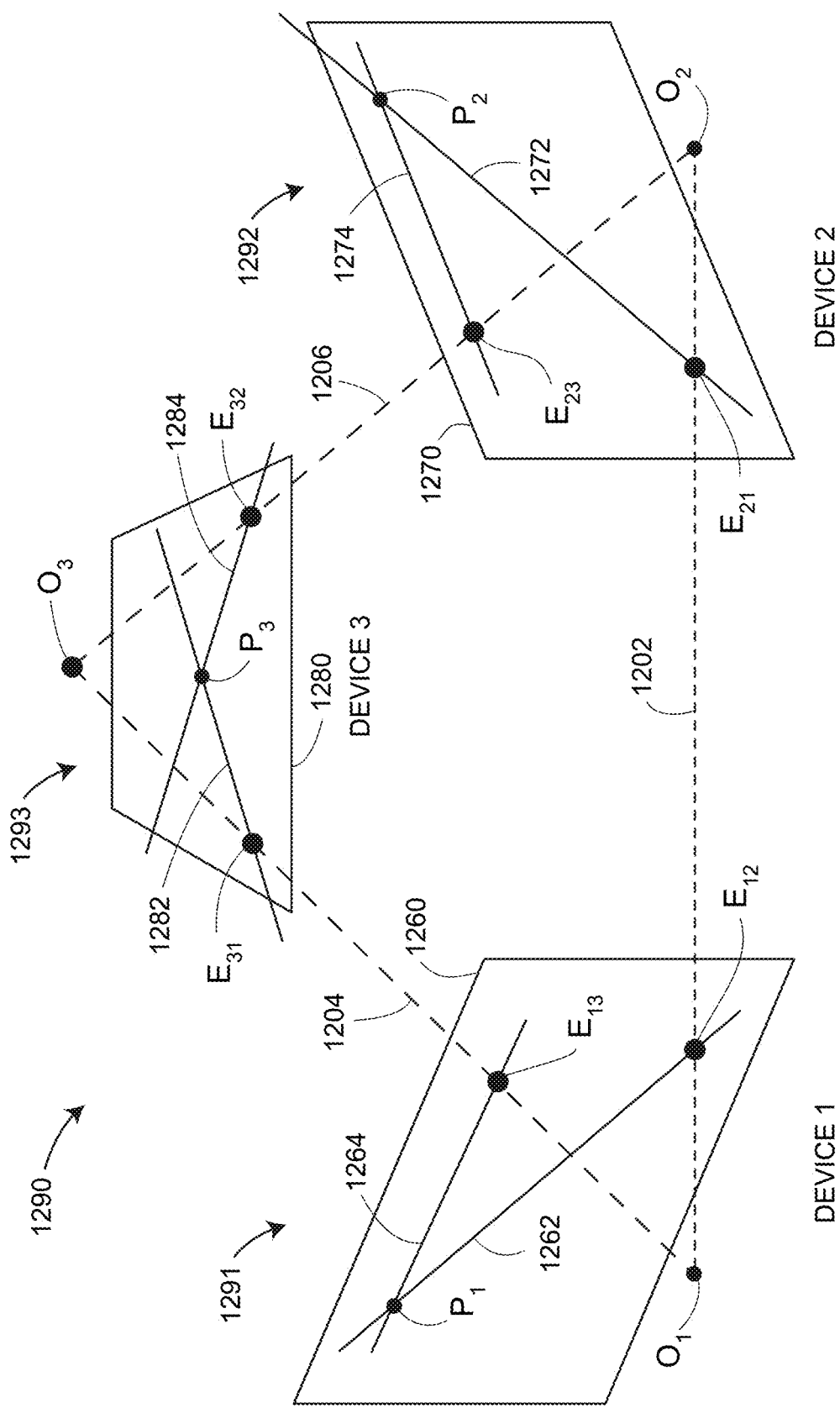

FIG. 12B illustrates the epipolar relationships for a 3D imager 1290 corresponding to 3D imager 1100 of FIG. 11 in which two cameras and one projector are arranged in a triangular pattern. In general, the device 1, device 2, and device 3 may be any combination of cameras and projectors as long as at least one of the devices is a camera. Each of the three devices 1291, 1292, 1293 has a perspective center $O_1$, $O_2$, $O_3$, respectively, and a reference plane 1260, 1270, and 1280, respectively. Each pair of devices has a pair of epipoles. Device 1 and device 2 have epipoles $E_{12}$, $E_{21}$ on the planes 1260, 1270, respectively. Device 1 and device 3 have epipoles $E_{13}$, $E_{31}$, respectively on the planes 1260, 1280, respectively. Device 2 and device 3 have epipoles $E_{23}$, $E_{32}$ on the planes 1270, 1280, respectively. In other words, each reference plane includes two epipoles. The reference plane for device 1 includes epipoles $E_{12}$ and $E_{13}$. The reference plane for device 2 includes epipoles $E_{21}$ and $E_{23}$. The reference plane for device 3 includes epipoles $E_{31}$ and $E_{32}$.

Consider the situation of FIG. 12B in which device 3 is a projector, device 1 is a first camera, and device 2 is a second camera. Suppose that a projection point $P_3$, a first image point $P_1$, and a second image point $P_2$ are obtained in a measurement. These results can be checked for consistency in the following way.

To check the consistency of the image point $P_1$, intersect the plane $P_3$-$E_{31}$-$E_{13}$ with the reference plane 1260 to obtain the epipolar line 1264. Intersect the plane $P_2$-$E_{21}$-$E_{12}$ to obtain the epipolar line 1262. If the image point $P_1$ has been determined consistently, the observed image point $P_1$ will lie on the intersection of the determined epipolar lines 1262 and 1264.

To check the consistency of the image point $P_2$, intersect the plane $P_3$-$E_{32}$-$E_{23}$ with the reference plane 1270 to obtain the epipolar line 1274. Intersect the plane $P_1$-$E_{12}$-$E_{21}$ to obtain the epipolar line 1272. If the image point $P_2$ has been determined consistently, the observed image point $P_2$ will lie on the intersection of the determined epipolar lines 1272 and 1274.

To check the consistency of the projection point $P_3$, intersect the plane $P_2$-$E_{23}$-$E_{32}$ with the reference plane 1280 to obtain the epipolar line 1284. Intersect the plane $P_1$-$E_{13}$-$E_{31}$ to obtain the epipolar line 1282. If the projection point $P_3$ has been determined consistently, the projection point $P_3$ will lie on the intersection of the determined epipolar lines 1282 and 1284.

The redundancy of information provided by using a 3D imager 1100 having a triangular arrangement of projector and cameras may be used to reduce measurement time, to identify errors, and to automatically update compensation/calibration parameters.

An example is now given of a way to reduce measurement time. As explained herein below in reference to FIGS. 14A-D and FIG. 15, one method of determining 3D coordinates is by performing sequential measurements. An example of such a sequential measurement method described herein below is to project a sinusoidal measurement pattern three or more times, with the phase of the pattern shifted each time. In an embodiment, such projections may be performed first with a coarse sinusoidal pattern, followed by a medium-resolution sinusoidal pattern, followed by a fine sinusoidal pattern. In this instance, the coarse sinusoidal pattern is used to obtain an approximate position of an object point in space. The medium-resolution and fine patterns used to obtain increasingly accurate estimates of the 3D coordinates of the object point in space. In an embodiment, redundant information provided by the triangular arrangement of the 3D imager 1100 eliminates the step of performing a coarse phase measurement. Instead, the information provided on the three reference planes 1260, 1270, and 1280 enables a coarse determination of object point position. One way to make this coarse determination is by iteratively solving for the position of object points based on an optimization procedure. For example, in one such procedure, a sum of squared residual errors is minimized to select the best-guess positions for the object points in space.

The triangular arrangement of 3D imager 1100 may also be used to help identify errors. For example, a projector 1293 in a 3D imager 1290 may project a coded pattern onto an object in a single shot with a first element of the pattern having a projection point $P_3$. The first camera 1291 may associate a first image point $P_1$ on the reference plane 1260 with the first element. The second camera 1292 may associate the first image point $P_2$ on the reference plane 1270 with the first element. The six epipolar lines may be generated from the three points $P_1$, $P_2$, and $P_3$ using the method described herein above. The intersection of the epipolar lines lie on the corresponding points $P_1$, $P_2$, and $P_3$ for the solution to be consistent. If the solution is not consistent, additional measurements of other actions may be advisable.

The triangular arrangement of the 3D imager 1100 may also be used to automatically update compensation/calibration parameters. Compensation parameters are numerical values stored in memory, for example, in the internal electrical system 700 or in another external computing unit. Such parameters may include the relative positions and orientations of the cameras and projector in the 3D imager.

The compensation parameters may relate to lens characteristics such as lens focal length and lens aberrations. They may also relate to changes in environmental conditions such as temperature. Sometimes the term calibration is used in place of the term compensation. Often compensation procedures are performed by the manufacturer to obtain compensation parameters for a 3D imager. In addition, compensation procedures are often performed by a user. User compensation procedures may be performed when there are changes in environmental conditions such as temperature. User compensation procedures may also be performed when projector or camera lenses are changed or after then instrument is subjected to a mechanical shock. Typically user compensations may include imaging a collection of marks on a calibration plate. A further discussion of compensation procedures is given herein below in reference to FIG. 35.

Inconsistencies in results based on epipolar calculations for a 3D imager 1290 may indicate a problem in compensation parameters. In some cases, a pattern of inconsistencies may suggest an automatic correction that can be applied to the compensation parameters. In other cases, the inconsistencies may indicate that user compensation procedures should be performed.

Figure 13A:
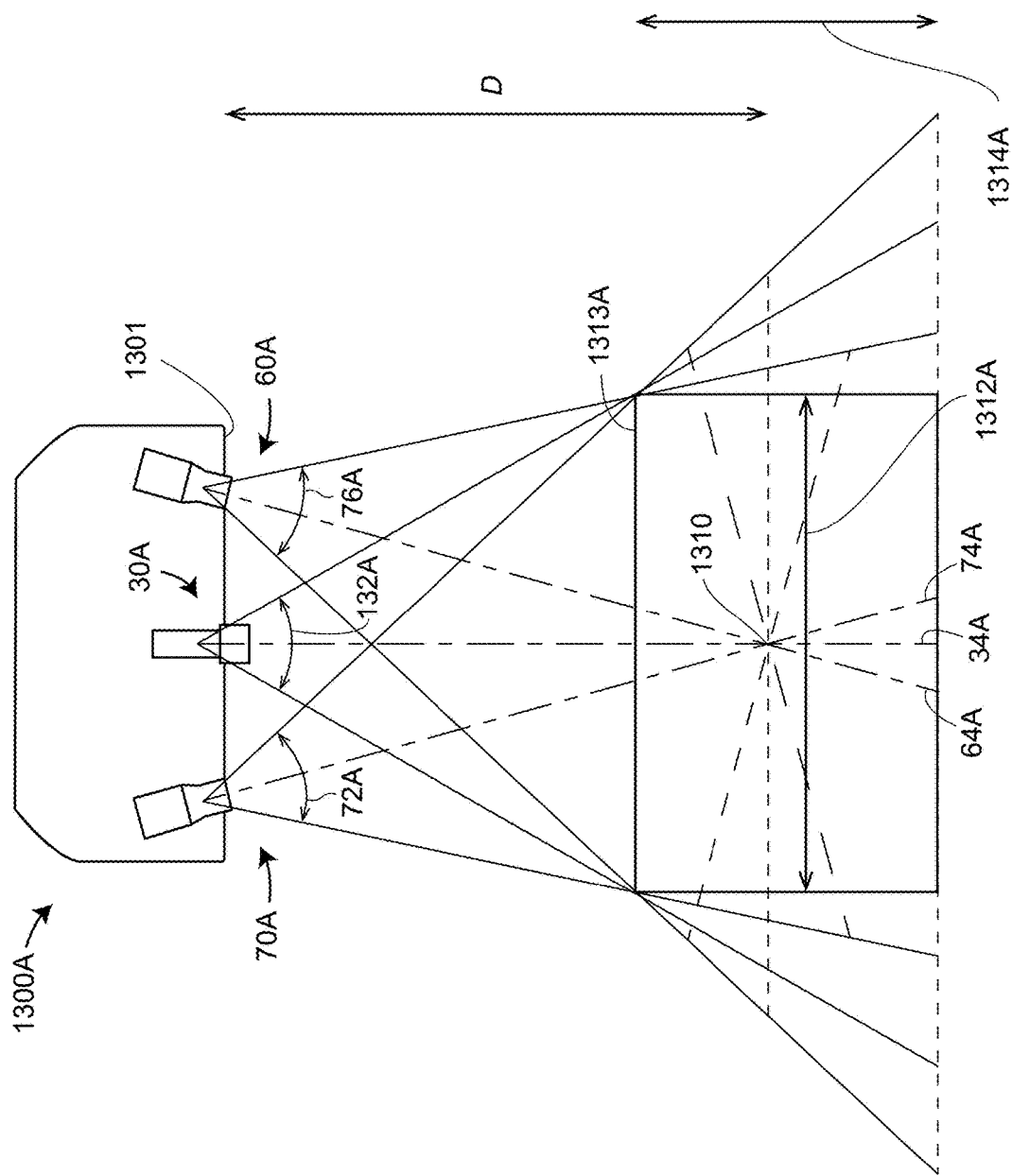
FIGS. 13A and 13B are schematic illustrations of 3D imagers having wide field-of-view (FOV) lenses and narrow FOV lenses, respectively, according to an embodiment.
Figure 13B:
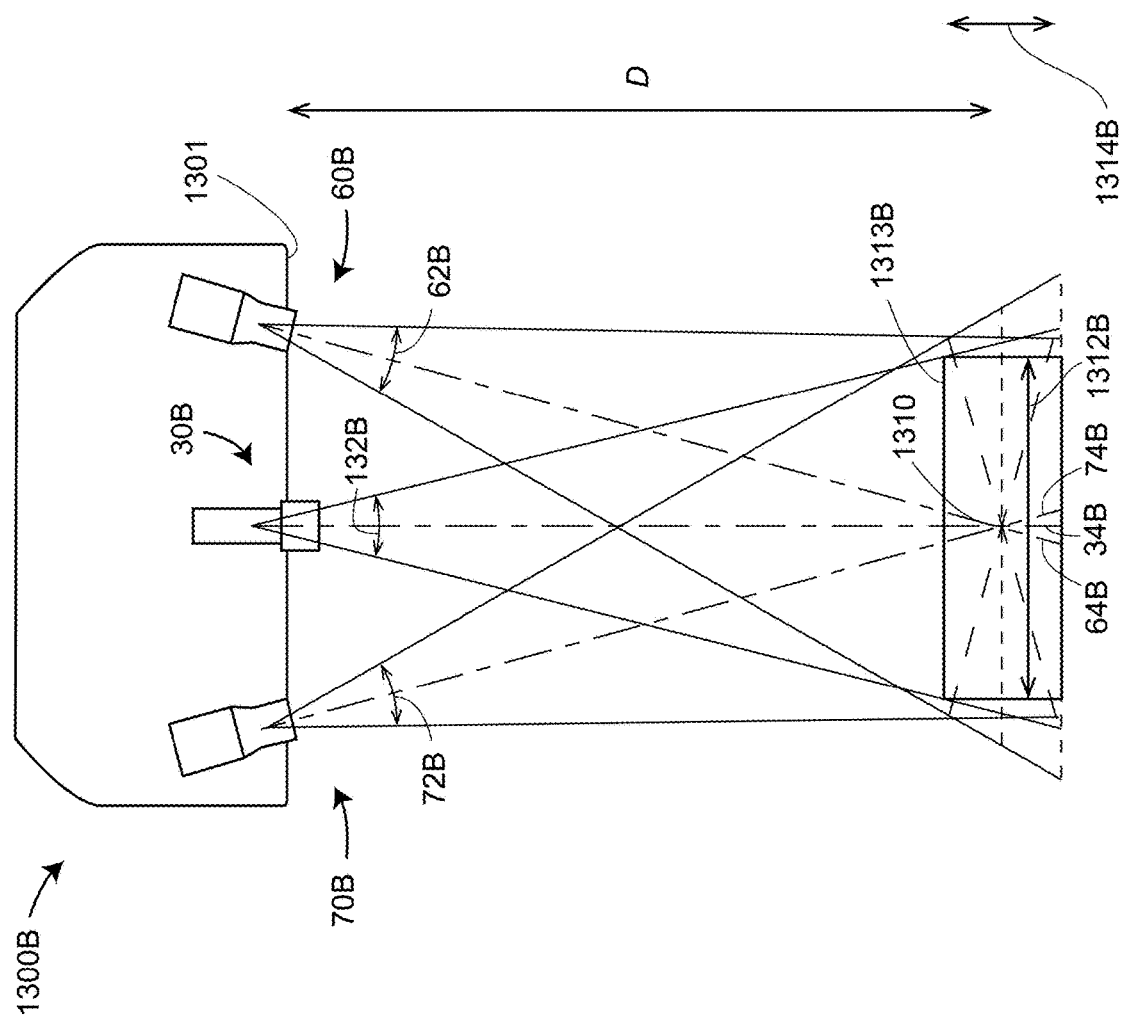

FIGS. 13A and 13B show two versions 1300A and 1300B, respectively, of the 3D imager 10. The 3D imager 1300A includes relatively wide FOV projector and camera lenses, while the 3D imager 1300B includes relatively narrow FOV projector and camera lenses. The FOVs of the wide-FOV cameras 70A, 60A and projector 30A of FIG. 13A are 72A, 62A, and 132A, respectively. The FOVs of the narrow-FOV cameras 70B, 60B and projector 30B of FIG. 13B are 72B, 62B, 132B, respectively. The standoff distance D of the 3D imager 1300A is the distance from the front 1301 of the scanner body to the point of intersection 1310 of the optical axes 74A and 64A of the camera lens assemblies 70A and 70B, respectively, with the optical axis 34A of the projector 30A. In an embodiment, the standoff distance D of the 3D imager 1300B is the same as the standoff distance D of the 3D imager 1300A. This occurs when the optical taxis 74B of the lens assembly 70B is the same as the optical axis 74A of the lens assembly 70A, which is to say that the assemblies 70A and 70B are pointed in the same direction. Similarly, the optical axes 34B and 34A have the same direction, and the optical axes 64A and 64B have the same direction. Because of this, the optical axes of the 3D imagers 1300A and 1300B intersect at the same point 1310. To achieve this result, lens assemblies 30A, 60A, and 70A are designed and constructed to be interchangeable without requiring fitting to each particular frame 10. This enables a user to purchase a lens off the shelf that is compatible with the configuration of imager 1300A, imager 1300B, or other compatible imagers. In addition, in an embodiment, such replacement lenses may be purchased without requiring adjustment of the lens to accommodate variations in the 3D imager. The method of achieving this compatibility is described in more detail herein below in reference to FIGS. 18, 19A-C, 20A-B, and 21A-C.

Because the nominal standoff distance D is the same for 3D imagers 1300A and 1300B, the narrow-FOV camera lenses 60B and 70B have longer focal lengths than the wide-FOV camera lenses 60A and 70A if the photosensitive array is the same size in each case. In addition, as shown in FIGS. 13A and 13B, the width 1312B of the measurement region 1313B is smaller than the width 1312A of the measurement region 1312A. In addition, if the diameters of lens apertures are the same in each case, the depth 1314B (the depth of field (DOF)) of the measurement region 1313B is smaller than the depth 1314A (DOF) of the measurement region 1313A. In an embodiment, 3D imagers 10 are available with different fields of view and different image sensor resolution and size.

Figure 13C:
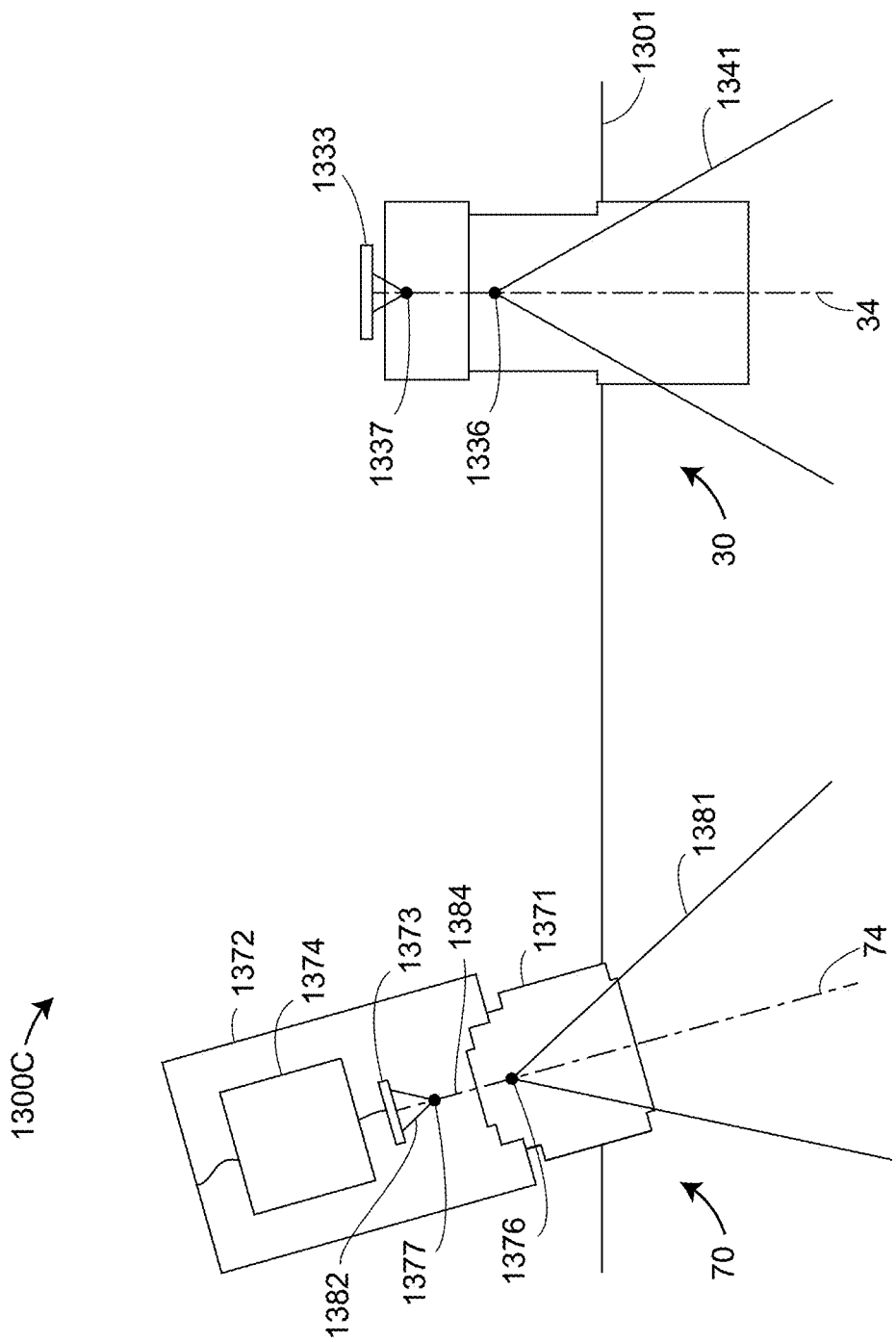
FIG. 13C is a schematic representation of camera and projector lenses according to an embodiment.

FIG. 13C shows a cross-sectional schematic representation 1300C of a camera assembly 70 and a projector 30 according to an embodiment. The camera lens assembly 70 includes a perspective center 1376, which is the center of the lens entrance pupil. The entrance pupil is defined as the optical image of the physical aperture stop as seen through the front of the lens system. The ray that passes through the center of the entrance pupil is referred to as the chief ray, and the angle of the chief ray indicates the angle of an object point as received by the camera. A chief ray may be drawn from each illuminated point on the object through the entrance pupil. For example, the ray 1381 is a chief ray that defines the angle of an object point (on the ray) with respect to the camera lens 1371. This angle is defined with respect to an optical axis 74 of the lens 3171.

The exit pupil is defined as the optical image of the physical aperture stop as seen through the back of the lens system. The point 1377 is the center of the exit pupil. The chief ray travels from the point 1377 to a point on the photosensitive array 1373. In general, the angle of the chief ray as it leaves the exit pupil is different than the angle of the chief ray as it enters the perspective center (the entrance pupil). To simplify analysis, the ray path following the entrance pupil is adjusted to enable the beam to travel in a straight line through the perspective center 1376 to the photosensitive array 1373 as shown in FIGS. 13D and 13E. Three mathematical adjustments are made to accomplish this. First, the position of each imaged point on the photosensitive array is corrected to account for lens aberrations and other systematic error conditions. This may be done by performing compensation measurements of the lenses in the cameras 70, 60 and the projector 30. Such compensation measurement may include, for example, measuring a calibration dot plate in a prescribed arrangement and sequence to obtain aberration coefficients or an aberration map for the lenses. Second, the angle of the ray 1382 is changed to equal the angle of the ray 1381 that passes through the perspective center 1376. The distance from the exit pupil 1377 to the photosensitive array 1373 is adjusted accordingly to place the image points at the aberration-corrected points on the photosensitive array 1373. Third, the point 1377 is collapsed onto the perspective center to remove the space 1384, enabling all rays of light 1381 emerging from the object to pass a straight line through the point 1376 onto the photosensitive array 1373, as shown in FIG. 13E. By this means, the exact path of each beam of light passing through the optical system of the camera 70C may be simplified for rapid mathematical analysis by the electrical circuit and processor 1374 in a mount assembly 1372. In the discussion herein below, the term perspective center is taken to be the center of the entrance pupil with the lens model revised to enable rays to be drawn straight through the perspective center to a camera photosensitive array or straight through the perspective center to direct rays from a projector pattern generator device.

Referring again to FIG. 13C, the projector assembly 3C has a perspective center 1336, a center of an exit pupil 1337, an optical axis 34, and a projector pattern array 1333. As in the camera assembly 70, mathematical corrections are made to enable a ray from light 1341 to travel straight through the perspective center 1336 from the projector pattern plane 1333 to an object. In an embodiment, the projector pattern array 1333 is the DMD 53 shown in FIG. 5A.

Figure 14B:
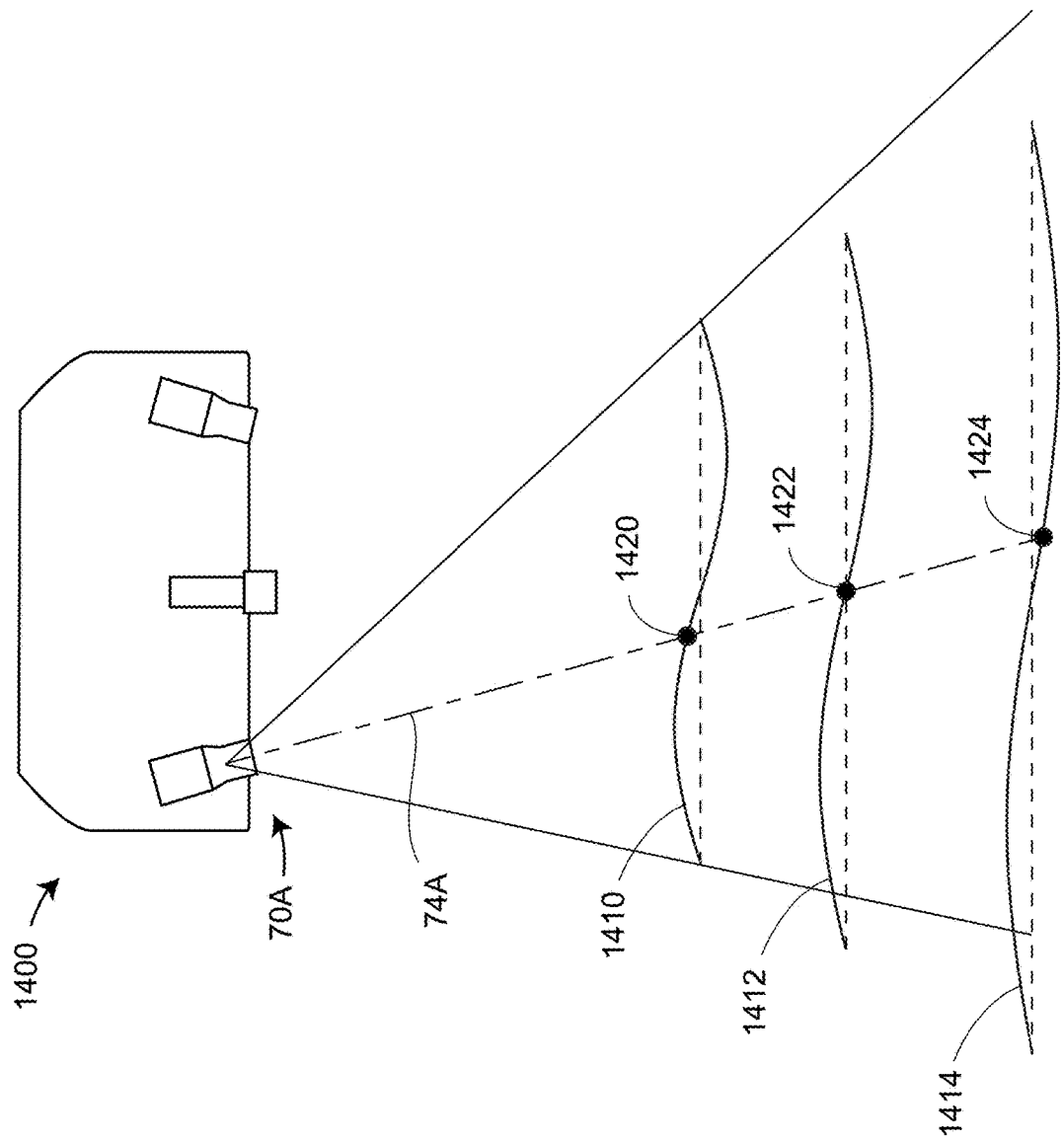
FIG. 14B illustrates reception of the coarse sine-wave pattern by a camera lens according to an embodiment.

An explanation is now given for a known method of determining 3D coordinate on an object surface using a sinusoidal phase-shift method, as described with reference to FIGS. 14A-D and FIG. 15. FIG. 14A illustrates projection of a sinusoidal pattern by the projector 30A. In an embodiment, the sinusoidal pattern in FIG. 14A varies in optical power from completely dark to completely bright. A minimum position on the sine wave in FIG. 14A corresponds to a dark projection and a maximum position on the sine wave corresponds to a bright projection. The projector 30A projects light along rays that travel in constant lines emerging from the perspective center of the projector lens. Hence in FIG. 14A, a line along the optical axis 34A in FIG. 14A represents a point neither at a maximum or minimum of the sinusoidal pattern and hence represents an intermediate brightness level. The relative brightness will be the same for all points lying on a ray projected through the perspective center of the projector lens. So, for example, all points along the ray 1415 are at maximum brightness level of the sinusoidal pattern. A complete sinusoidal pattern occurs along the lines 1410, 1412, and 1414, even though the lines 1410, 1412, and 1414 have different lengths.

In FIG. 14B, a given pixel of a camera 70A may see any of a collection of points that lie along a line drawn from the pixel through the perspective center of the camera lens assembly. The actual point observed by the pixel will depend on the object point intersected by the line. For example, for a pixel aligned to the optical axis 74A of the lens assembly 70A, the pixel may see a point 1420, 1422, or 1424, depending on whether the object lies along the lines of the patterns 1410, 1412, or 1414, respectively. Notice that in this case the position on the sinusoidal pattern is different in each of these three cases. In this example, the point 1420 is brighter than the point 1422, which is brighter than the point 1424.

FIG. 14C illustrates projection of a sinusoidal pattern by the projector 30A, but with more cycles of the sinusoidal pattern projected into space. FIG. 14C illustrates the case in which ten sinusoidal cycles are projected rather than one cycle. The cycles 1430, 1433, and 1434 are projected at the same distances from the scanner 1400 as the lines 1410, 1412, and 1414, respectively, in FIG. 14A. In addition, FIG. 14C shows an additional sinusoidal pattern 1433.

Figure 14D:
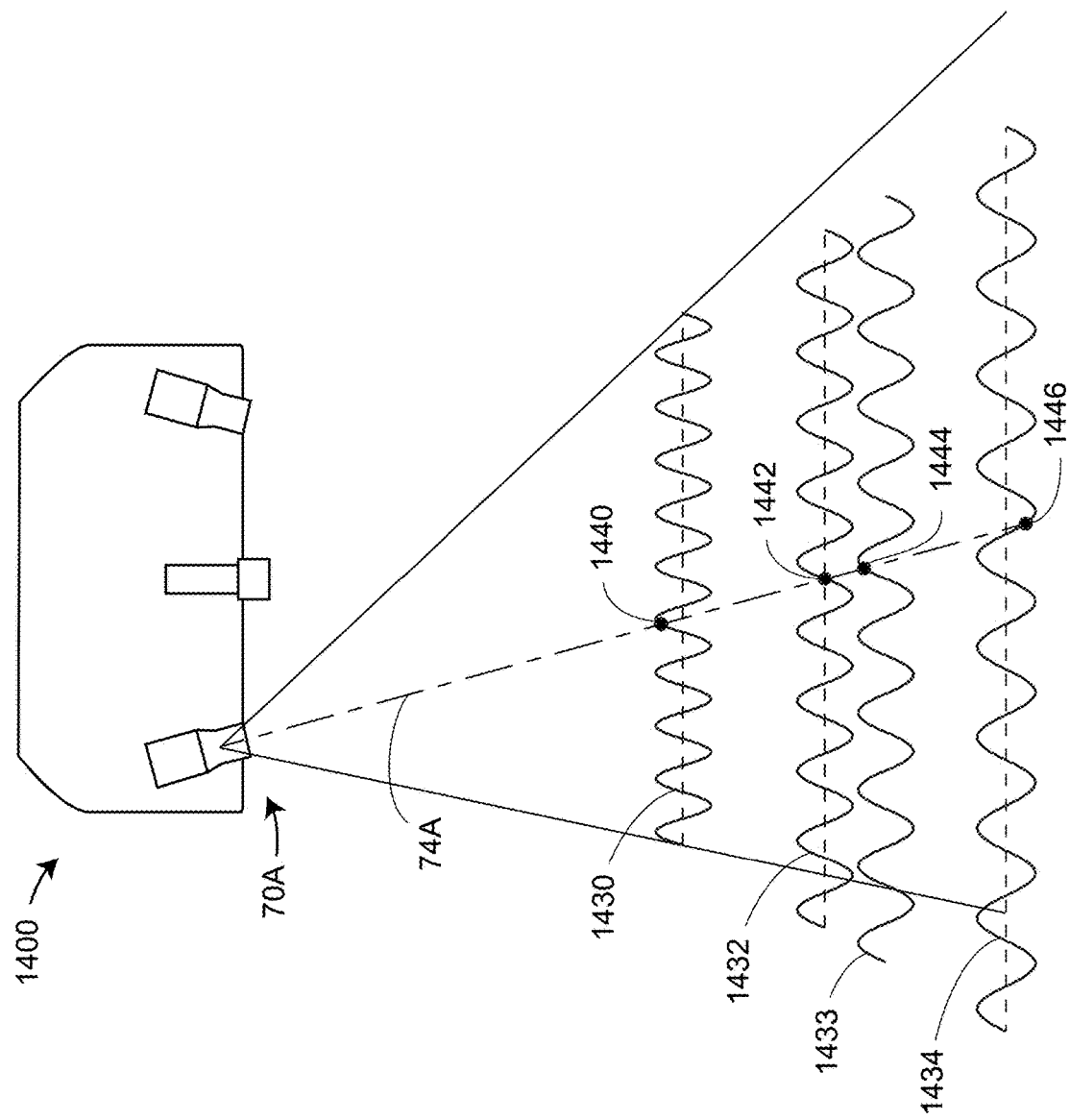
FIG. 14D illustrates reception of the finer sine-wave pattern according to an embodiment.

In FIG. 14D, a pixel aligned to the optical axis 74A of the lens assembly 70A sees the optical brightness levels corresponding to the positions 1440, 1442, 1444, and 1446 for the four sinusoidal patterns illustrated in FIG. 14D. Notice that the brightness level at a point 1440 is the same as at the point 1444. As an object moves farther away from the scanner 1400, from the point 1440 to the point 1444, it first gets slightly brighter at the peak of the sine wave, and then drops to a lower brightness level at position 1442, before returning to the original relative brightness level at 1444.

In a phase-shift method of determining distance to an object, a sinusoidal pattern is shifted side-to-side in a sequence of at least three phase shifts. For example, consider the situation illustrated in FIG. 15. In this figure, a point 1502 on an object surface 1500 is illuminated by the projector 30A. This point is observed by the camera 70A and the camera 60A. Suppose that the sinusoidal brightness pattern is shifted side-to-side in four steps to obtained shifted patterns 1512, 1514, 1516, and 1518. At the point 1502, each of the cameras 70A and 60A measure the relative brightness level at each of the four shifted patterns. If for example the phases of the sinusoids for the four measured phases are $\theta = \{160°, 250°, 340°, 70°\}$ for the positions 1522, 1524, 1526, and 1528, respectively, the relative brightness levels measured by the cameras 70A and 60A at these positions are $(1+\sin(\theta))/2$, or 0.671, 0.030, 0.329, and 0.969, respectively. A relatively low brightness level is seen at position 1424, and a relatively high brightness level is seen at the position 1528.

By measuring the amount of light received by the pixels in the cameras 70A and 60A, the initial phase shift of the light pattern 1512 can be determined. As suggested by FIG. 14D, such a phase shift enables determination of a distance from the scanner 1400, at least as long as the observed phases are known to be within a 360 degree phase range, for example, between the positions 1440 and 1444 in FIG. 14D. A quantitative method is known in the art for determining a phase shift by measuring relative brightness values at a point for at least three different phase shifts (side-to-side shifts in the projected sinusoidal pattern). For a collection of N phase shifts of sinusoidal signals resulting in measured relative brightness levels $x_i$, a general expression for the phase $\phi$ is given by $\phi = \tan^{-1}(-b_i/a_i)^{0.5}$, where $a_i = \Sigma x_j \cos(2\pi j/N)$ and $b_i = \Sigma x_j \sin(2\pi j/N)$, the summation being taken over integers from j=0 to N−1. For some embodiments, simpler formulas may be used. For example, for the embodiment of four measured phases each shifted successively by 90 degrees, the initial phase value is given by $\tan^{-1}((x_4 - x_2)/(x_1 - x_3))$.

The phase shift method of FIG. 15 may be used to determine the phase to within one sine wave period, or 360 degrees. For a case such as in FIG. 14D wherein more than one 360 interval is covered, the procedure may further include projection of a combination of relatively coarse and relatively fine phase periods. For example, in an embodiment, the relatively coarse pattern of FIG. 14A is first projected with at least three phase shifts to determine an approximate distance to the object point corresponding to a particular pixel on the camera 70A. Next the relatively fine pattern of FIG. 14C is projected onto the object with at least three phase shifts, and the phase is determined using the formulas given above. The results of the coarse phase-shift measurements and fine phase-shift measurements are combined to determine a composite phase shift to a point corresponding to a camera pixel. If the geometry of the scanner 1500 is known, this composite phase shift is sufficient to determine the three-dimensional coordinates of the point corresponding to a camera pixel using the methods of triangulation, as discussed herein above with respect to FIG. 9. The term "unwrapped phase" is sometimes used to indicate a total or composite phase shift.

An alternative method of determining 3D coordinates using triangulation methods is by projecting coded patterns. If a coded pattern projected by the projector is recognized by the camera(s), then a correspondence between the projected and imaged points can be made. Because the baseline and two angles are known for this case, the 3D coordinates for the object point can be determined.

An advantage of projecting coded patterns is that 3D coordinates may be obtained from a single projected pattern, thereby enabling rapid measurement, which is desired for example in handheld scanners. One disadvantage of projecting coded patterns is that background light can contaminate measurements, reducing accuracy. The problem of background light is avoided in the sinusoidal phase-shift method since background light, if constant, cancels out in the calculation of phase.

One way to preserve accuracy using the phase-shift method while minimizing measurement time is to use a scanner having a triangular geometry, as in FIG. 11. The three combinations of projector-camera orientation provide redundant information that may be used to eliminate some of the ambiguous intervals. For example, the multiple simultaneous solutions possible for the geometry of FIG. 11 may eliminate the possibility that the object lies in the interval between the positions 1444 and 1446 in FIG. 14D. This knowledge may eliminate a step of performing a preliminary coarse measurement of phase, as illustrated for example in FIG. 14B. An alternative method that may eliminate some coarse phase-shift measurements is to project a coded pattern to get an approximate position of each point on the object surface.

Figure 16:
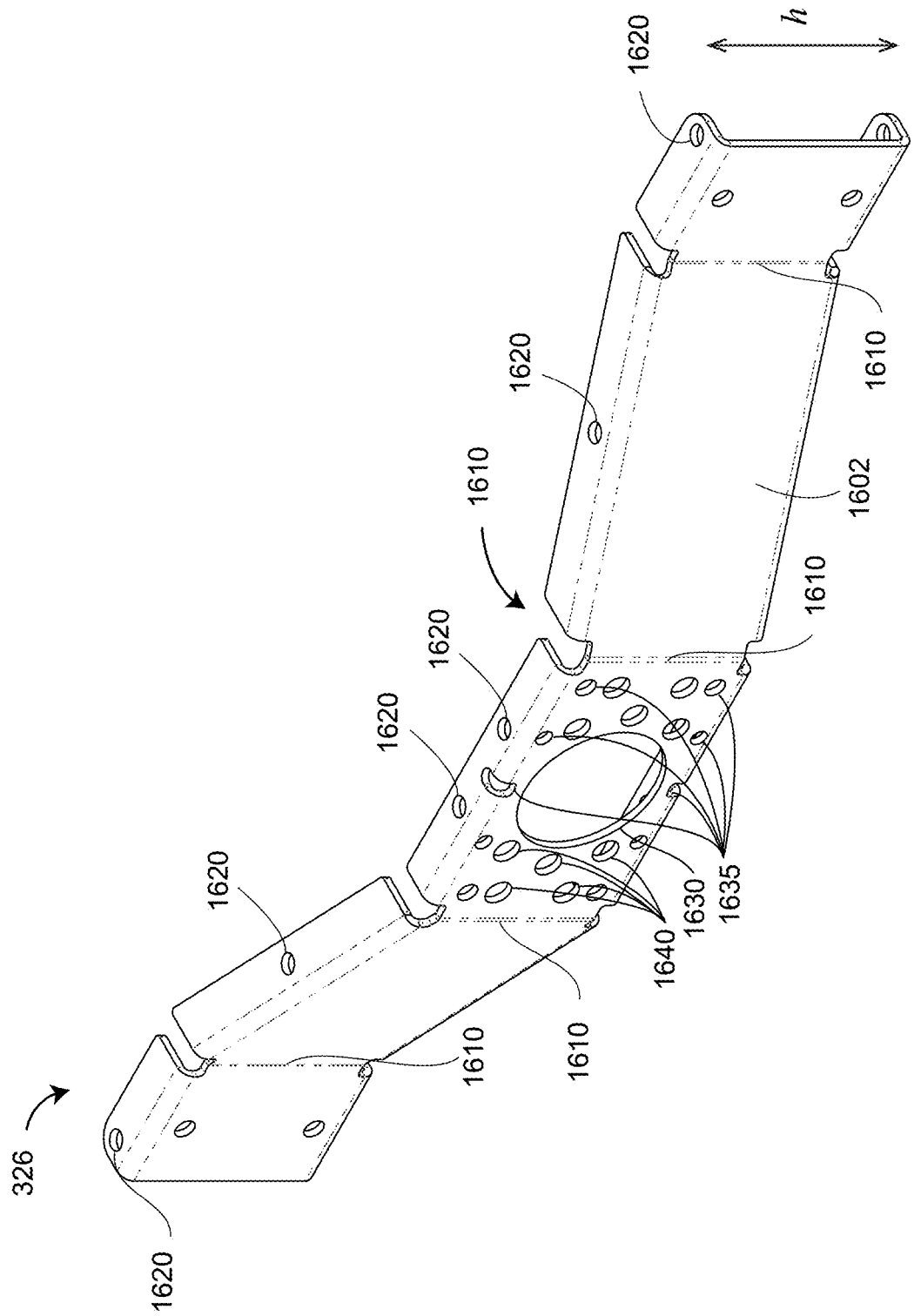
FIG. 16 is a perspective view of a web support according to an embodiment.
Figure 17:
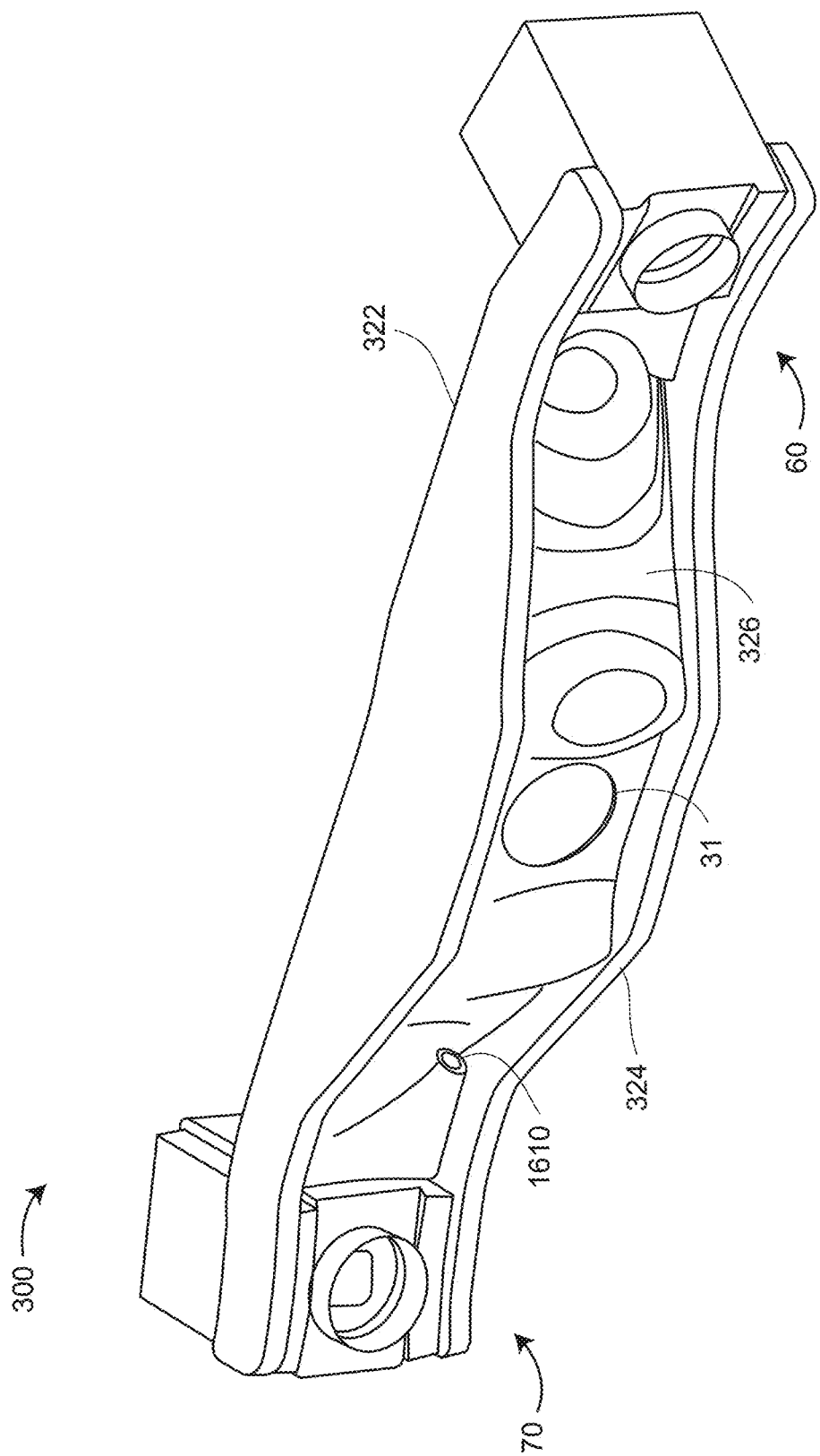
FIG. 17 is a perspective view of an finite-element analysis (FEA) model of the web support when heated according to an embodiment.

FIG. 16 is a perspective view of a web support 326, which is a part of the support assembly 300 that further includes a top structural support 322 and a bottom structural support 324. In an embodiment, the top and bottom structural supports are made of carbon-fiber composite material that is stiff and has a low coefficient of thermal expansion (CTE). In an embodiment, the web support 326 includes mounting holes 1620 for attaching it to the top structural support 322 and the bottom structural support 324. It includes a hole 1630 through which the projector components pass. In an embodiment, it includes attachment holes 1635 and ventilation holes 1640. In an embodiment, the web support is relatively thin and is configured to bend rather than to cause a change in the distance between camera and projector elements or to otherwise distort the structure. The effect of thermal expansion of the support assembly 300 is shown in a finite element analysis (FEA) model in FIG. 17, in which all of the deformations greatly magnified for clarity. FIG. 17 shows that although the web support 326 distorts in response to changes in temperature, the support structure 300 that holds the cameras 60, 70 and projector 30 changes relatively little.

In an embodiment, the camera lens assemblies 60 and 70 and the projector lens assembly 30 in FIG. 3, shown in cross section in FIG. 18, are configured to be interchangeable with other models of the same type without operator adjustment. In an embodiment, lens assemblies having different FOVs are interchangeable as purchased off-the-shelf and without requiring later adjustment. Designs and manufacturing methods are now described that enable these lens compatibility features.

FIG. 18 shows a portion of section view B-B taken from FIG. 3. FIG. 18 shows a projector lens assembly 1600 and a projector lens mount 1640. The projector lens assembly 1600 includes a collection of lens elements 1610, a lens housing 1620, a lens body 1630, and a lens cover 1660. The collection of lens elements 1610 are affixed within a cavity in the lens housing 1620 using methods well known in the art. A physical aperture stop 1615 is included within the collection of lens elements 1610. Chief rays from object points pass through the center of the physical aperture stop 1615 and also through the center of the entrance pupil, which is the aperture stop 1615 as seen from the front of the lens assembly. A window 1611 may be placed near the front of the lens assembly. The lens housing 1620 is placed inside the lens body 1630. Adjustment of the lens housing 1620 relative to the lens body 1630 is made using lens adjustment screw threads 1684. The lens body 1630 is firmly affixed to the lens housing 1620 with lens housing set screws 1672. In an embodiment, three lens housing set screws 1672 are spaced apart by 120 degrees. The cosmetic lens cover 1660 is affixed over a portion of the lens body 1630.

The projector lens mount 1640 includes a projector adjustment ring 1650 and a projector base 1645. Adjustment of the projector adjustment ring 1650 relative to the projector base 1645 is made using mount adjustment screw threads 1680. The projector adjustment ring 1650 is firmly affixed to the projector base 1645 with base set screws 1670. In an embodiment, three base set screws 1670 are spaced apart by 120 degrees. To ensure that the projector adjustment ring 1650 is accurately centered on the projector base 1645, a first pilot diameter 1692 and a second pilot diameter 1694 are provided for the projector adjustment ring 1650 and the projector base 1645. At the locations of the first pilot diameter 1692 and the second pilot diameter 1694, the tolerances on the inner and outer diameters of the projector adjustment ring 1650 and the projector base 1645 are relatively tight.

To ensure compatibility of projector lens assemblies 1600 and projector mounts 1640 for all manufactured lenses and scanners, golden projector lens assemblies and golden projector mounts are created in an initial stage and used thereafter in manufacturing.

To obtain a golden projector lens assembly and a golden projector mount in an initial stage, a projector lens assembly 1600 and a projector mount 1640 are assembled in a 3D imager 10. As shown in FIGS. 22A and 22B, an observation surface plane 1350A or 1350B is placed at a preferred standoff distance D from the 3D imager 10. The mount adjustment screw threads 1680 and lens adjustment screw threads 1684 are adjusted to project from the projector a sharp image onto the observation surface plane. The determination of whether the projector is projecting a sharp pattern may be determined from observation by one of the cameras 60, 70 on the 3D imager 10 or by an external camera. The projector lens housing set screws 1672 are tightened to fix the position of the projector lens housing 1620 to the projector lens body 1630, and the base set screws 1670 are tightened to fix the position of the projector adjustment ring 1650 to the projector base 1645. With these adjustments made, the relative position of the projector lens elements 1610 are fixed in relation to the front projecting surface of the DMD 53. When the projector lens assembly 1600 is removed from the scanner and reinserted at a later time, contact is made at the working flange 1690, which ensures that repeatability in the position of the projector lens assembly 1600 relative to the projector mount 1640. This ensures that the projected images remain sharp upon multiple removals and reinsertions of the projector lens assembly 1600. Note that this initial step, in which both the projector mount 1640 and the lens assembly 1600 are both adjusted, may only be carried out once—either with a narrow-FOV projector lens assembly or with a wide-FOV projector lens assembly. Thereafter, the golden projector mount has been obtained and may be used to obtain other wide-FOV and narrow-FOV projector lens assemblies.

Completing the initial stage as described in the previous paragraph results in creation of a golden projector lens assembly and a golden projector mount. If both wide-FOV and narrow-FOV lens assemblies are available, the initial step results in a both wide-FOV and narrow-FOV golden projector lens assemblies. Thereafter, the golden projector lens assembly is used in routine manufacturing to create a plurality of projector mounts, and the golden projector mount is used in routine manufacturing to create a plurality of projector lens assemblies.

To create a plurality of projector mounts 1640 in a routine manufacturing process, a golden projector lens assembly 1600 is placed on the projector mount 1640 of a production unit. An observation surface plane 1350A or 1350B is placed at the standoff distance D from the 3D imager 1300A or 1300B, respectively, as shown in FIG. 22A and FIG. 22B. Either the wide-FOV projector lens assembly in projector 30A or the narrow-FOV projector lens assembly in projector 30B may be used in this step. A pattern is projected from the DMD 53 through the golden projector lens assembly onto the observation surface plane. The mount adjustment screw threads 1680 are adjusted to produce a sharp (in-focus) pattern on the observation surface plane. The determination of whether the projector is projecting a sharp pattern may be determined from observation by one of the cameras on the 3D imager 10 or by an external camera. The base set screws 1670 are tightened to fix the position of the projector adjustment ring 1650 to the projector base 1645.

To create a plurality of projector lens assemblies 1600 in a routine manufacturing process, a golden projector mount 1640 in a 3D imager attaches to a production projector lens assembly 1600. An observation surface plane 1350A or 1350B is placed at the standoff distance D from the 3D imager. A pattern is projected from the DMD 53 onto the observation surface plane 1350A or 1350B. The lens adjustment screw threads 1684 are adjusted to project from the projector 30 a sharp image onto the observation surface plane 1350A or 1350B. The determination of whether the projector is projecting a sharp pattern may be determined from observation by one of the cameras on the 3D imager 10 or by an external camera. The lens housing set screws 1672 are tightened to fix the position of the lens housing 1620 to the lens body 1630.

FIGS. 19A and 19B are perspective and top views, respectively, of a camera 60 or 70 that includes a camera lens assembly 1710 and a camera mount 1750. FIG. 19C is a view of cross section C-C taken through the top view. Additional features of the camera lens assembly 1710 are shown in FIGS. 20A and 20B. In an embodiment, the cameras 60 and 70 use the same design for the camera lens assembly 1710 and camera mount 1750.

The camera lens assembly 1710 includes a camera cover 1740, lens mounting threads 1713, a camera lens focus adjustment ring 1715, a focus set screw 1727, an aperture set screw 1726, and a filter mount 1714. The camera lens assembly 1710 also includes a collection of lens elements internal to the camera lens assembly 1710 but not visible in the figures. In an embodiment, the camera may be a commercially purchased lens modified as described herein below. The lens focus adjustment ring 1715 is adjusted for each separate camera lens assembly 1710 to achieve a desired focal length. The focus set screw 1727 holds the focal length to a fixed value. The aperture set screw 1726 holds the aperture at a fixed value. An optional filter may be held in place by the filter mount 1714. The lens mounting threads 1713 are used to attach the camera lens assembly 1710 to the camera mount 1750. The engagement of the lens mounting threads 1713 is limited by the working flange 1730, as discussed further herein below. After the lens focal length and aperture size are fixed, a camera cover 1740 is placed over the rest of the camera lens assembly 1710. In an embodiment, epoxy or glue is placed between the camera lens focus adjustment ring 1715 and the camera cover 1740 to more strongly fix the set screws in place.

The camera mount 1750 includes an electrical enclosure 1752, a mount bracket 1770, a camera mount adjustment ring 1775, a pair of pins 328, an optical bandpass filter 1762, and a gasket dust seal 1764. Adjustment of the camera mount adjustment ring 1775 relative to the mount bracket 1770 is made using camera mount adjustment screw threads 1772. The camera mount adjustment ring 1775 is firmly affixed to the mount bracket 1770 with bracket set screws 1736. In an embodiment, three bracket set screws 1736 are spaced apart by 120 degrees. The electronics enclosure holds a photosensitive array and camera processing electronics. Although FIG. 19 does not show the photosensitive array or camera processing electronics within the electronic enclosure, the photosensitive array and camera processing electronics are shown in FIG. 13C by reference numbers 1373 and 1374, respectively. The mount bracket 1770 is attached to the top structural support 322 and the bottom structural support 324 with the pair of pins 328, as shown in FIGS. 3, 19A, and 19C. The pins fit tightly enough into pin holes to ensure a consistent distance between the cameras and the projector but loosely enough to permit rotation of the cameras 60, 70 about the respective pin axes. This enables the cameras to be pointed to the desired intersection point 1310 shown in FIGS. 13A and 13B. After the cameras are rotated to the desired orientation, they are locked into place with the screws 329A and 329B (FIG. 3) put through holes in the top structural support 322 and into threaded holes 1729A and 1729B, respectively. The optical bandpass filter passes light at the wavelength of the light source 37 and blocks other wavelengths from background lights. The gasket dust seal helps to ensure a dust-free environment within the electrical enclosure 1752.

To ensure compatibility of camera lens assemblies 1710 and camera mounts 1750 for all manufactured lenses and scanners, golden camera lens assemblies and golden camera mounts are created in an initial stage and used thereafter in manufacturing.

To obtain a golden camera lens assembly and a golden camera mount in an initial stage, a camera lens assembly 1710 and a camera mount 1750 are assembled in a 3D imager 10. As shown in FIGS. 22C and 22D, an observation surface plane 1350C (for a camera 60A, 70A) or 1350D (for a camera 60B, 70B) is placed at a preferred standoff distance D from the 3D imager 10. The observation surface planes 1350C, 1350D include a pattern on the surface. The pattern may be permanently marked on the surface, projected by the projector 30A or 30B, or projected onto marks on the surface. In the latter case, a pattern of light might be projected onto a collection of white reflective dots on an observation surface plane, for example. The camera mount adjustment screw threads 1772 and the camera lens focus adjustment ring 1715 are adjusted to obtain a sharp (focused) image of the pattern on the surface plane 1350C, 1350D on the photosensitive array of the camera. The bracket set screws 1736 are tightened to fix the position of the camera mount adjustment ring 1775 to the mount bracket 1770, and the focus set screw 1727 is tightened to fix the camera lens focus adjustment ring 1715 in place. With these adjustments made, the camera lens assembly 1710 is fixed in relation to the photosensitive array within the electrical enclosure 1752. When the camera lens assembly 1710 is removed from the scanner and reinserted, contact is made at the working flange 1730, which ensures that repeatability in the position of the camera lens assembly 1710 relative to the camera mount 1750. This ensures that the captured images remain sharp and in focus upon multiple removals and reinsertions of the camera lens assembly 1710. Note that this initial step, in which both the camera mount 1750 and the camera lens assembly 1710 are both adjusted, may only be carried out once—either with a narrow-FOV camera 60B, 70B or with a wide-FOV camera 60A, 70A. Thereafter, the golden camera mount 1750 has been obtained and may be used to obtain both wide-FOV and narrow-FOV camera lens assemblies.

Completing the initial stage as described in the previous paragraph results in creation of a golden camera lens assembly and a golden camera mount. If both wide-FOV and narrow-FOV lens assemblies are available, the initial step results in a both wide-FOV and narrow-FOV golden camera lens assemblies. Thereafter, the golden camera lens assembly is used in routine manufacturing to create a plurality of camera mounts, and the golden camera mounts are used in routine manufacturing to create a plurality of camera lens assemblies.

To create a plurality of camera mounts 1750 in a routine manufacturing process, a golden camera lens assembly 1710 is placed on the projector mount 1750 of a production unit. An observation surface plane 1350C (for wide-FOV cameras 60A, 70A) or 1350D (for narrow-FOV cameras 60B, 70B) is placed at the standoff distance D from the 3D imager 1300A or 1300B, respectively, as shown in FIG. 22C and FIG. 22D. The camera mount adjustment screw threads 1772 are adjusted to produce a sharp (in-focus) image of the pattern on the observation surface plane. The bracket set screws 1736 are tightened to fix the position of the camera mount adjustment ring 1775 to the mount bracket 1770.

To create a plurality of camera lens assemblies 1710 in a routine manufacturing process, a golden camera mount 1750 in a 3D imager attaches to a production camera lens assembly 1710. An observation surface plane 1350C (for wide-FOV cameras 60A, 70A) or 1350D (for narrow-FOV cameras 60B, 70B) is placed at the standoff distance D from the 3D imager. The focus adjustment ring 1715 is adjusted to obtain a sharp image of the pattern on the observation surface plane 1350C or 1350D. The focus set screw 1727 is tightened to fix the camera lens focus adjustment ring 1715 in place.

Figure 21C:
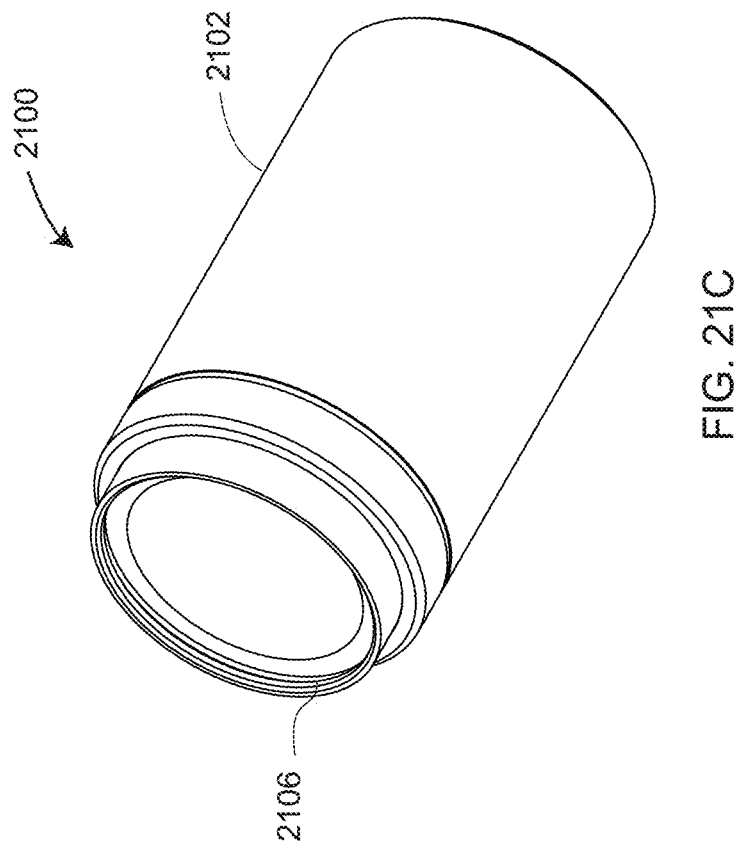
FIGS. 21A, 21B, and 21C are top, first perspective, and second perspective views of a second camera lens assembly according to an embodiment.
Figure 21A:
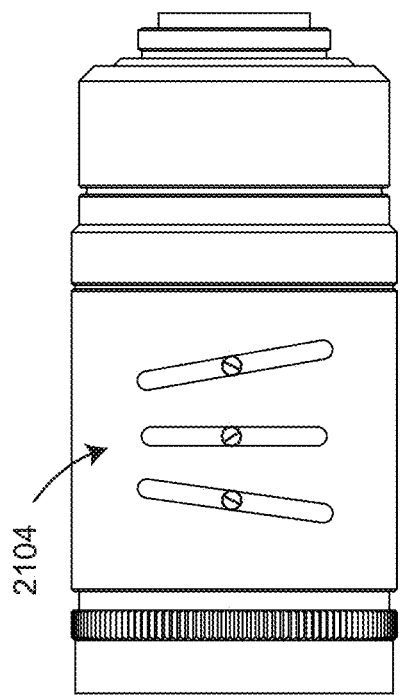
Figure 21B:
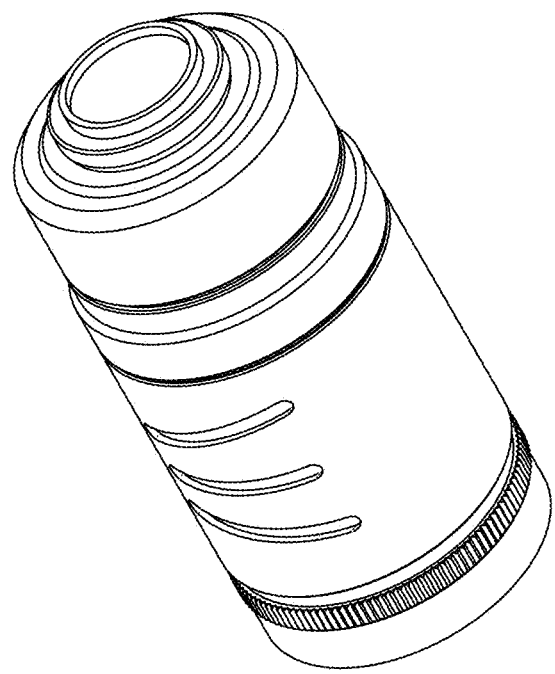

FIGS. 21A, 21B, and 21C are a top view, a first perspective view, and a second perspective view, respectively, of a camera lens assembly 2100 having a relatively long focal length. When the lens cover 2102 is removed, the focusing mechanism 2104 is revealed. In this instance the focusing mechanism 2104 sets three adjustment screws, which are configured to turn together. To ensure that the three adjustment controls are firmly locked into position, a layer of epoxy or other glue may be placed within the lens cover 2012 over the adjustment controls 2104. The front of the lens assembly is indicated by the presence of a mount for an optional filter.

A potential source of error in making 3D measurements with a 3D imager 10 is illumination of objects by background lights. FIGS. 23A and 23B are graphs of normalized light output from an incandescent A19 light bulb and a magnetically ballasted compact fluorescent lamp (CFL), respectively. Both types of lights are common in homes and offices. As can be seen, the normalized light output varies by more than 20 percent for the incandescent bulb and more than 50 percent for the CFL. For both cases, the light output repeats at 120 Hz, or every 8.33 milliseconds. Note that this is twice the power line frequency (or half the power line period). Power line frequency varies from country to country.

FIGS. 23C, 23D, 23E, and 23F show four different types of LED light sources. By comparison to incandescent and CFL lights, LED vary greatly in the fluctuation of normalized output power. For example, FIGS. 23C and 23D show the normalized light output observed for two different A-type LEDs. The light output is nearly constant for the LED in FIG. 23C but ranges from a few percent to 100 percent for the A-type LED in FIG. 23D. FIGS. 23E and 23F show the normalized output power for two MR16-type LEDs. As can be seen, the light output ranges from a few percent to 100 percent for the LED of FIG. 23E, but from around 70 percent to 100 percent for the LED of FIG. 23F. In all of the cases illustrated in FIGS. 23C to 23F, the light output repeats at 120 Hz, or every 8.33 milliseconds. This is twice the power line frequency (or half the power line period).

One way to minimize potential problems from background lights is to use optical filters in the camera lens assemblies 60 and 70. The optical filters may be optical coatings placed on the lenses, or they may be windows made of filter glass. This approach, though helpful, is not perfect because some background light will pass through the optical filters.

In an embodiment, the projector illumination duration and corresponding camera exposure duration are selected to minimize the effect on the calculation of phase. As explained herein above with reference to FIG. 15, a constant level of background light cancels out in the calculation of phase. For example, for four projected phases shifted in increments of ninety degrees, the phase may be determined from the four observed image levels $x_i$ using the formula $\tan^{-1}((x_4-x_2)/(x_1-x_3))$. A constant background level for $x_1$, $x_2$, $x_3$, and $x_4$ cancels out in the calculation of phase. A first method for minimizing the effect of background light is therefore to ensure that the exposure time of the cameras is a multiple of half the power line period (8.33 milliseconds in the examples herein above). In this case, the background light cancels out as long as the background light varies consistently over the time required to take the four measurements. In some cases, the minimum frame rate of the cameras 60, 70 may be less than half the power line period. For example, a camera may not be able to measure fewer than around 15 frames per second, which means that a minimum of seven to nine frames will be required in each sampling interval. The optical power from the projector 30 should be selected, in view of the optimal sampling interval, to provide the required energy to the cameras 60, 70.

Figure 24B:
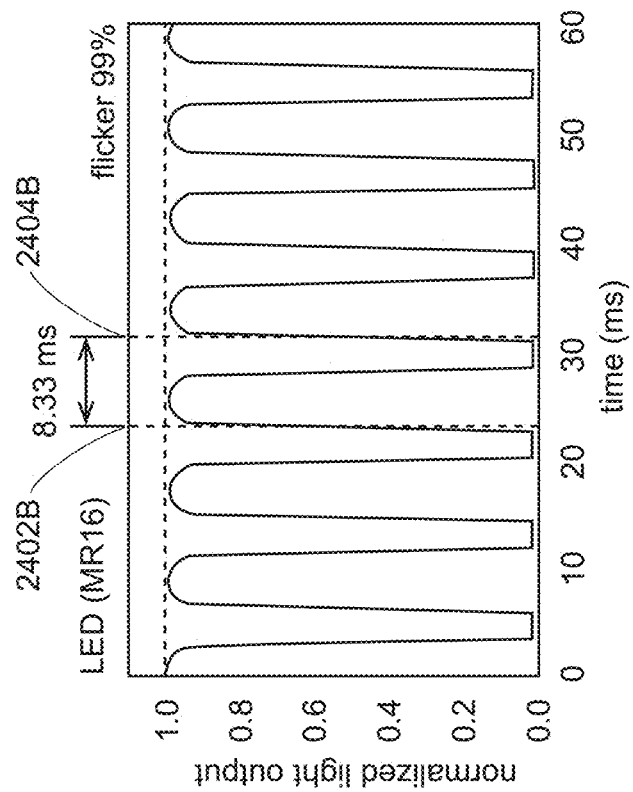
FIGS. 24A and 24B show how starting and stopping time of a measurement can change the influence of background lights.
Figure 24A:
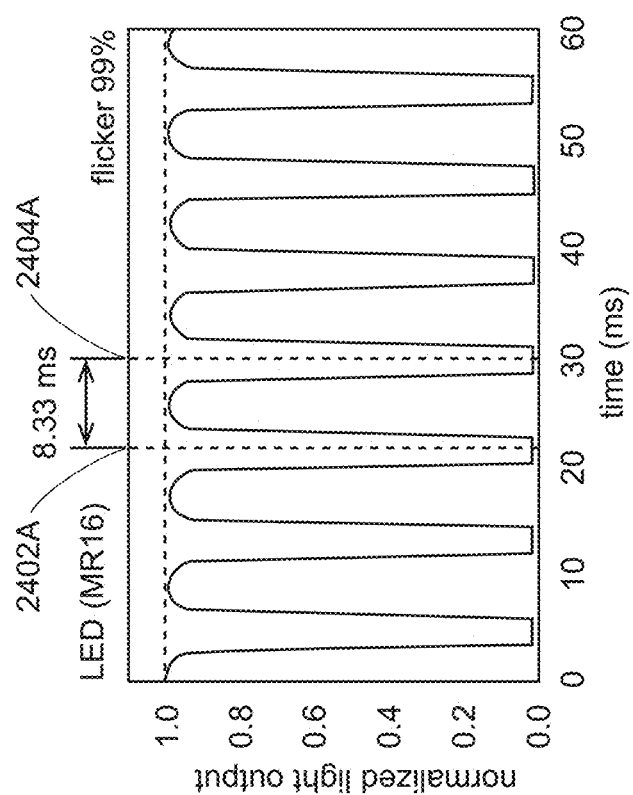

In a further embodiment, the exposure intervals are timed to correspond to preferred positions on the background light waveform. FIGS. 24A and 24B show a waveform of normalized light power for an exemplary background light. In FIGS. 24A and 24B, the camera measures for an 8.33 millisecond exposure in each case, but in FIG. 24A, the samples are taken when the background light is at a level that is low and slowly changing. In contrast, in FIG. 24B, the samples are taken during times when the waveform is rapidly changing. It is likely that there will more variation in the background light level in FIG. 24B than in FIG. 24A because any fluctuation in the background light or in the exposure interval will be magnified in FIG. 24B relative to FIG. 24A. This variation in the background light level will be transformed into a variation in the determined phase.

Figure 25:
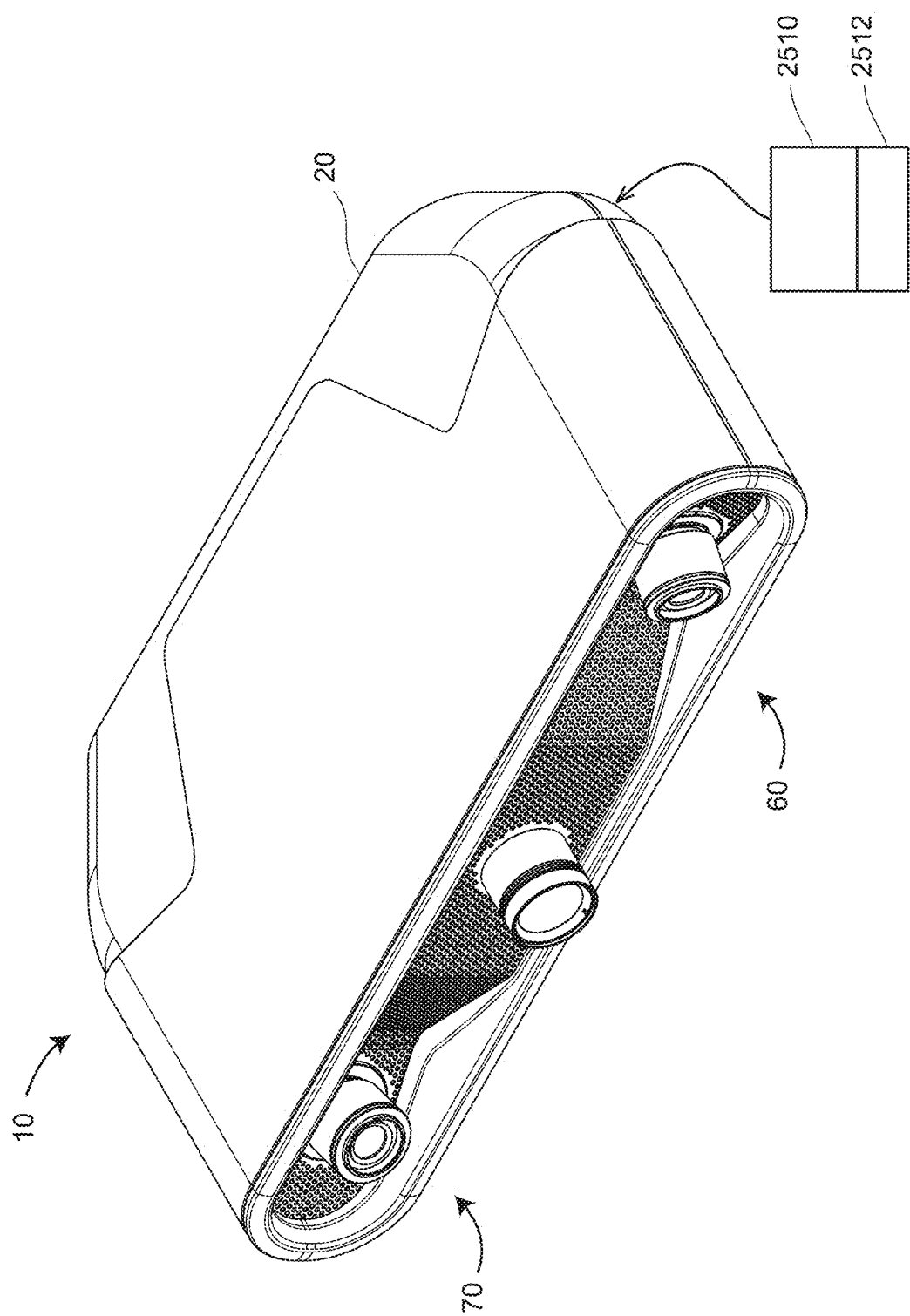
FIG. 25 shows elements that may be added to an exemplary scanner to determine background light as a function of time according to an embodiment.

Two methods are now described for determining optimal starting and stopping times for measurements by the cameras 60 and 70. In both methods, the camera exposure time is selected to be a multiple of half the power line period, which in the examples above is a multiple of 8.33 milliseconds. In a first method, illustrated in FIG. 25, an optical power meter 2510 is used to measure background light as a function of time. These background light levels are used to select those positions on the background light waveforms having the slowest variation in optical power. In an embodiment, an optical bandpass filter 2512 is further added to the optical power meter 2510. In an embodiment, the optical bandpass filter 2512 is similar to the filters provided for the cameras 60 and 70. The optical power readings may be sent from the optical power meter 2510 to the 3D imager 10 over wires or by wireless communication.

Figure 26A:
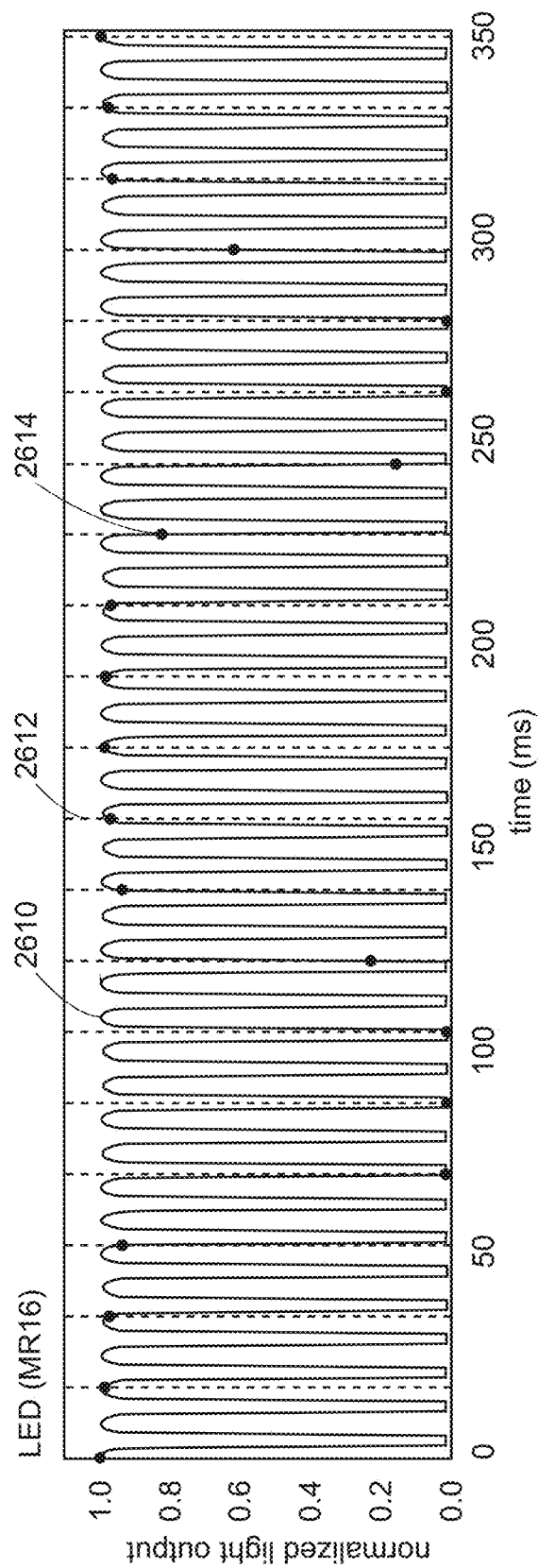
FIGS. 26A and 26B shows how an oversampling method can be used to determine emitted background light as a function of time according to an embodiment.
Figure 26B:
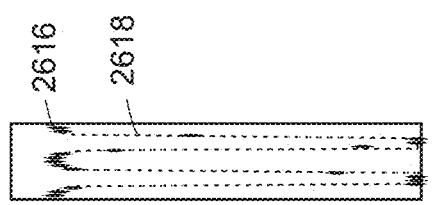

In the second method, illustrated in FIGS. 26A and 26B, one or more of the cameras 60, 70 measure the detected level 2610 of the background light as a function of time using an undersampling method. In FIG. 26A, the waveform 2610 is the background light detected by one of the cameras 60 or 70. The background pattern is that of the MR16-type LED of FIG. 23E. The frequency of the waveform is 120 Hz and the period is 8.33 milliseconds. For the example considered here, the camera has a maximum frame rate of 60 Hz, which gives the camera the ability to sample the waveform 2610 on every other cycle. In an embodiment, to measure different portions of the waveform, the sampling rate is set to five percent below the maximum rate of 60 Hz, which is a factor of 2.1 below the 120 Hz frequency of the background light. The sample times are indicated by the dashed lines 2612, and the sampled values are indicated by the solid dots 2614. In FIG. 26B, the sampled points are shrunk by the factor of 2.1, leaving the scaled sample values 2616. These values are compared to the original waveform 2610 of the background light, which is shown in FIG. 26B by the dashed lines 2618.

For the case in which the maximum sample rate of the camera 60 or 70 is a lower value, say 15 Hz, the procedure is followed as in the preceding paragraph but with every fourth cycle measured rather than every second cycle and with different scaling factors applied in interpreting the results. For the case in which a greater resolution is desired for the reconstructed waveform 2616, the difference in the rate relative to the twice the power line frequency is reduced. For example, in the case above, the sampling rate was set a factor of 2.1 below the 120 Hz frequency of the background light. This resulted in 10 samples per cycle. The sampling rate may for example be set a factor of 2.05 below the 120 Hz of the background light, which results in 20 samples per cycle.

Another potential problem for the 3D imager 10 is vibration. One source of vibration is internal vibrations from the fans 92, 402, 403, and 33 in FIG. 2 and FIG. 4. Vibrations may also come from the environment. One way to reduce vibrations is to detach to the extent possible structural elements that are to be measured from the ancillary elements that may contain vibrating elements or transmit vibrations from the outside. Hence the projector-camera assembly 300 is made to attach securely to a table or instrument stand, but the protective, cosmetic, and ancillary elements such as computing elements, fans, and enclosure are relatively loosely attached to the projector-camera assembly 300 so as to avoid transmitting vibrations and shocks to it. Despite efforts to isolate the projector-camera assembly 300 from the fans, some fan vibrations are transmitted to the fans if they are running. In an embodiment, fans are left running during measurements to stabilize the temperature of the system, for example, to hold the optical output power as constant as possible.

Figure 27:
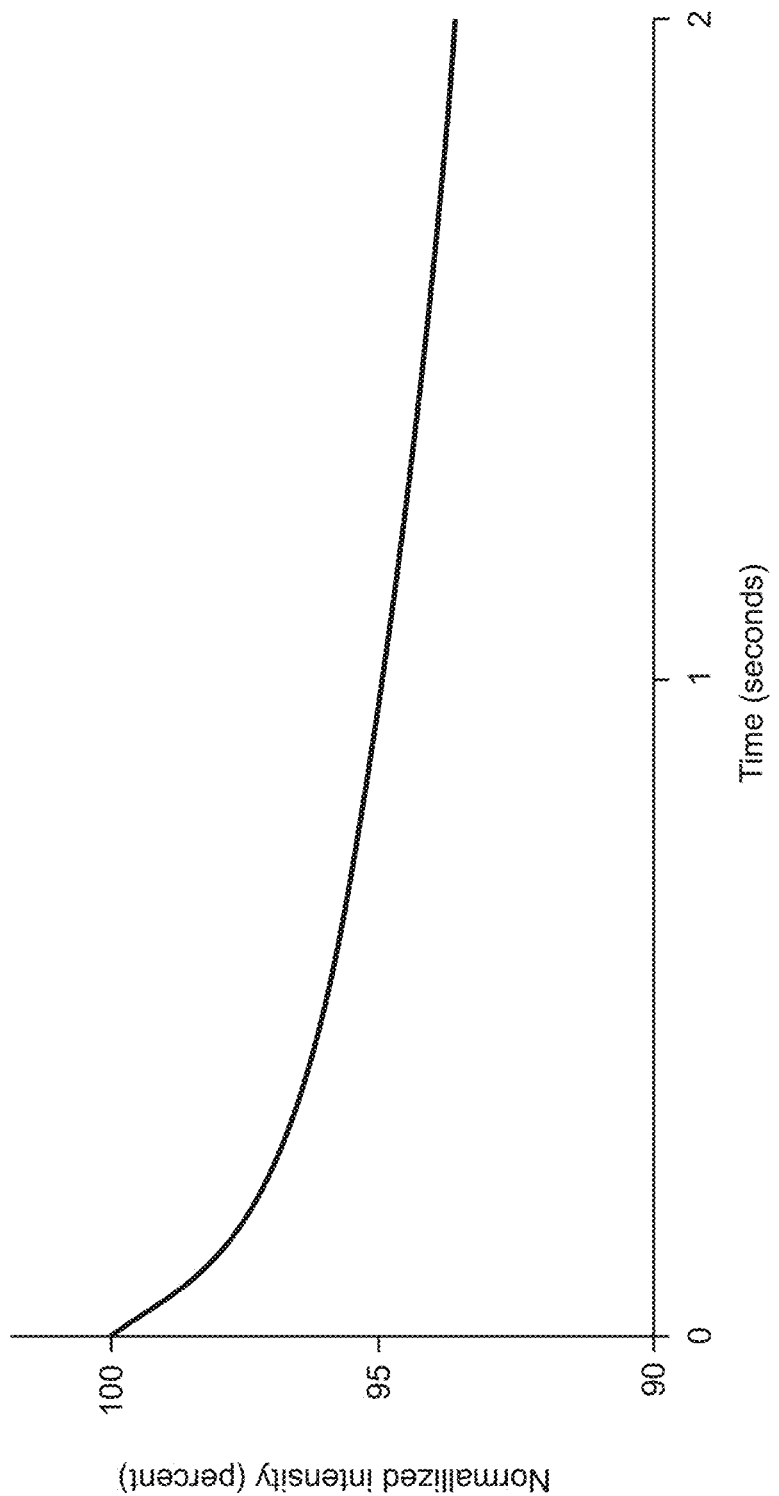
FIG. 27 illustrates the change in projected output power following shutting down of fans according to an embodiment.

In an alternative embodiment, discussed now, fans are turned off during critical portions of a measurement and steps taken to minimize changes in temperature. FIG. 27 shows an exemplary change in normalized intensity (optical output power) resulting from the fans being turned off. The graph shows that in an exemplary system, after fans are turned off, the normalized intensity has dropped to about 95% after one second and to about 93% after two seconds.

Figure 28:
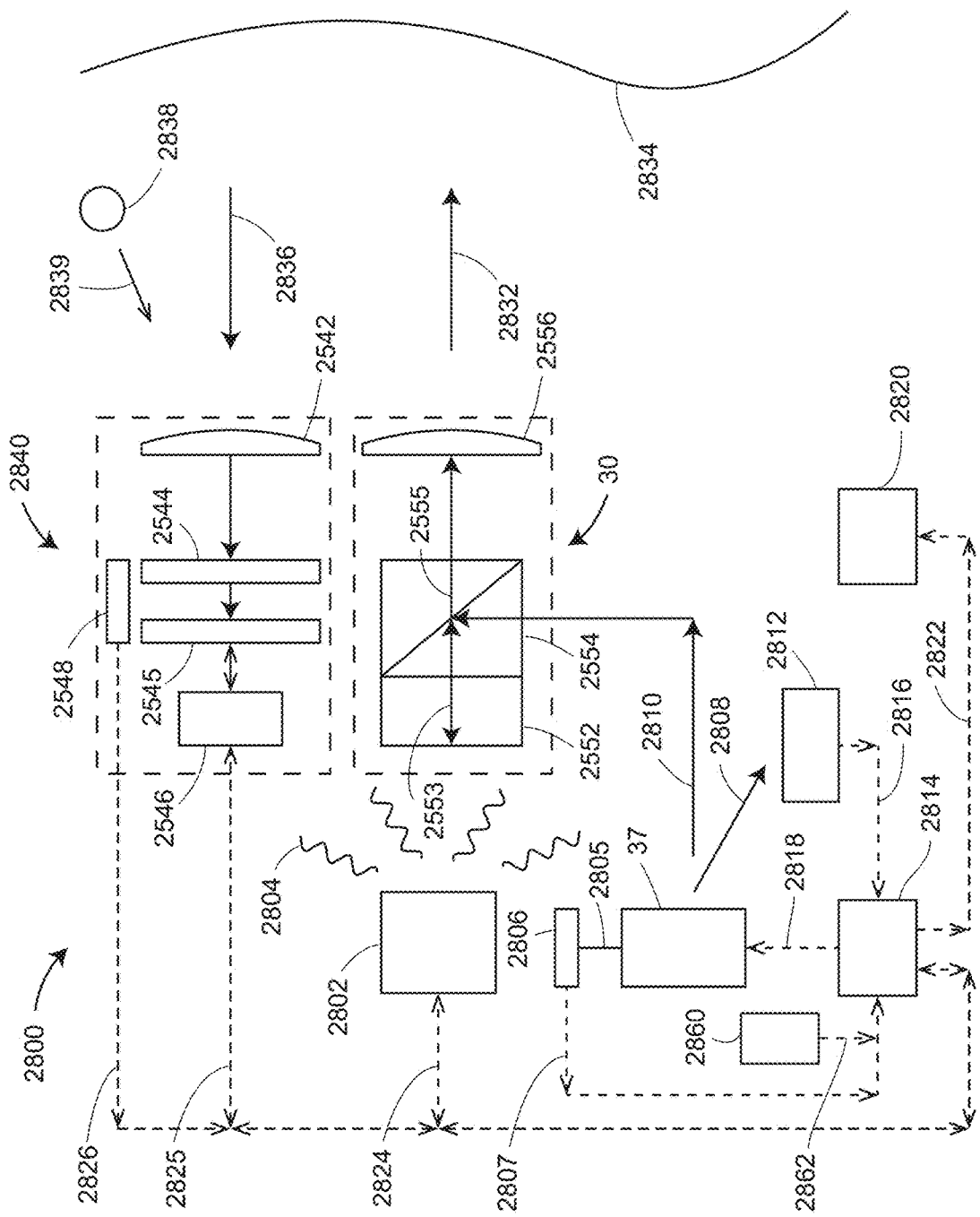
FIG. 28 shows structural elements of a feedback loop according to an embodiment.

FIG. 28 shows a fan 2802 that emits air 2804, the cessation of which is the cause of potential variation in the optical power from the light source 37. To overcome errors that might be caused by variations in the relative intensity (optical power) of the projected light, a feedback loop 2800 illustrated in FIG. 28 may be used. Structural elements of the feedback loop system 2800 include the light source 37, the projector 30, and the camera 2840, which may be the cameras 60 and 70. The light source 37 emits a light 2810 that is redirected by the beam splitter 2554 as light 2553 to the DMD 2552 and then out of the projector as light 2555 through the lens 2556. The projected light pattern 2832 travels to an object 2834 and reflects as light 2836 that is imaged through the camera lens 2542 through an optical bandpass filter 2544 to a photosensitive array 2545 connected to an electrical circuit 2546.

The feedback-loop system 2900A of FIG. 29A is an embodiment of the feedback loop system 2800. In an embodiment, the current applied to the light source 37 is increased to hold the projected optical power constant as temperature changes. An electrical signal 2818 from the feedback controller 2814 is sent to the light source 37 to adjust the optical power. In an embodiment, the light source 37 is an LED and the electrical signal 2818 includes an applied current. The electrical signal 2818 may further include electrical control signals or information signals. In an embodiment, a light considered representative of the output light level from the light source 37 is determined based on an emitted portion of light 2808 (FIG. 28) by a light sensor 2812 within the 3D imager 10. The light sensor might, for example, be a feedback photodiode 2806 on the light source 37 that receives a light 2805 from the light source 37 and sends an electrical signal 2807 to the feedback controller 2814, or the light sensor might be the photodiode 776 (FIG. 7) in the projector. The optical feedback loop may be implemented directly in electronics or be partly based on computations in the feedback controller 2814.

The feedback-loop system 2900B of FIG. 29B is another embodiment of the feedback loop system 2800. In an embodiment, the exposure time for the camera 2840 is increased in response to reduced optical power and vice versa. A signal from a feedback controller 2814 may be sent as an electrical signal 2825 to an electrical circuit 2546 that controls the exposure time of the photosensitive array 2545 within the camera 2840. In an embodiment of the feedback loop 2900B, a first step might be to set the amount of light received by the pixels of the photosensitive array 2545 during the exposure time of the camera. This amount of light might be selected by the operator based on observed images of an illuminated object, for example, or be based on an initial measurement automatically performed by the scanner. In either case, since the quantity of interest is the amount of light received by the pixels, the quantity is proportional to the optical energy received by each pixel or, equivalently, to the number of electrons captured by each pixel well during a camera exposure. In one implementation of the feedback loop 2900B, the determination of whether the desired set point exposure energy is being maintained at a constant level during a succession of phase measurements is made by measuring the optical power, for example with a light sensor such as 2806 or 776 as in control system 2900A. If the optical power is observed to drop, the feedback controller 2814 may send a signal 2825 to camera electronics 2546 to increase the exposure time to maintain the output exposure energy received by the pixels.

In further embodiments, the "light sensor" (e.g., 2806, 776) in FIGS. 29A and 29B may be replaced with a temperature sensor, which might be a temperature sensor 2860 that sends an electrical signal 2862 to the controller 2814, a temperature sensor 2548 that sends an electrical signal 2826 to the controller 2814, or a combination of temperature sensors. In an embodiment, the temperature sensors may include the thermistor temperature sensor 610 of FIG. 6C. In an embodiment, the temperature sensors may include thermistor temperature sensors 782A, 782B, 782C or I$^2$C temperature sensors 786A, 786B, 786C, and 786D. In an embodiment, the current to the light source 37 in feedback loop 2900A or the signal sent to the camera electronics to adjust the camera exposure time are based on the temperature signal. Since the connection between temperature and optical output power is indirect, lookup tables, curves, equations, or similar elements are to determine the expected change in optical power based on the observed change in temperature.

In other embodiments, the measurement by the light sensor in feedback loops 2900A and 2900B may be replaced by an expected change in output power based on a starting temperature of the light source and on the time the fans have been off. Since the connection that relates the off-time of the fans and optical output power from the light source 37 is indirect, lookup tables, curves, equations, or similar elements are may be used to go from the off-time of the fans to the expected change in optical output power. The lookup tables, curves, or equations may be further based on the initial starting temperature of the light source 37.

In still other embodiments, the feedback loops 2900A and 2900B may further include a provision for having the feedback controller 2814 send an electrical signal 2824 to set the speed of the fans 2802 or to turn the fans on or off. In an embodiment, signals 2822 may be provided by the feedback controller 2814 to an external computing device 2820 for use in further compensating measurement results. One type of an unwanted signal is background light 2839 from a background light source 2838. Methods for limiting the effects of such background light are discussed herein above in reference to FIGS. 23-26.

A practical consideration in making measurements with triangulation scanners is the large variation in the amount of reflected light. In one instance, an object may have a relatively high diffuse reflectance (for example, 90% diffuse reflectance) with a Lambertian surface having the same apparent brightness regardless of an observer's angle of observation. In contrast, in one type of extreme case, a surface may have low diffuse reflectance (for example, 1% diffuse reflectance), with a surface that scatters even less light when tilted at a steep angle. Such low reflectance may be seen with dark black or transparent materials, for example. In another type of extreme case, a surface may have a specular reflection when viewed in a particular angle. In many cases, a surface having relatively sharp curve surfaces will have a bright specular reflection known as a "glint" at certain locations seen by a camera. A way is desired to measure surfaces accurately even if the amount of reflected light varies greatly over the surface.

A method for optimizing the optical power projected from each pixel of the DMD is now described. Such an optimization procedure is intended to provide an optimum level of optical power for the pixels on the photosensitive arrays of cameras such as cameras 60 and 70, but without increasing measurement time. FIG. 30A illustrates a situation in which a small region 3020 of a surface 3000, which includes an illuminated spot 3002, is adjusted in optical power level. The pattern in the projected light continues to be shifted in 90 degree increments, as was also the case of FIG. 15, but now the sinusoidal pattern is decreased by a factor of two in the region 3020. The projected light levels 3022, 3024, 3026 and 3028 of the four successive phase-shifted patterns 3012, 3014, 3016, and 3018 have the same relative levels as do the projected light levels 1522, 1524, 1526, and 1528, respectively, of FIG. 15. The pixel of camera 60A and the pixel of camera 70A that captures the image of the point 3020 for the four different phase-shifted cases will, in the absence or noise or systematic errors, determine the same 3D coordinates in the case of FIG. 15 and FIG. 30A.

Figure 30B:
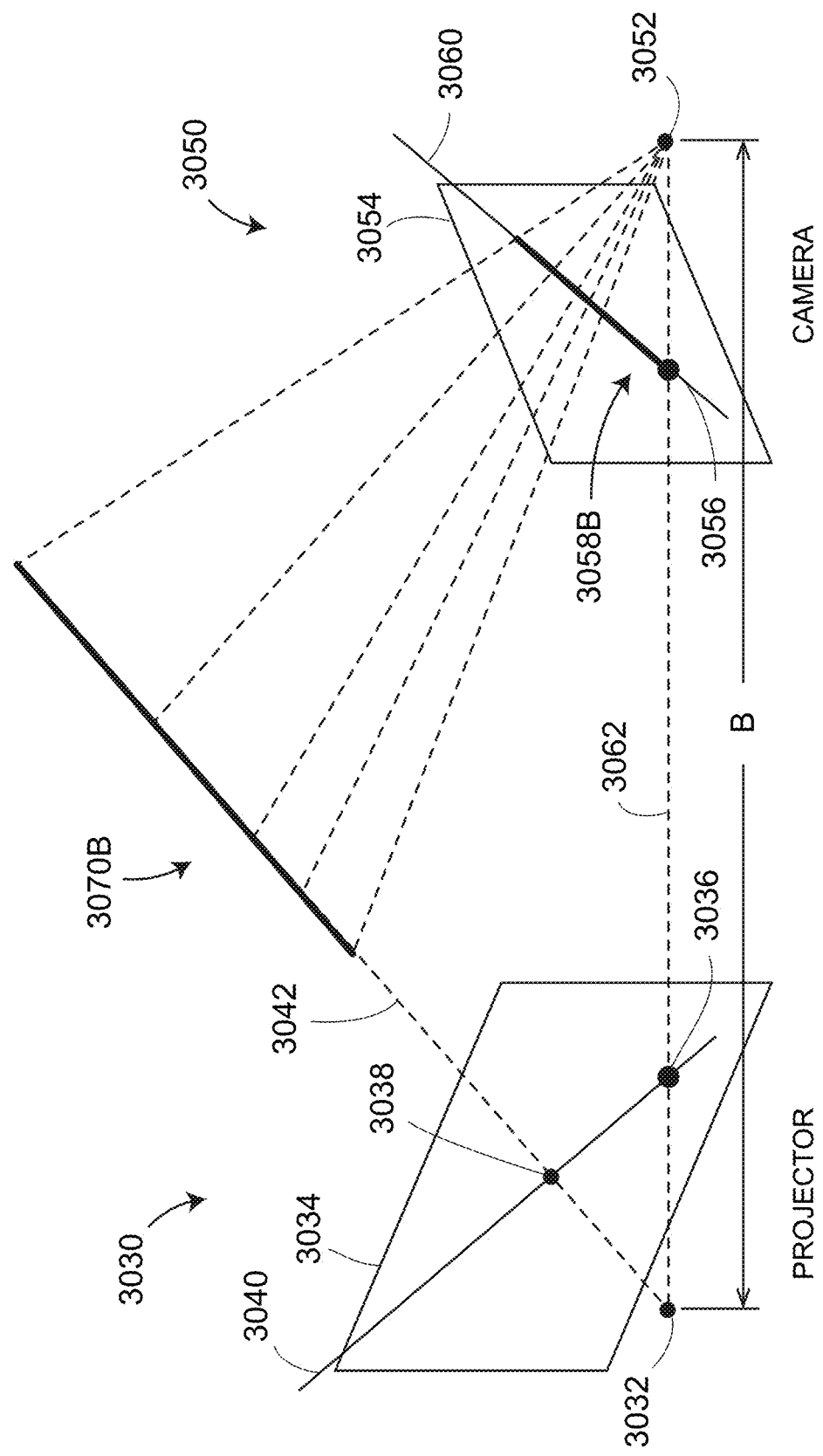

FIG. 30B illustrates a coarse measurement of 3D coordinates on an object surface made by projecting light from a projector point 3038 onto the object and imaging the light reflected from the object with the camera 3050. The projector 3030 includes a perspective center 3032 and a projector reference plane 3034. The concept of a reference plane was discussed herein above in reference to FIG. 12A. The light from the point 3038 projects along a ray 3042. The camera has a perspective center 3052 and a line drawn from the perspective center 3032 to the perspective center 3052 crosses the reference plane 3034 at the projector epipole 3036, and it crosses the reference plane 3054 at the camera epipole 3056. The line on the projector reference plane 3034 that passes through the epipole 3036 and the point 3038 is the projector epipolar line 3040. A straight line 3062 includes the points 3032, 3036, 3056, and 3052. The distance between the perspective centers 3032 and 3052 is the baseline distance B. Since any rays received by the camera pass through the perspective center 3052, it follows that a plane that includes the line 3062 and the projector point 3038 crosses the camera reference plane 3054 in a line 3060, which is the camera epipolar line. Any ray that passes through the camera perspective center 3052 and that also comes from the projected ray 3042 lies on the camera epipolar line 3060.

The measurement of FIG. 30B is an example of a coarse measurement in which the distance from the projector to the target is not very well known. Consequently, the projected ray 3042 may intersect the object at any point along the line segment 3070B. The corresponding line segment on the camera epipolar line 3060 may lie anywhere along the line segment 3058B on the camera reference plane. In an embodiment, the measurement of FIG. 30B is made using a phase-shift method with at least three phase shifts, as discussed above in reference to FIGS. 14 and 15. Following this measurement, the location of the object point intersected by the ray 3042 is localized to a smaller region 3070C of FIG. 30C along the projected ray 3042. The region 3058C on the camera epipolar line 3060 is correspondingly small.

Figure 30C:
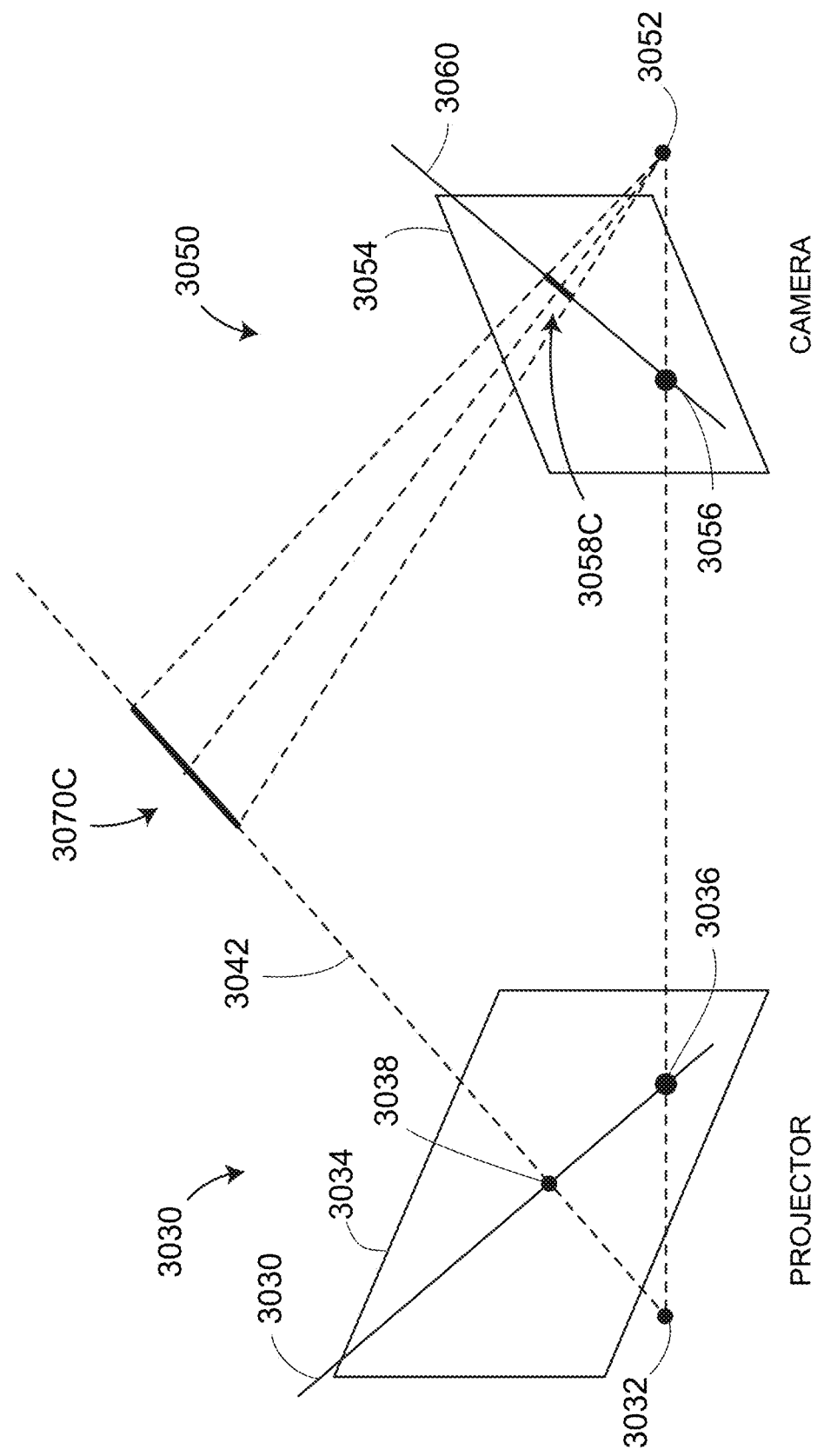

In an embodiment, the measurement of FIG. 30C is made using a phase-shift method with at least three phase shifts. Following this measurement, the location of the object point intersected by the ray 3042 is localized to a smaller region 3070D of FIG. 30D along the projected ray 3042. The region 3058D on the camera epipolar line is correspondingly small. A blowup of the small region 3058D is shown in an inset FIG. 30E.

A method is now described for taking advantage of the information from the camera points on the line segment 3058B to optimize the optical power projected from the projector point 3038 in FIG. 30C and for taking advantage of the information from the camera points on the line segment 3058C to optimize the optical power projected from the projector point 3038 in FIG. 30D. A projector point 3038 might correspond for example to a pixel on an array of a DMD projector 53. In an embodiment, in the coarse measurement of FIG. 30B, the optical power emitted by the projector point 3038 is set according to the expected reflectance characteristics of the object surface. In an embodiment, a coarse projected pattern might be the pattern of FIG. 14A, where the peak of the sine wave corresponds to the highest projected optical power and the trough of the sine wave corresponds to the lowest projected optical power. In an embodiment, there might be four 90 degree phase shifts, with the maximum optical power selected so as to avoid overfilling or saturating the pixels in the camera 3050 in FIG. 30B.

In an embodiment, the multiple phase shifted values projected by the projector 3030 from the point 3038 and read by the camera 3050 are evaluated to determine a range of possible distances to the object, narrowing the possible object points to the line segment 3070C in FIG. 30C. In a procedure, the levels of the signals received by the camera pixels over the line segment 3058C are evaluated to determine the highest received signal level compared to the saturation signal level for the pixels of the camera 3050. Then, prior to projecting the pattern in 30D, the optical power of the projector point 3038 is adjusted to an optimum level. The optimum level is ordinarily set to be as large as possible without saturating or otherwise degrading camera performance. The resulting projected intensity pattern on the object will not in general be a smoothly varying sinusoidal pattern but instead a pattern that is generally sinusoidal but with many local variations in projected optical power—for example, as seen in the region 3020 of FIG. 30A.

In some cases, efforts may be made to identify glints, which are specular reflections that ordinarily appear as bright specks of light in a camera image. Such glints may reflect optical power levels to the camera 3050 much larger than the optical power levels reflected by diffusing scattering surfaces. In these cases, it is usually better adjust the projected optical power level to the level appropriate for the diffusely scattering surfaces. If necessary, an additional measurement may be made at much lower power levels to characterize the glints. For the case of a dual-camera system such as that illustrated in FIGS. 1, 10, and 11, glints will seldom be produce in both cameras for the same part of an object surface. Hence, with a dual-camera system, it is usually possible to avoid problems with glints.

In the method described with respect to FIGS. 30A-30D, the determination of a maximum distance along a portion of an epipolar line was based on sequential projections of sinusoidally phase-shifted light patterns. In other embodiments, other projection patterns may be used. For example, instead of projecting three or more sinusoidally phase-shifted light patterns, as described with respect to FIG. 30B and FIGS. 14A-B, it a range of distances may be determined by projecting a single structured light pattern having coded pattern elements. Likewise, a sequence of light and dark stripes may be projected. Any of these embodiments would give a maximum distance to points along the epipolar line 3060.

FIGS. 31A-D, 32, and 33 illustrate a method for obtaining improved accuracy in determining 3D coordinates of edges through combined use of 3D measured values combined with a two-dimensional (2D) camera image.

In some cases, edges measured by a 3D imager are not sharply determined. Such a problem is encountered, for example, when a single pixel captures a range of distance values, for example, at the edge of a hole. Sometimes the term "mixed pixel" is used to refer to the case in which the distance ascribed to a single pixel on the final 3D image is determined by a plurality of distances to the object. For a mixed pixel, a 3D imager may determine the distance to a point as a simple average of the distances received by the pixel. In general, such simple averages can result in 3D coordinates that are off by a relatively large amount. In some cases, when a mixed pixel covers a wide range of distance values, it may happen that "ambiguity range" is exceeded during a phase shift calculation, resulting in a large error that is difficult to predict.

In accordance with an embodiment, a solution to this issue uses the sharp edges that appear in one or more 2D images of the feature being measured. In many cases, edge features can be clearly seen in 2D images—for example, based on textural shadings. These sharp edges may be determined in coordination with surface coordinates determined using the triangulation methods. By intersecting the projected rays that pass through the perspective center of the lens in the triangulation scanner with the 3D coordinates of the portion of the surface determined to relatively high accuracy by triangulation methods, the 3D coordinates of the edge features may be accurately determined.

Figure 31:
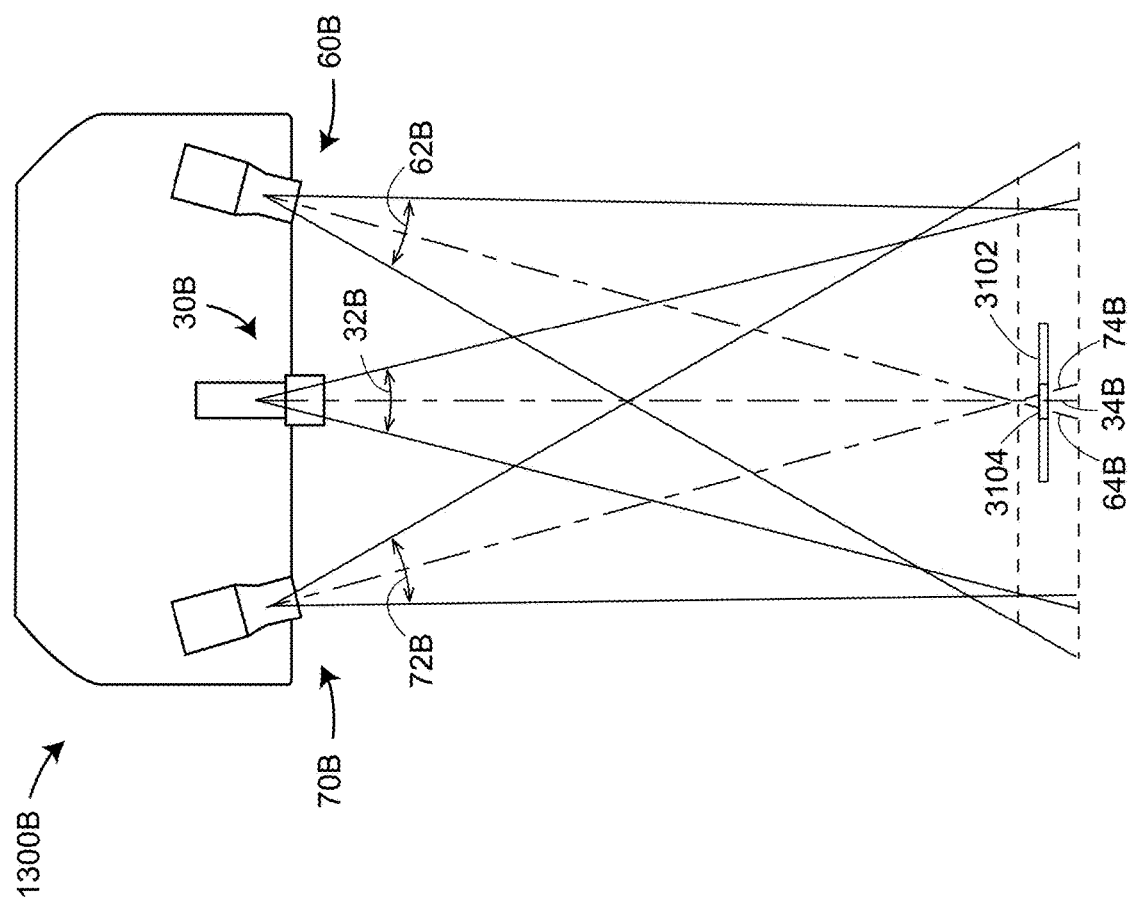
FIG. 31 illustrates measurement of a hole with a 3D imager according to an embodiment.
Figure 32:
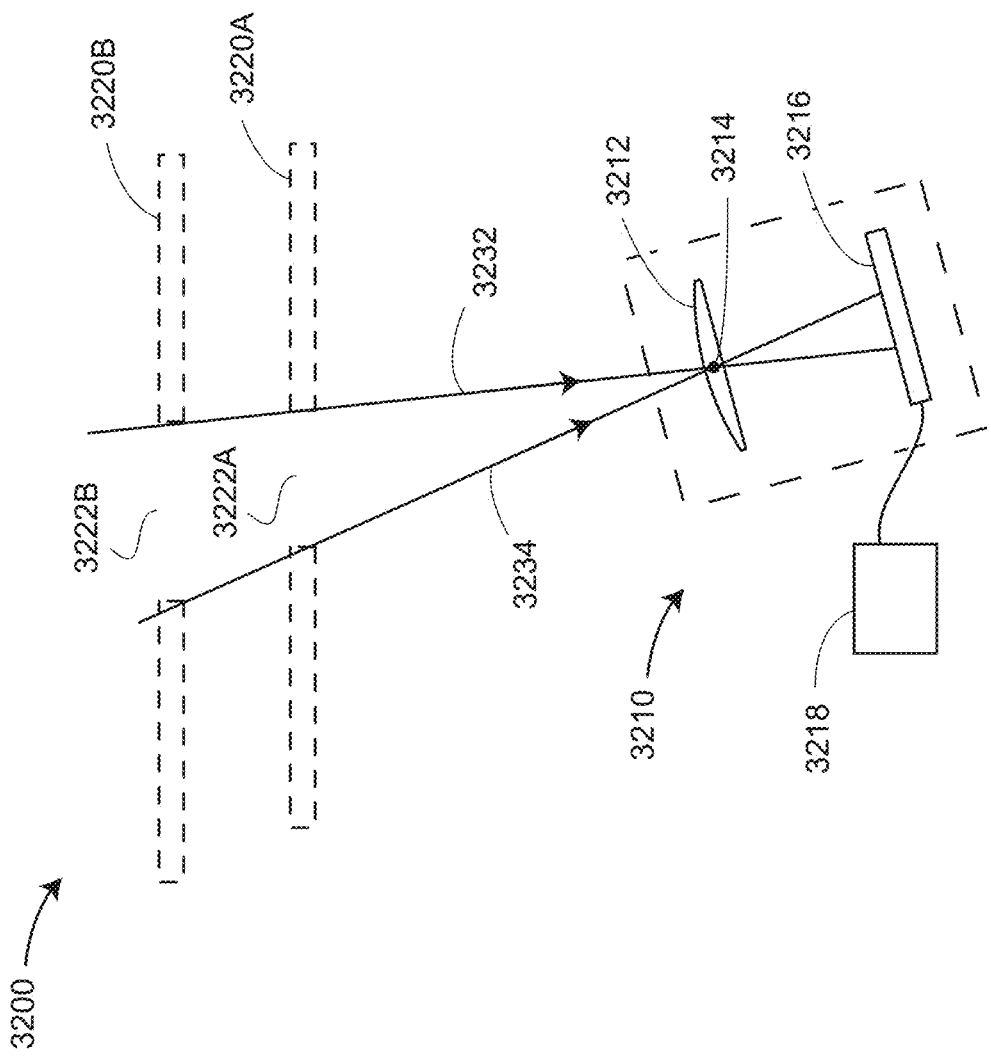
FIG. 32 illustrates how the image size of the imaged hole changes with distance from a scanner camera.
Figure 33:
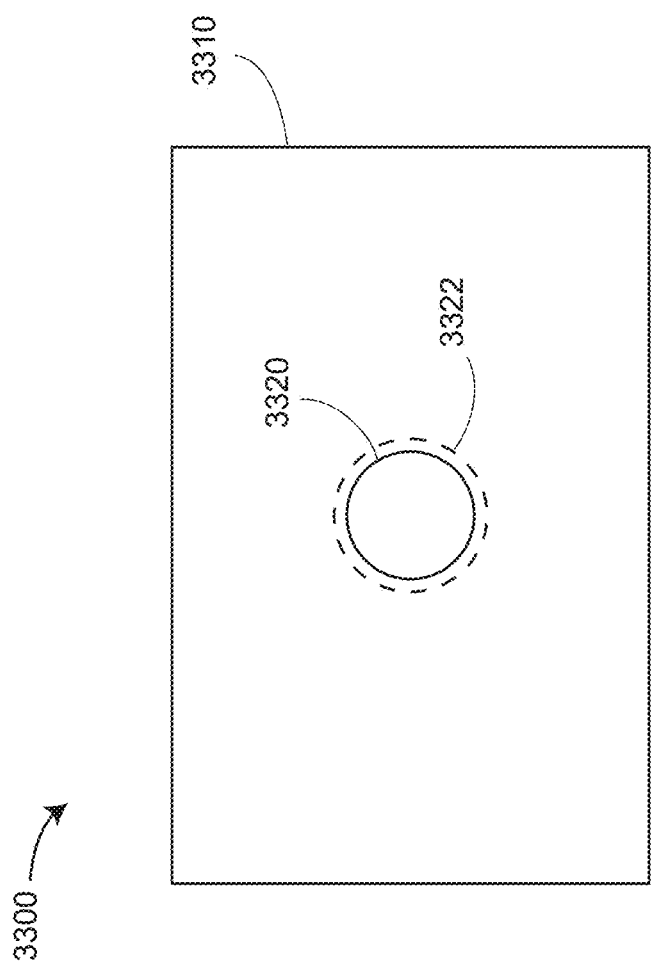
FIG. 33 illustrates how a measured 2D image may be combined with measured 3D points to improve the representation of hole edges according to an embodiment.

With reference made to FIGS. 31, 32, and 33, an example of the procedure described above is explained in more detail for the embodiment having an object 3102 with a hole 3104. The cameras 60B, 70B of triangulation scanner 1300B capture the image of light projected by projector 30B onto the surface of the object 3102 and reflected off the object surface. The reflected rays of light pass through the perspective center of the camera lens onto a photosensitive array within the camera. The photosensitive array sends an electrical signal to an electrical circuit board that includes a processor for processing digital image data. Using methods of triangulation described herein above, the processor determines the 3D coordinates to each point on the object surface.

The 2D image may be from a triangulation camera such as 60B or 70B or from a separate camera. In an embodiment illustrated in FIG. 32, a system 3200 includes a camera 3210 that receives rays of light 3232 and 3234 from the edges of holes in objects. The hole may be a hole 3222A in an object 3220A located relatively close to the camera 3210 or a hole 3222B in an object 3220B located relatively far from the camera 3210. A projector 30 provides light to illuminate the object 3220A or 3220B. In an embodiment, it is known from a priori knowledge that the hole is bored into a relatively flat object. A 3D imager such as the imager 1300B may determine the distance to the object, enabling the system to distinguish between the relatively near object 3220A and the relatively far object. An image of the hole on the photosensitive array 3216 is analyzed by a processor such as the processor 3218 to identify the edges of the hole. A cone is generated when the edges of the hole are mathematically projected from the image plane 3216 through the perspective center 3214 of the camera 3210. The mathematical cone of light expands outward and intersects the plane of the object, which has surface coordinates determined by the 3D imager. In this way a mathematical calculation of the intersection of the plane of the object with the cone projected from the image plane 3216 through the perspective center 3214 provides an accurate shape and diameter of the hole. This method helps to avoid problems from mixed pixels in the 3D measured points near edges, as described herein above.

Referring to FIG. 33, the method may be more clearly understood by considering the example of an object 3300 having a flat region 3310 into which is drilled a hole 3320. A region extends from the edge of hole 3320 to a peripheral boundary 3322 in which there is a relatively high level of uncertainty because of mixed pixel effects or other effects such as edges that not sharp, for example, because of bevels or fillets. In an embodiment, 3D measurements are based entirely on scanner measurements for the region outside 3322. The edges 3320 are determine by an intersection of the projected 2D image (e.g., a projected cone in the case of a hole) with the object surface 3310. The surface characteristics are maintained between the outer circle 3322 and the inner circle 3320. In the case discussed with respect to FIG. 33, the region between the circles 3320 and 3322 is assumed to be flat. In other situations, other assumptions may be made about the shape of the surface between regions such as 3322 and 3320.

In an embodiment illustrated in FIG. 31, two cameras 60B and 70B are used to obtain 3D coordinates by triangulation methods described herein above and also to identify edges in 2D camera images. By projecting edges from each of two or more cameras, an object is seen from multiple directions, thereby reducing the number of hidden features.

One of the challenges faced by manufacturers today is obtaining accurate and detailed measurement over large areas in a minimum cycle time. It is common for example to attach a 3D imager to a robot moved sequentially to measure areas of interest on an object. Such measurements are performed today on automobiles and many other manufactured products. In measurements on a production line, cycle time is of a desired metric, but it is also desired to obtain accurate and high resolution measurements. If 3D measuring instruments are not accurate enough, manufacturers tighten tolerances of components and assembly steps, resulting in increased manufacturing cost. There is a desire therefore for a method that simultaneously enables high measurement speed over large areas with high resolution and high accuracy of measured 3D coordinates. There is also a desire to provide immediate feedback to the operator for the case in which tolerances are not met to determine what remedial steps may be taken.

To obtain high resolution, one approach is to use a 3D imager projector and camera(s) having a relatively small FOV. This strategy is used in the 3D imager 1300B, which includes a projector 30B and cameras 60B, 70B having smaller fields of view than the projector 30A and cameras 60A, 70A of the 3D imager 1300A. Another approach for increasing resolution and accuracy is to increase the number of pixels in the cameras and DMD projector of a 3D imager. This strategy may be seen in the camera lens of FIGS. 21A-C, which is designed for use with a nine megapixel camera in a 3D imager, as compared to the cameras lens 20A-B, which is designed for use with a five megapixel camera in a 3D imager. However, there is a practical limit in how greatly the number of pixels can be increased in camera photosensitive arrays and projector DMDs. This limit occurs in both the expense to buy larger arrays and in the time to process the data from the increased number of pixels.

In an embodiment, a larger FOV is covered by using multiple 3D imagers having output data processed by an external computer. A potential difficulty with this approach is in scalability. How can the projector patterns be projected simultaneously without interference? How much raw data can be transferred from 3D imagers to a central processor without exceeding processor capability? Besides these limits, there is also the question on the amount of programming or setup effort required to seamlessly integrate data from multiple 3D imagers into a single large 3D representation. This is especially true for registering the multiple scans together. Still more off-line processing effort is required to filter the 3D point cloud data to reduce noise and sharpen edges. Additional off-line processing is used to determine whether an object being tested meets its specifications. More off-line processing is used if a user wants to convert registered point-cloud data into mesh or octree format.

Apparatus and methods are now described for overcoming these limitations to enable 3D data to be collected over large areas with high resolution and high accuracy with a minimum of programming or setup effort on the part of the user. These include apparatus and methods for seamlessly registering multiple data sets, filtering the data, comparing the data to object specifications, and converting the data into formats desired by the user such as mesh or octree. Methods are also given for expediting remedial action when manufacturing tolerances are not met.

Figure 34A:
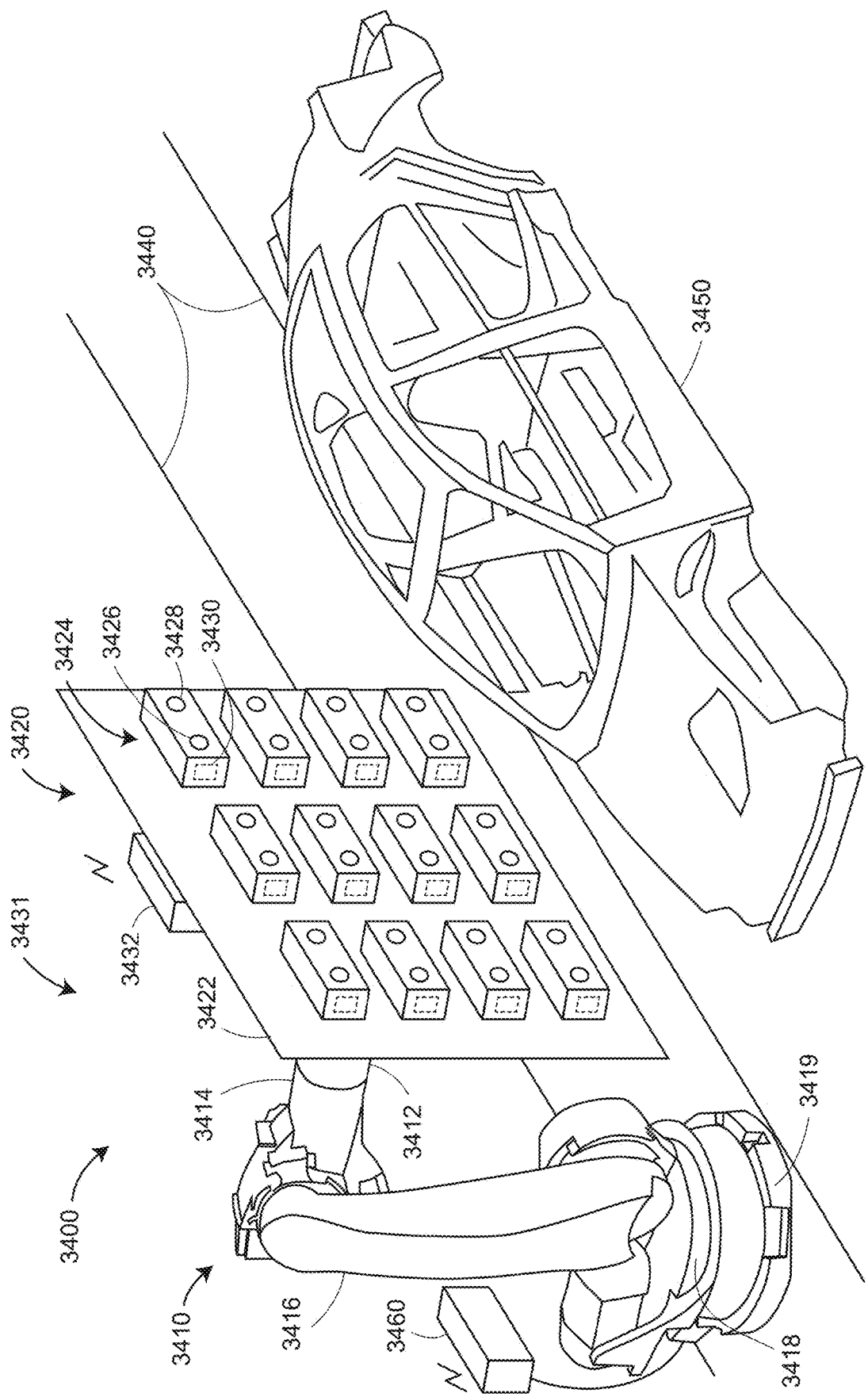
FIG. 34A is a perspective view of a bank of 3D imagers attached to a robot for measurement of an object according to an embodiment.

FIG. 34A illustrates a system 3400 for measuring a large object, the measuring performed relatively quickly with relatively high resolution and accuracy. The system 3400 includes a mover 3410 and a 3D measuring assembly 3420. In an embodiment the large object 3450 is an automobile body-in-white (BiW). In an embodiment, the mover 3410 is a robot that includes a robot end effector (not visible in FIG. 34A), a wrist mechanism 3412, a forearm mechanism 3414, an upper-arm mechanism 3416, a rotation stage 3418, and a base 3419. The robot 3410 in FIG. 34A provides movement over five degrees of freedom, but a robot or other mover may have more or fewer degrees of freedom of movement. In an embodiment, the robot is mounted on a mechanism 3440 that provides lateral movement for the entire robot assembly 3410. Other types of movers 3410 may be used, including Cartesian CMMs such as gantry CMMs and a self-propelled mobile stands such as described further herein below. In other embodiments discussed herein below, the 3D measuring assembly 3420 is fixed on a stationary structure and the object 3450 is moved, for example, by a conveyor belt.

The 3D measuring assembly 3420 includes a mounting frame 3422 to which are attached a plurality of 3D imagers 3424. In some embodiments, each of the 3D imagers 3424 in the plurality of 3D imagers has the same characteristics, for example, the same fields of view for the projector and camera(s) and the same camera-projector baseline(s). In other embodiments, each 3D imager from among the plurality of 3D imagers has distinct differences, for example, different fields of view, with each 3D imager 3424 configured to work synergistically with the other 3D imagers 3424. In an embodiment, each 3D imager 3424 includes a projector 3426, a camera 3428, and a processor 3430. Any type of 3D imager may be used. The projector 3426 and the camera (s) 3428 may be similar to or different from those of 3D imagers described herein above with respect to earlier figures. The type of projected pattern and processing may be of any type—for example, phase-shift patterns projected over an area, coded single-shot patterns projected over an area, line patterns scanned over an area, or points scanned rapidly over an area. The processor 3430 in each scanner is configured to determine 3D coordinates of points on the object 3450. The points determined by the processor 3430 correspond to a region jointly illuminated by the projector 3426 and imaged by the camera 3428. Another way of expressing this idea is to say that the processor 3430 in each scanner determines a point cloud within a frame of reference of the 3D imager that includes the processor, the point cloud being defined as a collection of 3D coordinates. In an embodiment, the processor 3430 within each scanner may include a plurality of processing elements such as the processing elements of the internal electrical system 700 of FIG. 7. In an embodiment, the processing elements include a main processor such as the processor 750 of FIG. 7, which in an embodiment is the NUC processor by Intel.

In an embodiment, each processor 3430 of a 3D imager 3424 is configured to determine a point cloud if 3D coordinates of the object surface and to send this information to a system controller 3431, which may include a computing unit 3432 coupled to the mounting frame 3422, an external computer 3460, a collection of networked computer configured to cooperate in parallel computations, or any other combination of computing elements. Communication among computing elements of the system controller and communications among 3D imagers 3424 and the system controller may be carried out by a wired or wireless communications medium. In an embodiment, the system controller may include one or more of the computing elements 810, 820, and the network of computing elements 830, commonly referred to as the "cloud" or distributed computing, as illustrated in FIG. 8. In an embodiment, each of the processors 3430 of a 3D imager 3424 sends the point cloud of 3D coordinates determined for its scanned region along with its position and orientation on the mounting frame 3422 to a system controller 3431.

The system controller 3431 may include processor 3432 attached to the mounting frame 3422, a separate computer 3460, a collection of computing elements networked together and possibly performing methods described herein in parallel, or any combination of these. The system controller 3431 registers together the point cloud data provided by the collection of 3D scanners 3424 in the 3D measuring assembly 3420. In an embodiment, the system controller 3431 may also direct or initiate the actions of the mover 3410, which in the example of FIG. 34A controls the movement mechanisms of the robot arm. To register together the multiple point cloud coordinate data provided by the collection of 3D imagers 3424, the pose of each 3D imager may be determined within a first frame of reference tied to 3D measuring assembly 3420, or equivalently to the mounting frame 3422. The pose of each 3D imager in the first frame of reference may be determined in a variety of ways. In an embodiment, the system controller 3431 may include, or be operably coupled to a remote computing device that includes, executable computer instructions that enables a user to select reference (fiducial) targets to be measured by the collection of 3D imagers. By comparing the 3D coordinates of the targets as measured by each of the 3D imagers, the pose of each 3D imager can be determined with the first frame of reference. This is discussed further in regard to FIGS. 44-46.

In a further embodiment, the system controller 3431 processes the 3D point cloud data provided by the processors 3430 to filter the 3D point cloud data, to compare measured features to specifications, and to obtain a mesh or an octree representation from the registered data. In some embodiments, immediate feedback may be provided to the user by projecting information directly from the 3D measuring assembly 3430 onto the measured object as projected patterns or alphanumeric characters. Such projected information may be especially useful when an object fails to meet its specifications. Such projection of information is discussed further herein below.

Figure 34B:
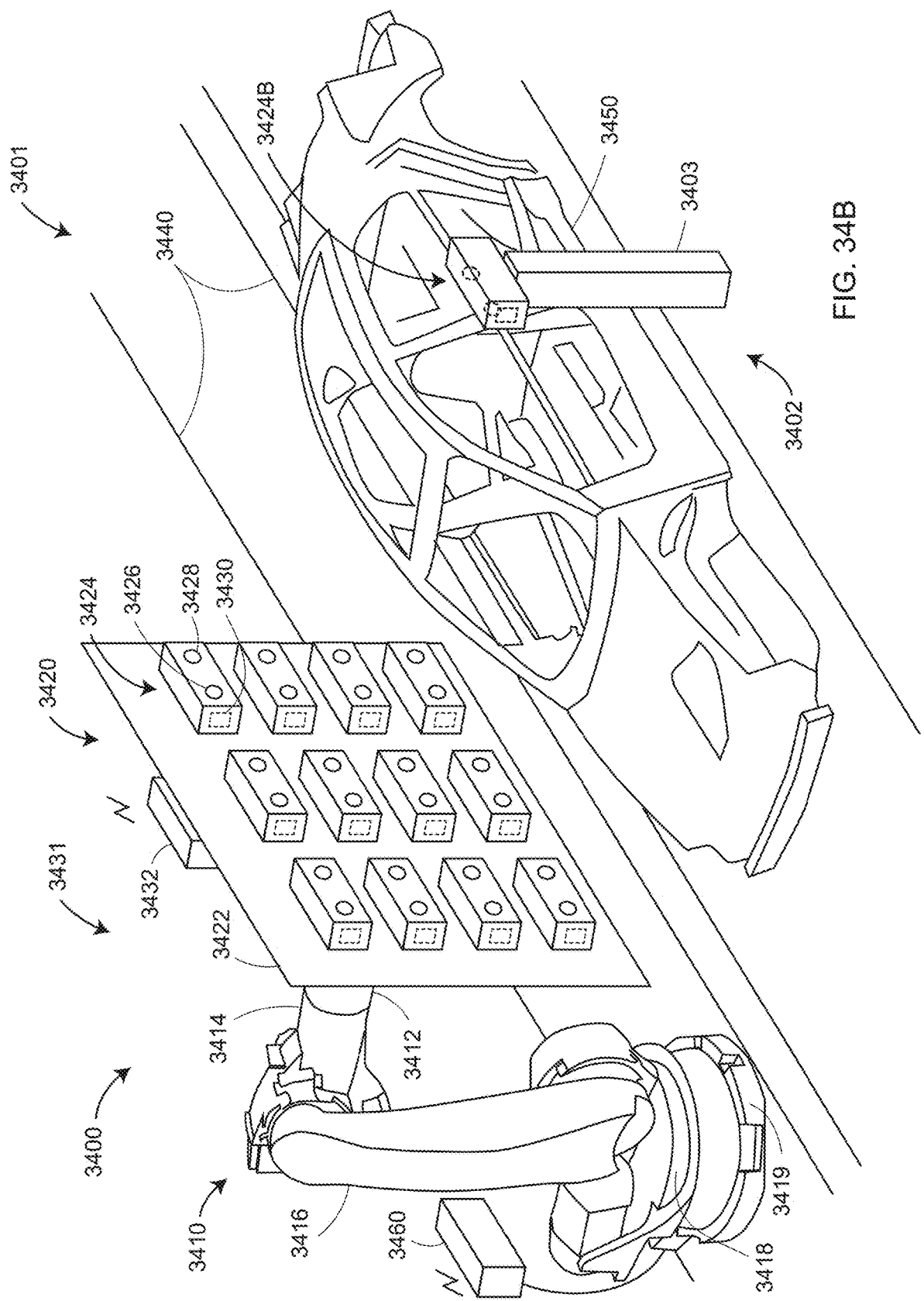
FIG. 34B is a perspective view of a first set of 3D imagers and a second set of 3D imagers measuring an object according to an embodiment.

In an embodiment illustrated in FIG. 34B, the 3D measuring device 3401 includes a first set of 3D imagers 3424 in a first assembly 3400 as well as a second set of 3D imagers 3424B in a second assembly 3402. In the example shown, the second set of 3D imagers includes just a single 3D imager. In the first assembly 3400 the first set of 3D imagers are coupled to a first mounting frame 3422, and the second set of 3D imagers is coupled to a second mounting frame 3403. Such an arrangement may enable measurement on two sides of an object.

Figure 34C:
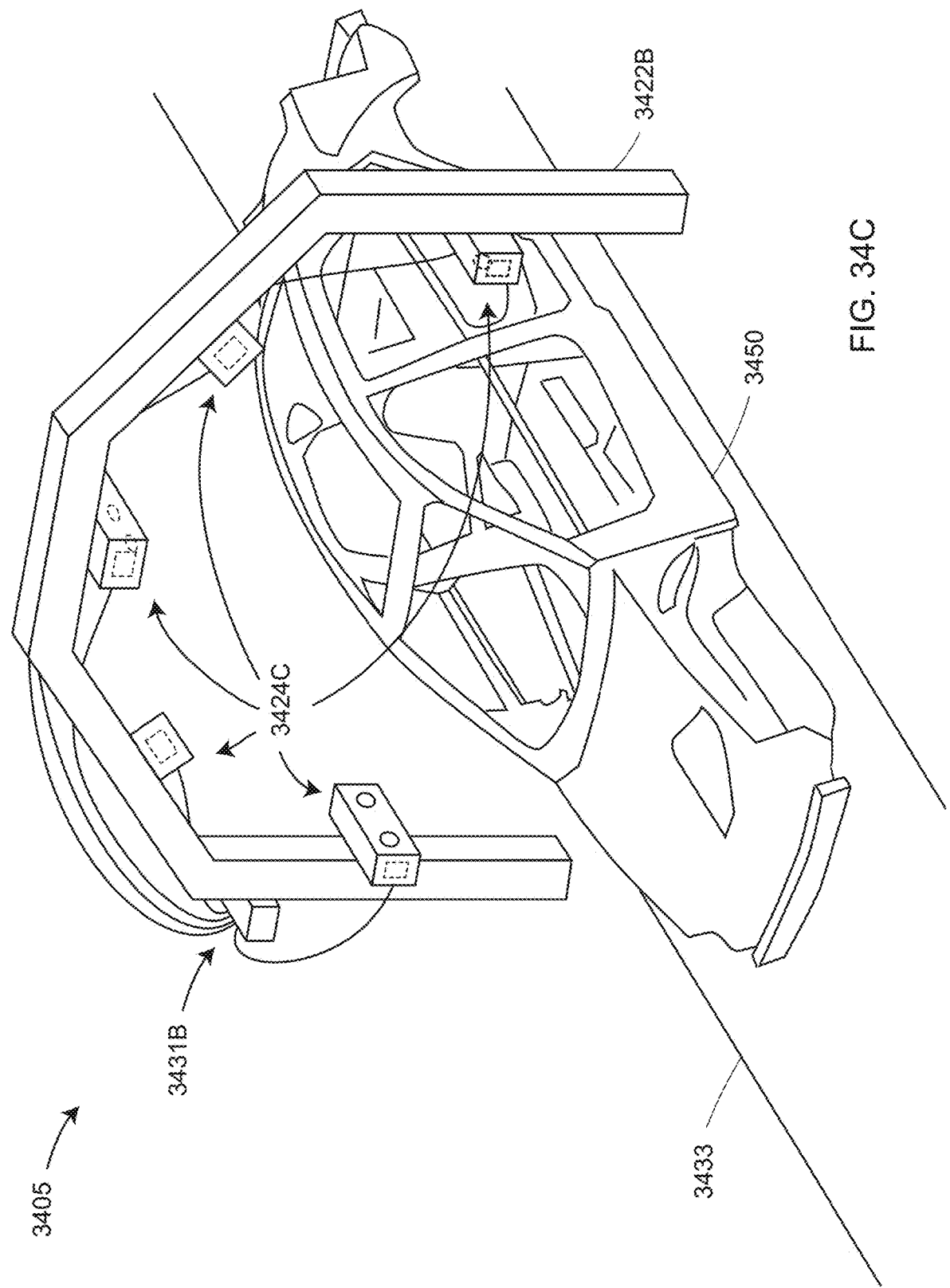
FIG. 34C is a perspective view of a bank of 3D imagers attached to a stationary mounting frame that measures an object on a conveyor according to an embodiment.

In an embodiment illustrated in FIG. 34C, a 3D measuring assembly 3405 includes a mounting frame 3422B to which are attached a plurality of 3D imagers 3424C. The mounting frame 3422B is configured to permit a first set of 3D imagers that include the 3D imagers 3422C to measure the object 3450 from multiple different directions. The 3D coordinates of the object 3450 are combined into a common frame of reference by the system controller 3431B, which in an embodiment may be attached to the mounting frame 3422B. In other embodiments, the system controller may be an external computer or a plurality of networked computers. In the embodiment of FIG. 34C, the mounting frame 3422B is stationary within a factory or work area, and the object 3450 is moved along by a conveyor belt 3450.

FIG. 35 shows a setup for performing a calibration (compensation) procedure by the 3D measuring assembly 3420. This calibration procedure enables determination of mutual registration information for each of the 3D imagers 3424 on the mounting frame 3422. Such registration information might take the form of position and orientation for each of the 3D imagers 3424 relative to a frame of reference of the mounting frame 3422. The calibration procedure may also enable compensation of extrinsic and intrinsic parameters of the 3D imagers 3424 such as baseline distances, camera orientations, projector orientations, camera aberration correction values or parameters, and projector aberration correction values or parameters.

In an embodiment, the calibration procedure is performed by imaging a pattern of spots or other patterns on a calibration frame 3500 by the cameras 3428. In an embodiment illustrated in FIG. 35, the calibration frame 3500 includes one or more reference lengths 3510A, 3510B and a calibration target plate 3520. The reference length 3510A includes a support member 3512A, a first reference (fiducial) target 3514A, and a second reference (fiducial) target 3515A. In an embodiment, the support member is made of a material having a low coefficient of thermal expansion (CTE). Examples of such low-CTE material include low-CTE carbon-fiber composite, Invar™, and Super Invar™. Invar™ and Super Invar™ being manufactured by Aperam Alloys of Imphy France. Carbon-fiber composites can be manufactured to have low CTEs, which might be either positive or negative. For example, carbon-fiber composites may have a CTE between $-0.1\times10^{-6}/°$ C. and $+0.1\times10^{-6}/°$ C. within a humidity controlled environment. A carbon-fiber composite support member 3515A having a CTE of $-0.1\times10^{-6}/°$ C. decreases in length by 0.1 µm for every one meter of its length and for every one degree Celsius increase in its temperature. Invar™ and Super Invar™ are examples of metal alloys having low CTE. A common Invar™ alloy is Invar™ 36, which includes 64% iron and 36% nickel. Super Invar™ includes 63% iron, 32% nickel, and 5% cobalt. The CTE of Invar™ is usually between $+0.5\times10^{-6}/°$ C. and $+2.0\times10^{-6}/°$ C. The CTE of Super Invar™ is usually between $+0.3\times10^{-6}/°$ C. and $+1.0\times10^{-6}/°$ C. An alternative approach to making the support member 3510A out of a low-CTE material is to measure the temperature of the support member with a temperature sensor 3518 connected to a temperature meter 3519. A correction value is then applied to the calibrated length (provided by a calibration laboratory) to account for any expansion or shrinkage in the reference length 3510A. It is common metrology practice to reference lengths at 20° C. Hence a calibration lab might provide a length for the reference artifact at 20° C. To obtain a corrected length that accounts for the temperature measured with the temperature sensor, a correction value is obtained by taking the difference in the measured temperature from 20° C. and multiplying this value by the length of the support member 3515A and by the CTE of the support member 3515A. Using the temperature correction method, it may be possible to use a support member having a higher CTE than would otherwise be possible. For example, the support member 3515A might be made of steel having a CTE of $+11.5\times10^{-6}/°$ C.

In an embodiment, the first reference target 3514A and the second reference target 3515A each include a carrier and a feature. The carrier holds the feature, which is visible to the cameras 3428. The reference targets 3514A, 3515A are attached to the support member 3512A. According to embodiments, FIGS. 35B and 35C are insets showing possible reference target 3532 and reference target 3434, respectively. Each of the reference targets includes a carrier 3513. The carrier 3513 as shown has a circular outline, but the carrier may take any shape—for example, a rectangular block. In the embodiment of 3532, the reference target includes a reflective spot 3516, which might be a round photogrammetric target, for example. In this case, a uniform patch of light might be sent from one or more of the projectors 3426 to illuminate the photogrammetric target. In the embodiment of FIG. 3434, the visible feature is an illuminated point of light 3517, for example, an illuminated LED. In another embodiment, the visible feature has a shape more complex than a circle or a point. All of the descriptions given for reference length 3510A are also applicable to reference length 3510B and its component parts.

In an embodiment, the carrier 3513 is made of a low-CTE material. In another embodiment, the carrier is made of a relatively high-CTE material such as aluminum or steel. In an embodiment, a temperature sensor 3518 is attached to the carrier 3513 on one end and to a temperature meter 3519 on the other end. Readings from the temperature meter are used by the processors 3430 or by other processors to correct for thermal expansion of the carrier 3513.

In an embodiment, the calibration target plate 3520 includes a plate 3522 and a collection of marks 3524. In an embodiment, the plate 3522 is made of a low-CTE material such as carbon-fiber composite. In another embodiment, the plate is made of a metallic material such as aluminum or aluminum honeycomb. In an embodiment, a temperature sensor 3518 is attached to the plate 3522 on one end and to a temperature meter 3519 on the other end. Readings from the temperature meter may be used by the processors 3430 or by other processors to correct the positions of the marks 3524 to account for thermal expansion of the plate 3522.

In an embodiment, the collection of marks 3524 includes a plurality of round reflective dots. In another embodiment, the collection of marks includes a plurality of illuminated points, which might be LEDs, for example. In other embodiments, other types of marks may be used. In an embodiment, the marks are not located in a precisely regular pattern but are spaced non-uniformly to ensure that each 3D imager 3524 responds correctly to different spatial frequencies. It is generally necessary to obtain calibration/compensation parameters to correct lens aberrations for both the camera lenses and the projector lenses. The position of each mark 3524 in the pattern of marks is known ahead of time through accurate measurement. If the pattern of marks includes reflective dots, the dots may be uniformly illuminated and viewed by the cameras 3428 to determine camera aberration coefficients. The projector may likewise project patterns of light onto the plurality of marks 3522 and the resulting pattern evaluated to determine the aberration coefficients of the lens in the projector 3426. In other embodiments, lens aberration coefficients may be further based on illuminated points of light, for example, from LEDs located on or off the plate 3522. In an embodiment, the relative position and orientation of the calibration target plate 3520 is moved to a plurality of positions and orientations relative to the 3D measuring assembly 3420 to more accurately determine the calibration/compensation parameters.

In some embodiments, reference lengths such as 3510A and 3510B may be omitted and the stability of the calibration target plate relied upon to provide acceptable calibration. In an embodiment, the calibration plate 3520 is not large enough to be viewed by all of the 3D imagers at the same time. In this case, the mover 3410 may move the plurality of cameras 3428 to different positions to enable measurement of the collection of marks 3424 to be viewed by each of the cameras 3428. Registration of the images obtained by the cameras 3428 may be obtained directly by comparison of overlapped images. Registration may be further enhanced with the assistance of an external registering device such as a laser tracker, as discussed further herein below. Registration may also be enabled using wide FOV cameras in combination with stable reference markers located off the registration plate.

Figure 41:
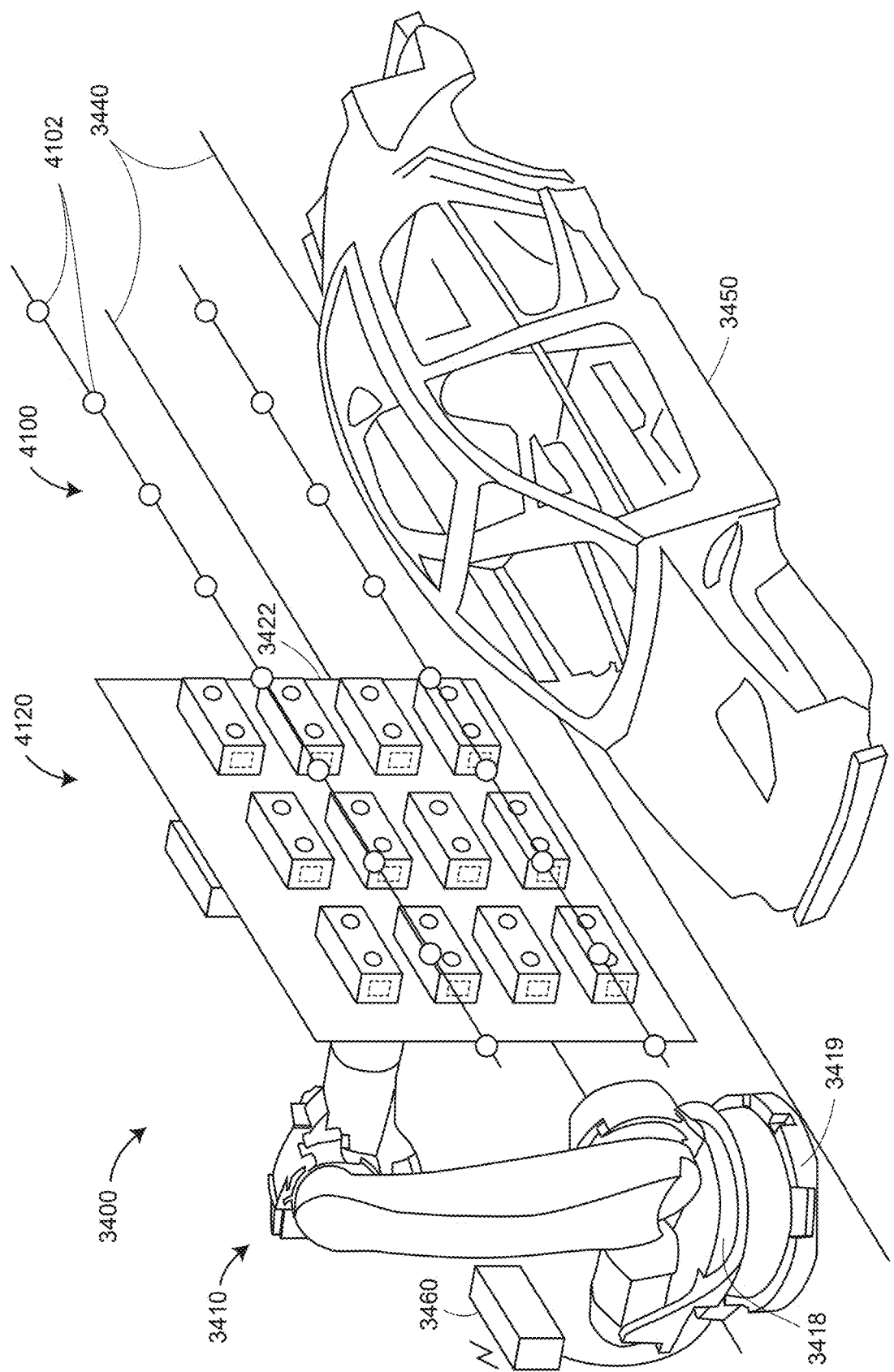
FIG. 41 illustrates inclusion of a collection of fixed reference targets in an environment.
Figure 42:
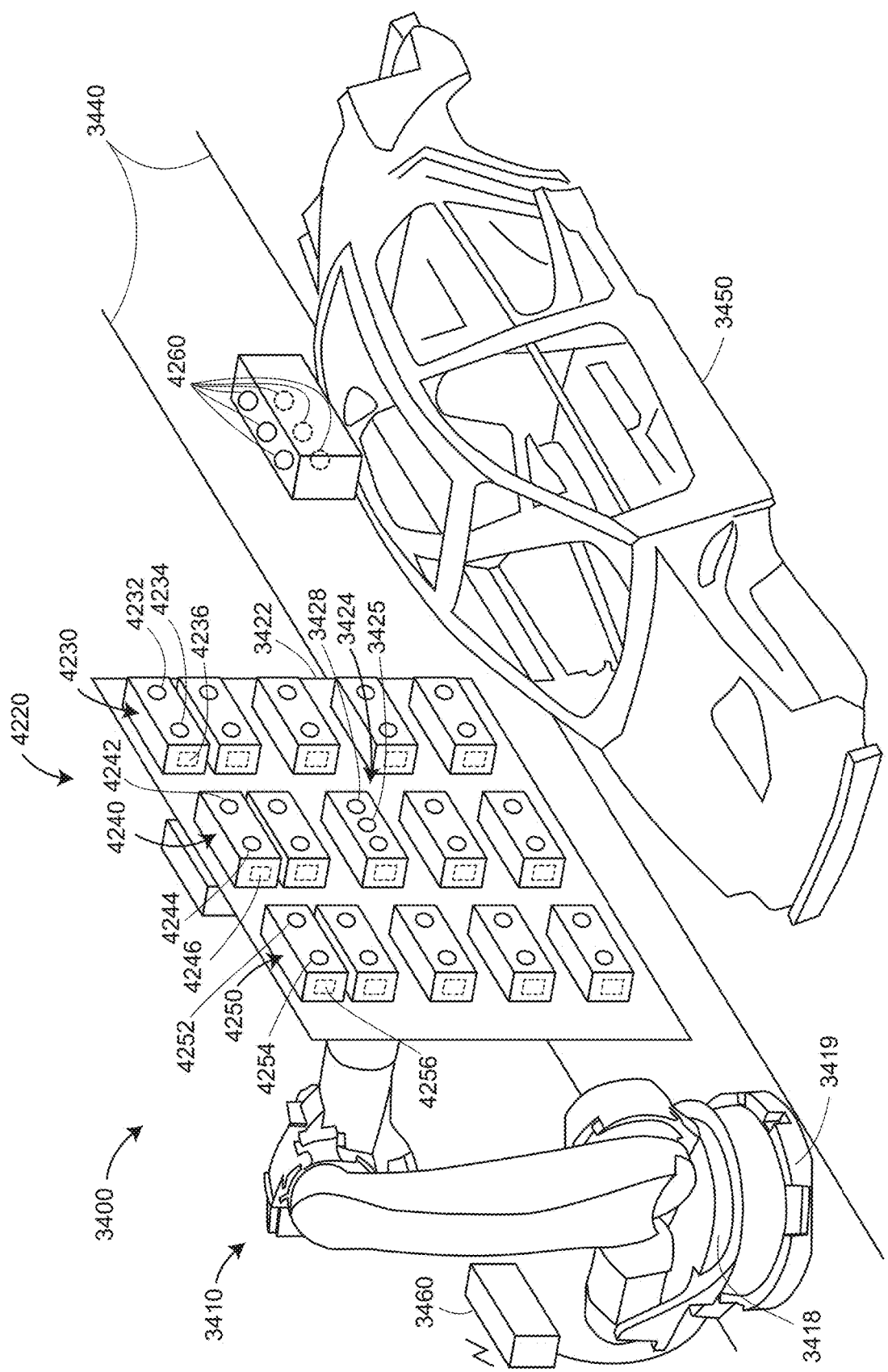
FIG. 42 illustrates inclusion of a wide-FOV registration camera, a color camera, and an information projector according to an embodiment.

In some embodiments, a collection of reference (fiducial) targets may be placed at multiple locations relative to the 3D measuring assembly 3420. As explained herein below in reference to FIGS. 44-46, fiducial targets to be measured by the 3D measuring assembly may be selected through a user interface and the 3D coordinates of fiducial targets displayed in a user interface in software accessed by the system controller 3431 or 3431B. Examples of such fiducial targets are shown in FIGS. 35, 41, and FIG. 42. In an embodiment, the fiducial targets include retroreflectors that are measured by a device such as a laser tracker to determine the 3D coordinates of the retroreflectors. In an embodiment, these retroreflectors are illuminated by the projectors of the 3D imagers and imaged by the cameras of the 3D imagers.

To capture all portions of a large area, the 3D imagers 3424 illuminate and image overlapping regions of an object-under-test 3450. The situation is illustrated in sequences 3600A, 3600B, 3600C, and 3600D in FIGS. 36A-D. In an embodiment, the plurality of 3D imagers 3424 in an arrangement 3610 provides four different patterns of illumination and imaging: 3612, 3614, 3616, and 3618. The dashed boxes of patterns 3612, 3614, 3616, and 3618 represent the covered illumination/imaging area as seen on a flat object. As shown in FIGS. 36A-D, avoiding overlap in the projection patterns eliminates potential problems with interference in the measured 3D coordinates. In particular, for a given 3D imager that projects a patterned light onto an object and images that projected patterned light, it is desired that it is not at the same time (i.e. simultaneously) imaging a patterned light projected by another 3D imager. Such an imaging of multiple patterns at an instant in time may produce errors in the determined 3D coordinates. It is for this reason that a 2D array of 3D imagers 2424 (the arrangement 3610) as illustrated in FIG. 34 and FIG. 36A-36D are advantageously imaged in a four-step sequence as illustrated in FIGS. 36A-36D.

In addition, although FIGS. 36A-36D shows the arrangement 3610 of twelve 3D imagers 3424, it can be seen that four projector patterns of FIGS. 36A-36D may be extended to an arbitrarily large number of 3D imagers 3424. Hence the method described herein is scalable to any number of 3D imagers 3424. It should be appreciated that an extensible approach is also possible with illumination/imaging patterns other than those of 3612, 3614, 3616, and 3618. The 3D imagers 3424 may have different fields of view, for example, or a non-rectangular arrangement. There may be fewer or more 3D imagers 3424. Other sequential patterns besides those of FIGS. 36A-36D are also possible that avoid problems with overlap of projected light.

An example is now given of an exemplary sequence of projector and camera actions interleaved with processing of data. In an example, suppose that an object having a relatively high diffuse reflectance requires an illumination and exposure of 10 milliseconds. Further suppose that the camera 3428 has a maximum frame rate of 15 Hertz and a pixel readout time of 81 milliseconds. Further suppose that the voltage mains powers the background lights at a line frequency of 60 Hz, with the lights fluctuating periodically at a period of half the reciprocal of the line frequency, or 8.33 milliseconds. As explained in reference to FIGS. 23-26, the illumination and exposure should last for a multiple of this value to minimize errors caused by background light. Since the exposure time in this example is 10 milliseconds, the exposure time should be set to 2(8.33)=16.667 milliseconds. The exposure time plus the readout time in this example is 16.667+81=97.7 milliseconds. The minimum time between successive exposures is 1/15=0.06667 seconds=66.67 milliseconds. For this situation, the optimum operation is provided by starting a new exposure cycle every 100 milliseconds, which is equal to twelve of the 8.33 millisecond periodic intervals of the background lights.

FIG. 37A designates the 16.67 millisecond time intervals by the reference number 3702. For this example, four 16.67 millisecond exposures 3712, 3714, 3716, and 3718 are sequentially applied for the four patterns 3612, 3614, 3616, and 3618, respectively. The four sequential exposures are followed by four corresponding pixel readouts 3722, 3724, 3726, and 3728, respectively. The total time to capture each image and transfer the pixel data is 0.1 seconds, indicated for four successive phase measurements by the intervals 3732, 3734, 3736, and 3738.

FIG. 37B incorporates the four phase measurements of 37A into time intervals 3742, which represents a four-phase coarse measurement of the sort shown in FIGS. 14A-B. It also incorporates the four phase measurements of 37A into time intervals 3744, which represents a four-phase mid-resolution measurement of the sort shown in FIGS. 14C-D. It corporates an eighteen-phase fine measurement into time interval 3746. For the timing shown in FIGS. 37A-C, the four patterns 3612, 3614, 3616, and 3618 in FIGS. 36A-D are used. In this example, the total time to complete these steps is (4+4+18) (0.1)=2.6 seconds. Of course, the time to complete the measurement may vary considerably, depending on the camera characteristics, required illumination time, and desired number of phase measurements. (An increased number of phase measurements results in decreased measurement noise.)

A computation 3750 processes the data 3740 to obtain 3D coordinates of points on an object. Such measurements may begin as data has been read out and may proceed in parallel as the data continues to be collected. Because each 3D array has its own internal processing of 3D coordinates, and because data collection is not slowed down by adding more 3D imagers, speed is not impaired by adding more 3D imagers 3424 to the 3D measuring assembly 3420. Steps within the computation 3750 may include determining unwrapped phase, applying lens aberration corrections, and performing triangulation calculations. Such calculations may take more or less time than the data collection steps, depending on the processing power available and the number of pixels being processed. Additional computational steps may be carried out by the processors within each 3D imager 3424 or in separate computers. As explained above, such processing may include filtering, feature analysis and comparison to specifications, and mesh/octree calculations, for example. Parallel processing is possible in either case, for example, in local hardware or in a network. Considerable parallel processing is possible in a graphics processing unit (GPU).

After measuring an object with the plurality of 3D imagers 3424 at a particular position and orientation in space, the mover 3410 may move the plurality of 3D imagers 3424 to a new position and orientation in space. A method is used to properly register the data received from the 3D measurements made at each of the multiple positions and orientations of the mover 3410. For the example of the robot 3410, movements may include translation along the tracks 3440 or translation/rotation of the 3D measuring assembly 3420 by the robot movement mechanisms.

An arrangement of 3D imagers 3424C on a stationary structure 2422B as in FIG. 34C may be illuminated without interference among the adjacent 3D imagers 3424C by projecting and capturing the captured light on the object 3450 in a two-step sequence 3600E-3600F, as illustrated in FIG. 36E-36F.

Figure 38A:
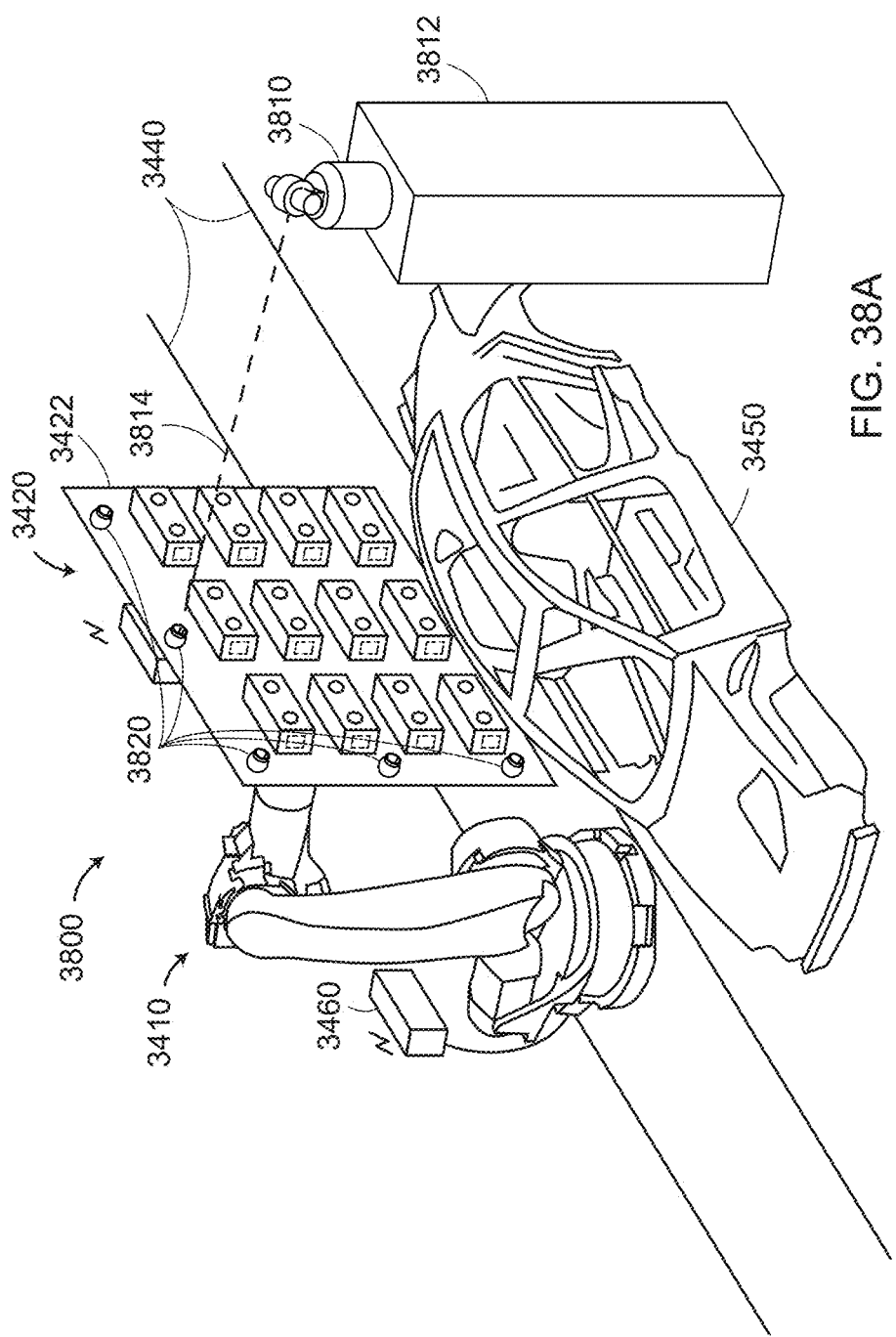

As illustrated in FIG. 38A, one way to register the multiple sets of data is by using a 3D coordinate measuring device 3810 to measure three or more targets 3820 on the 3D measuring assembly 3420 in each of its multiple positions/orientations. Matrix transformations can then be obtained to transform each of the collected data sets into a common frame of reference. In a first embodiment, the 3D coordinate measuring device 3810 is a laser tracker 3810 mounted on a pedestal 3812, and the targets are retroreflectors 3820. In FIG. 38A, the targets are spherically mounted retroreflectors (SMRs), but any type of retroreflector may be used. In a first instance of an embodiment, the laser tracker sends a beam of laser light 3814 to each of at least three retroreflectors for the 3D measuring assembly 3420 in its first position/orientation. In a second instance, with the 3D measuring assembly 3420 in its second position/orientation, the laser tracker sends the beam of laser light 3814 to at least three of the same retroreflectors as measured in the first instance. The 3D coordinates measured for each of the three or more common retroreflectors are used to determine a transformation matrix to transform the collected scan data (from the first and second position/orientation of the mover 3410) into a common frame of reference.

Figure 38B:
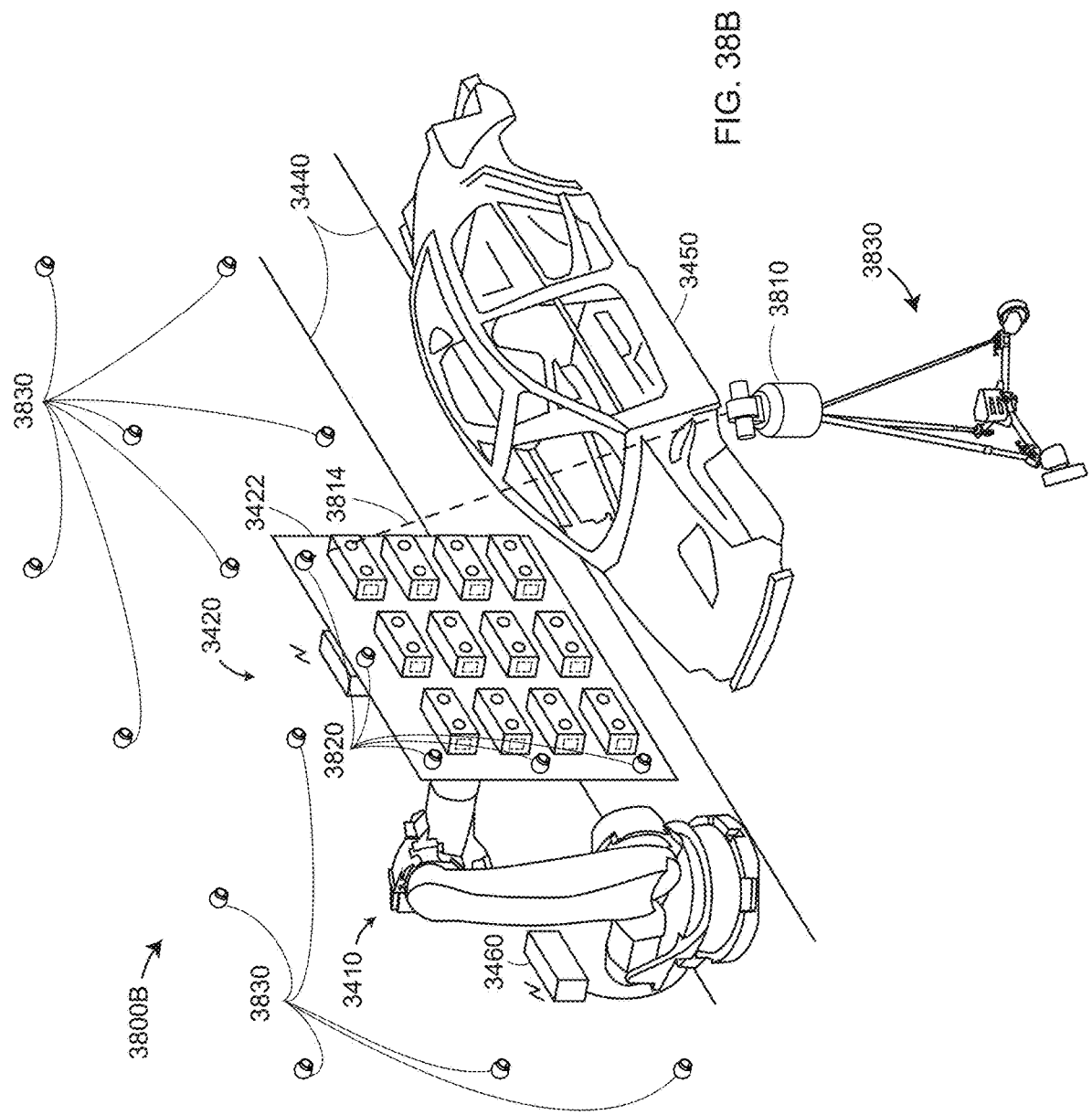

In some cases, the object being measured may block the path from the 3D measuring device 3810 and the three or more targets 3820. FIGS. 38B and 38C illustrate a way around this potential problem. In FIG. 38B, a 3D measuring device 3810 sends a beam of light to three or more retroreflector targets 3820 on the mounting frame 3422 and three or more retroreflector targets 3830 on fixed targets located off the mounting frame 3422. In an embodiment, in a first measurement sequence, the 3D measuring device 3810, while located in a first pose, measures the 3D coordinates of three or more targets 3820 and the 3D coordinates of three or more targets 3830. Then in a second measurement sequence following a change in the relative pose of the mounting frame 3422 and the object 3450, the 3D measuring device 3810 is moved to a second pose that gives it a clear view of the targets 3820 and 3830 measured in the first measurement sequence. In the second pose, the 3D measuring device 3810 determines 3D coordinates of the three or more of the targets 3820 and the three or more targets 3830 measured in the first sequence. The measured 3D coordinates of the targets 3820 and 3830 in the first and second sequences are used in matrix calculations to register the scanned 3D points on the object 3450 measured in the first sequence and the second sequence.

In an embodiment, the 3D measuring device 3810 is a laser tracker. In an embodiment, the 3D measuring device 3810 is moved to a first fixed instrument stand or tripod to obtain the first pose and to a second fixed instrument stand or tripod to obtain the second pose. In an embodiment illustrated in FIGS. 38B and 38C, the 3D measuring device 3810 is guided on a mobile platform 3830 to the first pose and the second pose. A representative mobile platform 3830 illustrated in FIGS. 38B and 38C is described in U.S. Patent Application No. 62/140,706, filed Mar. 31, 2015, the contents of which are incorporated by reference. In some embodiments, the mobile platform 3830 is motorized. In some cases, the mobile platform 3830 is moved under computer control. In some cases, the mobile platform moves under its own autonomous, self-directed movement based on knowledge of measurements requirements.

In some cases, the object 3450 may be moved while the mounting frame 3422 is kept fixed. In this case, the targets 3820 would be attached to the object 3450 rather than to the mounting frame 3422. The same sort of matrix transformation mathematics may be used in each case to obtain registration of 3D images collected in multiple relative positions of the object 3450 and the mounting frame 3422.

Figure 39:
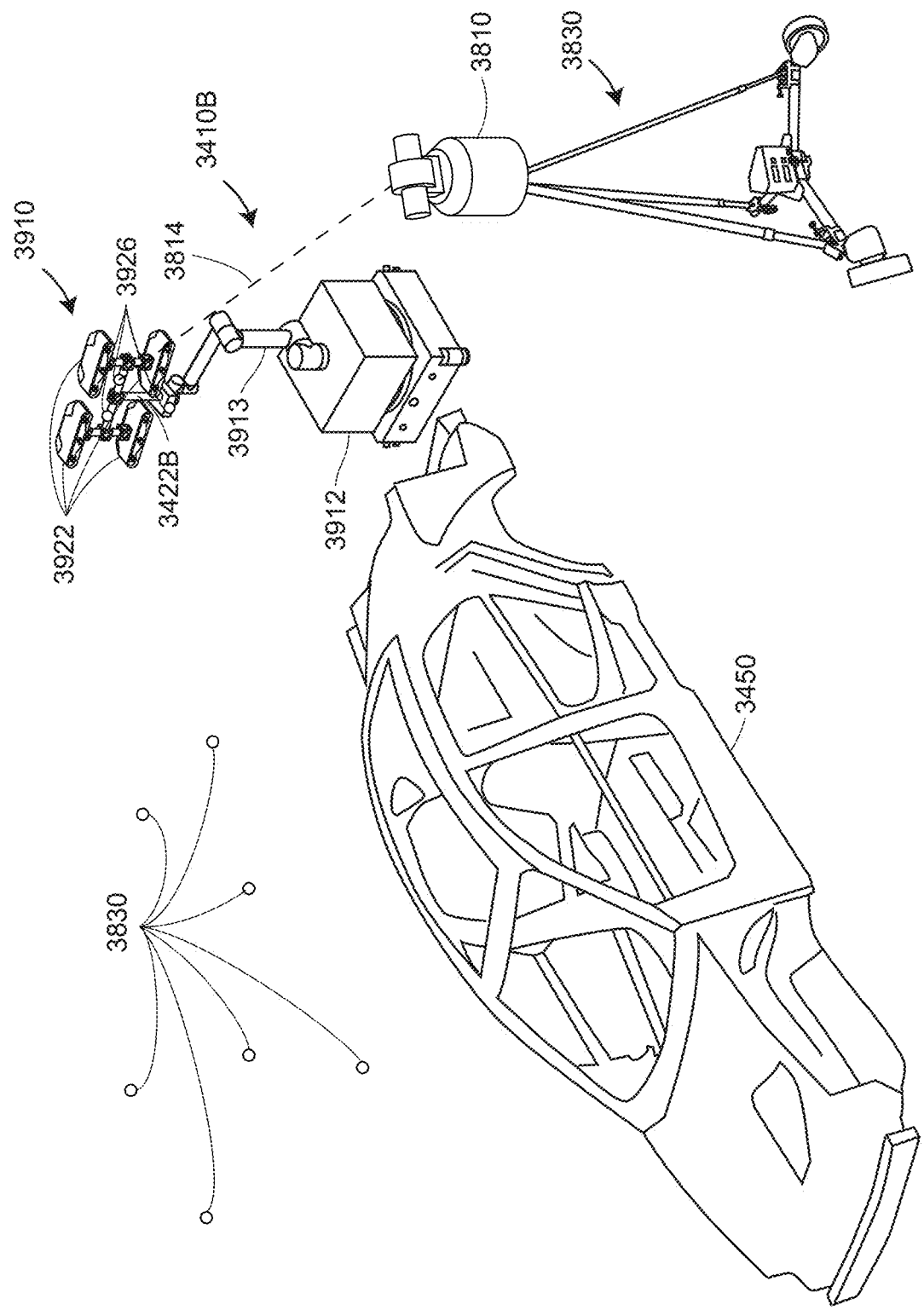
FIG. 39 illustrates a 3D measuring device being used to register coordinates obtained from a bank of 3D imagers that are moved by a mover according to an embodiment.

The mover 3410 may be any type of movement apparatus. For example, it could be a mover 3410B illustrated in FIG. 39. The mover in FIG. 39 is a mobile platform 3410B that includes a mobile base 3912 and a robotic arm 3913. The mover includes a 3D measuring apparatus 3910 that includes a mounting frame 3422B, a plurality of 3D imagers 3922, and three or more targets 3926 measurable by the 3D measuring device 3810. In embodiment, the robotic arm 3913 has the ability to direct the mounting frame 3422B to a variety of positions and orientations. A representative mobile platform 3410B is described in U.S. Patent Application No. 62/157,673, filed May 6, 2015, the contents of which are incorporated by reference. In an embodiment, the 3D measuring device measures the targets 3926 each time the mover 3410B travels to a new location. If this movement is further accompanied by a movement of the mobile platform 3830, the 3D measuring device 3810 further measures the targets 3830. The targets 3926 and 3830 measured before and after movement are used with matrix mathematics to register the 3D points measured on the object 3450 before and after the movement of the mover 3410B and/or mobile platform 3830.

In other embodiments, the 3D measuring device 3810 is not a laser tracker but is a different type of 3D measuring device such as a camera bar. A camera bar includes two or more cameras separated by a fixed distance. A camera bar may measure photogrammetric targets, which might be circular dots or LED point light sources, for example.

Figure 40:
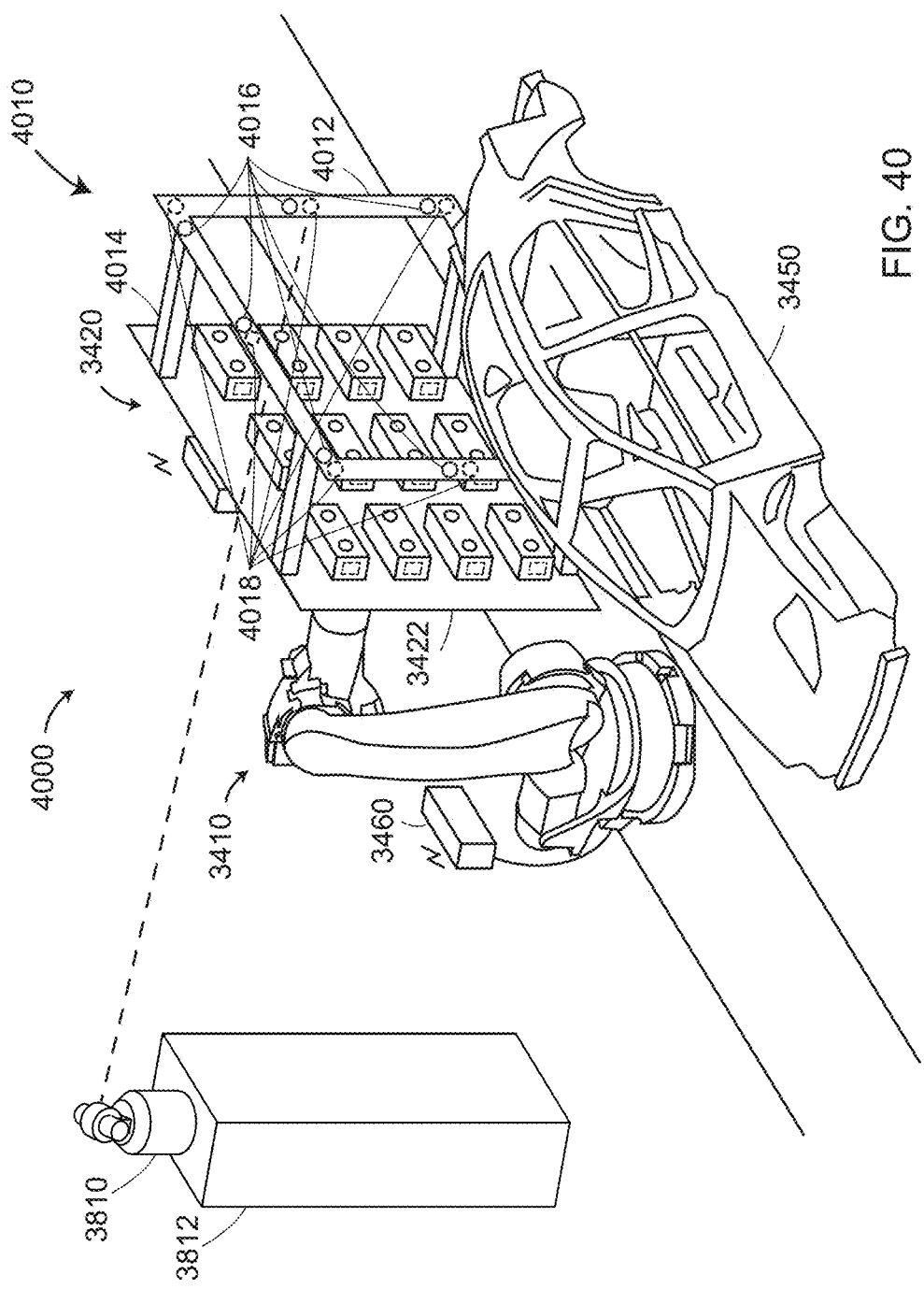
FIG. 40 illustrates a 3D measuring device further including an extension frame having targets according to an embodiment.

In an embodiment illustrated in FIG. 40, an extension frame 4010 is attached to the frame 3422. In an embodiment, the extension frame 4010 includes standoffs 4014, frame structure 4012, first targets 4016, and second targets 4018. In an embodiment, cameras 3428 image the targets 4016 attached to the extension frame 4010 along with the points on the object 3450 illuminated by the projectors 3426. The 3D coordinates of the targets 4016 are known in the frame of reference of the 3D measuring assembly 3420. Because the targets 4016 are brought close to the object 3450, accuracy of the measured 3D points on the object 3450 may be improved in the frame of reference of the 3D measuring assembly 3420. Measurement accuracy may be further improved by measuring the coordinates of the targets 4018 on the frame with a 3D measuring device 3810. In some cases, the targets 4016 and 4018 are the same targets; in other words, a single type of target that can be measured by both the cameras 3426 and the 3D measuring device 3810. An example of such a common target might be a retroreflector. In other cases, the targets 4018 may be located on the reverse side of the extension frame with the 3D measuring device relocated to measure these targets.

In an embodiment illustrated in FIG. 41, the measurement environment includes a collection 4100 of fixed reference targets 4102. The mover 3410 measures the positions of at least three of the reference targets 4102 before and after movement of the 3D measuring assembly 4120. This allows a common frame of reference to be established for the mover 3410 before and after movement, thereby enabling registration of 3D points measured on the surface of the object 3450.

In an embodiment illustrated in FIG. 42, the 3D measuring assembly 4220 further includes one or more of a wide-FOV registration camera 4230, a color camera 4240, and an information projector 4250. In an embodiment, one or more of the 3D imagers 3424 further include a color camera 3425. In an embodiment, one or more of the 3D imagers 3424 is configured with two cameras spaced about a central projector as in the 3D imager 10 of FIG. 1. In an embodiment, one or more of the 3D imagers 3424 is configured with two cameras and a projector in a triangular arrangement as in the 3D imager 1100 of FIG. 11.

If present, the wide-FOV registration camera 4230 includes a camera 4232 having a relatively wide FOV capable of capturing targets such as targets on the object 3450 or targets on foreground fixtures such as the targets 4102 in FIG. 41 or targets 4260 in FIG. 42. The targets 4260 may be configured to move along with the object 3450, for example, if the object is on a conveyor belt, or they may remain fixed in place even if the object 3450 is moved. Targets 4260 may be reflective dots, light sources such as LEDs, or retroreflectors. In an embodiment, the targets 4260 are natural features rather than artificial targets such as dots or LEDs. In an embodiment, the registration camera 4230 may have a second camera 4234 in addition to the first camera 4232. In an embodiment the second camera 4234 has a wider FOV than the camera 4232. By using two cameras 4232 and 4234 having different fields of view, it is possible to see relatively fine details with one camera while obtaining an overview registration with the other camera. In an embodiment, the narrow-FOV camera observes fine natural features while the wide-FOV camera observes artificial targets. In an embodiment, the wide-FOV registration camera 4230 includes a processor 4236 that enables it to analyze the observed features and provide registration information to other processors.

If present, the color camera 4240 includes a first color camera 4242. In an embodiment, the color camera has a larger FOV than the cameras 3428 used for triangulation in the 3D imager 3424. In an embodiment, the color cameras may capture color information that the system integrates with the 3D coordinate data obtained from the collection of 3D imagers 3424 on the plate 3422. In an embodiment, the color camera provides a basis for AR representations in which a 3D representation is superimposed on the color image. Such a 3D representation may be based on 3D measured data or on computer-generated data, for example, from CAD or rendered models. In an embodiment, the color camera 4240 includes a second color camera 4244 that has a different FOV than the first camera. This may be used to enable relatively fine color information to be applied to the collected 3D information, for example, but allow color images to be obtained for background objects over a wider FOV. The color camera 4240 may include a processor to apply the color information to the measured 3D coordinates or to perform other functions. In an embodiment, the color camera 4240 is used to provide registration information over a relatively wide FOV.

In an embodiment, some or all of the 3D imagers 3424 include a color camera 3425. In an embodiment, color data from the collection of cameras 3425 is applied to the 3D coordinates obtained from the 3D imagers. Such an approach provides a way to obtain high-resolution color images over a large measurement volume.

If present, the information projector 4250 includes a first projector 4252 configured to project a pattern onto the object 3450. Such a pattern might include information such as measurement results, part dimensions, geometrical dimensioning and tolerancing (GD&T) notation, tolerance information, and color or whisker indications measurement results versus specifications. The first projector 4252 may also indicate locations at which assembly or repair operations are to be performed. For example, the projector might project a location at which a screw is to be attached, a hole to be drilled, or adjustment to be made. In an embodiment, the first projector 4252 might project a pattern forming part of an AR image, which might be captured by a color camera and shown on a display or headset, for example. Such an AR image might include features or objects not present but potentially present in the future. In an embodiment, the information projector 4250 further includes a second projector 4254 having a different FOV than the first projector. One of the two projectors 4252, 4254 may be used to project a relatively small, higher resolution image, while the other projector is used to project a relatively large, lower resolution image. In an embodiment, projection of patterns is coordinated by a processor 4256 within the information projector 4250.

In an embodiment, the processor 4256 or another processor in the system is configured to project the pattern in such a way as to account for curvature of the object surface. For example, if a pattern is to be projected onto a curved surface in such a way as to form a rectangle when viewed head on, the processor considers the curvature of the surface—either based on actual measured data or on CAD data—to curve the projected lines to obtain the desired rectangular shape when viewed head-on. Such a correction might be necessary when projected a pattern for a hole to be drilled in a tilted surface.

In an embodiment, some or all of the projectors 3426 of the 3D imagers 3424 project patterns onto the object 3450 or onto surrounding objects. Projection by the multiple projectors 3426 enables projection of a pattern that includes many pixels of projected information. The projectors 2426 may be project a single color or multiple colors.

In an embodiment, the system is configured to issue an alarm when an indicated condition has been obtained. Such a condition, for example, might be observation of a portion of the object 3450 being out of specification. In an embodiment, the alarm might include a warning sound, a flashing light, a recorded message, stopping of a moving assembly line, or other type of indication.

In an embodiment, applications software tied to the system controller 3431, 3431B supports a 3D measuring assembly such as 3420, 3420B, 3420C, 3910 or similar assemblies. Some representative user interface (UI) displays tied to the system controller 3431 are illustrated in FIGS. 43-47.

Figure 43:
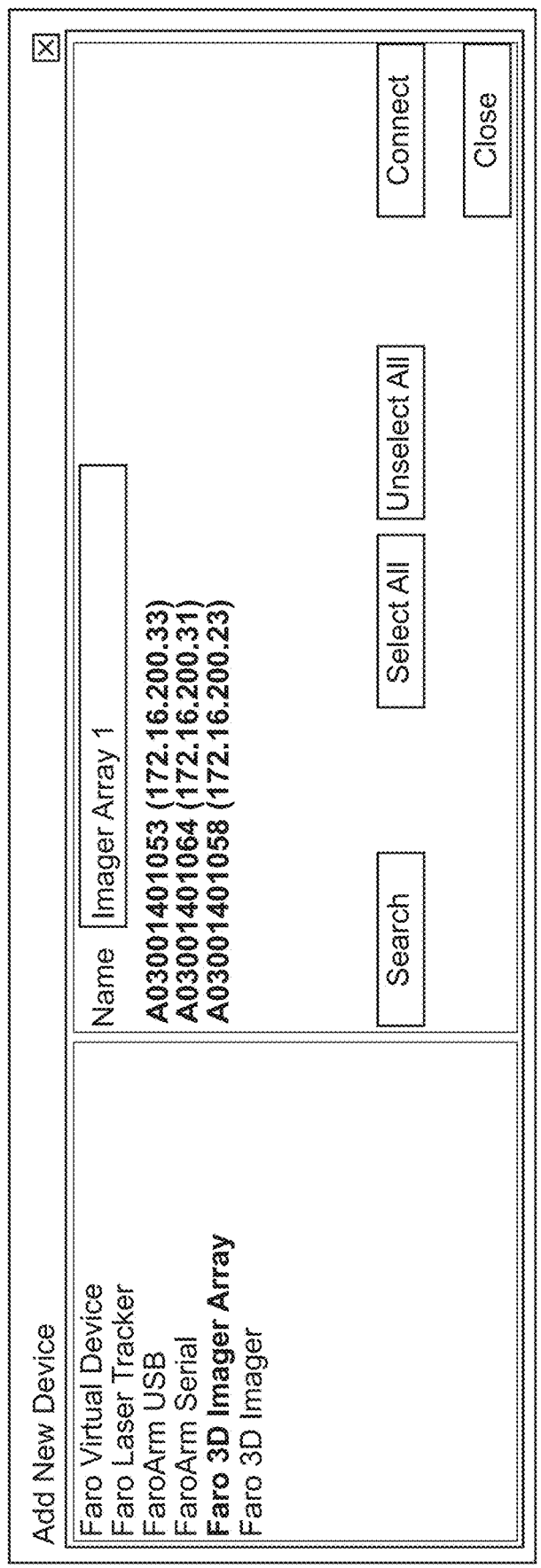
FIG. 43 shows a display screen from a user interface (UI) that enables configuration of a 3D assembly of 3D imagers according to an embodiment.

In the leftmost portion 6006 of FIG. 43, a UI display 6004 provides a means for a user to enter a device labeled "3D Imager Array" 6000 to a collection of other measurement devices 6002, which might for example be 3D coordinate measuring devices. The 3D Imager Array 6000 differs from the other devices in the list 6002 in that it includes a collection of separate 3D Imager devices configured to operated cooperatively to obtain 3D coordinates over a larger area than would be possible with any one of the 3D Imagers. In the right side portion 6008 of FIG. 43, a UI display 6004 identifies three 3D Imagers 6010 that together comprise "Imager Array 1" as indicated in the Name box. Each separate 3D imager has a serial number such as A03001401053 and an Internet Protocol address (IP address) such as 172.16.200.33. Searching may be performed to locate available 3D imagers and add these to Imager Array 1 if desired.

Figure 44:
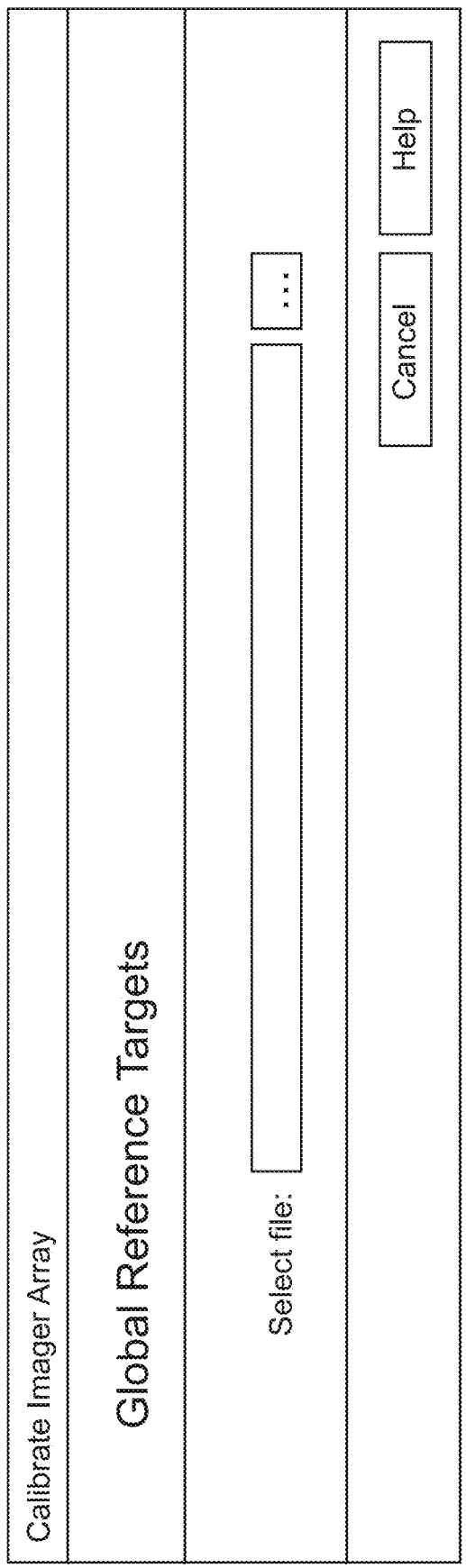
Figure 46:
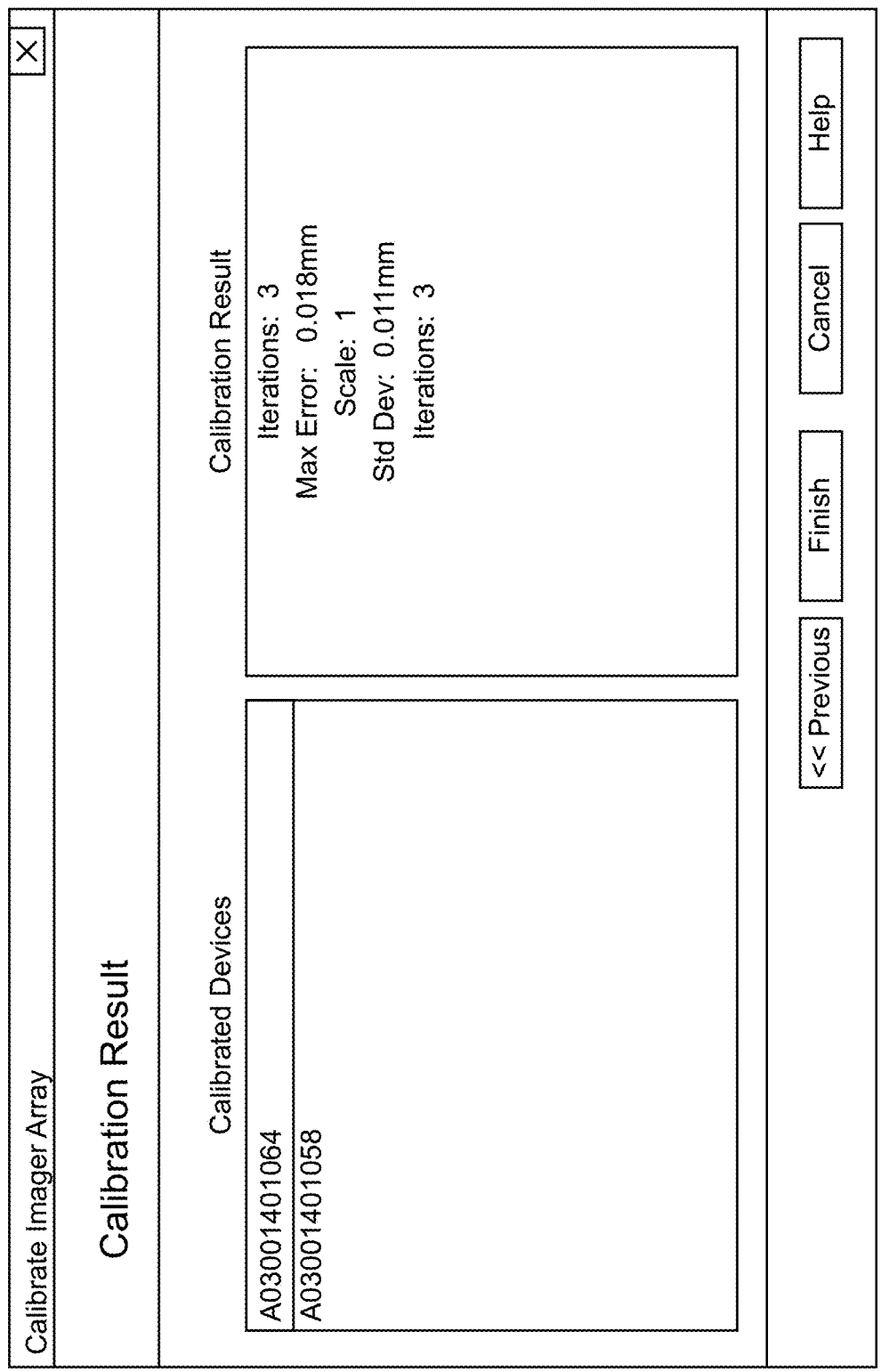

As explained herein above, a pose is obtained for each of the plurality of 3D imagers in the 3D Imager Array so that the 3D coordinates collected by the plurality of 3D imagers are properly registered in a common frame of reference. One method for determining the pose for each of the 3D imagers is to have each of the 3D imagers measure a common collection of targets. Such methods are illustrated in reference to targets 3514A, 3515A, 3514B, 3515B, 3524 in FIG. 35, targets 4102 in FIG. 41, and targets 4260 in FIG. 42. Exemplary UI displays 6014, 6016 to support use of such a common collection of targets are shown in FIGS. 44-46. FIG. 44 provides the user a way to select a file containing a list of 3D coordinates of a collection of target points. FIG. 45 shows, in the lower right portion 6012 of the UI display 6014, 3D coordinates for a collection of targets. Each of the 3D coordinates shown in FIG. 45 includes an x-coordinate, a y-coordinate, and a z-coordinate given in some unspecified frame of reference. In general, each of the 3D imagers 3424 in the 3D Imager Array will obtain different values for the measured x-coordinate, a y-coordinate, and a z-coordinate, since each 3D imager measures in a different frame of reference. Based on the scan data obtained from each of the 3D imagers, the relative pose is determined of each of the 3D imagers within the 3D measuring assembly 3420, 3D measuring apparatus 3910, or similar device.

FIG. 46 is a UI display 6016 showing the goodness-of-fit of a calibration (compensation) enabling the two 3D imagers 6018, A03001401064 and A03001401058, to be put into a common frame of reference. In this case, each of the two 3D imagers 6018 measured each of the targets three times. An optimization was performed to select a pose (three orientational degrees-of-freedom and three translational degrees-of-freedom) for each of the two 3D imagers 6018 to place them as well as possible into a common frame of reference. The mathematical optimization method was able to obtain the desired result to within a maximum error 6020 of 0.018 millimeters. This procedure may be performed with any number of 3D imagers in the 3D Imager Array.

Figure 47:
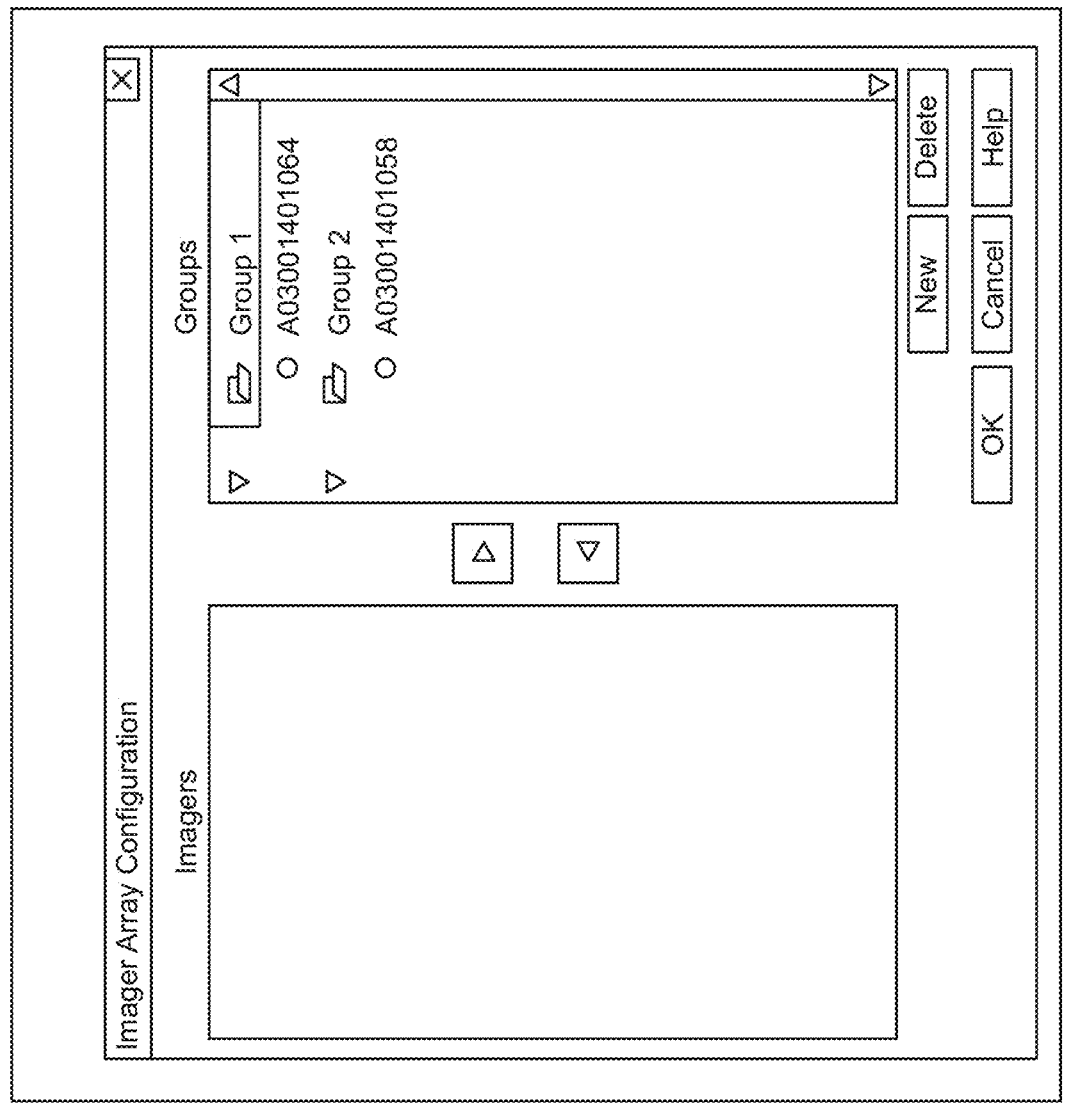
FIG. 47 shows a UI display screen that provides further assistance in configuration a 3D assembly of 3D imagers.

FIG. 47 is a UI display 6022 showing forming of a 3D Imager array from a collection of 3D imagers. Each individual 3D imager is collected in an area labeled "Imagers" on the left and moved as desired to the rightmost area labeled groups. 3D Imagers may be removed from the 3D Imager Array using the left arrow to move the 3D Imager from the Groups area to the Imagers area.

When making measurements with an array of imagers, it is desired that the relative pose of each of imager in the array of imagers is determined. This enables the 3D readings from each of the 3D imagers to be combined into a single image and compared as a group to specified values in a CAD model.

Some methods for determining the relative pose of imagers in an array were discussed herein above in relation to FIGS. 35, 38A-38C, 39, 40, 41, 42, 44, 45, 46. Making measurements of objects with an array of imagers placed at a variety of distances and orientations relative to an object poses challenges. For example, in measuring car door panel, it may be desired to position 3D imagers to view (e.g. acquire images of) each side of the door panel as well as features on a side of the door. This embodiment is illustrated in FIG. 51B, where a first imager 5112 images a door latch feature 5010 shown in FIG. 50. A second imager 5114 images a hinge feature 4910 in FIG. 49. In FIG. 51B, an imager 5116 images an upper window assembly, while an imager 5118 images features on the side of the door panel.

Figure 48:
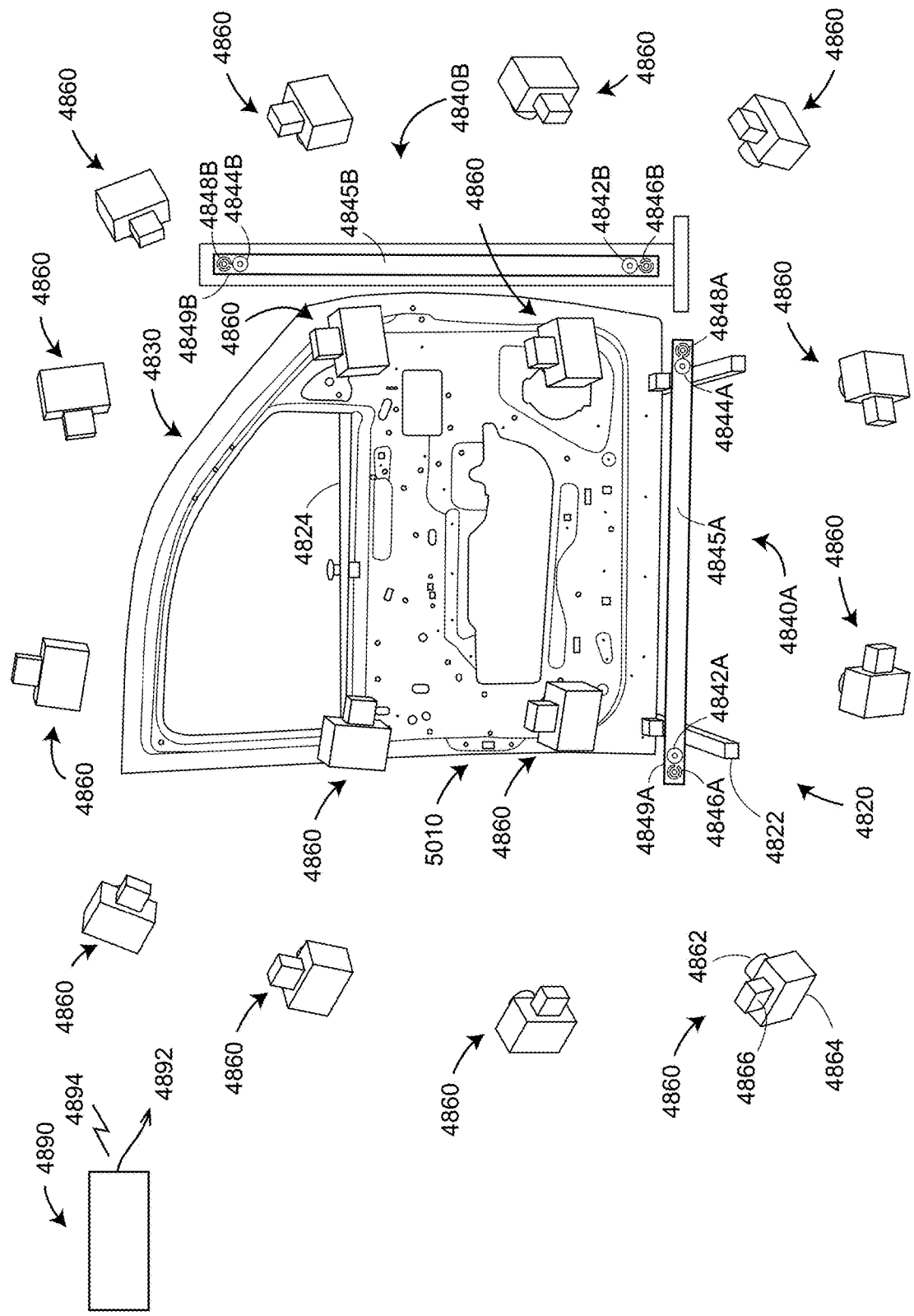
FIG. 48 is a perspective view of a master part having a collection of fiducial targets being imaged by a photogrammetry camera held in a plurality of positions according to an embodiment.

In some embodiments, a relatively complicated arrangement of 3D positioners can be efficiently registered into a common frame of reference (by determining their relative poses) by a method that uses a "master part" 4830, as is now described. FIG. 48 shows a master part 4830 held in place by a fixture 4820 that includes a fixture base 4822 and fixture clamp 4824. The master part 4830 is similar to the "part-under-test" 5130 in FIG. 51B except that the master part includes fiducial markers 4832 while the part-under-test 5130 does not include fiducial markers. The fiducial markers 4832 are clearly shown in FIG. 49 and FIG. 50. In an embodiment, one or more scale bars 4840A, 4840B are fixed in place relative to the master part 4830. Each scale bar 4840A, 4840B includes at least two marks 4842A, 4844A (or 4842B, 4844B) to establish a first calibrated reference length 4845A (or 4845B). The scale bars 4840A, 4840B may further contain one or more additional marks to establish additional length. For example, two additional marks 4846A, 4848A (or 4846B, 4848B) may establish a second calibrated reference length 4849A (or 4849B). Each calibrated reference length is measured ahead of time and is known to a stated uncertainty.

Both the master part and the part-under-test may be considered to include a base part, which in the example considered here is the door panel. Each part-under-test may be considered to be selected from among a plurality of base parts. The master part further includes fiducial markers in addition to the selected base part.

Figure 49:
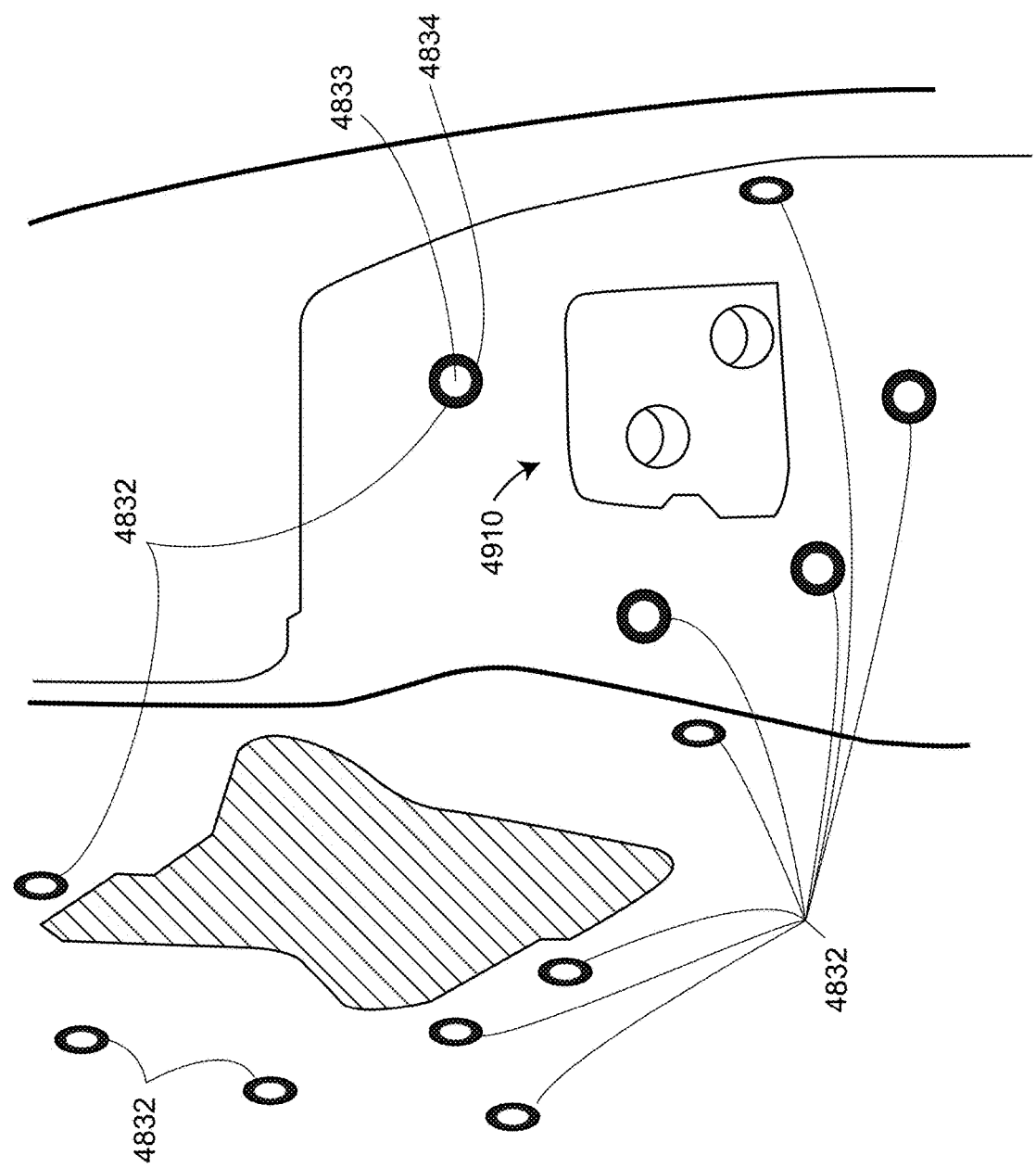
FIG. 49 is a perspective view of an right edge of the master part showing a hinge assembly and a collection of fiducial targets according to an embodiment.

In an embodiment, a photogrammetry camera 4860 is moved to a plurality of positions and orientations to capture 2D images of the master part 4830, including the fiducial marks. In an embodiment, the photogrammetry camera 4860 includes a lens 4862, a camera body 4864, and a flash unit 4866. The camera body includes a photosensitive array and associated electronics. In an embodiment, the fiducial markers are photogrammetry dots. Such dots are configured to reflect a relatively large amount of the light form the flash unit into the camera lens. In other words, the photogrammetry dots appear much brighter than the material surrounding the photogrammetry dots. In an embodiment, the photogrammetry dots include a circular retroreflective region 4833 surrounded by a ring of black 4834. It is desired that at least three fiducial targets 4832 be used, but in an embodiment twenty or more fiducial targets are distributed over the extent of the master part. Some fiducial targets are placed near or adjacent features of interest, as shown in FIG. 49 and FIG. 50.

In an embodiment, the photogrammetry camera has a vertical field-of-view (FOV) of 45 to 65 degrees and a horizontal FOV of 55 to 75 degrees, although any FOV may be used. Each of the fiducial targets are captured in 2D camera images with the camera held in at least two different positions, but it is helpful to include at least six camera positions. In some embodiments, it is desirable to rotate the camera at least once in acquiring the images. Such a rotation provides information that is advantageous in determining intrinsic compensation parameters of the camera lens system. In the example shown in FIG. 48, the photogrammetry camera has been moved to 16 different positions and orientations, with the camera in approximately vertical positions half the time and in approximately horizontal positions half the time. In an embodiment, the photogrammetry camera 4860 when on the left side of FIG. 48 is held at an angle of approximately 45 degrees with respect to the front and the left side of the car door panel. In this way, the camera 4860 held to the left side of FIG. 48 may obtain images of the fiducial targets 4832 shown in FIG. 50. Likewise, the photogrammetry camera 4860 on the right side of FIG. 49 is held at an angle of approximately 45 degrees with respect to the front and the right side of the car door panel. In this way, the camera 4860 when held on the right side of FIG. 48 may obtain images of the fiducial targets 4832 shown in FIG. 49. At least one calibrated reference length (such as 4845A) is included in each of the 2D images collected by the photogrammetry camera 4860. It should be appreciated that while embodiments herein refer to orientations of right, left, top and bottom, this is for exemplary purposes and not intended to be limiting. These references are based on the point of view illustrated in the respective Figure being described.

After the plurality of photogrammetry 2D images have been obtained from the photogrammetry camera 4860 at the plurality of photogrammetry camera positions, the 3D coordinates of the at least three fiducial markers are found using a mathematical optimization method such as minimization of a sum of squared errors. This method of optimization is often referred to as least-squares optimization. For the embodiment considered here, in which the measurements are made at a plurality of camera positions and orientations (sometimes referred to as camera "stations"), the optimization is sometimes referred to as a "bundle adjustment." The result of the mathematical optimization method is to determine 3D coordinates for each of the fiducial targets within a common frame of reference. The frame of reference is arbitrary. For example, the frame of reference may coincide with a frame of reference of the first camera pose or be related in some way to the fiducial markers. The plurality of photogrammetry 2D camera images when evaluated mathematically are said to yield the 3D coordinates of the fiducial targets in the system frame of reference.

Figure 51A:
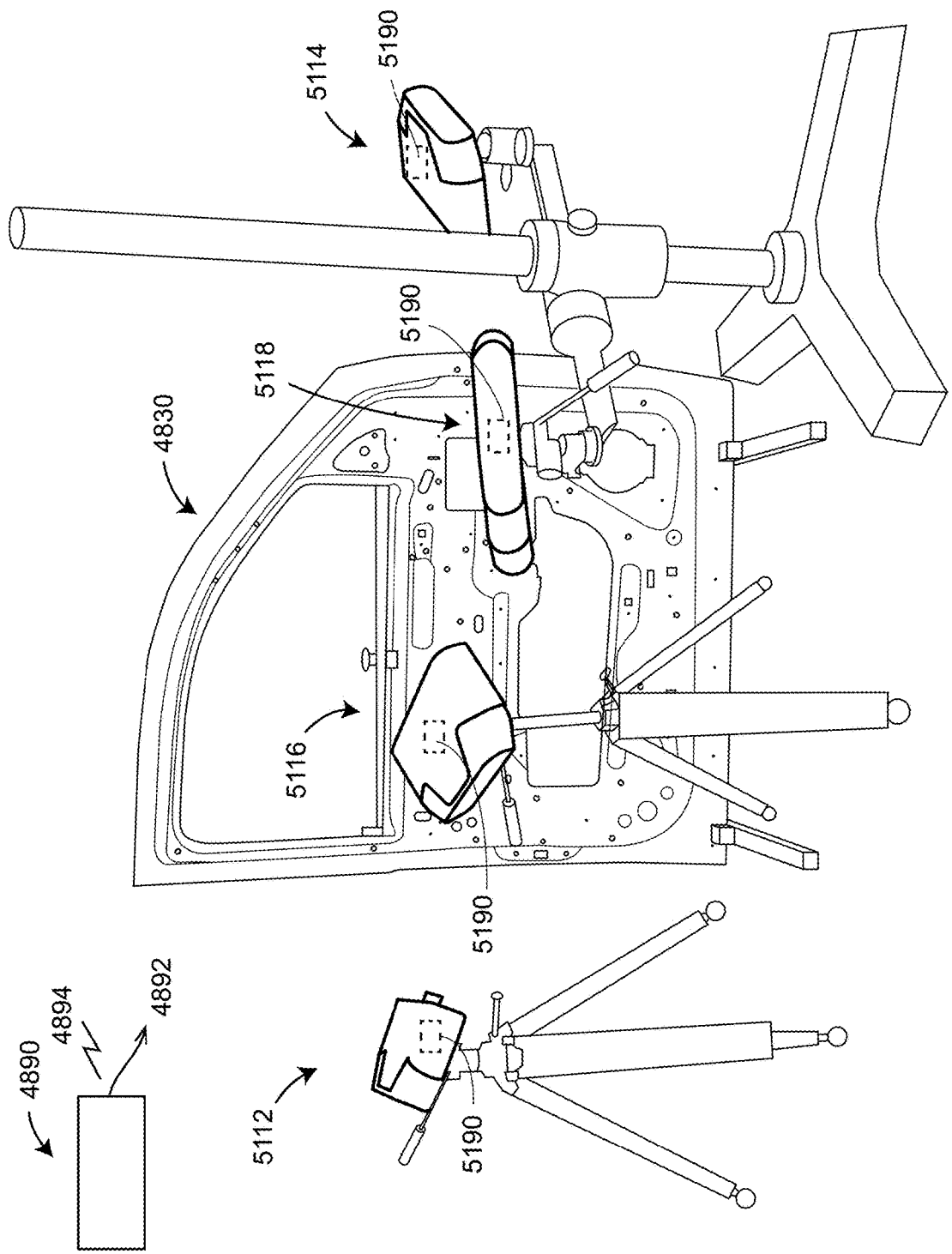
FIG. 51A shows a collection of 3D imagers imaging the master part to determine the relative pose of each within a common frame of reference according to an embodiment.
Figure 51B:
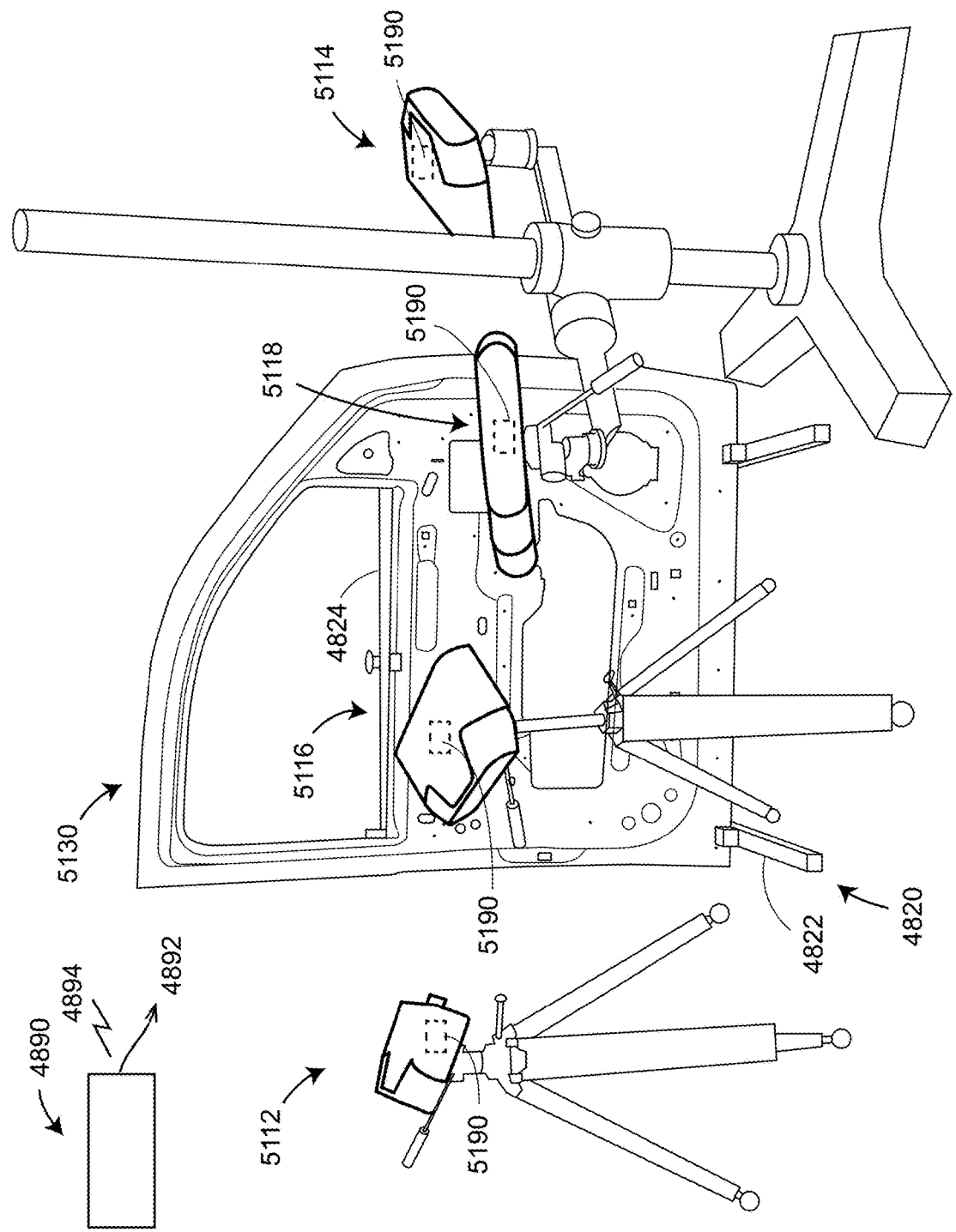
FIG. 51B shows the collection of 3D imagers determining 3D coordinates of surface points on a part-under-test according to an embodiment.

Following capturing of the master part 4830 by the photogrammetry camera 4860 at the plurality of stations, the 3D imagers 5112, 5114, 5116, 5118 are moved into position in relation to the master part 4830, as shown in FIG. 51A. Each 3D imager obtains a 3D image of at least three fiducial markers. In some embodiments, greater accuracy may be achieved by imaging more than three fiducial markers with each of the 3D imagers 5112, 5114, 5116, 5118.

The configuration described herein includes at least two 3D imagers that may be referred to as a first 3D imager and a second 3D imager. The first 3D imager is said to have a first frame of reference and to determine 3D coordinates of the fiducial targets or of other points on the part within the first imager frame of reference. Likewise, the second 3D imager is said to have a second frame of reference and to determine 3D coordinates of the fiducial targets or other points on the part within the second imager frame of reference.

Since the 3D coordinates of each of the fiducial markers is known in system frame of reference, a first pose of the first 3D imager may be found within the system frame of reference, and the second pose of the second 3D imager may also be found within the system frame of reference. The mathematical method may be extended to determine the pose of each of the 3D imagers 5112, 5114, 5116, and 5118 in the system frame of reference.

The method performed to determine the 3D coordinates of the fiducial marks in the system frame of reference may be performed by an external computer 4890, connected either by wired 4892 or wireless 4894 communication channels/mediums, or by processors 5190 within the 3D imagers such as 5112, 5114, 5116, and 5118.

In an embodiment, it is not necessary that for a first 3D imager to view the same fiducial marks as the other 3D imagers to determine the pose of the first 3D imager within the system frame of reference. This embodiment is illustrated in FIG. 51A, which shows each of the four 3D imagers 5112, 5114, 5116, 5118 viewing a different collection of fiducial targets. There is some overlap in the fiducial markers imaged by 3D imagers 5114, 5118, however, the 3D imagers may view a collection of fiducial targets distinct from the other 3D imagers. This is possible because each of the 3D imagers views at least three non-collinear fiducial targets having 3D coordinates known with the system frame of reference.

FIG. 51B is like FIG. 51A except that the master part 4830 is replaced by the part-under-test 5130. For this measurement, the scale bars 4840A, 4840B (FIG. 48) are not used and may be removed. In an embodiment, parts-under-test 5130, such as door panels, are rapidly replaced in the fixture 4820 to enable relatively high speed testing. In other cases, parts may be carried on a conveyor belt or other moving element to permit rapid testing.

The methods performed to determine the 3D coordinates of points on the surface of the part-under-test 5130 in the local frame of reference of each 3D imager or in the system frame of reference may be performed by either an external computer 4890, connected by wired 4892 or wireless 4894 communications channels/mediums, or by processors 5190 within the 3D imagers such as 5112, 5114, 5116, and 5118.

Figure 52:
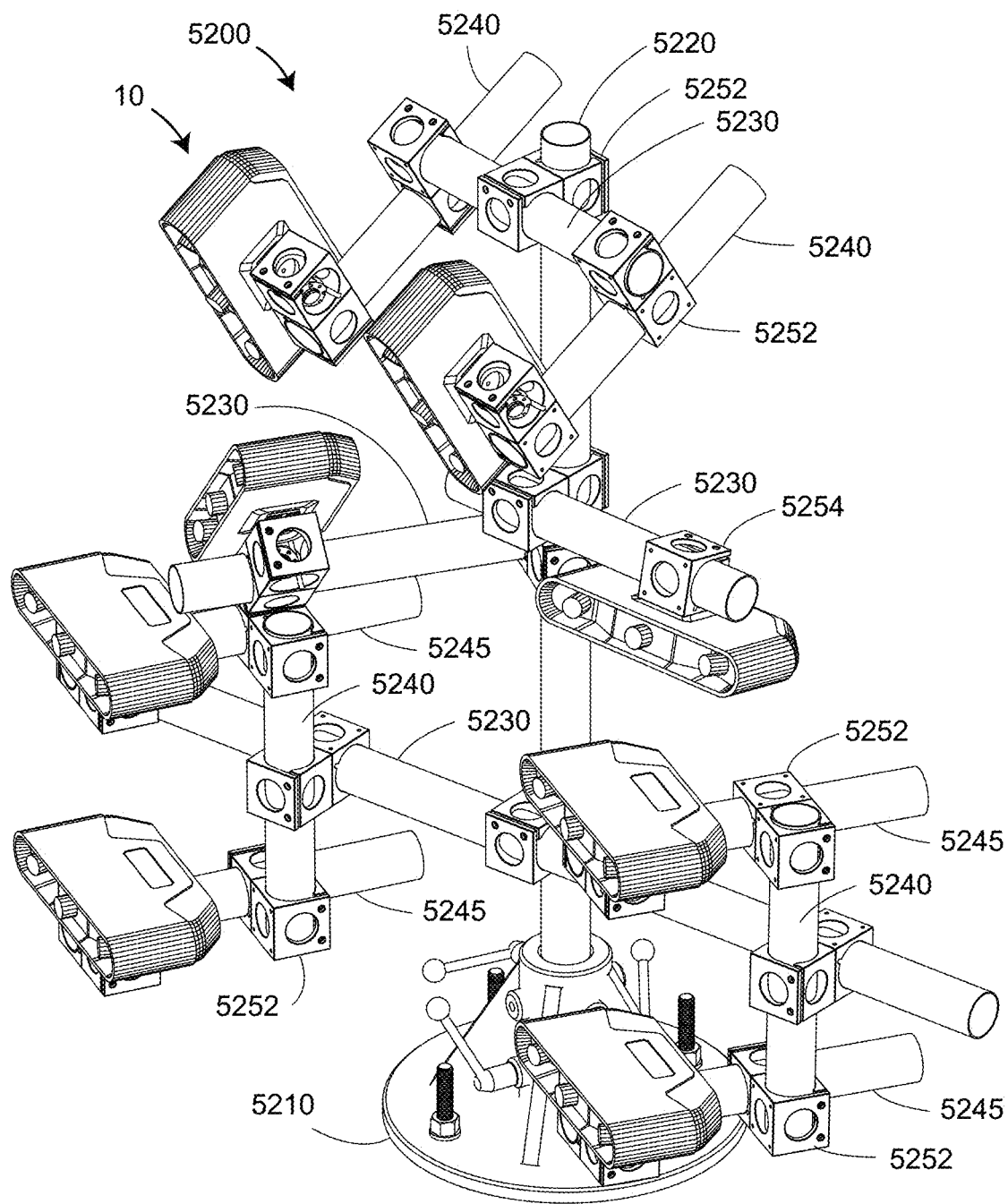
FIG. 52 shows a tree structure used to position 3D imagers according to an embodiment.

3D imagers 10 in a 3D imager array are positioned in relation to features of interest in the part-under-test. To enable such positioning to be rapidly and flexibly accomplished, a tree structure 5200 may be used, as shown in FIG. 52. In an embodiment, each tree structure includes a base 5210, a trunk 5220, primary branches 5230, secondary branches 5240, tertiary branches 5245, and branch connectors. One type of branch connector is a two-element branch connector 5252, each sized to hold a branch or a trunk and each configured to be locked into place at a desired position and orientation. A second type of branch connector is single-element branch connector 5254 having a single element with a flange that connects to a 3D imager. In an embodiment, the trunk and branches are made of a material having a relatively low coefficient of thermal expansion (CTE) and relatively high stiffness. An example of such a material is a low-CTE carbon fiber composite tube having a circular cross section. In an embodiment, the carbon fiber composite tube has a CTE not exceeding 2.0 $\mu$m/m/° C. In an embodiment, the branch connectors are made of aluminum or steel. The tree structure is configured to enable a plurality of 3D imagers to be conveniently arranged in a wide variety of positions and orientations. In an embodiment, multiple tree structures may be used to measure 3D coordinates of a relatively large object.

In an embodiment, a branch connector is a two-element connector that includes a first connector part and a second connector part, with the second connector part configured to rotate relative to the first connector part. In one instance, a two-element connector 5252 attaches a trunk element 5220 to a primary branch element 5230. If the first connector part of the branch connector rotates relative to the second connector part, then a branch connector that couples the trunk element 5220 to the primary branch element 5230 will cause the primary branch element will rotate relative to the trunk element. For example, in FIG. 52, the uppermost primary branch element 5230 is perpendicular to the trunk element 5220. However, by rotating the second connector part of the connector element relative to the first connector part, the primary branch element 5230 can be rotated away from perpendicularity.

In other embodiments, the system may also be configured to enable rotation of the trunk element 5220 or any branch element within a connector assembly. So for example, the uppermost primary branch element 5230 in FIG. 52 attaches on the left side to a secondary branch element 5240, which in turn attaches to a 3D imager 10. By rotating the primary branch element 5230 within the connector assembly 5252, the imager is made to rotate about the axis of the primary branch element. By rotating the secondary branch element 5240 within the connector assembly 5252, the 3D imager can be made to rotate about the axis of the axis of the secondary branch element. By rotating the connector the attaches the 3D imager 10 to the secondary branch element 5240, the 3D imager can be made to rotate about an axis perpendicular to the axis of the secondary branch element. It can readily be seen that by a combination of connector rotations and branch element rotations, almost any pose can be obtained for a 3D imager within the volume constraints of the tree structure.

In an embodiment, a method makes use of the tree structure to properly align the 3D imagers and register the aligned 3D imagers in a common frame of reference. The proper alignment will generally involve setting the distance and orientation of the 3D imager relative to the object under test. Registration of the 3D imagers involves determining the relative pose of each 3D imager with an array of imagers. After registration of the array of 3D imagers has been completed, the 3D coordinates of object points measured by the collection of imagers are transformed into a common frame of reference, which may also be referred to as a global frame of reference.

One way that registration may be performed is by first determining 3D coordinates of a collection of fiducial targets by using a photogrammetry camera, as was described in relation to FIGS. 48, 49, 50, 51A, and FIG. 51B. Software for registering an array of imagers based on 3D coordinates of fiducial targets was described in relation to FIGS. 44-46. Other methods for registering an array of 3D imagers were further described in relation to FIGS. 35, 38A, 38B, 38C, 39, 40, 41, and FIG. 42.

Figure 53A:
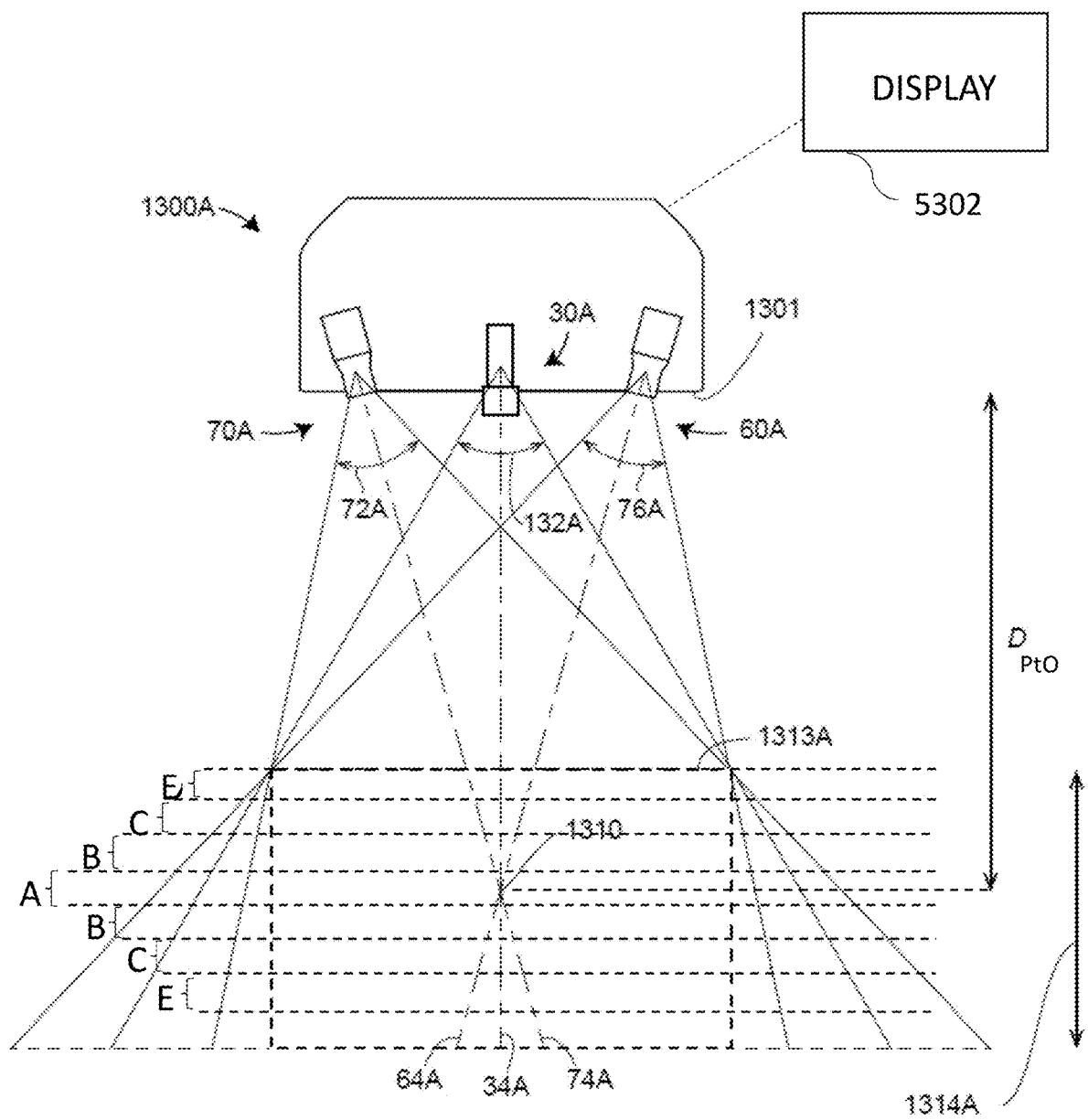
FIG. 53A and FIG. 53B are schematic representations of camera and projector lenses according to embodiments.
Figure 53B:
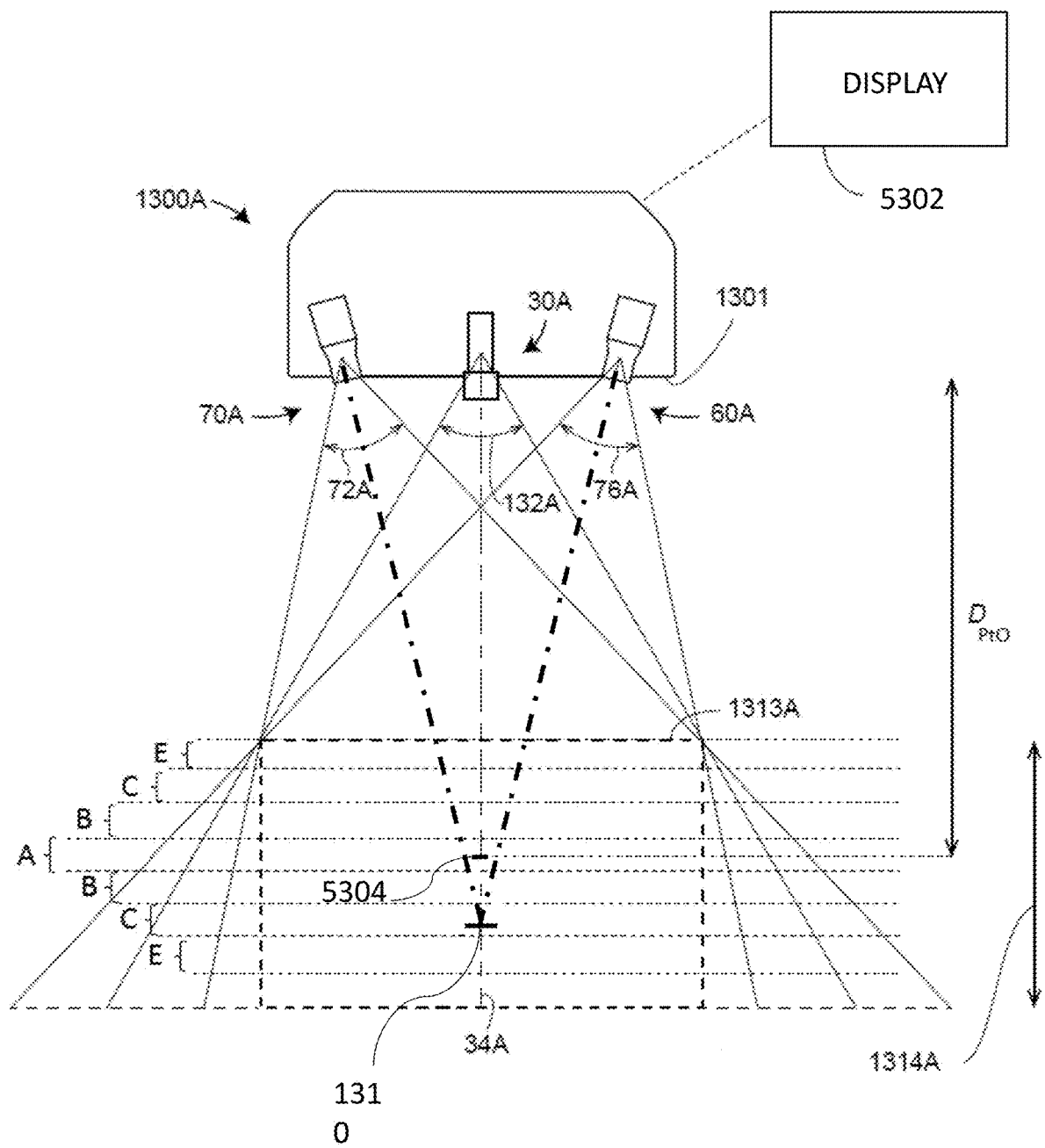

Referring now to FIG. 53A, FIG. 53B and FIGS. 54-59, a system and method are shown for positioning an object that is being scanned at a desired position. In some embodiments, it is desired to place the object at or near a predetermined projector-to-object distance $D_{PtO}$. In one embodiment shown in FIG. 53A, the projector-to-object distance $D_{PtO}$ is the same as, or is equal to, the standoff distance D (FIG. 13A) that corresponds to the distance from the front 1301 of the scanner body to the point of intersection 1310 of the optical axes 74A and 64A of the camera lens assemblies 70A and 70B, respectively, with the optical axis 34A of the projector 30A. In an embodiment, the standoff distance D may be a range of distances defining a band A that the object may be placed and measurements made with the desired level of accuracy and reliability. While the projector-to-object distance $D_{PtO}$ may in some cases be the same as the standoff distance D, a more general case is illustrated in FIG. 53B where the point 5304 at the projector-to-object distance $D_{PtO}$ is offset from the standoff distance point 1310. In an embodiment, the projector-to-object distance $D_{PtO}$ may set to the based at least in part on the focal length of the camera, the focal length of the projector or a combination of the foregoing. In one embodiment the point 5304 is offset from both a focal point of the cameras/projector and the standoff point 1310.

In this embodiment, the measurement region 1313A may be defined by a plurality of bands or regions A, B, C, E that define ranges of distances from the front 1301 of the imager 1300A. As discussed herein, the measurement region 1313A defines an area that an object may be placed and will be viewable by both cameras 60A, 70A. It should be appreciated that it may be difficult for an operator to visually determine the appropriate projector-to-object distance $D_{PtO}$ for a particular object being scanned.

Figure 54:
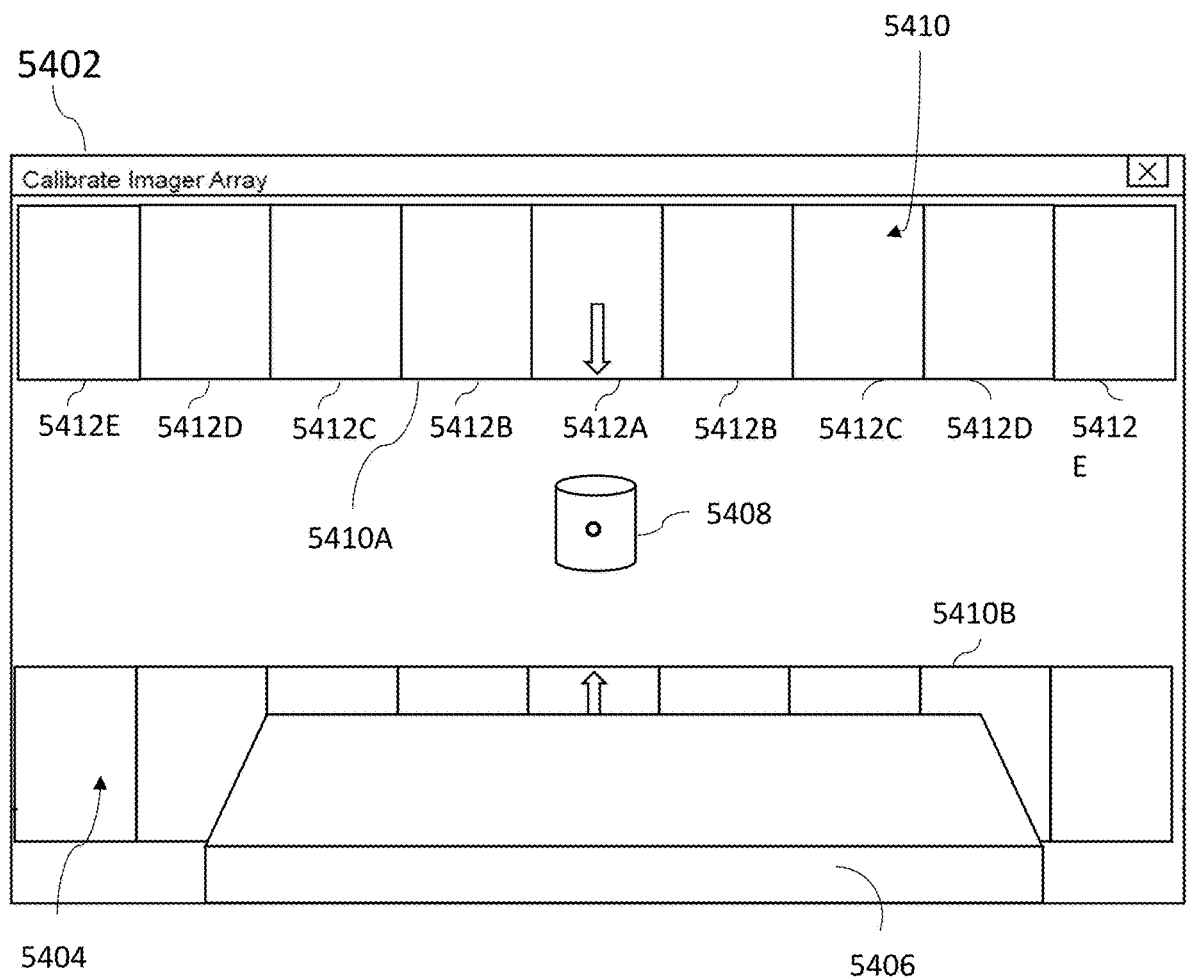
FIGS. 54-58 are illustrations of a graphical display with a standoff distance indicator that cooperates with a 3D imager.
Figure 55:
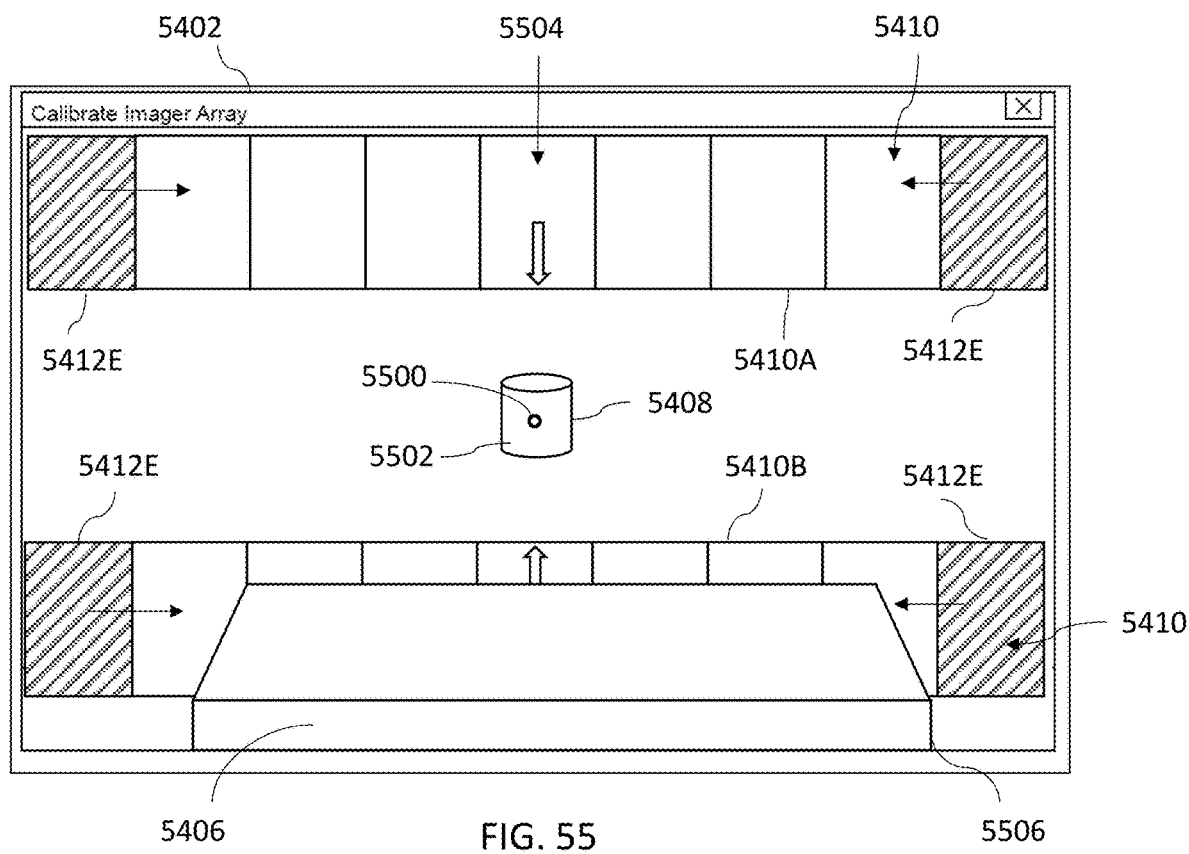
Figure 56:
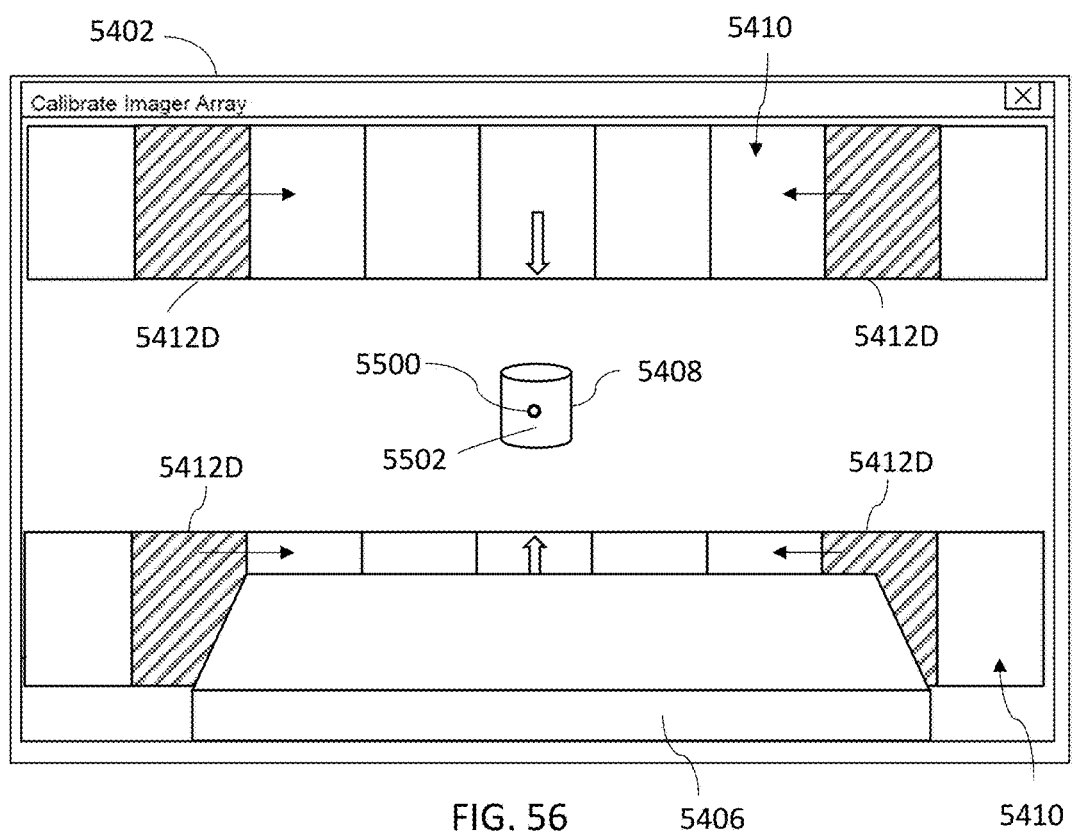
Figure 57:
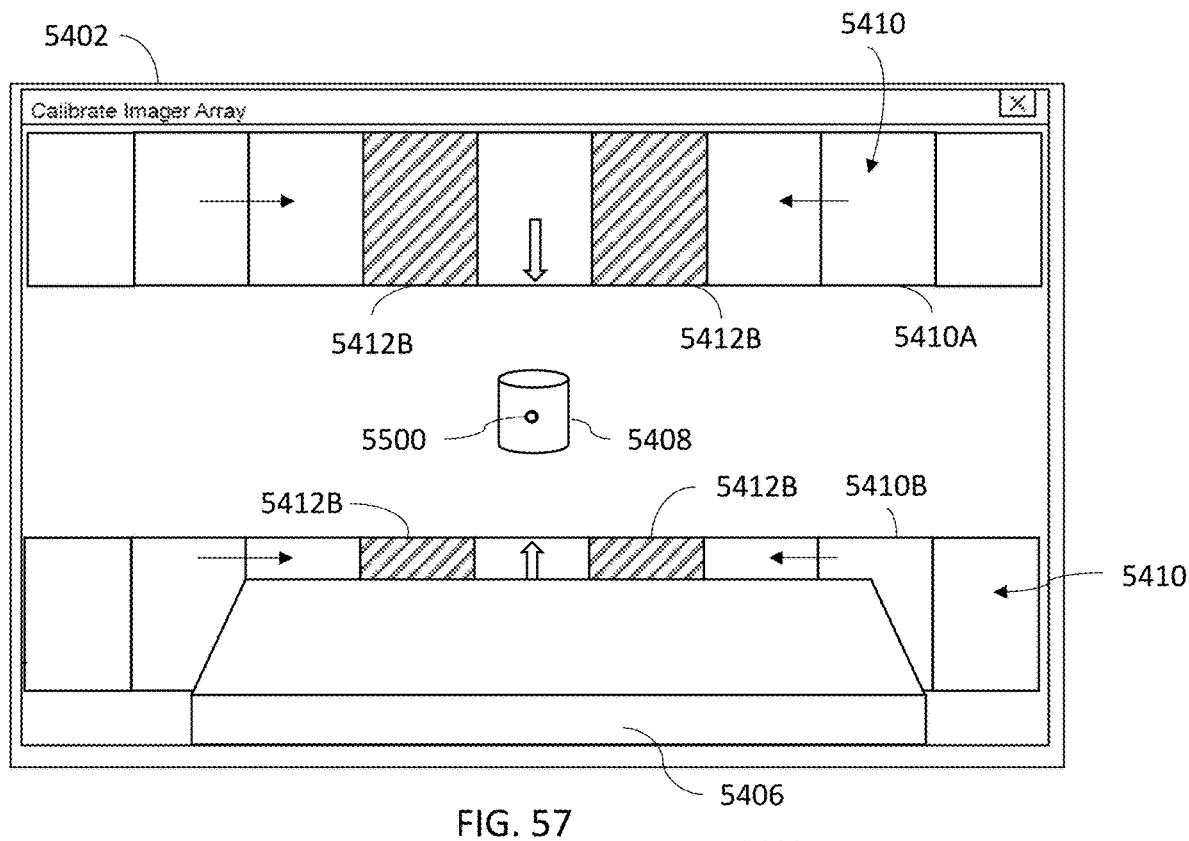
Figure 58:
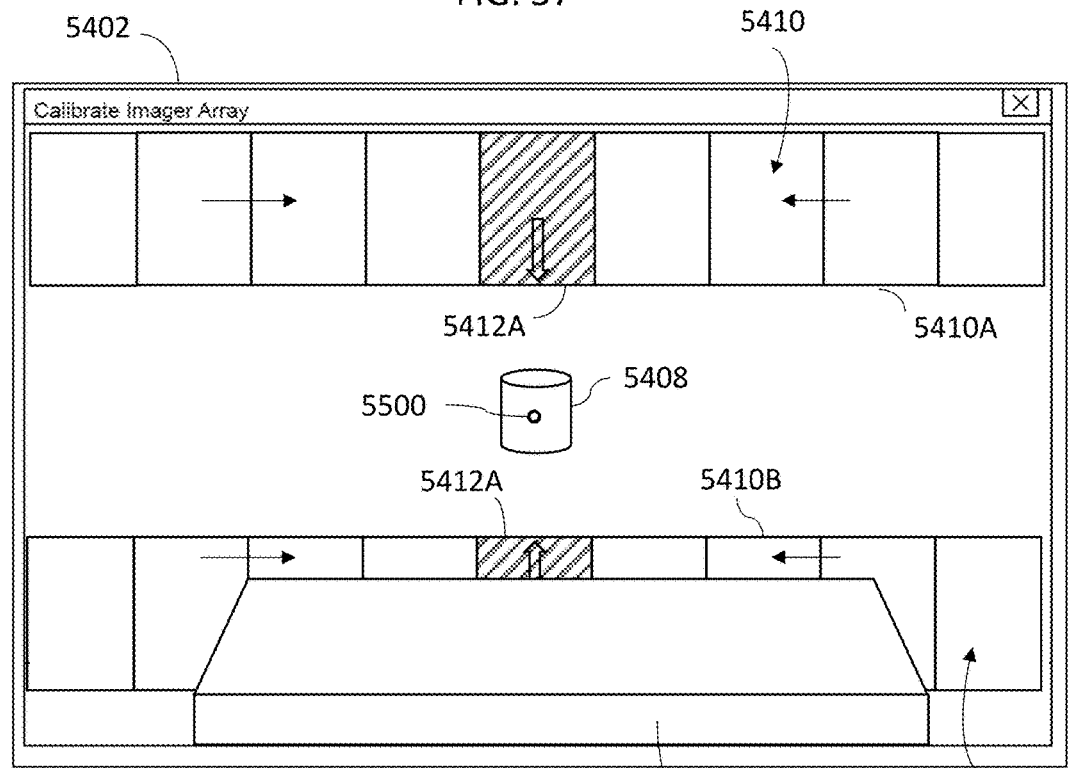

In an embodiment, to assist the operator, a display 5302 is coupled to the imager device 1300A. The display 5302 may be a liquid crystal display (LCD) monitor for example. In another embodiment, the display 5302 may be a remote computing device connector via a wired or wireless medium to the imager device 1300A. In still another embodiment, the display 5302 may be portable or integrated into a mobile computer device, such as but not limited to a cellular phone, a personal digital assistant (PDA), a tablet computer or a laptop computer. The display 5302 allows an operator to view an image of an object being scanned. In an embodiment, the display includes a user interface 5402 (FIG. 54). The user interface 5402 may be a window of an application software being executed on one or more processors, such as the processor 1374, processor 950, a processor on processor board 750, the processor of a mobile computing device or a combination of the forgoing for example, and displayed on the display 5302. In an embodiment, an image 5404 is displayed within the user interface 5402 is at least partially acquired by one of the cameras 60A, 70A. In another embodiment, an image 5406 of the imager device 130 is superimposed or overlaid on the image 5404. It should be appreciated that when an object 5408 is placed within the measurement region 1313A, the object 5408 will be visible in the image 5404.

To assist the operator in the placement of the object 5408, an indicator element 5410 is overlaid or superimposed on the display 5302. The indicator element 5410 provides a visual feedback to the operator on the distance to the object 5408 from the front 1301 of the imager device 1300A. In an embodiment, the indicator element 5410 is comprised of a plurality of display elements, such as polygons for example. In the illustrated embodiment, the polygons are as rectangular elements 5412A-5412E. As will be discussed in more detail herein, the polygon elements 5412B-5412E are provided in pairs that are arranged on opposite sides of a center polygon element 5412A. In the exemplary embodiment, the indicator element 5410 is comprised of a first plurality of display elements 5410A arranged on a first side of the user interface 5402 and a second plurality of display elements 5410B arranged on a second side of the user interface 5402 opposite the first side.

Figure 59:
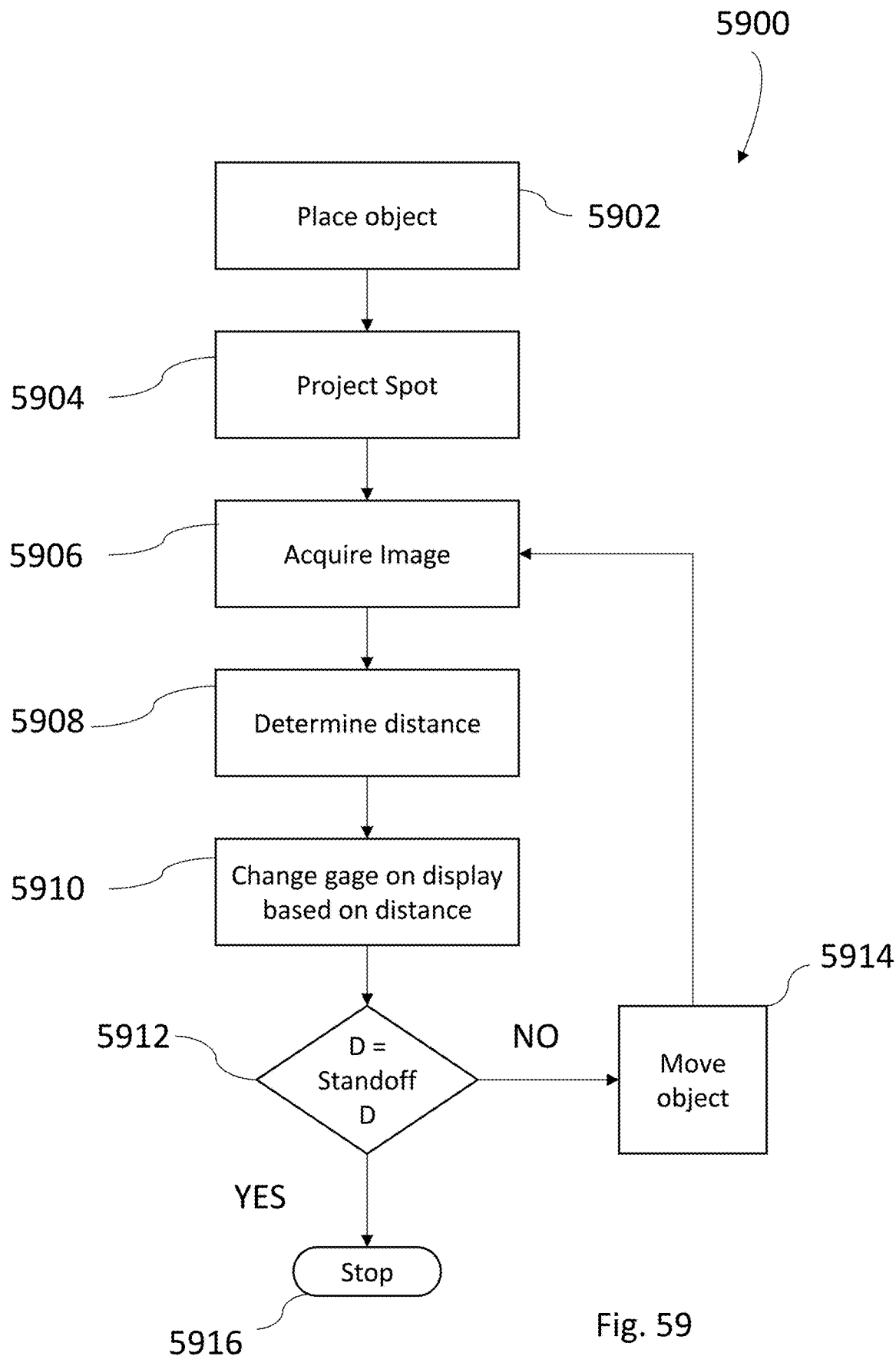
FIG. 59 is a flow diagram illustrating a method of positioning an object at a desired standoff distance.

Referring now to FIG. 59, with continuing reference to FIGS. 55-58, a method 5900 will be described for positioning an object to be scanned relative to a imager device, such as imager 1300A. The method 5900 begins in block 5902 with placing an object 5408 into the field of view of the imager device 1300A, such as within or near the measurement region 1313A. The method 5900 then proceeds to block 5904 where the imager device 1300A projects with projector 30A an element 5500 onto a surface 5502 of the object 5408. In the exemplary embodiment, the element 5500 is a circular or substantially circular spot of light. In other embodiments, the element 5500 may be comprised of a plurality of elements, such as a coded structured light pattern for example. The element 5500 may be visible on the display 5302. In an embodiment, the image displayed on display 5302 is acquired by one of the cameras 69A, 70A. In another embodiment, the imager device 1300A may have a third camera, such as a color camera for example, that is used to acquire the image of the object 5408.

The method 5900 then proceeds to block 5906 where images of the element 5500 are acquired by the cameras 60A, 70A. Based at least in part on the images of the element 5500 acquired by the cameras 60A, 70A along with the predetermined distances (baseline distances) and geometric relationship between the cameras 60A, 70A and projector 30A, the distance from the imager device 1300A to point on the object 5408 that the element 5500 is projected is determined in block 5908. In the exemplary embodiment, to determine the distance to the object, a correspondence of the element 5500 is first determined between the images acquired by the cameras 60A, 70A. In the illustrated embodiment, the projected pattern is a circular spot. In an embodiment, the correspondence is made between the center points of the circular spots in the images obtained by the cameras 60A, 70A. Next, the distance from the imager device to the object is determined based trigonometry as described with respect to FIG. 10.

It should be appreciated that the distance may also be determined using a projector and single camera based on epipolar geometry in a similar manner to that as described with respect to FIG. 12A. In this embodiment, the projector is Device 1 and the camera is Device 2.

The method 5900 then proceeds to block 5910 where the indicator 5410 is changed based on the distance determined in block 5908. In the exemplary embodiment, the indicator 5410 is comprised of a series of polygons 5412A-5412E, such as squares or rectangles for example, that are linearly arranged in series across a top portion or side 5504 of display 5302. In one embodiment, the indicator 5410 is comprised of two rows or series of polygons 5410A, 5410B.

Based on the determined distance, one or more polygons 5412A-5412E are changed, such as by changing from an outline of the polygon to a filled or solid polygon for example. In another embodiment, the color of the polygon is changed. In the exemplary embodiment, each of the polygons 5412A-5412E correspond to one of the ranges A-E (FIG. 53). In this way, the operator is provided with a visual feedback on the location of the object 5408 relative to the imager device 1300A. In one embodiment, the outermost polygons 5412E represent a distance that is either too close to the imager 1300A (e.g. between the edge of region 1313A and the front 1301 of the imager device 1300A or too far from the imager 1300A.

It should be appreciated that while the illustrated embodiment shows the indicator 5410 as being a series of polygons, this is for exemplary purposes and the claims should not be so limited. In other embodiments, the indicator 5410 may consist of, but is not limited to: a single or non-paired row of polygons, a symbol that changes based on distance, a plurality of colors, or a dial indicator for example.

The method 5900 then proceeds to query block 5912 where the operator determines whether the determined distance is equal to the desired projector-to-object distance $D_{PtO}$ based on the indicator 5410. It should be appreciated that the projector-to-object distance $D_{PtO}$ is a distance that corresponds to a location (or range of locations) where 3D coordinates of the object may be acquired with a desired level of accuracy and reliability. In some embodiments, the projector-to-object distance $D_{PtO}$ is a distance where the element 5502 is substantially in-focus on the cameras 60A, 70A. It should be appreciated that the projector-to-object distance $D_{PtO}$ may represent a range or band A (FIG. 53) of distances where 3D coordinates may be acquired.

When query block 5912 returns a negative, meaning that the distance does not fall within the projector-to-object distance $D_{PtO}$ (band A), the method 5900 proceeds to block 5914 where the placement of the object 5408 relative to the imager device 1300A is changed. The method 5900 then loops back to block 5906 and the process repeats. It should be appreciated that as the object 5408 is moved, the indicator 5410 is also changed to provide feedback to the operator whether the object 5408 is being moved closer or farther away from the desired standoff location. As illustrated in FIGS. 55-58, as the object 5408 is moved closer to the desired standoff location, the polygons 5412E-5412A are progressively changed. In the illustrated embodiment, the progression of the changing of the polygons 5412A-5412E change from the outermost polygon 5412E when the object 5408 is outside the measurement region 1313A and move inward toward the polygon 5412A (FIG. 58) that represents the desired projector-to-object distance $D_{PtO}$ (band A).

This process continues until the object 5408 is moved within the projector-to-object distance $D_{PtO}$ band. When the object 5408 is positioned in the desired location, the query block 5912 will return a positive and the method 5900 will proceed to stop block 5916 and the operator may continue on to measure the object 5408 as described herein. It should be appreciated that while embodiments herein refer to the operator moving the object 5408, this is for exemplary purposes and the claims should not be so limited. In other embodiments, the object 5408 may be moved using automated mechanism (e.g. a robot) rather than by the operator themselves. In an embodiment, when the object 5408 is positioned at the standoff distance, a signal may be transmitted to stop the movement of the object 5408.

In an embodiment, a three-dimensional (3D) measuring device is provided. The 3D measuring device having a projector configured to project a first pattern of projected light onto an object. A first camera is configured to capture a first image of the first pattern of light on the object, the 3D measuring device being configured to determine 3D coordinates of a point on the object based at least in part on the first pattern of projected light and on the first image. An enclosure is coupled to the projector and the first camera. A first cooling fan is configured to draw air through an first opening in a front of the enclosure, across a plurality of components contained within the enclosure, and out a second opening in the enclosure. In one embodiment, the plurality of components includes the first camera. In one embodiment, the plurality of components includes the projector. In one embodiment, the plurality of components includes the first camera and the projector.

In still another embodiment, the 3D measuring device further includes a second camera coupled to the enclosure, the second camera configured to form a second image of the first pattern of light on the object, the 3D measuring device being configured to determine the 3D coordinates of the point on the object further based on the second image. Wherein the plurality of components includes the first camera, the second camera, and the projector. In another embodiment, the 3D measuring device further includes a second cooling fan configured to draw the air through the first opening, across the plurality of components, and out a third opening of the enclosure.

In still another embodiment, the 3D measuring device further includes a light source configured to generate light for the projector, the light source including a light-emitting diode (LED). A heat sink is arranged in thermal contact with the LED. An LED cooling fan is configured to circulate air across the heat sink, the circulated air being taken from outside the enclosure, the circulated air being kept separate from the air drawn into the enclosure by the first cooling fan. In an embodiment, a light-channel heat sink that encloses a portion of a light channel, the light channel configured to carry light from the LED to a pattern-generator device, the light-channel heat sink being configured to receive a first part of the air drawn from the first opening to the second opening. In still another embodiment, the pattern-generator device includes a digital micromirror device (DMD) configured to project a first portion of light it receives onto the object and to project a second portion of the light it receives onto a beam block, the beam block being configured to receive a second part of the air drawn from the first opening to the second opening.

In another embodiment, the 3D measuring device further includes a circuit board having a processor, the circuit board including a circuit cooling system having a circuit cooling fan, the circuit cooling fan being configured to draw air from outside the enclosure, send the drawn air across elements of the circuit board, and expel the drawn air outside the enclosure, the circuit cooling system being configured to keep the air drawn by the circuit cooling fan separate from the air drawn into the enclosure by the first cooling fan. In one embodiment, the 3D measuring device further includes a grill attached to the front of the enclosure, the grill having perforations configured to allow the first cooling fan to draw air from outside the front of the enclosure through the perforations.

In another embodiment, the first cooling fan has a first fan speed, the first fan speed based at least in part on an electrical fan feedback signal. In still another embodiment, a photodetector element within the enclosure, the photodetector element configured to provide a first indication of an amount of light projected by the projector, the electrical fan feedback signal being based at least in part on the first indication. In one embodiment, a temperature sensor within the enclosure, the temperature sensor configured to read a first temperature and to send the electrical fan feedback signal in response.

In accordance with another embodiment, a three-dimensional (3D) measuring system includes a projector configured to project a pattern of light onto an object, the pattern of light including a collection of pattern elements, the projector having a projector optical axis and a projector pose in a first frame of reference, wherein adjacent pattern elements are distinguishable based at least in part on a difference in visual appearance of the adjacent pattern elements. A first camera is configured to capture a first image of the pattern of light projected onto the object, the first camera having a first-camera optical axis and a first-camera pose in the first frame of reference. A second camera is configured to capture a second image of the pattern of light projected onto the object, the second camera having a second-camera optical axis and a second-camera pose in the first frame of reference. An enclosure is provided to which the projector, the first camera, and the second camera are coupled in a triangular pattern in a plane not coincident with any of the projector optical axis, the first-camera optical axis, and the second-camera optical axis, the enclosure being fixed with respect to the first frame of reference. The 3D measuring system is configured to determine 3D coordinates of a point on the object based at least in part on the projected pattern of light, the first image, the second image, the projector pose, the first-camera pose, and the second-camera pose.

In an embodiment, the 3D measuring system provided for determining the 3D coordinates of the point on the object further based on determining a correspondence among pattern elements projected by the projector, captured in the first image by the first camera, and captured in the second image by the second camera. In an embodiment, the 3D measuring system is further configured to determine the correspondence among pattern elements projected by the projector, captured in the first image by the first camera, and captured in the second image by the second camera further based on first epipolar constraints between the projector and the first camera, second epipolar constraints between the projector and the second camera, and third epipolar constraints between the first camera and the second camera. In an embodiment, the 3D measuring system is further configured to determine the correspondence among pattern elements projected by the projector, captured in the first image by the first camera, and captured in the second image by the second camera based at least in part on a matching of differences in the visual appearance of adjacent pattern elements in the projected pattern, the captured first image, and the captured second image. In an embodiment, the 3D measuring system further includes a set of calibration parameters, the set of calibration parameters including at least values characterizing the projector pose, the first-camera pose, and the second-camera pose.

In still another embodiment, the 3D measuring system is further configured to detect an error in the set of calibration parameters based at least in part on an inconsistency in a first determined correspondence and a second determined correspondence, the first determined correspondence being the determined correspondence of pattern elements based on the first epipolar constraints, the second epipolar constraints, and the third epipolar constraints, the second determined correspondence being the determined correspondence based at least in part on the matching of adjacent pattern elements in the projected pattern, the captured first image, and the captured second image. In still another embodiment, the 3D measuring system is further configured to generate an error signal or to stop a 3D measurement in response to the detected error in the set of calibration parameters. In one embodiment, the 3D measuring system is further configured to determine and store a corrected set of calibration parameters in response to the detected error in the set of calibration parameters. In one embodiment, the 3D measuring system of is further comprising a third camera, the third camera configured to capture color images, the 3D measuring system being further configured to overlay color onto the 3D coordinates of the point on the object.

In another embodiment, the 3D measuring system further includes a first processor coupled to the enclosure, the first processor configured to determine the 3D coordinates of the point on the object. In one embodiment the first processor is configured to cooperate with an external processor outside the enclosure to determine the 3D coordinates of the point on the object. In one embodiment, the first processor is connected to the external processor directly or through a network connection.

In accordance with another embodiment, a three-dimensional (3D) measuring system is provided. The 3D measuring system having a projector configured to project a pattern of light onto an object, the projector having a collection of projector points, a first projector point from among the collection of projector points having an assigned spatial period and an assigned phase, the first projector point configured to be projected along a first projector ray, the first projector ray having a first projected light level in a first instance, a second projected light level in a second instance, and a third projected light level in a third instance, the first, second, and third projected light levels varying sinusoidally according to the assigned spatial period and phase, the projector having a projector optical axis and a projector pose in a first frame of reference. A first camera is configured to capture a first image of the pattern of light projected onto the object in the first instance, a second image of the pattern of light on the projected onto the object in the second instance, and a third image of the pattern of light projected onto the object in the third instance, the first camera having a first-camera optical axis and a first-camera pose in the first frame of reference. A second camera is configured to capture a fourth image of the pattern of light projected onto the object in the first instance, a fifth image of the pattern of light projected onto the object in the second instance, and a sixth image of the pattern of light projected onto the object in the third instance, the second camera having a second-camera optical axis and a second-camera pose in the first frame of reference. An enclosure is provided to which the projector, the first camera, and the second camera are coupled in a triangular pattern, the triangular pattern being in a plane not coincident with any of the projector optical axis, the first-camera optical axis, and the second-camera optical axis, the enclosure being fixed with respect to the first frame of reference. The 3D measuring system is configured to determine first 3D coordinates of a first object point, the first object point being a point of intersection of the first projector ray with the object, the determined first 3D coordinates of the first object point based at least in part on the assigned period, the assigned phase, the first image, the second image, the third image, the fourth image, the fifth image, the sixth image, the projector pose, the first-camera pose, and the second-camera pose.

In an embodiment, the 3D measuring system is further configured to determine second 3D coordinates of the first object point further based on first epipolar constraints between the projector and the first camera, second epipolar constraints between the projector and the second camera, and third epipolar constraints between the first camera and the second camera. In one embodiment, the 3D measuring system is further configured to determine third 3D coordinates of the first object point further based on the first 3D coordinates of the first object point and the second 3D coordinates of the first object point. In one embodiment, the 3D measuring system further comprises a set of calibration parameters, the set of calibration parameters including values characterizing the projector pose, the first-camera pose, and the second-camera pose. In still another embodiment, the 3D measuring system is further configured to detect an error in the set of calibration parameters based at least in part on an inconsistency in determined first 3D coordinates of the first object point and determined second 3D coordinates of the first object point. In still one more embodiment, the 3D measuring system is further configured to generate an error signal or to stop a 3D measurement in response to the detected error in the set of calibration parameters. In still one more embodiment, the 3D measuring system is further configured to determine and store a corrected set of calibration parameters in response to the detected error in the set of calibration parameters. In still one more embodiment, the 3D measuring system further comprises a third camera, the third camera configured to capture color images, the 3D measuring system being further configured to overlay color onto the 3D coordinates of the first object point.

In another embodiment, the 3D measuring system further comprises a first processor coupled to the enclosure, the first processor configured to determine the 3D coordinates of the first object point. In one embodiment, the first processor is further configured to cooperate with an external processor outside the enclosure to determine the 3D coordinates of the first object point. In one embodiment, the first processor is connected to the external processor directly or through a network connection.

In accordance with an embodiment, a method is provided for measuring three-dimensional (3D) coordinates. The method includes projecting from a projector having a collection of projector points a first projected pattern of light in a first instance, a second projected pattern of light in a second instance, and a third projected pattern of light in a third instance, the collection of projector points including a first projector point from which is projected a first projector ray having an assigned period and an assigned phase, the first projector ray having a first projected light level in the first instance, a second projected light level in the second instance, and a third projected light level in the third instance, the first, second, and third projected light levels varying sinusoidally according to the assigned period and the assigned phase, the projector having a projector optical axis and a projector pose in a first frame of reference; capturing with a first camera a first image of the first projected pattern of light on the object, a second image of the second projected pattern of light on the object, and a third image of the third projected pattern of light on the object, the first camera having a first-camera optical axis and a first-camera pose in the first frame of reference; capturing with a second camera a fourth image of the first projected pattern of light on the object, a fifth image of the second projected pattern of light on the object, and a sixth image of the third projected pattern of light on the object, the second camera having a second-camera optical axis and a second-camera pose in the first frame of reference, wherein the projector, the first camera, and the second camera are coupled to an enclosure in a triangular pattern, the triangular pattern being in a plane not coincident with any of the projector optical axis, the first-camera optical axis, and the second-camera optical axis, the enclosure being fixed with respect to the first frame of reference; determining first 3D coordinates of a first object point, the first object point being a point of intersection of the first projector ray with the object, the determined first 3D coordinates of the first object point based at least in part on the assigned period, the assigned phase, the first image, the second image, the third image, the fourth image, the fifth image, the sixth image, the projector pose, the first-camera pose, and the second-camera pose; and storing the first 3D coordinates of the first object point.

In an embodiment, the method further includes determining second 3D coordinates of the first object point further based on first epipolar constraints between the projector and the first camera, second epipolar constraints between the projector and the second camera, and third epipolar constraints between the first camera and the second camera. In an embodiment, the method further includes determining third 3D coordinates of the first object point further based on the first 3D coordinates of the first object point and the second 3D coordinates of the first object point. In an embodiment, the method further includes storing a set of calibration parameters, the set of calibration parameters including values characterizing the projector pose, the first-camera pose, and the second-camera pose. In one embodiment, the method further includes detecting an error in the set of calibration parameters based at least in part on an inconsistency in the determined first 3D coordinates of the first object point and the determined second 3D coordinates of the first object point. In one embodiment, the method further includes generating an error signal or stopping a 3D measurement in response to the detected error in the set of calibration parameters. In one embodiment, the method further includes determining and storing a corrected set of calibration parameters in response to the detected error in the set of calibration parameters.

In another embodiment, the method further comprises: capturing color images with a third camera, the third camera being a color camera; and overlaying color onto the 3D coordinates of the first object point, the overlaid color being based at least in part on a color image captured by the third camera. In another embodiment, the method further includes determining the third 3D coordinates of the first object point with a first processor coupled to the enclosure. In one embodiment, the first processor cooperates with an external processor outside the enclosure to determine the third 3D coordinates of the first object point. In one embodiment, the first processor connects to the external processor directly or through a network connection.

In accordance with another embodiment, a three-dimensional (3D) measuring device is provided. The 3D measuring device having a projector having a collection of projector points, the projector configured to project a first projected pattern of light in a first instance, a second projected pattern of light in a second instance, and a third projected pattern of light in a third instance, the collection of projector points including a first projector point from which is projected a first projector ray having an assigned period and an assigned phase, the first projector ray having a first projected light level in the first instance, a second projector light level in the second instance, and a third projected light level in the third instance, the first, second, and third projected light levels varying sinusoidally according to the assigned period and the assigned phase, the projector having a projector pose in a first frame of reference. A camera is configured to capture a first image of the first projected pattern of light on the object, a second image of the second projected pattern of light on the object, and a third image of the third projected pattern of light on the object, the camera having a camera pose in the first frame of reference. An electrical power distribution network is configured to receive alternating current having a line frequency from a power mains. An enclosure is provided to which the projector, the camera, and the electrical power distribution network are coupled, the enclosure being fixed with respect to the first frame of reference. A control system is configured to set an exposure time of the camera to a positive integer divided by twice the line frequency. The 3D measuring system is configured to determine 3D coordinates of a first object point, the first object point being a point of intersection of the first projector ray with the object, the determined first 3D coordinates of the first object point being based at least in part on the assigned period, the assigned phase, the first image, the second image, the third image, the projector pose, and the camera pose.

In another embodiment, the control system is further configured to trigger exposure of the camera to begin at a trigger instant, the trigger instant being an instant in time occurring once per half-period, the half-period being a reciprocal of twice the line frequency. In another embodiment, the control system is configured to select the trigger instant to be at a time of minimum change in detected background light observed within the half-period. In another embodiment the control system is configured to select the trigger instant to be at a time of minimum signal level in detected background light observed within the half-period.

In another embodiment, the control system is further configured to reconstruct a waveform of the detected background light by sampling background light with an optical detector, the sampling performed at a sampling period. In another embodiment the optical detector is comprised of one or more photodetectors included in a photosensitive array of the camera. In one embodiment, the sampling period is longer than the half-period. In one embodiment the optical detector is a single-element photodetector. In one embodiment the optical detector is configured to move independently of the enclosure. In one embodiment the camera further includes an optical filter element or an optical filter coating to reduce entry of wavelengths into the camera light different than wavelengths of the first, second, and third projected patterns of light.

In accordance with another embodiment, a three-dimensional (3D) measuring system is provided. The 3D measuring system includes an enclosure, a light source and a projector coupled to the enclosure, the projector configured to convert a first light received from the light source into a patterned light and to project the patterned light onto an object, the projector having a projector pose. A camera is coupled to the enclosure, the camera configured to capture a first image of the patterned light on the object, the camera including a camera lens and a photosensitive array, the photosensitive array having a plurality of pixels, each pixel having a potential well configured to hold electrons produced in response to incident light received during an exposure period of the camera, the camera having a camera pose, the system being configured to determine 3D coordinates of the object based at least in part on the projected patterned light, the captured first image, the projector pose, and the camera pose. A cooling fan is coupled to the enclosure, the cooling fan configured to cool components within the enclosure. A feedback control system configured to control a number of electrons in each potential well to be independent of whether the cooling fan is turned on or turned off.

In another embodiment, the 3D measuring system further includes an optical detector configured to produce a second electrical signal indicative of a second optical power of a second light incident on the optical detector, the second light being a portion of the first light, wherein the feedback control system is further configured to drive the light source to maintain the same second optical power regardless of whether the cooling fan is turned on or off. In another embodiment the optical detector is placed within the enclosure at a location selected from the group consisting of: near the light source, in the projector, and in the camera.

In another embodiment, the 3D measuring system further includes a temperature sensor configured to produce a third electrical signal indicative of a first temperature in the enclosure, wherein the feedback control system is further configured to drive the light source to maintain the same second optical power regardless of whether the cooling fan is turned on or off. In one embodiment, the feedback control system provides a first electrical current to the light source based at least in part on information selected from the group consisting of: a lookup table, a curve, and an equation. In one embodiment, the temperature sensor is placed within the enclosure at a location selected from the group consisting of: near the light source, in the camera, and near a camera electronic circuit. In one embodiment, the temperature sensor is a thermistor.

In another embodiment, the feedback control system is configured to apply a first electrical current to the light source based at least in part on relationships derived from experimental data, the relationships dependent at least in part on a starting temperature of the 3D measuring system. In still another embodiment the 3D measuring system of claim 59 further includes an optical detector configured to produce a second electrical signal indicative of a second optical power of a second light incident on the optical detector, wherein the feedback control system is configured to adjust the exposure period to maintain a fixed integrated optical power regardless of whether the cooling fan is turned on or off, the integrated optical power being an integral of the second optical power over the exposure period.

In accordance with another embodiment, a method is provided. The method includes providing an enclosure, a light source, a projector, a camera, a cooling fan, and a feedback control system, the enclosure coupled to the light source, the camera, and the cooling fan, the projector having a projector pose, the camera having a camera pose, the camera having a camera lens and a photosensitive array, the photosensitive array having a plurality of pixels, each pixel having a potential well configured to hold electrons produced in response to incident light received during an exposure period of the camera. In a first instance the method includes turning on the cooling fan to cool components within the enclosure. In a second instance the method includes turning off the cooling fan. The method further includes: converting by the projector a first light received from the light source into a patterned light; projecting from the projector the patterned light onto an object; capturing with the camera a first image of the patterned light on the object; controlling with the feedback control system a number of electrons in each potential well produced in response to the capturing of the first image, the feedback control system being configured to make the number of electrons in each potential well independent of whether the cooling fan is turned on or turned off; determining 3D coordinates of the object based at least in part on the projected patterned light, the captured first image, the projector pose, and the camera pose; and storing the 3D coordinates.

In another embodiment, the method further includes producing with an optical detector a second electrical signal indicative of a second optical power of a second light incident on the optical detector, the second light being a portion of the first light. In one embodiment the feedback control system is configured to drive the light source to maintain the same second optical power regardless of whether the cooling fan is turned on or off. In one embodiment, the optical detector is placed within the enclosure at a location selected from the group consisting of: near the light source, in the projector, and in the camera.

In another embodiment, the method further includes producing with a temperature sensor a third electrical signal indicative of a first temperature in the enclosure. In one embodiment, the feedback control system is configured to drive the light source to maintain the same third electrical signal regardless of whether the cooling fan is turned on or off. In one embodiment, the method further includes providing by the feedback control system a first electrical current to the light source based at least in part on information selected from the group consisting of: a lookup table, a curve, and an equation.

In another embodiment, the method further includes providing by the feedback control system a first electrical current to the light source, the first electrical current based at least in part on relationships derived from experimental data, the relationships dependent at least in part on a starting temperature of the 3D measuring device.

In another embodiment, the method further includes: producing with an optical detector a second electrical signal indicative of a second optical power of a second light incident on the optical detector; and adjusting with the feedback control system the exposure period to maintain the same integrated optical power regardless of whether the cooling fan is turned on or off, the integrated optical power being an integral of the second optical power over the exposure period.

In accordance with another embodiment, a method is provided. The method comprising: providing a three-dimensional (3D) measuring system including a projector and a camera, the projector having a projector pose, a projector perspective center and a projector reference plane, there being a collection of projector pixels associated with the projector reference plane, the camera having a camera lens, a camera photosensitive array, a camera pose, a camera perspective center and a camera reference plane, the camera photosensitive array having a collection of camera pixels further associated with the camera reference plane; and providing an object having a first object point and a second object point, there being a first ray of light extending from the projector perspective center through a first projector pixel on the projector reference plane onto the first object point, there being a second ray of light extending from the projector perspective center through a second projector pixel on the projector reference plane onto the second object point. In a first instance the method comprises: illuminating by the projector the object with a first projector light pattern and capturing a first image of the illuminated object with the camera; determining for the first projector pixel a corresponding first region of the collection of camera pixels, the first region determined based at least in part on epipolar geometry of the 3D measuring system and on a first estimate of a position of the first object point relative to the projector perspective center and the camera perspective center; determining for the second projector pixel a corresponding second region of the collection of camera pixels, the second region determined based at least in part on the epipolar geometry of the 3D measuring system and on a first estimate of a position of the second object point relative to the projector perspective center and the camera perspective center; determining a first pixel response level, the first pixel response level being a maximum of electrical readout signals from the collection of camera pixels in the first region of the collection of camera pixels; determining a second pixel response level, the second pixel response level being a maximum of electrical readout signals from the collection of camera pixels in the second region of the collection of camera pixels;

In a second instance the method comprises illuminating the object with a second projector light pattern, the second projector light pattern producing a third ray of light extending from the projector perspective center through the first projector pixel and a fourth ray of light extending from the projector perspective center through the second projector pixel, an optical power emitted by the first projector pixel being scaled by a first scale factor according to the determined first pixel response level, an optical power emitted by the second projector pixel being scaled by a second scale factor according to the determined second pixel response level, the first scale factor being different than the second scale factor; capturing with the camera a second image of the second projector light pattern on the object, the first scale factor having been selected so as to prevent saturation of the collection of camera pixels in the first region of the collection of camera pixels, the second scale factor having been selected so as to prevent saturation of the collection of camera pixels in the second region of the collection of camera pixels; determining 3D coordinates of the first object point and the second object point based at least in part on the second projector light pattern, the second image, the projector pose, and the camera pose; and storing the determined 3D coordinates of the first object point and the second object point.

In another embodiment, in illuminating by the projector the object with a first projector light pattern, the first projector light pattern is a uniform illumination. In another embodiment, in determining for the first projector pixel a corresponding first region of the collection of camera pixels, the first estimate of a position of the second object point is based at least in part on measuring 3D coordinates of the object with the 3D measuring system.

In one embodiment, in determining for the first projector pixel a corresponding first region of the collection of camera pixels, determining the first estimate further comprises: illuminating by the projector the object with a structured light pattern, the structured light pattern covering an area of the object and having a collection of coded pattern elements; capturing by the camera an image of the structured-light pattern on the object; and determining by the system 3D coordinates of the object based at least in part on the projected structured light, the structured-light pattern on the object, the projector pose, and the camera pose.

In another embodiment, in illuminating by the projector the object with a first projector light pattern, the first projector light pattern includes a basic projector pattern projected at a first time and a complementary projector pattern projected at a second time, the basic projector pattern and the complementary projector pattern configured to cover the object. In one embodiment, in illuminating by the projector the object with a first projector light pattern, the basic projector pattern is a collection of light-and-dark stripes and the complementary projector pattern is a black-and-white reversal of the basic projector pattern. In one embodiment, in determining for the first projector pixel a corresponding first region of the collection of camera pixels, determining the first estimate further comprises: capturing with the camera a basic image of the basic projector pattern on the object at the first time and capturing with the camera a complementary image of the complementary projector pattern on the object at the second time; and determining by the system 3D coordinates of the object based at least in part on the basic projector pattern, the complementary projector pattern, the basic image, the complementary image, the projector pose, and the camera pose.

In another embodiment in determining for the first projector pixel a corresponding first region of the collection of camera pixels, determining the first estimate of a position of the first object point relative to the projector perspective center and the camera perspective center further comprises: obtaining a model for the object, the model being selected from the group consisting of: a computer-aided design (CAD) model, and an as-measured model, the as-measured model being a model obtained by a 3D measurement of the object by a 3D measuring instrument; moving the object into a fixed position relative to the 3D measuring system; and determining the estimate of the first object point by mathematical evaluation by a processor with the 3D measuring system.

In another embodiment, in determining for the first projector pixel a corresponding first region of the collection of camera pixels, the epipolar geometry of the 3D measuring system is characterized by the projector perspective center, the projector reference plane, the camera perspective center, and the camera reference plane, a relative positions of the projector and the camera being characterized by the projector pose and the camera pose.

In another embodiment, in illuminating by the projector the object with a first projector light pattern and capturing a first image of the illuminated object with the camera, the capturing of the first image is performed with binned camera pixels, each of the binned camera pixels including a plurality of the camera pixels.

In accordance with another embodiment, a method is provided. The method comprising: providing a three-dimensional (3D) measuring system including a projector and a camera, the projector having a projector pose, a projector perspective center and a projector reference plane, there being a collection of projector pixels associated with the projector reference plane, the camera having a camera lens, a camera photosensitive array, a camera pose, a camera perspective center and a camera reference plane, the camera photosensitive array having a collection of camera pixels further associated with the camera reference plane; providing an object having a first object point and a second object point, there being a first ray of light extending from the projector perspective center through a first projector pixel on the projector reference plane to the first object point, there being a second ray of light extending from the projector perspective center through a second projector pixel on the projector reference plane to the second object point.

In a first instance the method provides: illuminating by the projector the object with a first sequence of projector light patterns and in response capturing a corresponding first sequence of first images of the illuminated object with the camera; determining for the first projector pixel a corresponding first region of the collection of camera pixels, the first region determined based at least in part on epipolar geometry of the 3D measuring system and on a first estimate of a position of the first object point relative to the projector perspective center and the camera perspective center, the first estimate of the position of the first object point based at least in part on the first sequence of projector light patterns, the first sequence of first images, the projector pose, and the camera pose; determining for the second projector pixel a corresponding second region of the collection of camera pixels, the second region determined based at least in part on the epipolar geometry of the 3D measuring system and on a first estimate of a position of the second object point relative to the projector perspective center and the camera perspective center, the first estimate of the position of the second object point based at least in part on the first sequence of projector light patterns, the first sequence of first images, the projector pose, and the camera pose; determining a first pixel response level based at least in part on electrical readout signals from the collection of camera pixels in the first region of the collection of camera pixels for at least one of the first sequence of first images; and determining a second pixel response level based at least in part on electrical readout signals from the collection of camera pixels in the second region of the collection of camera pixels for at least one of the first sequence of first images.

In a second instance the method provides: illuminating by the projector the object with a second sequence of projector light patterns, the second sequence of projector light patterns including the first ray and the second ray, optical powers emitted in the second sequence of projector light patterns by the first projector pixel being scaled by a first scale factor according to the determined first pixel response level, optical powers emitted in the second sequence of projector light patterns by the second projector pixel being scaled by a second scale factor according to the determined second pixel response level; capturing with the camera a second sequence of second images corresponding to the second sequence of projector light patterns on the object, the first scale factor having been selected so as to prevent saturation of the collection of camera pixels in the first region of the collection of camera pixels, the second scale factor having been selected so as to prevent saturation of the collection of camera pixels in the second region of the collection of camera pixels, the first scale factor being different than the second scale factor; determining 3D coordinates of the first object point and the second object point based at least in part on the second sequence of projector light patterns, the second sequence of second images, the projector pose, and the camera pose; and storing the determined 3D coordinates of the first object point and the second object point.

In another embodiment, in illuminating by the projector the object with a first sequence of projector light patterns and in determining for the first projector pixel a corresponding first region of the collection of camera pixels, the first sequence of projector light patterns include three or more phase-shifted sinusoidal intensity patterns. In one embodiment, in determining for the first projector pixel a corresponding first region of the collection of camera pixels, the epipolar geometry of the 3D measuring system is characterized by the projector perspective center, the projector reference plane, the camera perspective center, and the camera reference plane, a relative positions of the projector and the camera being characterized by the projector pose and the camera pose. In one embodiment in determining for the first projector pixel a corresponding first region of the collection of camera pixels, the first region of the collection of camera pixels is based at least in part on the first sequence of first images.

In another embodiment, in illuminating by the projector the object with a second sequence of projector light patterns, the second sequence of projector light patterns include three or more phase-shifted sinusoidal intensity patterns. In another embodiment, in illuminating by the projector the object with a first sequence of projector light patterns and in determining for the first projector pixel a corresponding first region of the collection of camera pixels, the first sequence of projector light patterns include three or more phase-shifted trapezoidal intensity patterns. In another embodiment, in illuminating by the projector the object with a second sequence of projector light patterns, the second sequence of projector light patterns include three or more phase-shifted trapezoidal intensity patterns. In still another embodiment, in the illuminating by the projector the object with a first sequence of projector light patterns and in response capturing a corresponding first sequence of first images of the illuminated object with the camera, the capturing of the first sequence of first images is performed with binned camera pixels, each of the binned camera pixels including a plurality of the camera pixels.

In accordance with another embodiment, a three-dimensional (3D) measuring system is provided. The 3D measuring system includes a first set of 3D imagers, each designated by an index j between 1 and an integer N equal to or greater than 2, each 3D imager j configured to determine 3D coordinates of an object in an imager frame of reference, each 3D imager j having a 3D imager pose j within a system frame of reference. Each 3D imager j includes: a projector j configured to project a patterned light over an area onto the object; a camera j configured to capture an image of the patterned light on the object, the camera j including a lens j and a photosensitive array j, the camera j configured to image the patterned light on the object onto the photosensitive array j; a processor j mechanically coupled to the projector j and the camera j, the processor j configured to determine the 3D coordinates of the object in the imager frame of reference based at least in part on the projected patterned light, the image of the patterned light on the object captured by the camera j, and a relative pose of the projector j with respect to the camera j; a first mounting frame coupled to each 3D imager j in the first set of 3D imagers; and a system controller configured to obtain a system collection of 3D coordinates, the system collection of 3D coordinates being 3D coordinates of the object in the system frame of reference, the system collection of coordinates based at least in part on the determined 3D coordinates of the object provided by the first set of 3D imagers and on the 3D imager pose j in the system frame of reference of each 3D imager j in the first set of 3D imagers.

In an embodiment, the first mounting frame is further attached to a mover device, the mover device being configured to change a pose of the first mounting frame. In one embodiment, the mover device is selected from the group consisting of: a robot and a mobile platform. In another embodiment, a portion of the system controller is coupled to the first mounting frame. In another embodiment, the system controller includes an external computer not connected to the first mounting frame. In one embodiment, the system controller includes a collection of networked computers configured to perform parallel processing of the 3D coordinates provided by the first set of 3D imagers.

In another embodiment, the 3D measuring system further includes a second set of the 3D imagers, each designated by an index j between N+1 and an integer M, the integer M being equal to or greater than N+1, each 3D imager j of the second set of 3D imagers being coupled to a second mounting frame. In one embodiment, the first set of 3D imagers and the second set of 3D imagers are arranged to measure different sides of the object. In one embodiment, the object is coupled to a conveyor device, the conveyor device configured to move the object relative to the first set of 3D imagers.

In another embodiment, the first set of 3D imagers includes a first group of 3D imagers and a second group of 3D imagers, each 3D imager of the first group of 3D imagers associated with a corresponding first area of the object, each 3D imager of the second group of 3D imagers associated with a corresponding second area of the object, the 3D measuring system configured to: in a first time interval, project patterned light by each 3D imager of the first group of 3D imagers onto the corresponding first area of the object, each of the corresponding first areas receiving no projected patterned light from any other 3D imager in the first set of 3D imagers, each 3D imager in the first group of 3D imagers further configured to determine 3D coordinates of the corresponding first area; and in a second time interval, project patterned light by each 3D imager of the second group of 3D imagers onto the corresponding second area of the object, each of the corresponding second areas receiving no projected patterned light from any other 3D imager in the first set of 3D imagers, each 3D imager in the second group of 3D imagers further configured to determine 3D coordinates of the corresponding second area.

In accordance with an embodiment, during the first time interval, the system controller blanks each projector j in the second group of 3D imagers and during the second time interval, the system controller blanks each projector j in the first group of 3D imagers. In accordance with another embodiment, the 3D measuring system is further configured, during the second time interval, to read out electrical signals corresponding to at least a portion of images obtained by the first set of 3D imagers.

In another embodiment, the first set of 3D imagers includes a third group of 3D imagers and a fourth group of 3D imagers, each 3D imager of the third group of 3D imagers associated with a corresponding third area of the object, each 3D imager of the fourth group of 3D imagers associated with a corresponding fourth area of the object, the 3D measuring system further configured to: in a third time interval, project patterned light by each 3D imager of the third group of 3D imagers onto the corresponding third area of the object, each of the corresponding third areas receiving no projected patterned light from any other 3D imager in the first set of 3D imagers, each 3D imager in the third group of 3D imagers further configured to determine 3D coordinates of the corresponding third area; and in a fourth time interval, project patterned light by each 3D imager of the fourth group of 3D imagers onto the corresponding fourth area of the object, each of the corresponding fourth areas receiving no projected patterned light from any other 3D imager in the first set of 3D imagers, each 3D imager in the fourth group of 3D imagers further configured to determine 3D coordinates of the corresponding fourth area.

In another embodiment, the 3D measuring system is further configured to: during the second time interval, read out electrical signals corresponding to at least a portion of images obtained by the first set of 3D imagers, during the third time interval, read out electrical signals corresponding to at least a portion of images obtained by the second set of 3D imagers, and during the fourth time interval, read out electrical signals corresponding to at least a portion of images obtained by the third set of 3D imagers. In one embodiment, there is overlap among the areas covered by patterned light projected by the first group of 3D imagers, the second group of 3D imagers, the third group of 3D imagers, and the fourth group of 3D imagers.

In another embodiment the system controller is configured, during a second time interval, to determine at least a portion of the system collection of 3D coordinates collected based at least in part on 3D coordinates provided during a first time interval by the first set of 3D imagers. In another embodiment, the 3D measuring system further includes a collection of fiducial targets coupled to the first mounting frame. In one embodiment the collection of fiducial targets are retroreflectors. In one embodiment, the collection of fiducial targets are spherically mounted retroreflectors configured to attach to magnetic nests coupled to the first mounting frame. In one embodiment, the collection of fiducial targets are light sources.

In another embodiment, each 3D imager j from the first set of 3D imagers is configured to measure a collection of fiducial targets, the position of each fiducial target having 3D coordinates in a first frame of reference, and the system controller is configured to determine the 3D imager pose j for each 3D imager j of the first set of 3D imagers based at least in part on the 3D coordinates of the fiducial targets in the first frame of reference and the 3D coordinates of the fiducial targets as determined by each 3D imager j within the first set of 3D imagers.

In one embodiment, the 3D measuring system further includes a scale bar, the scale bar including a first fiducial target and a second fiducial target within the collection of fiducial targets, a distance between the first fiducial target and the second fiducial target being a reference distance. In one embodiment, the system controller is further configured to determine the 3D imager pose j for each 3D imager j of the first set of 3D imagers further based on the reference distance and on 3D coordinates of the first fiducial target and the second fiducial target as determined by the 3D measuring system.

In another embodiment, each 3D imager j in the first set of 3D imagers further includes a color camera j in addition to the camera j; and each processor j is further configured to integrate color into the determined 3D coordinates of the object. In another embodiment, the 3D measuring system further includes a wide field-of-view (FOV) camera having a wider FOV than any camera j within the first set of 3D imagers. In one embodiment, the wide FOV camera is a color camera, the system controller being further configured to add color to a representation of the system collection of 3D coordinates.

In another embodiment, the 3D measuring system further includes a standoff structure coupled to the first mounting frame, the standoff structure configured to hold first targets configured to be imaged by the cameras j of the 3D imagers j. In one embodiment, the system controller is further configured to adjust the mover device to bring the standoff structure into proximity of the object so that at least one camera j captures an image that includes at least one first target and the object.

In another embodiment, the 3D measuring system further includes: a mover device configured to change a relative position of the object and the first set of 3D imagers; and a collection of fiducial targets placed between the object and the 3D imagers. In another embodiment, the 3D measuring system further includes a collection of fiducial targets configured to be held stationary relative to the object, the object being configured to change its pose relative to the first set of 3D imagers. In another embodiment the 3D measuring system further includes a collection of fiducial targets configured to be held stationary relative to the first set of 3D imagers, the object being configured to change its pose relative to the first set of 3D imagers. In one embodiment, the system controller further includes a user interface configured to enable selection of 3D imagers j to be included in the first set of 3D imagers, the user interface permitting a user to select a plurality of imagers to include in the first set of 3D imagers. In one embodiment, the user interface permits users to select 3D imagers j to include in the first set of 3D imagers based on a serial number, an internet protocol (IP) address, or both. In one embodiment, the system controller further includes a user interface configured to enable a user to select the collection of fiducial targets and to display on the user interface 3D coordinates of each the selected fiducial targets.

In accordance with another embodiment, a three-dimensional (3D) measuring system is provided. The 3D measurement system comprising a master part including a first base part selected from a plurality of base parts, there being at least three fiducial markers affixed to the first base part. A first part-under-test includes a second base part selected from the plurality of base parts. A photogrammetry camera is configured to image the master part, including the at least three fiducial markers, from a plurality of photogrammetry camera positions to obtain a corresponding plurality of photogrammetry two-dimensional (2D) images. A first 3D imager is provided having a first projector and a first camera, the first 3D imager configured to determine 3D coordinates in a first imager frame of reference. A second 3D imager is provided having a second projector and a second camera, the second 3D imager configured to determine 3D coordinates in a second imager frame of reference. The system is configured to determine in a system frame of reference a first pose of the first 3D imager and a second pose of the second 3D imager based at least in part on the plurality of photogrammetry 2D images, determined 3D coordinates of at least three fiducial markers from among the at least three fiducial markers in the first imager frame of reference, and determined 3D coordinates of at least three fiducial markers from among the at least three fiducial markers in the second imager frame of reference. The system is further configured to determine 3D coordinates of the first part-under-test in the system frame of reference based at least in part on the determined first pose, the determined second pose, determined 3D coordinates of the first part-under-test by the first 3D imager in the first imager frame of reference, and determined 3D coordinates of the first part-under-test by the second 3D imager in the second imager frame of reference.

In another embodiment, the system further includes a scale bar having a first target and a second target, a distance between the first target and the second target being a calibrated reference distance, the scale bar being configured to be fixedly positioned relative to the master part, the first target and the second target being visible in the plurality of photogrammetry 2D images. In one embodiment, the system is further configured to determine the first pose and the second pose based on the calibrated reference distance. In another embodiment, the three fiducial markers include retroreflective targets. In one embodiment, the photogrammetry camera further includes a flash unit configured to illuminate the retroreflector targets.

In another embodiment, the at least two of the plurality of photogrammetry 2D images are obtained with the photogrammetry camera rotated to different orientations. In another embodiment, the first 3D imager further includes a processor configured to determine the 3D coordinates in the first imager frame of reference, and the second 3D imager further includes a processor configured to determine the 3D coordinates in the second imager frame of reference.

In another embodiment, the first 3D imager is further configured to cooperate with an external computer to determine the 3D coordinates in the first imager frame of reference, and the second 3D imager is further configured to cooperate with the external computer to determine the 3D coordinates in the second imager frame of reference. In another embodiment, the system is further configured to cooperate with an external computer to determine in the system frame of reference the first pose of the first 3D imager and the second pose of the second 3D imager.

In another embodiment, the system further comprises a second part-under-test including a third base part selected from the plurality of base parts, wherein the system is further configured to determine 3D coordinates of the second part-under-test in the system frame of reference based at least in part on the determined first pose, the determined second pose, determined 3D coordinates of the second part-under-test by the first 3D imager in the first imager frame of reference, and determined 3D coordinates of the second part-under-test by the second 3D imager in the second imager frame of reference.

In another embodiment, the at least three fiducial markers from among the at least three fiducial markers in the first imager frame of reference includes at least one fiducial marker not included in the at least three fiducial markers from among the at least three fiducial markers in the second imager frame of reference. In one embodiment, the at least three fiducial markers includes a first marker, a second marker, a third marker, a fourth marker, a fifth marker, and a sixth marker, the at least three fiducial markers from among the at least three fiducial markers in the first imager frame of reference including the first marker, the second marker, and the third marker but not the fourth marker, the fifth marker or the sixth marker, the at least three fiducial markers from among the at least three fiducial markers in the second imager frame of reference including the fourth marker, the fifth marker, and the sixth marker but not the first marker, the second marker, or the third marker.

In accordance with another embodiment, a method is provided. The method comprising: providing a master part, a first part-under-test, a photogrammetry camera, a first three-dimensional (3D) imager, and a second 3D imager, the master part including a first base part selected from a plurality of base parts, there being at least three fiducial markers affixed to the first base part, the first part-under-test including a second base part selected from the plurality of base parts, the first 3D imager having a first projector, a first camera, and a first frame of reference, the second 3D imager having a second projector, a second camera, and a second frame of reference; imaging the master part, including the at least three fiducial markers, with the photogrammetry camera from a plurality of photogrammetry camera positions to obtain a corresponding plurality of photogrammetry two-dimensional (2D) images; determining with the first 3D imager 3D coordinates of the at least three fiducial markers in the first frame of reference; determining with the second 3D imager 3D coordinates of the at least three fiducial markers in the second frame of reference; determining in a system frame of reference a first pose of the first 3D imager and a second pose of the second 3D imager based at least in part on the plurality of photogrammetry 2D images, the determined 3D coordinates of at least three fiducial markers from among the at least three fiducial markers in the first frame of reference, and the determined 3D coordinates of at least three fiducial markers from among the at least three fiducial markers in the second frame of reference; determining with the first 3D imager first 3D coordinates of the first part-under-test in the first frame of reference; determining with the second 3D imager second 3D coordinates of the first part-under-test in the second frame of reference; determining 3D coordinates of the first part-under-test in the system frame of reference based at least in part on the determined first pose, the determined second pose, the determined first 3D coordinates of the first part-under-test in the first imager frame of reference, and the determined second 3D coordinates of the first part-under-test in the second frame of reference; and storing the 3D coordinates of the first part-under-test in the system frame of reference.

In another embodiment, the method further comprises providing a scale bar having a first target and a second target, a distance between the first target and the second target being a calibrated reference distance, the scale bar being configured to be fixedly positioned relative to the master part, the first target and the second target being visible in the plurality of photogrammetry 2D images. In one embodiment, in determining in a system frame of reference a first pose of the first 3D imager and a second pose of the second 3D imager, the first pose and the second pose are further based on the calibrated reference distance.

In another embodiment, the at least three fiducial markers include retroreflective targets. In one embodiment, the photogrammetry camera further includes a flash unit configured to illuminate the retroreflector targets. In one embodiment, the at least two of the plurality of photogrammetry 2D images are obtained with the photogrammetry camera rotated to different orientations.

In another embodiment, the method further comprises providing a second part-under-test, including a third base part selected from the plurality of base parts. In one embodiment, the method further comprises determining 3D coordinates of the second part-under-test in the system frame of reference based at least in part on the determined first pose, the determined second pose, determined 3D coordinates of the second part-under-test by the first 3D imager in the first imager frame of reference, and determined 3D coordinates of the second part-under-test by the second 3D imager in the second imager frame of reference.

In another embodiment, in providing the master part, the part-under-test, the photogrammetry camera, the first 3D imager, and the second 3D imager, the first 3D imager further includes a first processor and the second 3D imager further includes a second processor. In one embodiment, in determining with the first 3D imager first 3D coordinates of the part-under-test in the first frame of reference, the first processor determines the first 3D coordinates, and in determining with the second 3D imager second 3D coordinates of the part-under-test in the second frame of reference, the second processor determines the second 3D coordinates.

In another embodiment, in determining with the first 3D imager first 3D coordinates of the part-under-test in the first frame of reference, the first 3D imager cooperates with an external computer to determine the 3D coordinates of the part-under-test in the first frame of reference; and in determining with the second 3D imager second 3D coordinates of the part-under-test in the second frame of reference, the second 3D imager cooperates with the external computer to determine the 3D coordinates of the part-under-test in the second frame of reference. In another embodiment, in determining in a system frame of reference a first pose of the first 3D imager and a second pose of the second 3D imager, an external computer assists in determining in the system frame of reference the first pose of the first 3D imager and the second pose of the second 3D imager.

In accordance with another embodiment, a structure is provided. The structure including a plurality of three-dimensional (3D) imagers, each 3D imager configured to determine 3D coordinates of points on an object, each 3D imager having a projector and a camera, the projector configured to project a pattern of light onto the object, the camera including a lens and a photosensitive array, the lens configured to image the pattern of light on the object onto the photosensitive array, the lens and the projector being separated by a baseline distance. The structure further including a treelike structure configured to hold the plurality of 3D imagers to enable translation and rotation of each 3D imager in the plurality of 3D imagers, the structure having a central trunk element on which one or more branch elements are coupled, each of the plurality of 3D imagers being coupled to the one or more branch elements.

In another embodiment, the one of the one or more branch elements is a primary branch element coupled to the central trunk element by a branch connector, the branch connector including a first connector part and a second connector part, the second connector part configured to rotate relative to the first connector part. In one embodiment, the structure is further configured to enable relative rotation between the first connector part and the central trunk element. In one embodiment, the structure is further configured to enable relative rotation between the second connector part and the primary branch element.

In another embodiment, the central trunk element and the one or more branch elements are tubes having a circular cross section. In one embodiment, the tubes are made of a carbon-fiber composite material having a coefficient of thermal expansion (CTE) less than 2.0 μm/m/° C. In another embodiment, the one or more branch elements includes a primary branch element and a secondary branch element, the primary branch element including a third connector part and a fourth connector part, the fourth connector part configured to rotate relative to the third connector part.

In another embodiment, an imager connector couples the 3D imager to a first branch element selected from the one or more branch elements. In one embodiment, the imager connector is configured to rotate the 3D imager about the first branch element. In one embodiment, the imager connector includes a first imager connector part and a second imager connector part, the second imager connector part configured to rotate relative to the first image connector part.

In another embodiment, the branch connector includes a first branch part and a second branch part, the second branch part configured to rotate relative to the first branch part.

In accordance with another embodiment, a method is provided. The method comprising: providing a first three-dimensional (3D) imager configured to determine first 3D coordinates on an object, the first 3D imager having a first projector and a first camera, the first projector configured to project a first pattern of light onto the object, the first camera including a first lens and a first photosensitive array, the first lens configured to image the first pattern of light on the object onto the first photosensitive array, the first lens configured to image the first pattern of light on the object onto the first photosensitive array, the first lens and the first projector being separated by a first baseline distance; providing a second three-dimensional (3D) imager configured to determine second 3D coordinates on an object, the second 3D imager having a second projector and a second camera, the second projector configured to project a second pattern of light onto the object, the second camera including a second lens and a second photosensitive array, the second lens configured to image the second pattern of light on the object onto the second photosensitive array, the second lens configured to image the second pattern of light on the object onto the second photosensitive array, the second lens and the second projector being separated by a second baseline distance; providing a structure configured to hold the first 3D imager and the second 3D imager to enable translation and rotation of the first 3D imager and the second 3D imager; translating and rotating the first 3D imager on the structure to a first preferred distance and first preferred orientation relative to the object under test; translating and rotating the second 3D imager on the structure to a second preferred distance and second preferred orientation relative to the object under test; performing a registration procedure to determine a relative pose of the first 3D imager and the second 3D imager; measuring first 3D coordinates of first points on the object under test with the first 3D imager, the first 3D coordinates being in a first local frame of reference of the first 3D imager; measuring second 3D coordinates of second points on the object under test with the second 3D imager, the second 3D coordinates being in a second local frame of reference of the second 3D imager; transforming the first 3D coordinates of the first points and the second 3D coordinates of the second points into global 3D coordinates of the first points and the second points, the transforming based at least in part on the relative pose of the first 3D imager and the second 3D imager, the measured first 3D coordinates, and the measured second 3D coordinates; and storing the global 3D coordinates of the first points and the second points.

In another embodiment, in performing the registration procedure to determine the relative pose of the first 3D imager and the second 3D imager, the registration procedure further comprises: imaging three fiducial markers and a first calibrated reference length with a photogrammetry camera held in a first camera pose to obtain a first 2D marker image; imaging the three fiducial markers and the first calibrated reference length with the photogrammetry camera held in a second camera pose to obtain a second 2D marker image; measuring 3D coordinates of the three fiducial targets with the first 3D imager; measuring 3D coordinates of the three fiducial targets with the second 3D imager; and determining the relative pose of the first 3D imager and the second 3D imager based at least in part on first 2D marker image, the second 2D marker image, the 3D coordinates of the three fiducial targets measured with the first 3D imager, and the 3D coordinates of the three fiducial targets measured with the second 3D imager.

In another embodiment, in performing the registration procedure to determine the relative pose of the first 3D imager and the second 3D imager, the registration procedure further comprises: providing a collection of three or more fiducial targets, each target having calibrated 3D coordinates; measuring 3D coordinates of the three or more fiducial targets with the first 3D imager and the second 3D imager; determining the relative pose of the first 3D imager and the second 3D imager based at least in part on the calibrated 3D coordinates of the collection of three or more fiducial targets, the 3D coordinates of the three or more fiducial targets as measured by the first 3D imager, and the 3D coordinates of the three or more fiducial targets as measured by the second 3D imager.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description, but is only limited by the scope of the appended claims.

What is claimed is:

1. A three-dimensional (3D) measuring system comprising:
   a master part including a first base part selected from a plurality of base parts, there being at least three fiducial markers affixed to the first base part;
   a first part-under-test including a second base part selected from the plurality of base parts;
   a photogrammetry camera configured to image the master part, including the at least three fiducial markers, from a plurality of photogrammetry camera positions to obtain a corresponding plurality of photogrammetry two-dimensional (2D) images;
   a first 3D imager having a first projector and a first camera, the first 3D imager configured to determine 3D coordinates in a first imager frame of reference;
   a second 3D imager having a second projector and a second camera, the second 3D imager configured to determine 3D coordinates in a second imager frame of reference,
   wherein the system is configured to determine in a system frame of reference a first pose of the first 3D imager and a second pose of the second 3D imager based at least in part on the plurality of photogrammetry 2D images, determined 3D coordinates of at least three fiducial markers from among the at least three fiducial markers in the first imager frame of reference, and determined 3D coordinates of at least three fiducial markers from among the at least three fiducial markers in the second imager frame of reference, and
   wherein the system is further configured to determine 3D coordinates of the first part-under-test in the system frame of reference based at least in part on the determined first pose, the determined second pose, determined 3D coordinates of the first part-under-test by the first 3D imager in the first imager frame of reference, and determined 3D coordinates of the first part-under-test by the second 3D imager in the second imager frame of reference.

2. The system of claim 1, further comprising:
   a scale bar having a first target and a second target, a distance between the first target and the second target being a calibrated reference distance, the scale bar being configured to be fixedly positioned relative to the master part, the first target and the second target being visible in the plurality of photogrammetry 2D images,
   wherein the system if further configured to determine the first pose and the second pose based on the calibrated reference distance.

3. The system of claim 1, wherein the three fiducial markers include retroreflective targets and the photogrammetry camera further includes a flash unit configured to illuminate the retroreflector targets.

4. The system of claim 1, wherein the at least two of the plurality of photogrammetry 2D images are obtained with the photogrammetry camera rotated to different orientations.

5. The system of claim 1, wherein:
   the first 3D imager further includes a processor configured to determine the 3D coordinates in the first imager frame of reference, and is further configured to cooperate with an external computer to determine the 3D coordinates in the first imager frame of reference; and
   the second 3D imager further includes a processor configured to determine the 3D coordinates in the second imager frame of reference, and is further configured to cooperate with the external computer to determine the 3D coordinates in the second imager frame of reference,
   wherein the system is further configured to cooperate with an external computer to determine in the system frame of reference the first pose of the first 3D imager and the second pose of the second 3D imager.

6. The system of claim 1, wherein the system further comprises:
   a second part-under-test including a third base part selected from the plurality of base parts,
   wherein the system is further configured to determine 3D coordinates of the second part-under-test in the system frame of reference based at least in part on the determined first pose, the determined second pose, determined 3D coordinates of the second part-under-test by the first 3D imager in the first imager frame of reference, and determined 3D coordinates of the second part-under-test by the second 3D imager in the second imager frame of reference.

7. The system of claim 1, wherein:
   the at least three fiducial markers from among the at least three fiducial markers in the first imager frame of reference includes at least one fiducial marker not included in the at least three fiducial markers from among the at least three fiducial markers in the second imager frame of reference, and
   the at least three fiducial markers includes a first marker, a second marker, a third marker, a fourth marker, a fifth marker, and a sixth marker, the at least three fiducial markers from among the at least three fiducial markers in the first imager frame of reference including the first marker, the second marker, and the third marker but not the fourth marker, the fifth marker or the sixth marker, the at least three fiducial markers from among the at least three fiducial markers in the second imager frame of reference including the fourth marker, the fifth marker, and the sixth marker but not the first marker, the second marker, or the third marker.

8. A method comprising:
   providing a master part, a first part-under-test, a photogrammetry camera, a first three-dimensional (3D) imager, and a second 3D imager, the master part including a first base part selected from a plurality of base parts, there being at least three fiducial markers affixed to the first base part, the first part-under-test including a second base part selected from the plurality of base parts, the first 3D imager having a first projector, a first camera, and a first frame of reference, the second 3D imager having a second projector, a second camera, and a second frame of reference;

imaging the master part, including the at least three fiducial markers, with the photogrammetry camera from a plurality of photogrammetry camera positions to obtain a corresponding plurality of photogrammetry two-dimensional (2D) images;

determining with the first 3D imager 3D coordinates of the at least three fiducial markers in the first frame of reference;

determining with the second 3D imager 3D coordinates of the at least three fiducial markers in the second frame of reference;

determining in a system frame of reference a first pose of the first 3D imager and a second pose of the second 3D imager based at least in part on the plurality of photogrammetry 2D images, the determined 3D coordinates of at least three fiducial markers from among the at least three fiducial markers in the first frame of reference, and the determined 3D coordinates of at least three fiducial markers from among the at least three fiducial markers in the second frame of reference;

determining with the first 3D imager first 3D coordinates of the first part-under-test in the first frame of reference;

determining with the second 3D imager second 3D coordinates of the first part-under-test in the second frame of reference;

determining 3D coordinates of the first part-under-test in the system frame of reference based at least in part on the determined first pose, the determined second pose, the determined first 3D coordinates of the first part-under-test in the first imager frame of reference, and the determined second 3D coordinates of the first part-under-test in the second frame of reference; and storing the 3D coordinates of the first part-under-test in the system frame of reference.

9. The method of claim 8, further comprising:

providing a scale bar having a first target and a second target, a distance between the first target and the second target being a calibrated reference distance, the scale bar being configured to be fixedly positioned relative to the master part, the first target and the second target being visible in the plurality of photogrammetry 2D images, wherein in determining in a system frame of reference a first pose of the first 3D imager and a second pose of the second 3D imager, the first pose and the second pose are further based on the calibrated reference distance.

10. The method of claim 8, wherein:

the at least three fiducial markers include retroreflective targets, the photogrammetry camera further includes a flash unit configured to illuminate the retroreflector targets, and the at least two of the plurality of photogrammetry 2D images are obtained with the photogrammetry camera rotated to different orientations.

11. The method of claim 8, further comprising:

providing a second part-under-test, including a third base part selected from the plurality of base parts; and determining 3D coordinates of the second part-under-test in the system frame of reference based at least in part on the determined first pose, the determined second pose, determined 3D coordinates of the second part-under-test by the first 3D imager in the first imager frame of reference, and determined 3D coordinates of the second part-under-test by the second 3D imager in the second imager frame of reference.

12. The method of claim 8, wherein:

in providing the master part, the part-under-test, the photogrammetry camera, the first 3D imager, and the second 3D imager, the first 3D imager further includes a first processor and the second 3D imager further includes a second processor, in determining with the first 3D imager first 3D coordinates of the part-under-test in the first frame of reference, the first processor determines the first 3D coordinates; and in determining with the second 3D imager second 3D coordinates of the part-under-test in the second frame of reference, the second processor determines the second 3D coordinates.

13. The method of claim 8, wherein:

in determining with the first 3D imager first 3D coordinates of the part-under-test in the first frame of reference, the first 3D imager cooperates with an external computer to determine the 3D coordinates of the part-under-test in the first frame of reference; and in determining with the second 3D imager second 3D coordinates of the part-under-test in the second frame of reference, the second 3D imager cooperates with the external computer to determine the 3D coordinates of the part-under-test in the second frame of reference; and in determining in a system frame of reference a first pose of the first 3D imager and a second pose of the second 3D imager, an external computer assists in determining in the system frame of reference the first pose of the first 3D imager and the second pose of the second 3D imager.

14. A three-dimensional (3D) measuring system comprising:

a master part including a first base part, there being at least three fiducial markers affixed to the first base part;

a first part-under-test including a second base part;

a photogrammetry camera configured to image the master part, including the at least three fiducial markers, and to obtain a plurality of photogrammetry 2D images;

a first 3D imager having a first projector and a first camera, the first 3D imager configured to determine 3D coordinates in a first imager frame of reference;

a second 3D imager having a second projector and a second camera, the second 3D imager configured to determine 3D coordinates in a second imager frame of reference; and one or more processors responsive to executable computer instructions, to perform a method comprising:

determine first 3D coordinates of at least three fiducial markers from among the at least three fiducial markers in the first imager frame of reference;

determine second 3D coordinates of at least three fiducial markers from among the at least three fiducial markers in the second imager frame of reference;

determine in a system frame of reference a first pose of the first 3D imager and a second pose of the second 3D imager based at least in part on the plurality of photogrammetry 2D images, the first 3D coordinates and the second 3D coordinates;

determine in a system frame of reference a first pose of the first 3D imager and a second pose of the second 3D imager based at least in part on the plurality of photogrammetry 2D images, the first 3D coordinates, and the second;

determine a third 3D coordinates of the first part-under-test by the first 3D imager in the first imager frame of reference;

determine a fourth 3D coordinates of the first part-under-test by the second 3D imager in the second imager frame of reference; and determine a third 3D coordinates of the first part-under-test in the system frame of reference based at least in part on the determined first pose, the determined second pose, the third 3D coordinates and the fourth 3D coordinates.

15. The system of claim 14, further comprising:

a scale bar having a first target and a second target, a distance between the first target and the second target being a calibrated reference distance, the scale bar being configured to be fixedly positioned relative to the master part, the first target and the second target being visible in the plurality of photogrammetry 2D images, wherein the method further comprises determining the first pose and the second pose based on the calibrated reference distance.

16. The system of claim 14, wherein the three fiducial markers include retroreflective targets and the photogrammetry camera further includes a flash unit configured to illuminate the retroreflector targets.

17. The system of claim 14, wherein the at least two of the plurality of photogrammetry 2D images are obtained with the photogrammetry camera rotated to different orientations.

* * * * *